United States Patent [19]
Kikuchi et al.

[11] Patent Number: 5,598,037
[45] Date of Patent: Jan. 28, 1997

[54] SEMICONDUCTOR DEVICE WITH A CONTACT MEMBER MADE OF SEMICONDUCTOR MATERIAL HAVING A COLUMNAR STRUCTURE

[75] Inventors: Shin Kikuchi, Isehara; Mamoru Miyawaki, Tokyo; Genzo Monma, Hiratsuka; Hayao Ohzu, Kawasaki; Shunsuke Inoue, Yokohama; Yoshio Nakamura, Atsugi; Takeshi Ichikawa, Zama; Osamu Ikeda, Tokyo; Tetsunobu Kohchi, Hiratsuka, all of Japan

[73] Assignee: Canon Kabushiki Kaisha, Tokyo, Japan

[21] Appl. No.: 404,746

[22] Filed: Mar. 15, 1995

Related U.S. Application Data

[62] Division of Ser. No. 872,295, Apr. 22, 1992, Pat. No. 5,466,961.

[30] Foreign Application Priority Data

| Apr. 23, 1991 | [JP] | Japan | 3-92304 |
| Apr. 23, 1991 | [JP] | Japan | 3-92305 |
| Apr. 26, 1991 | [JP] | Japan | 3-97243 |
| Jun. 28, 1991 | [JP] | Japan | 3-184168 |
| Jun. 28, 1991 | [JP] | Japan | 3-184169 |
| Jun. 28, 1991 | [JP] | Japan | 3-184170 |
| Jun. 28, 1991 | [JP] | Japan | 3-184171 |

[51] Int. Cl.$^6$ .......................... H01L 27/02; H01L 29/10
[52] U.S. Cl. .......................... 257/773; 257/774; 257/329; 257/334; 257/623; 257/306
[58] Field of Search ........................... 257/331, 334, 257/330, 302, 532, 774, 773, 306, 623

[56] References Cited

U.S. PATENT DOCUMENTS

| 4,853,341 | 8/1989 | Nishioka et al. | 257/774 |
| 4,884,121 | 11/1989 | Ishii | 257/752 |
| 4,924,276 | 5/1990 | Heime et al. | 257/774 |
| 5,057,896 | 10/1991 | Gotou | 257/623 |
| 5,072,269 | 12/1991 | Hieda | 257/390 |
| 5,192,988 | 3/1993 | Yoshii | 257/774 |

FOREIGN PATENT DOCUMENTS

| 1-266756 | 10/1989 | Japan | 257/302 |
| 1-248557 | 10/1989 | Japan | 257/302 |
| 2-314418 | 2/1990 | Japan | 257/774 |
| 2-12872 | 1/1995 | Japan | 257/774 |

Primary Examiner—Robert P. Limanek
Assistant Examiner—Alexander Oscar Williams
Attorney, Agent, or Firm—Fitzpatrick, Cella, Harper & Scinto

[57] ABSTRACT

A semiconductor device including: an insulated gate type transistor having a columnar semiconductor region formed on the main side of a semiconductor substrate, a gate electrode formed on the side surface of the columnar semiconductor region while interposing a gate insulating film and main electrode regions respectively formed on and formed below the columnar semiconductor region; and a memory element which is formed on the upper main electrode region and which can be broken electrically.

7 Claims, 112 Drawing Sheets

F I G. 27
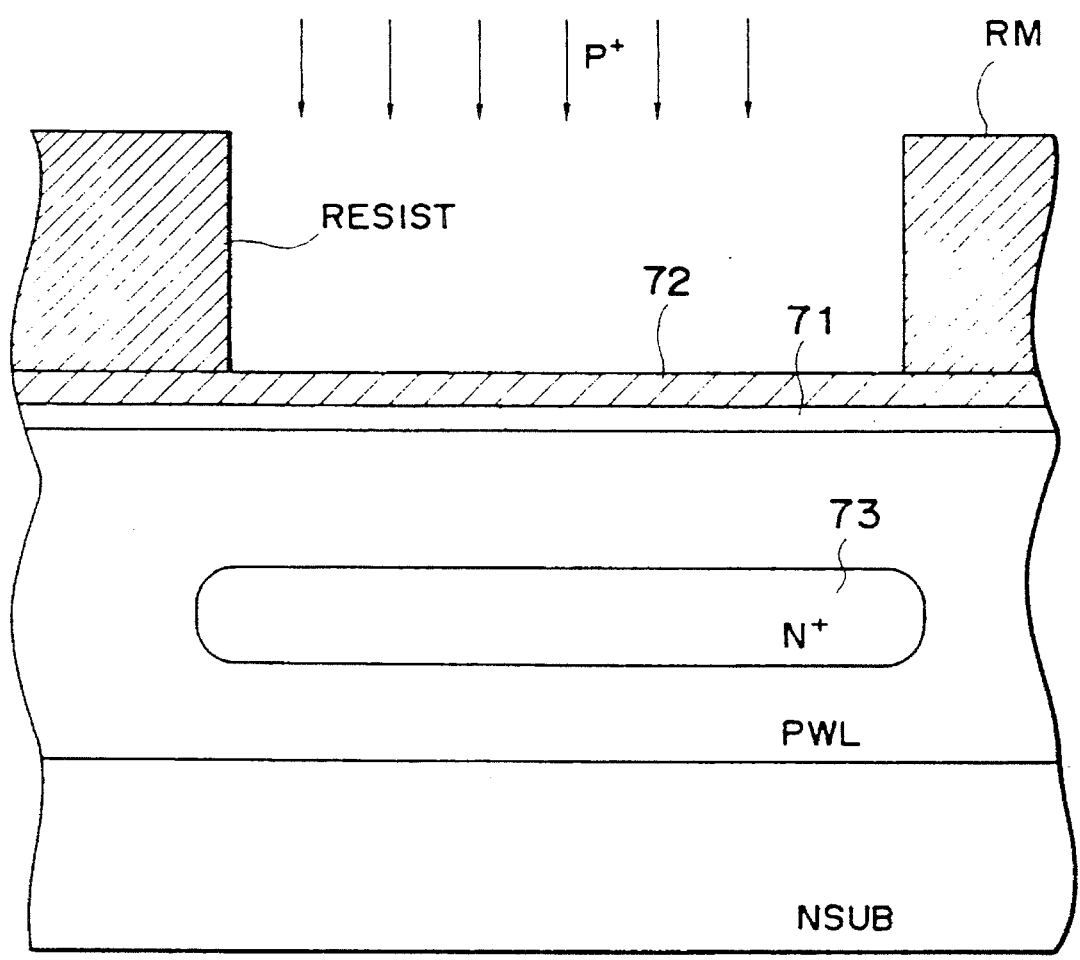

SEMICONDUCTOR DEVICE WITH A CONTACT MEMBER MADE OF SEMICONDUCTOR MATERIAL HAVING A COLUMNAR STRUCTURE

This application is a continuation of application Ser. No. 07/872,295 filed Apr. 22, 1992 now U.S. Pat. No. 5,466,961.

BACKGROUND OF THE INVENTION

1. Field of the Invention

The present invention relates to a semiconductor device for use in an electronic circuit for a variety of technical fields such as an automobile, an electric power generating plant, an artificial satellite as well as an OA machine and an electronic product for a private use such as a copying machine, a facsimile machine, a printer and a video camera, and a method of manufacturing the semiconductor device.

In particular, the present invention relates to a semiconductor memory device for storing a required information signal.

2. Related Background Art

FIG. 45 illustrates the structure of a semiconductor memory capable of storing and programming data only one time, the semiconductor memory being constituted by an MOS type field effect transistor (hereinafter called an "MOSFET") serving as an insulated gate type field effect transistor and a memory cell having an insulating film.

A memory of the aforesaid type has been disclosed in, for example, "A New Programmable Cell Utilizing Insulator Breakdown", IDEM' 85, pp 639 to 642.

Another type semiconductor arranged as shown in FIG. 46 has been known.

FIG. 46 is a cross-sectional view which illustrates the semiconductor memory of the aforesaid type. Referring to FIG. 46, reference numeral 120 represents an n-type substrate, 121 represents a p$^+$ drain, 122 represents a P$^+$ source, 123 represents a floating gate, 124 represents an insulating layer, 125 represents a drain wiring and 126 represents a source wiring. The floating gate 123 is manufactured by, for example, embedding a polycrystalline silicone in a silicone oxide film.

A transistor for use in ULSIs and having a gate length of sub-micron order has been developed thanks to progress of the fine processing technology.

FIG. 101 is a schematic cross sectional view which illustrates an LDD (Lightly Doped Drain) structure as a typical MOS type field effect transistor (hereinafter called a "MOSFET").

Referring to FIG. 101, reference numeral 201 represents a P type semiconductor substrate, 202 represents a field oxide film, 203 and 204 respectively represent n$^+$ layer of the source region and that of the drain region and 205 represents a gate insulating film, 206 represents a gate electrode. Reference numerals 207 and 208 respectively represent n$^-$ layer provided for the purpose of relieving the field concentration taken place adjacent to the gate of the source region and that of the drain region, 290 represent a channel dope layer formed by an ion injection operation for the purpose of making the threshold to be a desired value and 210 represents a P$^+$ layer.

However, the transistor structured as described above arises the following problems.

A first problem takes place in that drain current I$_D$ and the mutual inductance (gam) are too small due to the presence of the n$^-$ layers 207 and 208. A second problem arises in that the mobility is deteriorated, and a third problem will arise in that the gate width W cannot be fined with the similar scaling to that for use to fining the gate length L.

The aforesaid problems will now be described.

FIG. 102 is a graph which illustrates an example of the relationship between the length of the channel and the drain current as disclosed in K. Yano, M. Aoki, and T. Masahara Extended Abstracts of the 18th (1986 International) Conference on Solid State Devices and Material (1986) PP85 to 88. FIG. 102 shows results of comparisons made between a drain voltage V$_D$ of 0.1 V, 5 V, temperature of 77 K. and 300 K.

As can be understood from FIG. 102, parasitic drain resistance generated due to the n$^-$ layers 207 and 208 causes the decrease of the length of the channel and the increase in the drain current are not in proportion to each other as designated by a dashed line XA but are made as designated by a solid line XB. Referring to FIG. 102, symbol XC shows measured values. Since a large drain current is not obtained as described above, the mutual conductance characteristics (the gm characteristics) are deteriorated.

A rule of scaling a typical MOSFET is shown in Table 1.

TABLE 1

| Parameter | Scaling Ratio |
|---|---|
| Length of channel | 1/K |
| Width of channel | 1/K |
| Thickness of gate oxide film | 1/K |
| Depth of joint | 1/K |
| Thickness of Depletion layer | 1/K |
| Concentration of impurities in channel | K |
| Voltage | 1/K |

As can be understood from Table 1, the punch-through current between the source and the drain generated due to fining of the channel length L can be prevented by raising the impurity concentration Na of the region which is formed into the channel. However, the concentration of the impurities in the channel is raised, the mobility of the carrier is lowered and thereby the gm characteristics are deteriorated. It might therefore be considered feasible to employ a method in which the p$^+$ layer 210 is brought near the gate insulating film 205. In this case, the field intensity in the vertical direction in relation to the direction in which the carrier is moved is raised. Therefore, also the mobility of the carrier is lowered while maintaining the correlative relationship as shown in FIG. 103 (which illustrates the relationship between the field intensity (axis of abscissa) in the vertical direction and the mobility (axis of ordinate) as disclosed in, for example, A. G. Sabnis et al IEDM 79 PP18 to 21, where XD, XE and XF are measured values when the power supply voltage was 0.1 V, −5.0 V and −20.0 V, respectively).

That is, the characteristics of the MOSFET having the gate length L ranged from 0.5 to 0.8 μm can be improved to a certain degree according to the scaling rule shown in Table 1. However, the gate length L is smaller than the aforesaid range, the drain current and the gm characteristics excessively deteriorated. Furthermore, the fining operation will cause the proportion of the wiring section to be enlarged. Therefore, there is a desire of a transistor having further improved gm characteristics. However, it can be met by only widening the gate width W under the present conditions. Therefore, the original object of fining the size cannot be achieved.

Also a GOLD type (Gate Overlap Lightly Doped Drain) MOSFET which is a modification to the LDD type MOSFET encounters the aforesaid problems.

In order to overcome the aforesaid problems experienced with the MOSFET structured as described above, a surrounding gate transistor (SGT) has been disclosed which is arranged in such a manner that four gate electrodes face one another as suggested in H. Tadato, K. Sunoushim, N. Okabe, A. Nitayama, K. Hieda, F. Horiguchi, and F. Masuoka IEDM (International Electron Device Meeting) (1988) PP222 to 225. The structure of it is shown in FIG. 128. FIG. 128A is a perspective view and 128B is a cross section taken along line A–A'.

Referring to FIGS. 66 and 67, reference numeral 215 represents a substrate, 216 represents a p well layer, 217 represents a source region, 218 represents a gate electrode, 219 represents a gate insulating film, 220 represents a drain region and 221 represents a drain outlet electrode. In the aforesaid structure, the gate electrode 218 is formed to surround the channel region. Therefore, the following advantages can be obtained: the concentration of the electric field can be relieved, the adverse effect of the hot carrier or the like can be eliminated and the control of the potential of the channel portion by using the gate can be easily performed.

FIG. 104A and FIG. 104B respectively are a plan view and a circuit diagram which illustrate a CMOS invertor circuit which utilizes an SGT. FIGS. 105 and 106 are cross-sectional views respectively taken along line A–A' and C–C' of FIG. 104A. The contact portions between Vin and PMOSFET and NMOSFET are represented by 230 and 231.

In the aforesaid conventional transistor, the portion between the source and the drain is not conductive in a normal state. Writing can be performed by applying negative high voltage between the source and the drain of the transistor, avalanche-breaking down the pn junction on the drain side and injecting large energy electrons generated at this time into the floating gate so as to cause the portion between the source and the drain to be a conductive state. In a case where the aforesaid device is used as a memory, facts whether or not the charge is injected into the floating gate are made correspond to information 1 and 0.

However, since the charge stored in the floating slightly leaks in the memory of the aforesaid type, problems arises in that information cannot be stored permanently and the reading characteristics are undesirably changed with time.

Furthermore, the aforesaid MOSFET is not suitable to be fined and its characteristics (gm characteristics) encounter a problem in that the mutual conductance is too small.

In addition, if the gate length is 0.5 μm or less at the time of the fining operation, the improvement of the aforesaid MOSFET by scaling cannot be expected.

As a dynamic random access memory (DRAM), a vertical memory cell constituted by using a surrounding gate transistor (SGT) as the addressing transistor and by forming a trench capacitor in its main electrode region of the substrate has been suggested.

However, the inventors of the present invention found that a DRAM of the aforesaid type has the following problems: with the high integration exceeding 16M bits and further fining of the cell, the capacitor size is limited and the capacity is thereby reduced. As a result, a large signal charge cannot be stored. On the contrary, the parasitic capacity of the wiring is increased due to the fining process. As a result, the signal transmitted finally becomes too small and the SN ratio is also lowered at the time of reading the stored signal by means of the capacity division. Therefore, the memory is erroneously operated.

Furthermore, since the shape is formed into an vertical shape, the manufacturing process is too complicated and therefore the yield cannot be improved. As a result, a problem in terms the commercial viewpoint arises.

That is, the inventors of the present invention found that the original object to satisfactorily apply the fine transistor such as the SGT to the DRAM cannot be achieved.

Another semiconductor memory has been known which is arranged as shown in FIG. 46.

FIG. 46 is a cross sectional view which illustrates a semiconductor memory of the aforesaid type. Referring to FIG. 46, reference numeral 120 represents an n-type substrate, 121 represents a $p^+$ drain, 122 represents a $P^+$ source, 123 represents a floating gate, 124 represents an insulating layer, 125 represents a drain wiring and 126 represents a source wiring. The floating gate 123 is manufactured by, for example, embedding a polycrystalline silicone in a silicone oxide film. The portion between the source and the drain is not conductive in a normal state. Writing can be performed by applying negative high voltage between the source and the drain of the transistor, avalanche-breaking down the pn junction on the drain side and injecting large energy electrons generated at this time into the floating gate so as to cause the portion between the source and the drain to be a conductive state. In a case where the aforesaid device is used as a memory, facts whether or not the charge is injected into the floating gate are made correspond to information 1 and 0.

However, since the charge stored in the floating slightly leaks in the memory of the aforesaid type, problems arises in that information cannot be stored permanently and the reading characteristics are undesirably changed with time. Furthermore, the aforesaid MOSFET is not suitable to be fined and its characteristics (gm characteristics) encounter a problem in that the mutual conductance is too small.

In addition, if the gate length is 0.5 μm or less at the time of the fining operation, the improvement of the aforesaid MOSFET by scaling cannot be expected.

The aforesaid conventional technology encounters another problem in that the voltage resistance of the oxide film in the Si edge portion is deteriorated.

FIG. 67 illustrates the process of the change in the thickness of the oxide film in the Si edge portion. Assuming that the thickness of the oxide film in the flat region made of Si is δ2 and that in the edge portion is δ1 as designated by 254 shown in FIG. 67, the following relationship is held:

$$\delta_1 < \delta_2 \tag{1}$$

Furthermore, the shape of the Si in the edge portion tends to be formed into an wedge shape, causing the voltage resistance of the portion in the vicinity of the edge to be lowered.

Therefore, the reliability of the semiconductor device will be deteriorated.

The integrated circuits of the semiconductor integrated circuits using the MOS transistor have been further highly integrated. With the tendency of raising the degree of integration, the MOS transistor for use in the integrated circuit has been fined to a sub-micron order. However, if the gate size is reduced to the sub-micron order, the following problems arise:

1. The leak current increases due to the short channel effect.

2. The VTH and the mutual conductance are undesirably changed due to the hot carrier effect.

In order to overcome these problems, an MOS transistor having a surrounding gate is used in the existing state.

FIG. 82 is a cross sectional view which illustrates an example of the structure of the conventional surrounding gate-type MOS transistor.

Referring to FIG. 82, reference numeral 651 represents a N-type Si substrate, 652 represents a P⁻ layer for forming a columnar semiconductor layer, 653 represents a drain N⁺ layer of the NMOS, 654 represents a gate electrode, 655 represents a source N⁺ layer of the N-MOS, 656 represents an Al electrode for ejecting the drain, 659a represents a gate oxide film formed around the columnar semiconductor layer and 659b represents a gate oxide film formed under the gate electrode.

In the aforesaid conventional surrounding gate type MOS transistor (hereinafter called an "SGT-MOS Tr"), the thickness of the oxide film 659b under the gate electrode is the same as that of the oxide film (the side portion of the columnar semiconductor layer). In a case where the thickness of the oxide film 659b under the gate electrode is about 20 to 150Å, the gate . source capacity in the MOS Tr increases, causing a problem to arise in that the switching characteristics of the memory excessively deteriorate.

However, if the DRAM is formed by integrating 1-gigabit memory devices, it is considered that the size of a cell becomes about 0.3 μm square. Therefore, the aforesaid vertical MOS transistor which is the most promising device in the age of the high integration devices encounters multiple problems at the time of the manufacturing process if the size is the aforementioned order.

In the method of manufacturing the conventional vertical MOS transistor, the top surface of the columnar silicon monocrytal region serving as a source region of the MOS transistor and the gate electrode are separated from each other while interposing a thin gate oxide film. Therefore, there arises the following problems:

(Problem 1)

The size of the contact portion of the source electrode becomes very small in a very fine pattern in which the vertical transistor is able to exhibit its performance. Therefore, a slight positional deviation taken place in relation to the lower layer at the time of forming a contact opening will cause a short circuit to be generated between the gate electrode and the source electrode. If the columnar silicon region is enlarged in order to overcome the aforesaid problem, the degree of integration of the overall circuit will be lowered.

(Problem 2)

If the introduction of impurities into the source region is performed by the ion injection, the gate oxide film adjacent to the source region can be easily damaged. Therefore, the short circuit between the source and the gate will take place or the reliability of the gate oxide film will be deteriorated.

(Problem 3)

Since the parasitic capacity between the source and gate electrodes increases, the high speed operation of the circuit is hindered.

Furthermore, the aforesaid conventional structure encounters a problem that patterning at the time of ejecting the wiring from the upper portion of the columnar semiconductor layer cannot be easily performed in a state where the width of the columnar semiconductor layer has been fined with proceeding of the fining operation. Therefore, the fining speed is limited.

FIG. 107 is an enlarged view which illustrates a contact hole portion shown in FIG. 104. Referring to FIG. 107, the contact hole 231 to be opened when the wiring is taken from the upper portion of the columnar semiconductor 217 is formed in such a manner that its longer side runs parallel to the longer side of the upper portion of the columnar semiconductor.

Therefore, assuming that the shorter side of the upper portion of the columnar semiconductor 217 is a and the alignment margin between the contact hole 231 and the columnar semiconductor 217 is x, the width of the contact hole 231 becomes a −2x or less.

As a result, it is very difficult to perform aligning with the contact hole and therefore the yield becomes too difficult. This leads to a fact, when a becomes a sub-micron order, the aforesaid process cannot be performed at the existing technological level.

What is even worse, when the aforesaid conventional structure is constituted, it is very difficult to perform a process in which wiring is arranged from the gate electrode, that is, a photolithography process in which both of the surrounding gate and the gate wiring portion are left. The aforesaid problem becomes critical with proceeding of the fining process and it is a critical problem for the surrounding gate type MOSFET.

SUMMARY OF THE INVENTION

Accordingly, an object of the present invention is to provide a semiconductor storage device constituted so as to be suitable to be subjected to a fining process and capable of operating at high speed while reducing power consumption.

Another object of the present invention is to provide an insulated gate type transistor and a semiconductor memory arranged in such a manner that its SGT cell, which has been formed into a square shape in a conventional structure, is formed into a cylindrical shape in order to eliminate a region in which the thickness of the oxide film is locally reduced so as to relieve the concentration of the electric field to improve the voltage resistance of the oxide film and to improve the reliability.

Another object of the present invention is to realize a surrounding gate type MOS Tr capable of preventing an increase in the gate-source capacity of the MOS Tr and excessive deterioration in the switching characteristics of a memory.

Another object of the present invention is to provide a method of manufacturing a semiconductor device capable of improving the manufacturing margin adjacent to the source of a vertical MOS transistor, improving the reliability of the gate oxide film and performing a high speed operation.

Other and further objects, features and advantages of the invention will be appear more fully from the following description.

BRIEF DESCRIPTION OF THE DRAWINGS

FIG. 27 is a schematic view which illustrates a process of manufacturing a semiconductor memory according to the present invention;

FIG. 120 illustrates a process of manufacturing a pMOS according to the present invention;

FIG. 121 illustrates a process of manufacturing a pMOS according to the present invention;

FIG. 122 illustrates a process of manufacturing an nMOS according to the present invention;

FIG. 123 illustrates a process of manufacturing an nMOS according to the present invention;

FIG. 124 illustrates a process of manufacturing an nMOS according to the present invention;

FIG. 125 illustrates a process of manufacturing an nMOS according to the present invention;

FIGS. 126A and 126B illustrate a process of forming a dummy land by the method according to the present invention; and FIG. 127 is schematic plan view which illustrates the apparatus according to the present invention.

DETAILED DESCRIPTION OF THE PREFERRED EMBODIMENTS

Figure 1:
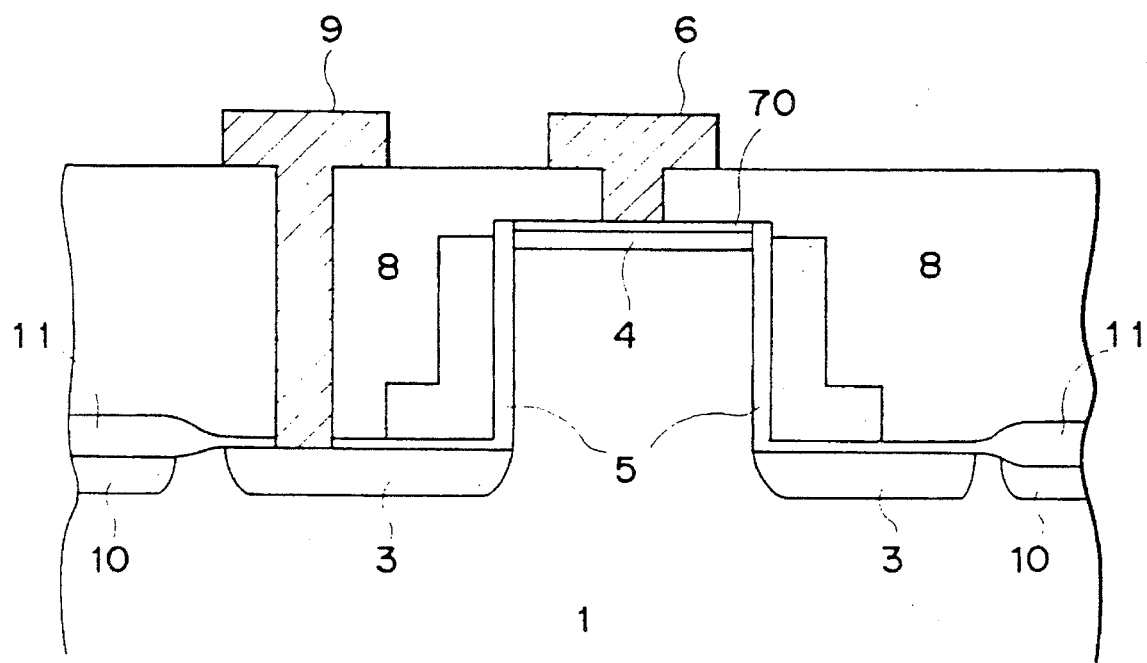
FIG. 1 is a schematic cross sectional view which illustrates a memory cell according to Embodiment 1(A) of the present invention.

The object of the present invention is achieved by a semiconductor device comprising: an insulated gate type transistor having a columnar semiconductor region formed on the main side of a semiconductor substrate, a gate electrode formed on the side surface of the columnar semiconductor region while interposing a gate insulating film and main electrode regions respectively formed on and formed below the columnar semiconductor region; and a memory element which is formed on the upper main electrode region and which can be broken electrically.

According to one aspect of the invention, there is provided a semiconductor memory in which a gate electrode is formed to surround the side surface of a columnar semiconductor layer formed on the main surface of a semiconductor substrate while interposing a gate insulating film, and an electrode is formed on an FET having source and drain regions in the upper and the lower portions of the columnar semiconductor layer, the electrode being formed while interposing an insulating film or a semiconductor layer which can be electrically broken.

According to this aspect, an MIS type structure is employed which is arranged in such a manner that the vertical type FET is employed as the addressing transistor of the memory cell, the insulating film or the semiconductor layer, which forms a semiconductor junction which can be broken and which serves as a memory element, is stacked and electrodes are disposed on the vertical type FET. As a result, a semiconductor memory which can be further high integrated and capable of performing at high speed can be provided.

An object of the present invention can be achieved by a semiconductor memory in which a gate electrode is formed to surround the side surface of a columnar semiconductor layer formed on the main surface of a semiconductor substrate while interposing a gate insulating film, and an electrode is formed on an FET having source and drain regions in the upper and the lower portions of the columnar semiconductor layer, the electrode being formed while interposing a memory element which can be electrically broken.

According to this aspect, an MIS type structure is employed which is arranged in such a manner that the vertical type FET is employed as the addressing transistor of the memory cell, the insulating film, which can be broken and which serves as a memory element, is stacked and electrodes are disposed on the vertical type FET. As a result, a semiconductor memory which can be further high integrated and capable of performing at high speed can be provided.

In order to overcome the aforesaid problems, according to the present invention, there is provided a semiconductor device of a surrounding gate type having a gate insulating film and a gate electrode around a columnar semiconductor layer formed on a substrate, the semiconductor device comprising an oxide film formed just below the gate electrode, the oxide film being thicker than the gate insulating film around the columnar semiconductor layer.

According to the present invention, the surrounding gate type MOS transistor is formed into the MOS transistor having a structure in which the oxide film formed below the gate electrode is thicken. As a result, the gate and source capacity can be reduced.

The aforesaid object of the invention can be achieved by a method of manufacturing a semiconductor device including the steps of: forming a monocrystal silicon region into a columnar shape on a substrate; forming an insulating film which surrounds the side surface of the columnar monocrystal silicon region; forming a gate electrode which surrounds the insulating film; and forming a high concentration impurity diffusion layer adjacent to the top surface of the monocrystal silicon region, the method of manufacturing a semiconductor device comprising the step of: oxidizing the top surface of the columnar monocrystal silicon region and the insulating film positioned in contact with the top surface of the monocrystal silicon region by performing heat treatment in an atmosphere containing an oxidizing gas after the gate electrode has been formed so as to form an oxide film around the high concentration impurity diffusion layer, the oxide film being thicker than the insulating film which surrounds the side surface of the columnar monocrystal silicon region.

According to the present invention, the drain electrode and the gate electrode can be assuredly separated from each other by the oxide film which is sufficiently thicker than the gate oxide film. As a result, the breakdown voltage resistance between the drain and the gate can be improved.

Furthermore, by thickening the oxide film formed between the source and the gate, the leak current generated through the oxide film can be reduced.

Furthermore, the alignment margin at the time of the manufacturing process can be enlarged.

In addition, the parasitic capacity between the source and the gate can be reduced and thereby high speed switching operation can be realized.

The present invention has the following means in order to overcome the aforesaid problems:

A semiconductor device having a member which is the subject of contact and which is formed into a rectangular or a rectangular-like shape, the semiconductor device comprising: a contact hole formed in such a manner that its longer side crosses at substantially right angles made from the direction of the longer side of the contact member which is the subject of contact.

A semiconductor device wherein the member which is the subject of contact is semiconductor material having a columnar structure formed on the substrate.

A semiconductor device wherein the member which is the subject of contact is columnar semiconductor material which constitutes a surrounding gate type MOSFET.

A method of manufacturing a semiconductor device comprising the steps of: forming an insulating film on a member which is the subject of contact and which has a top surface formed into a rectangular or a rectangular shape; etching the insulating film so as to form a contact hole in such a manner that its longer side crosses at substantially right angles made from the direction of the longer side of the contact member which is the subject of contact; and depositing conductive material on the member which is the subject of contact and which has been caused to appear outside.

According to the present invention, the contact hole formed into a rectangular or a rectangular-like shape is formed in such a manner that its longer side crosses at substantially right angles made from the member which is the subject of the contact and which is formed into a rectangular or a rectangular-like shape. Therefore, if the short side of the member which is the subject of the contact is short, contact can be established easily and assuredly.

According to the present invention, the aforesaid object can be achieved by a semiconductor device comprising: one or more columnar semiconductor layers which constitute a circuit; and one or more columnar layers which are disposed at positions different from the positions of the columnar semiconductor layers and which do not constitute any circuit.

An aspect of the invention lies in a semiconductor device in which the columnar layer has a film made of insulating material on the surface thereof. An aspect of the invention lies in a semiconductor device in which the columnar layer is made of insulating material. An aspect of the invention lies in a semiconductor device in which the insulating material is silicon oxide. An aspect of the invention lies in a semiconductor device in which the columnar semiconductor layer is made of silicon.

An aspect of the invention lies in a semiconductor device in which one or more layers are formed around at least one of the columnar semiconductor layers and around at least one of the columnar layers. An aspect of the invention lies in a semiconductor device in which the interval between the columnar layer and the columnar semiconductor layer disposed adjacently or the columnar layer is two times or less the thickness of at least one layer. An aspect of the invention lies in a semiconductor device in which the at least one layer is a gate electrode of an MOSFET and a gate wiring.

In order to achieve the aforesaid problem, according to the present invention, there is provided a method of manufacturing a semiconductor device in which, when the one or more layer is formed, material of the layer is deposited and etching is performed by an etching back method.

An aspect of the invention lies in a method of manufacturing a semiconductor device in which no mask is used at the etching. An aspect of the invention lies in a method in which the film made of silicon oxide is formed by heat-oxidizing silicon. An aspect of the invention lies in a method of manufacturing a semiconductor device in which, when the one or more layers are deposited, the thickness of a deposited film is the half or more of the interval between the columnar layer and the columnar semiconductor layer disposed adjacently or the columnar layer.

First, a transistor serving as the basic portion of the present invention will now be described.

In a channel region of the transistor according to the present invention, the width (d3) of the channel region interposed by a gate electrode in the direction in which the gate electrode faces each other and the concentration of impurities in a semiconductor in the channel region are determined as follows: they are determined in such a manner that depletion layers extending from the two facing portions are connected to each other and thereby a desired depletion portion is formed. Specifically, assuming that the width of the channel region between the facing portions of the gate electrode is d3 and the width of the depletion layer extending from the two portions in the direction of the extension is W, a relationship d3≦W is held. The reason for this lies in that, the depletion state realized in the channel region between the facing portions of the electrode acts to relieve the electric field acting on inside portion of the aforesaid channel region if the gate voltage is raised to a level at which an inversion layer is formed.

It is preferable that a dope region adjacent to the channel region be formed. The dope region must be a conduction type which is different from that of the source and the drain regions and as well as it must be a semiconductor region sowing a high impurity concentration. The type of the impurity and that of the conduction are not limited. Specifically, the concentration of the impurity in the dope region is made to be a concentration at which the dope region is not inverted by driving voltage which acts on the gate at the time of operating the transistor. As for the required function, it must receive the carrier supplied from the channel region held between the facing portions of the gate electrode.

The gate electrode according to the present invention may be made of metal, polycrystal silicon, silicide or polycide. Specifically, Al, W, Mo, Ni, Co, Rh, Pt, Pd, their silicide or their polycide may be used. A suitable material is selected after the structure of the MOSFET, the driving conditions and its work function have been considered.

The shape of the gate electrode and that of the dope region may be constituted in such a manner that the portion of the channel region which faces the dope region has no gate electrode, that the aforesaid portion is formed into the dope region dr that also the portion facing the dope region has a portion of the gate electrode. It is preferable that the cross sectional shape of the channel region when it is cut in a direction perpendicular to the direction in which the carriers move is a square such as a rectangular shape so that the three sides of the channel region are surrounded by the gate electrode and the residual portion is positioned in contact with the dope region. Its side may be a side having a curvature in place of a correct straight line. Furthermore, each edge portion may be a shape formed by chamfering after the coating feasibility of the gate insulating film has been considered.

Embodiment 1(A)

FIG. 1 is a schematic cross sectional view which illustrates a semiconductor memory according to Embodiment 1 (A) by a portion corresponding to one cell.

A semiconductor substrate 1 has a columnar semiconductor layer in the upper portion thereof. A gate electrode 2 is formed around the columnar portion while holding a gate insulating film 5. A drain region 3 is formed in the side portion of the lower portion of the columnar portion, the columnar portion having a source region 4 formed thereon. Reference numeral 9 represents a drain electrode. A source electrode 6 is connected to the source region 4 while interposing an insulating film 70, so that an MIS capacitor is formed. The vertical size of the columnar semiconductor layer is longer than the necessitated gate length and the length of one side of the top surface and that of the lower surface is made to be of the order of sub-micron (0.1 μm). The area of the insulating film 70 is made to be substantially the same as the area of the source region 4 formed under the insulating film 70 or to be slightly smaller than the same so as to improve the feasibility of the insulating film to cover the stepped portion.

Reference numerals 10 and 11 respectively represent a channel stopper for insulating the elements and a field insulating film.

Figure 2:
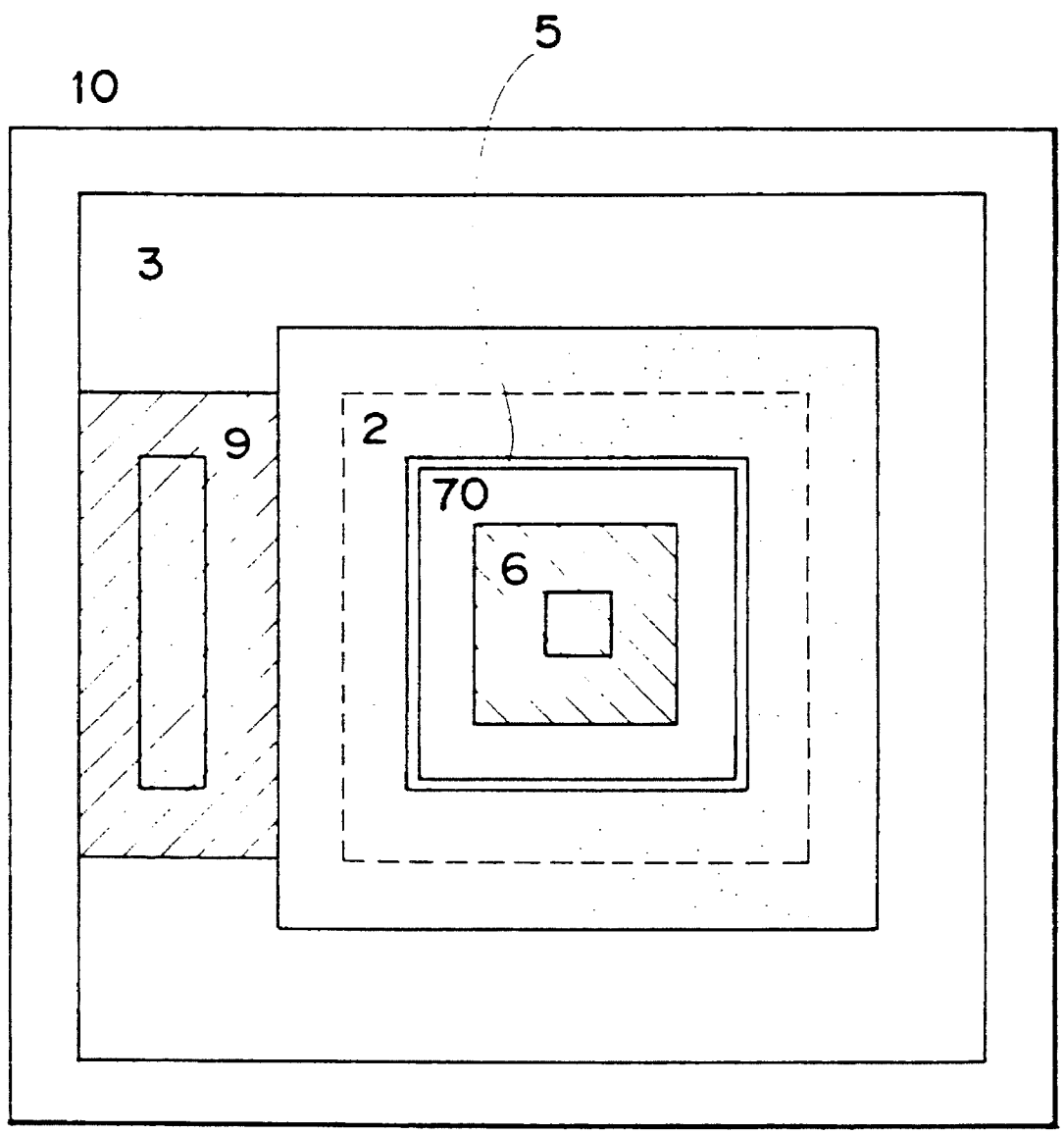
FIG. 2 is a schematic top view which illustrates a memory cell according to Embodiment 1(A) of the present invention.

FIG. 2 is a schematic top view which illustrates the cell shown in FIG. 1. As shown in FIG. 2, the one cell is structured by stacking capacitor on a vertical type MOSFET.

In a case where a P-type semiconductor is employed to form the substrate 1, the N-type semiconductor may be employed to form the source region and the drain region. A contrary structure may also be employed.

The electrodes 2, 6 and 9 may be constituted by a single layer or a multilayer of polysilicon, Al, Mo or W.

The insulating film 70 must be a dielectric member from which a desired capacity can be obtained. Specifically, single or multilayered silicon nitride, aluminum oxide or tantalum oxide is employed. In order to be broken by a voltage level of 3 to 5 V but to withstand a voltage level of 1 to 3 V, its thickness, structure and material are selected.

Embodiment 2(A)

Figure 3:
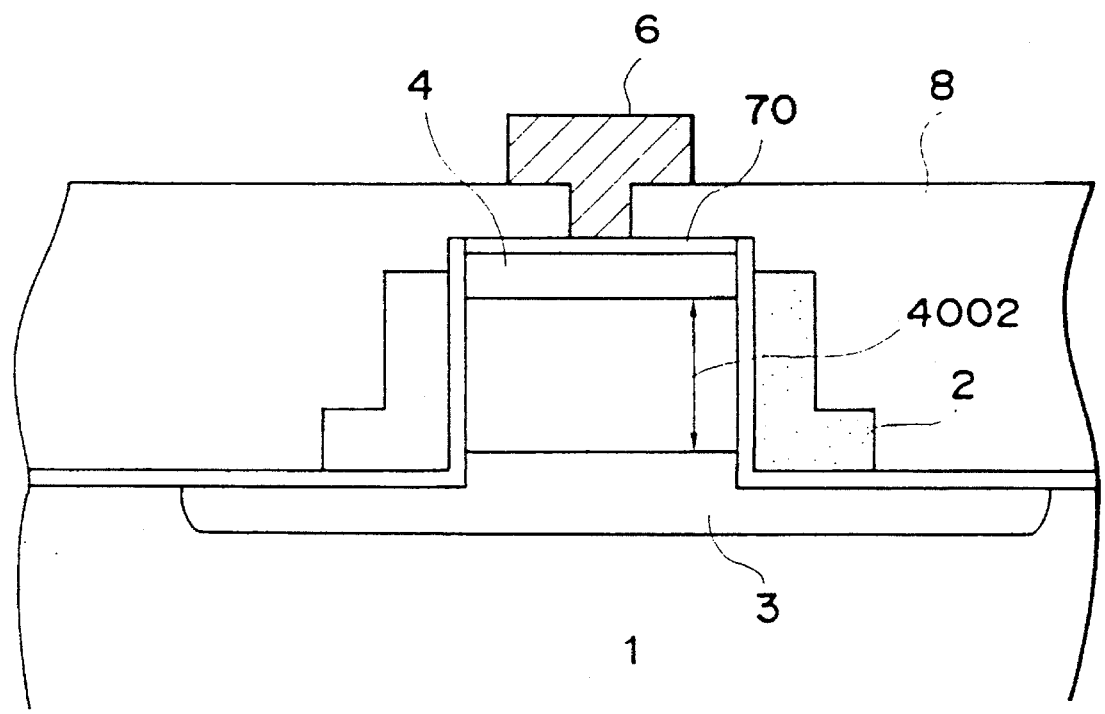
FIG. 3 is a schematic cross sectional view which illustrates a memory cell according to Embodiment 2(A) of the present invention.

FIG. 3 illustrates a memory cell according to Embodiment 2(A).

The difference from the structure shown in FIG. 1 lies in that the drain region 3 is formed to cover the overall lower surface of the column and thereby the channel region is narrowed. According to this structure, the controllability of the effective channel length 4002 of the SGT can be improved and the deterioration of the voltage resistance can be prevented. Furthermore, the generation-re-bonded current in the lower portion of the column can be completely prevented.

Embodiment 3(A)

Figure 4:
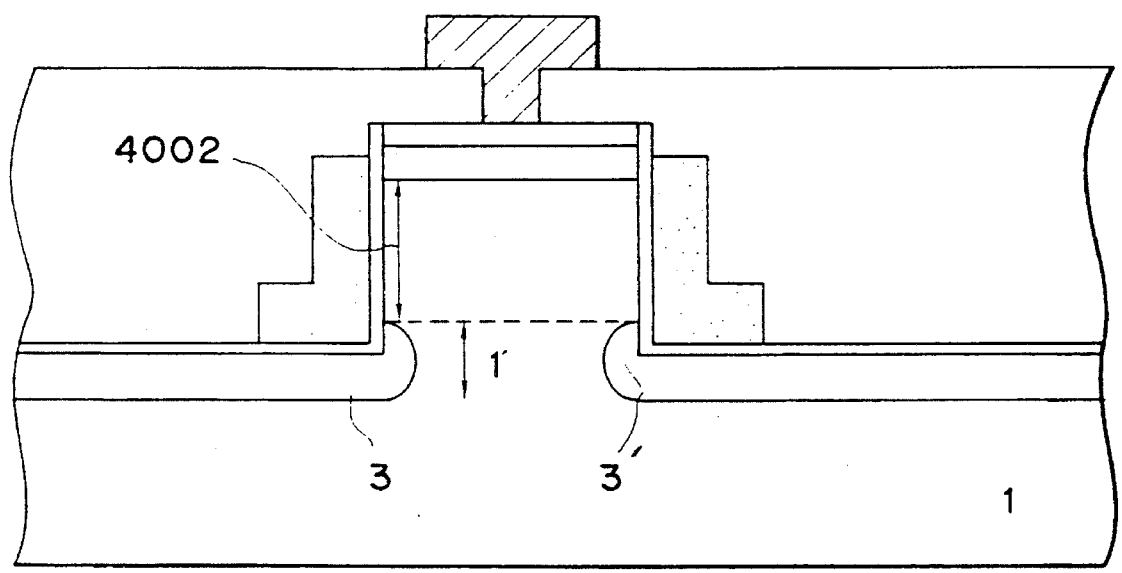
FIG. 4 is a schematic cross sectional view which illustrates a memory cell according to Embodiment 3(A) of the present invention.

FIG. 4 illustrates a memory cell according to Embodiment 3(A).

The difference from the structures shown in FIGS. 1 and 3 lies in that a portion 3' of the drain region is positioned in a portion of the column.

According to this structure, a cell exhibiting further improved OFF-characteristics can be obtained.

The reason for this lies in that the channel and the substrate 1 can be maintained at the same potential while interposing a region 1'.

Embodiment 4(A)

Figure 5:
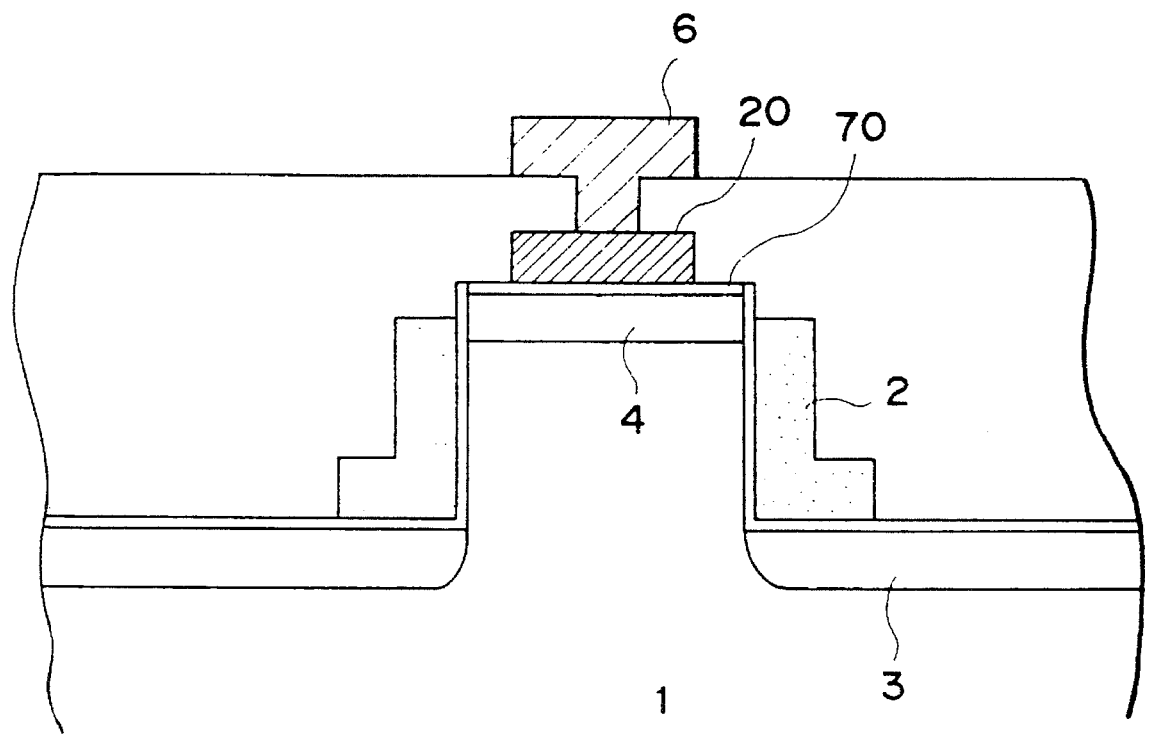
FIG. 5 is a schematic cross sectional view which illustrates a memory cell according to Embodiment 4(A) of the present invention.

FIG. 5 illustrates a memory cell according to Embodiment 4(A).

The difference from the structure shown in FIG. 1 lies in that a layer 20 is formed between the insulating film 70 and the electrode 6, the layer 20 being made of different material. The layer 20 is provided for the purpose of preventing the Al spike or the concentration of the electric fields due to generation of a transition region of W—Si, W—o and the like.

It is preferable that the layer 20 be made of material which is capable of excellent interfacial characteristics between the insulating film 70 and the electrode 6 and which has an etching rate different form that of SiO2. Specifically, it is exemplified by polysilicon and the like.

Embodiment 5(A)

Figure 6:
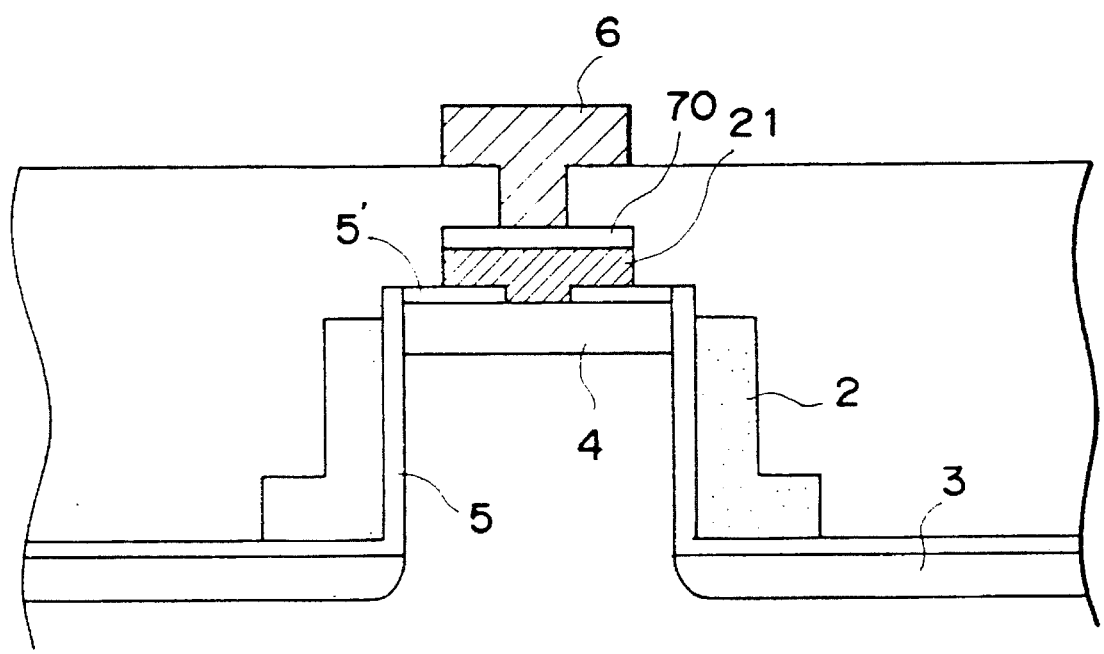
FIG. 6 is a schematic cross sectional view which illustrates a memory cell according to Embodiment 5(A) of the present invention.

FIG. 6 illustrates a memory cell according to Embodiment 5(A).

The difference from the structure shown in FIG. 5 lies in that the source region 4 is formed into an N-type semiconductor region of an order of $10^{19}$ or less, preferably of an order of $10^{16}$ to $10^{17}$. Furthermore, a layer 21 of the same conduction type as that of the source is formed on it while being communicated via an opening. In addition, the insulating film 70 is formed on the layer 21.

Since the film 70 is made of silicon oxide or silicon nitride prepared by the CVD method or the sputtering method and therefore the necessity of employing the thermal oxidation method can be eliminated, a problem of deterioration of the voltage resistance and that of the insulating characteristics due to dopant can be overcome.

Embodiment 6(A)

Figure 7:
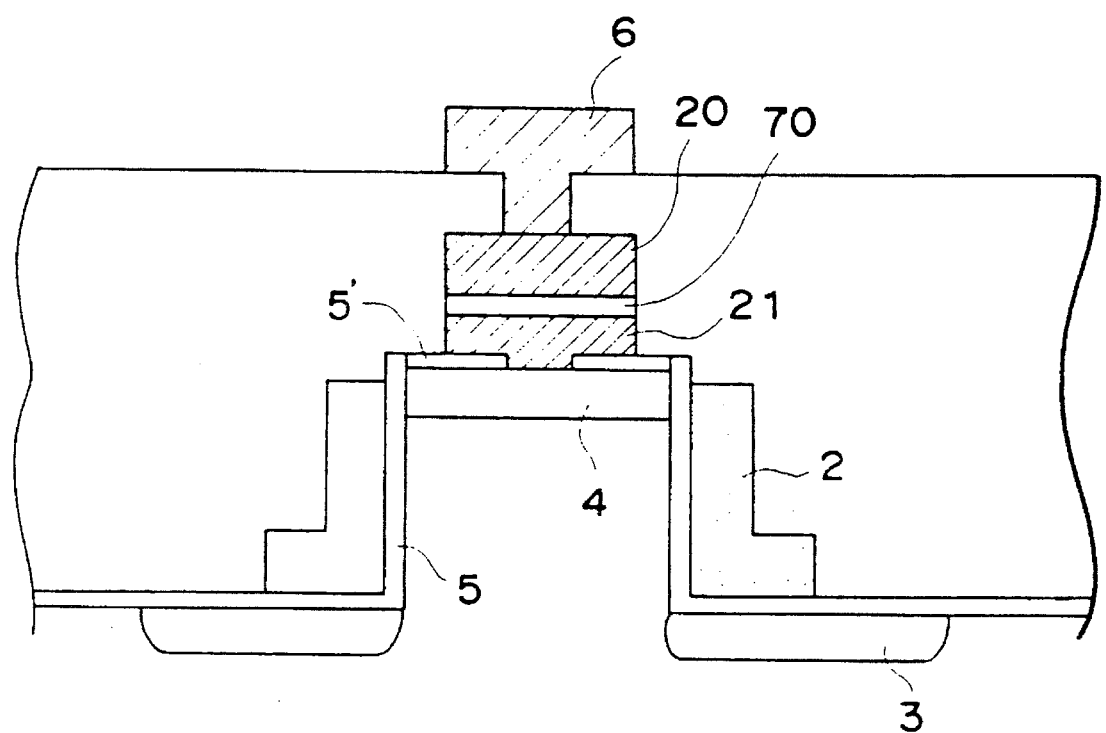
FIG. 7 is a schematic cross sectional view which illustrates a memory cell according to Embodiment 6(A) of the present invention.

A memory cell according to Embodiment 6(A) shown in FIG. 7 is constituted by forming the polysilicon layer 20 on the insulating film 70 according to the embodiment shown in FIG. 6.

According to aforesaid Embodiments 1(A) to 6(A), various problems can be overcome and high-performance and fine semiconductor memory can be realized.

By using the MOSFET to constitute the switching device in place of the bipolar transistor, the driving current required per memory cell can be significantly reduced and mounting density can be raised and the power consumption can be reduced.

By using the SGT to constitute the switching device, a further fined device can be formed and therefore a semiconductor memory having a larger size and high performance can be realized.

According to Embodiments 2(A) and 3(A), the high concentration source or drain region extends to the lower portion of the columnar semiconductor layer in the lower source and drain region of the SGT. Therefore, a problem of deterioration of reliability due to the generation-re-bonded current and the concentration of the electric field can be effectively overcome.

That is, since the lower drain region 3 can be determined due to the diffusion from the surface of the substrate prior to performing etching of the substrate, the accuracy of the channel length L can be significantly improved as compared with the conventional method in which the effective channel length (L) is determined by the bulk etching method. Furthermore, a finer MOSFET can be manufactured.

Dark currents are generated in the depletion layer formed between the drain and the gate mainly due to a defect in the lower portion of the channel and that at an end point of the drain region. However, since the aforesaid point is covered with the drain region according to the present invention, the concentration of the electric fields, deterioration of the voltage resistance and generation of the dark current can be prevented.

Furthermore, when the gate electrode is formed in a maskless manner by using a metal CVD exhibiting excellent coating feasibility, the electrode ejecting region can be formed by a selfalignment manner.

By using the memory cell having a transistor which can be easily fined arid which exhibits excellent current driving performance and by making the gate of this transistor to be the word line and by forming a semiconductor memory connected to the bit line on the source region of this transistor while interposing the insulating film between layers. As a result, a single-permanent-write enabled semiconductor memory exhibiting reduced error rate and having high density and high speed read/write characteristics can be realized.

(Embodiment 7)

Figure 8:
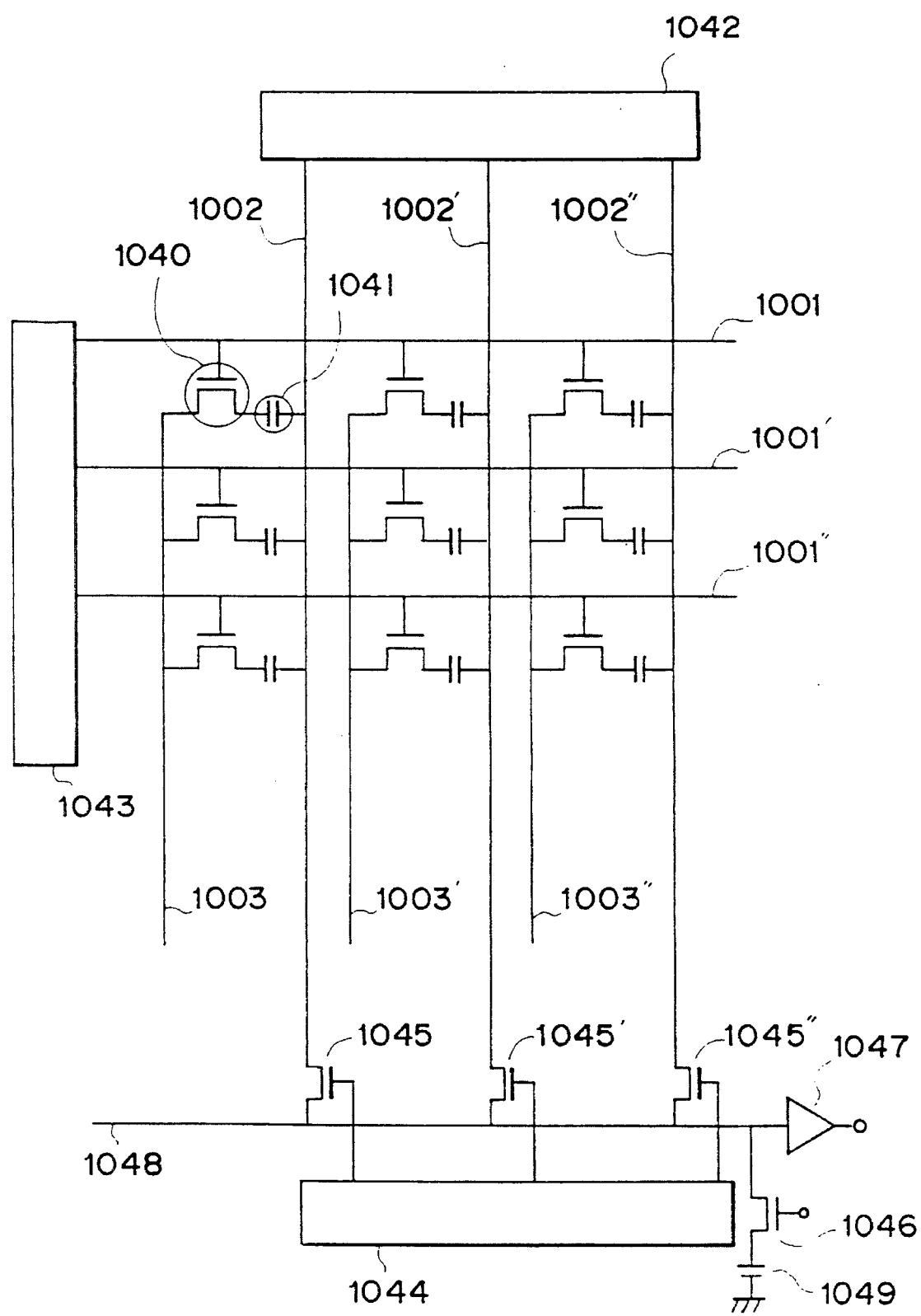
FIG. 8 is a circuit diagram which illustrates a semiconductor memory according to Embodiment 7(A) of the present invention.

FIG. 8 is a circuit diagram which illustrates a semiconductor memory having 3×3 cells. Aforementioned Embodiments 1 to 6 can be applied to these cells.

One cell has an addressing transistor 1040 and a memory element 1041. The memory element 1041 is a capacitor before the insulating film is broken and is not a capacitor after it has been broken because of a short circuit.

The transistor 1040 and the memory element 1041 can be constituted by the structures according to aforesaid Embodiments 1(A) to 6(A).

Reference numerals 1001, 1001' 1001" and 1001''' represent word lines connected to the gates of the FET.

Reference numerals 1002, 1002' and 10012" represent bit lines each connected to either side of the memory element.

Reference numerals 1003, 1003' and 1003" represent power-supply lines.

As the peripheral circuits of the memory, the following elements are provided: a bit line voltage setting circuit 1042, a word line voltage setting circuit 1043, a selection signal generating circuit 1044 for sequentially selecting the bit lines, bit line selection switches 1045, 1045' and 1045", a switch 1046 for resetting the bit line reading line 1048 and an amplifier 1047.

Figure 9:
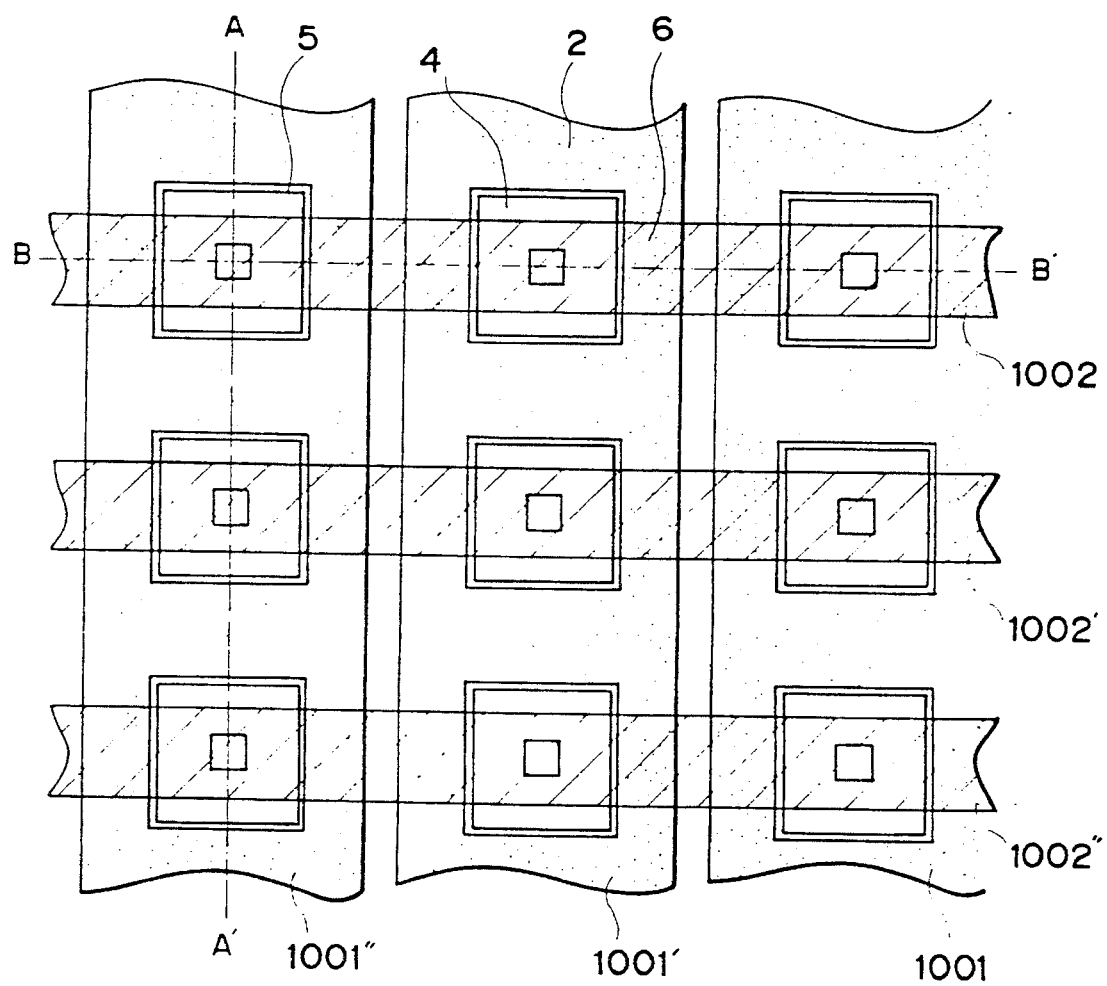
FIG. 9 is a schematic top view which illustrates a semiconductor memory according to Embodiment 7(A) of the present invention.

FIG. 9 is a schematic top view of the semiconductor memory shown in FIG. 8.

Three memory cells in one row constitute the word lines 1001, 1001' and 1001" since their gate electrodes 2 are connected by the same electrode layer.

Similarly, the three memory cells in one column constitute the bit lines 1002, 1002' and 1002" since the electrodes of their memory elements are connected by the same wiring layer.

Figure 10:
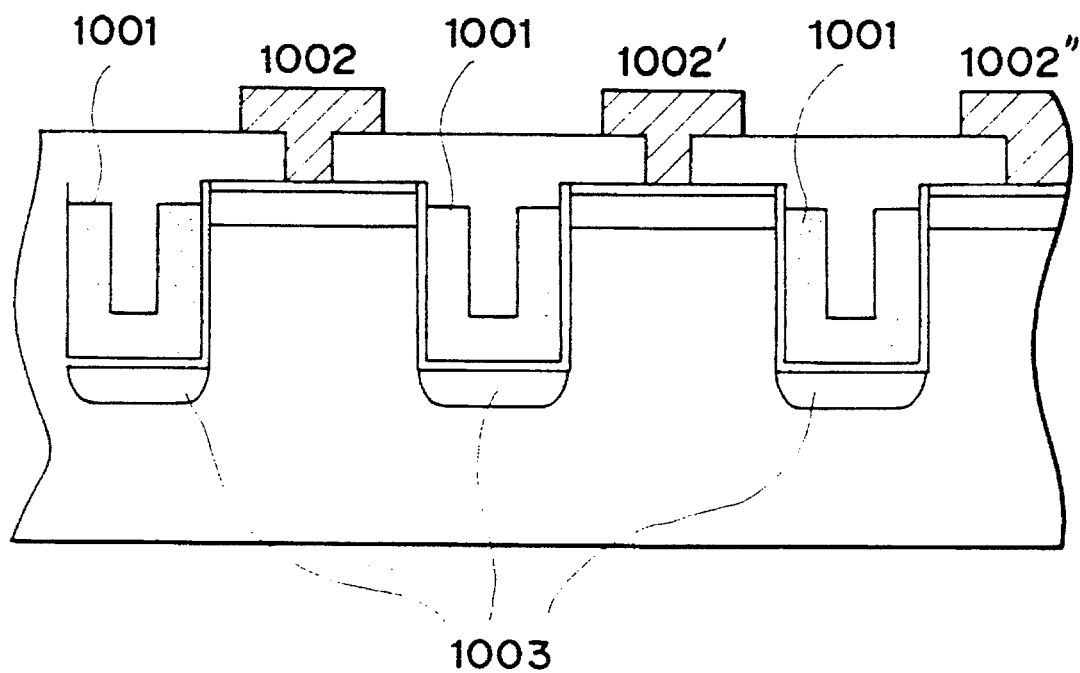
FIG. 10 is a cross sectional view taken along line AA' of FIG. 9.

FIG. 10 is a cross sectional view taken along line AA' of FIG. 9.

Figure 11:
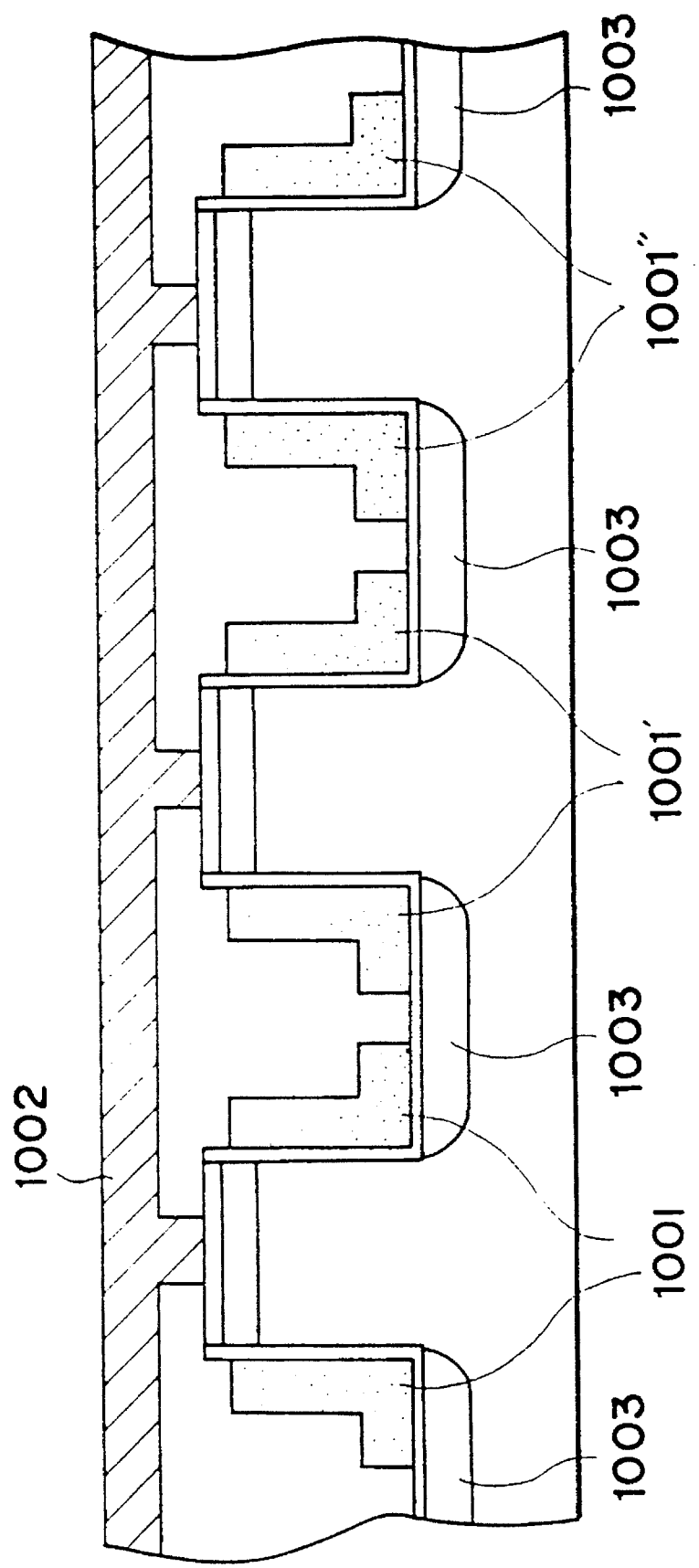
FIG. 11 is a cross sectional view taken along line BB' of FIG. 9.

FIG. 11 is a cross sectional view taken along line BB' of FIG. 9.

Then, the operation of the aforesaid semiconductor memory will now be described.

First, its writing operation will now be described, the writing operation including the following four main operations.

(1) Writing Operation 1: (precharge of bit lines)

The bet line is set to reference-voltage $V_{DD}$ by the voltage setting circuit 1042. As a result, the potential difference between the power supply line and the bit line is eliminated. Therefore, no potential is generated and no current passes between the source and the drain of the FET regardless of the level of voltage applied to the word line. As a result, the insulating film 1041 is not broken. The precharging voltage for the bit line may be the same level as that of the power supply voltage or may be different from the same. In this case, the structure must be arranged in such a manner that the conductive state is not realized due to the breakage of the insulation film region. The value of $V_{DD}$ may be about 1 to 5 V.

(2) Writing Operation 2: (discharge of word lines)

The voltage of all of the word lines is fixed to first ground level $V_{GND1}$, for example, 0 V. The aforesaid operation is performed in order to prevent mixture of a signal with the word line adjacent to the word line for performing the writing operation, the mixture being caused from crosstalk.

(3) Writing Operation 3 (selection of writing word line)

In a case where the present writing bit is a cell at the second row and second column when the top left cell shown in FIG. 8 is made to be the origin, the word line in which the writing bit exists becomes 1001' shown in FIG. 8. Therefore, the potential of this word line is made to be $V_G$ which holds the following relationship:

$$V_{GND1} < V_G V_{GB} \tag{2}$$

where $V_{GB}$ is gate insulating film breaking voltage.

(4) Writing Operation 4 (selection of bit line)

A bit line potential which corresponds to a writing cell present on a selected line is set to ground potential 1. Since all of the FETs of the selected line are brought to the actuated state, high voltage is applied to the insulating film by making the potential of the bit line to be the ground potential. Therefore, the insulating film is broken and therefore the conductive state is realized. It is preferable that the bit line selections be sequentially performed because an electric current passes between the bit line and the word line when the writing operation is completed. However, a plurality of bit lines may be simultaneously written.

Then, the reading operation will now be described, the reading operation including the following four main operations.

(1) Reading Operation 1 (precharge of bit lines)

It is performed similarly to the writing operation. The reason for this lies in that a problem taken place in that a blank bit is written due to the reading operation must be prevented. The voltage at this time may be a level similar to power supply voltage VDD.

(2) Reading Operation 2 (discharge of word line)

The voltage of all of the word lines is set to second ground level VGND2 which holds the following relationship with first ground level VGND1:

$$V_{GND1} < V_{GND2} \qquad (3)$$

(3) Reading Operation 3 (selection of line to be read)

The potential of the word line of the line to be read is fixed to range VG defined according to Equation (2). As a result, the FET on the aforesaid line is brought to an actuated state.

(4) Reading Operation 4 (resetting of bit line reading line)

The bit line reading line 1048 is reset by the switch 1046. The resetting potential is determined by the power source connected to the switch 1046, the potential being made to be VGND2. Then, the switch 1046 is switched off and the bit line reading line is brought into a floating state.

(5) Reading Operation 5 (selection of bit line)

The bit line sequential selection signal generating circuit 1044 is used to raise the level of the gate of the selection bit selection switch, the switch is switched on so as to be connected to the bit line reading line. In a case where the selection cell has not been written, the voltage of the reading line is converged to a value obtained from the following equation assuming that the capacity of the bit line is $C_{BIT}$ and the capacity of the reading line is $C_{OUT}$:

$$\frac{C_{BIT} \cdot V_{DD} + C_{OUT} \cdot V_{GND2}}{C_{BIT} + C_{OUT}}$$

In a case where the selection cell has been written and therefore the state in which the insulating film has ben brought into the conductive state, this reading line is connected to the power source VDD while interposing the transistor. Therefore, the voltage of the reading line is converged to VDD. The aforesaid difference is used to discriminate whether or not the written cell (bit) has been written. This voltage is detected by the amplifier 1047. As a result, the reading operation is performed. In the writing mode, the time required for the potential of the reading line to be converged to VDD determines the reading speed. The capacity of the bit line and that of the bit line reading line are in proportion to-the capacity of the memory. Therefore, a critical factor is the feasibility of driving the large capacity. The SGT fined satisfactorily and exhibiting excellent driving performance according to this embodiment, and in particular, the improved SGT structure will cause a significant effect to be obtained.

The reason why the two levels of the ground potentials are provided to perform the operation according to this embodiment lies in that the breakage of the insulating film must be prevented at the time of the reading operation. That is, the potential difference to be applied to the two end portions of the insulating film at the time of the reading operation is made to be smaller than the difference at the time of the writing operation.

(Manufacturing Method)

Then, a method of manufacturing the semiconductor memory according to Embodiment 7 shown in FIGS. 12 to 31 will now be described.

(Manufacturing Method 1)

First, an N-type silicon substrate NSUB having a specific resistance of 0.1 to 1 Ω·cm is subjected to a heat oxidation process, so that a heat oxidation film having a thickness of about 1,000 to 10,000 Å is formed.

Then, the oxide film formed on a portion on which the NMOS is formed is removed by etching and an oxide film having a thickness of about 100 to 500 Å is again formed by the heat oxidation (patterning process for P-well). While using the oxide film having the thickness of 1,000 to 10,000 Å as a mask, a P-type impurity such as $BF^{+2}$ is ion-injected into a region in which the NMOS will be formed. It is preferable that the concentration of the impurity be 1E13 to 14 cm$^{-2}$. Then, heat treatment at about 1,000° to 1,100° C. is performed, resulting in a P-well PWL having a diffusion depth of about 1.0 to 1.5 μm to be formed.

The oxide film is fully peeled off by using an HF type solution, and a heat oxide film 51 having a thickness of 100 to 500 Å is formed. Then, a low pressure chemical vapor deposition (LP-CVD) method is used to form an Si3N4 film 52 having a thickness of about 500 to 2,000 Å. Then, the element portion is formed by performing patterning in such a manner that the Si3N4 film and the SiO2 film are removed by etching (a process of patterning for the active region). Then, the resist film is peeled off, and then the Si substrate is subjected to etching while using the Si3N4 film 52 as the mask. The cross sectional shape of the Si substrate is changed by the etching gas and the pressure and the like. In order to make the shape perpendicular, a low pressure method is effective in general. However, it is in a trade-off relation with the selection ratio or the like. As the etching gas, a Cl2 type gas is used and etching is performed under a pressure of about 1 Pa, so that a rectangular groove is formed.

Figure 12:
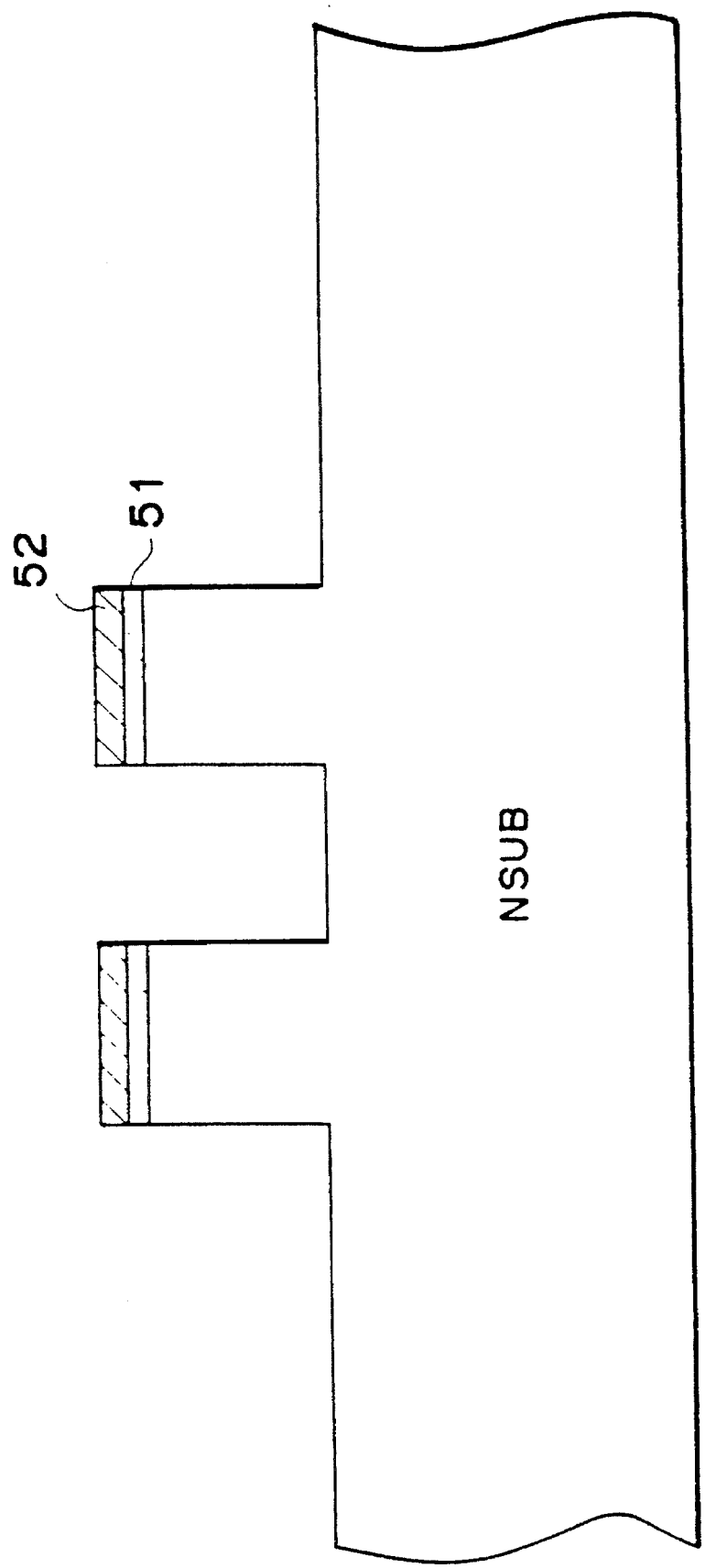
FIG. 12 is a schematic view which illustrates a process of manufacturing a semiconductor memory according to the present invention.
Figure 13:
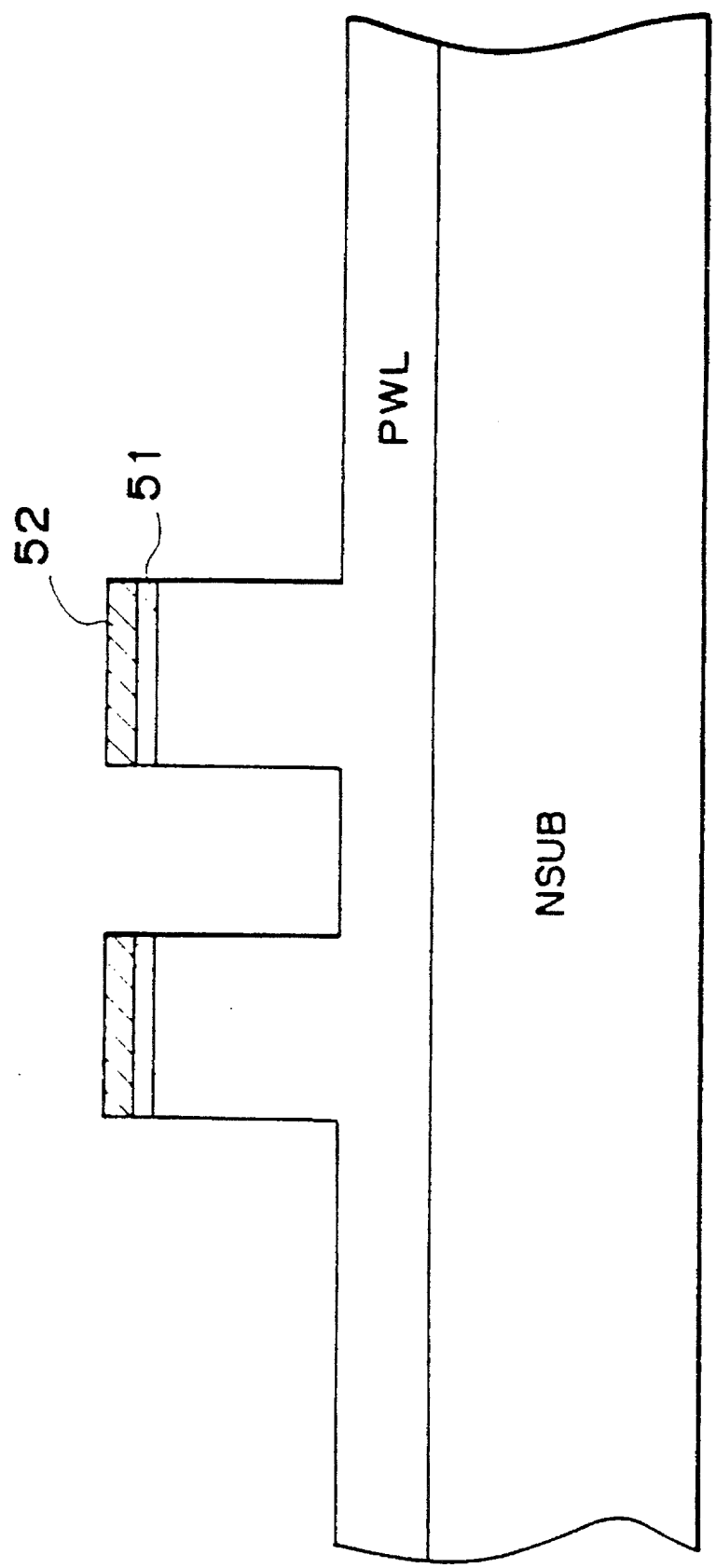
FIG. 13 is a schematic view which illustrates a process of manufacturing a semiconductor memory according to the present invention.
Figure 14:
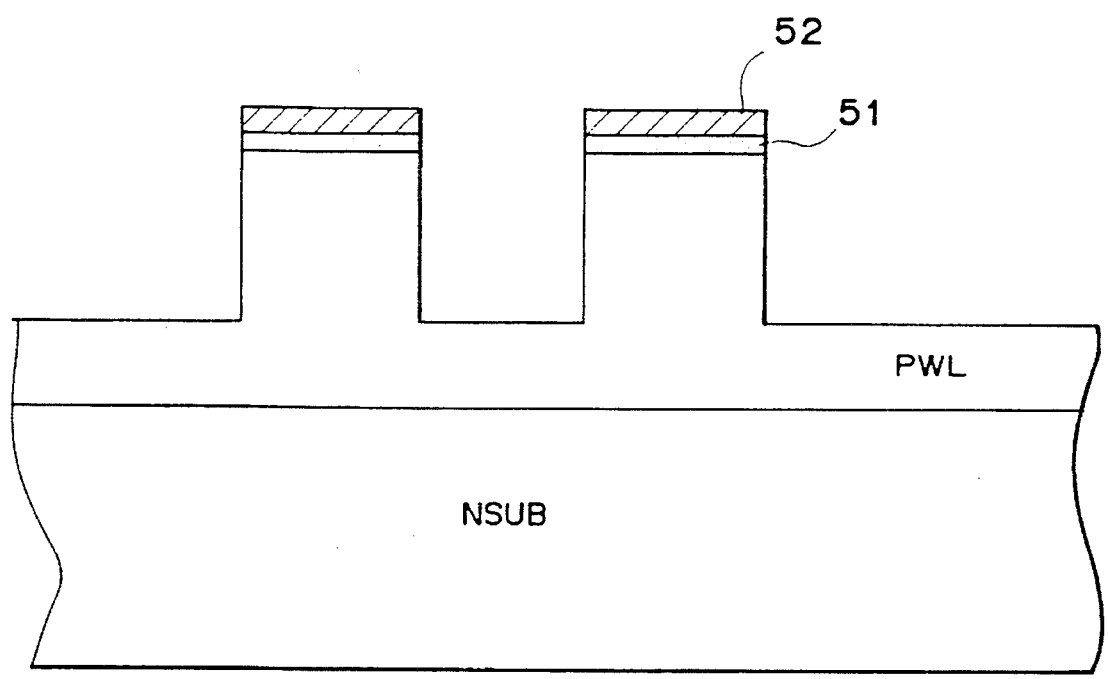
FIG. 14 is a schematic view which illustrates a process of manufacturing a semiconductor memory according to the present invention.

The state of the substrate thus formed is shown in FIGS. 12, 13 and 14. Then, the wafer is cleaned with an NH3OH type solution, and a heat oxide film having a thickness of 300 Å or less is formed. This oxide film is again peeled off by an HF type solution. Then, a heat oxide film 53 having a thickness of 50 to 300 Å is again formed, and then an Si3N4 film 54 having a thickness of 500 Å or less is formed by the LP-CVD method. The Si3N4 film 54 is etched back, so that only the Si3N4 film formed in the groove portion is removed. It it preferable that the Si3N4 film be left for the S/D contact portion, the etching back be performed by using a parallel and plate type etching device and a CF4 type gas be used under pressure of a level of 1.8 Pa or lower. Then, a resist pattern is used, so that $CF^{+2}$ type and P-type high impurity concentration region (element separated region) 55 is formed. It is preferable that the impurity concentration be made about 1E14 to 1E15 cm$^{-2}$. Then, the heat oxidation film is formed in only the groove portion.

Figure 15:
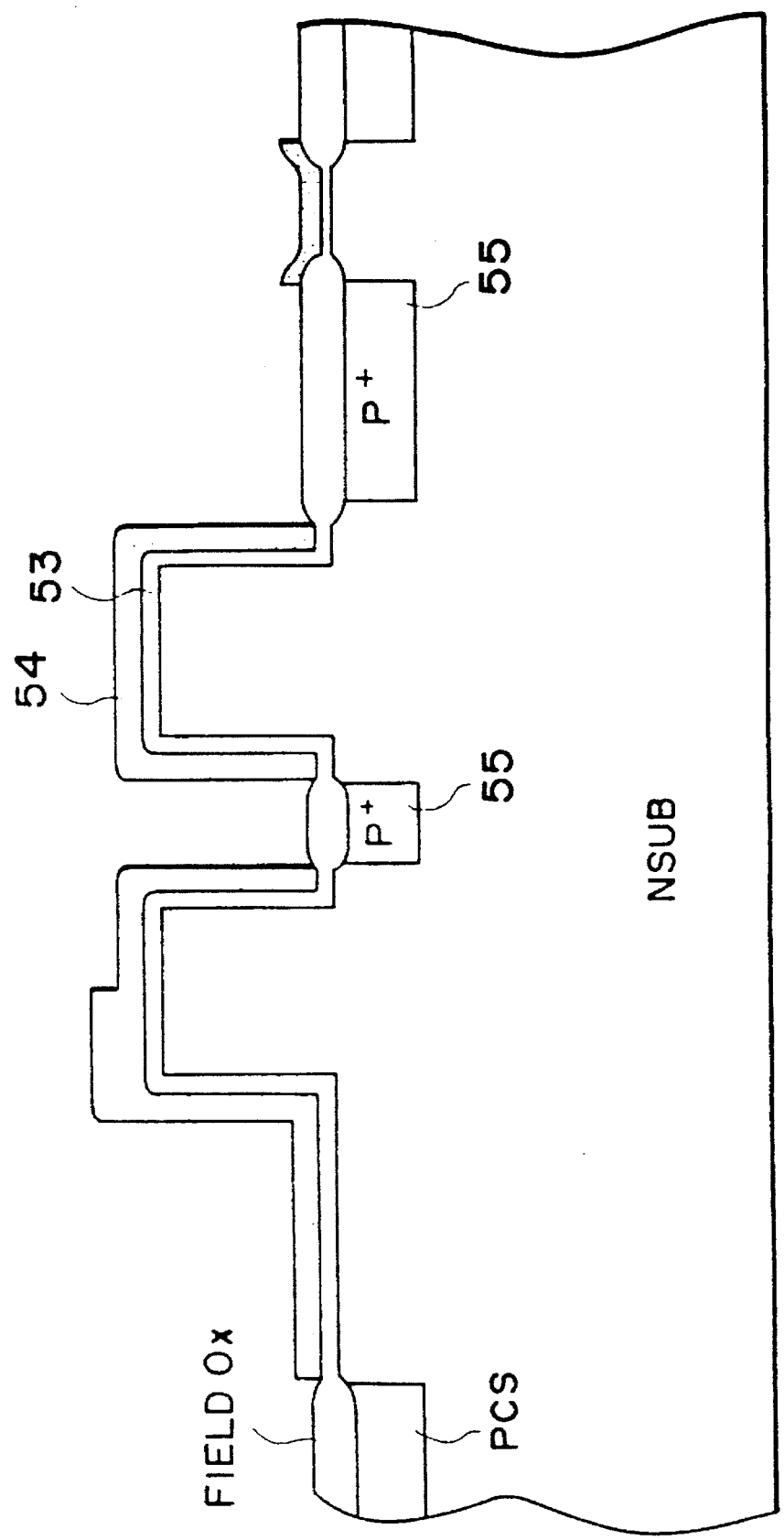
FIG. 15 is a schematic view which illustrates a process of manufacturing a semiconductor memory according to the present invention.
Figure 16:
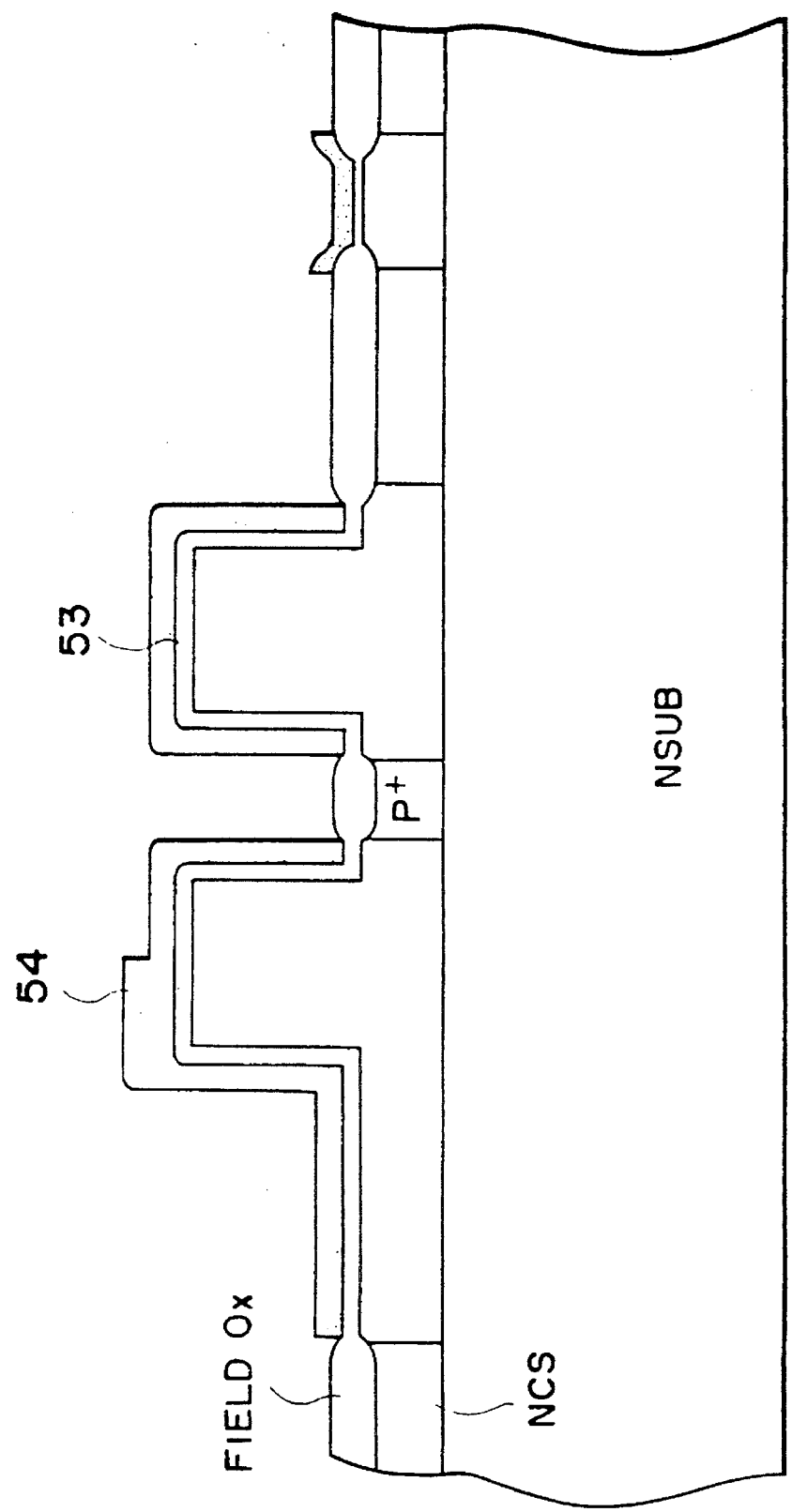
FIG. 16 is a schematic view which illustrates a process of manufacturing a semiconductor memory according to the present invention.
Figure 17:
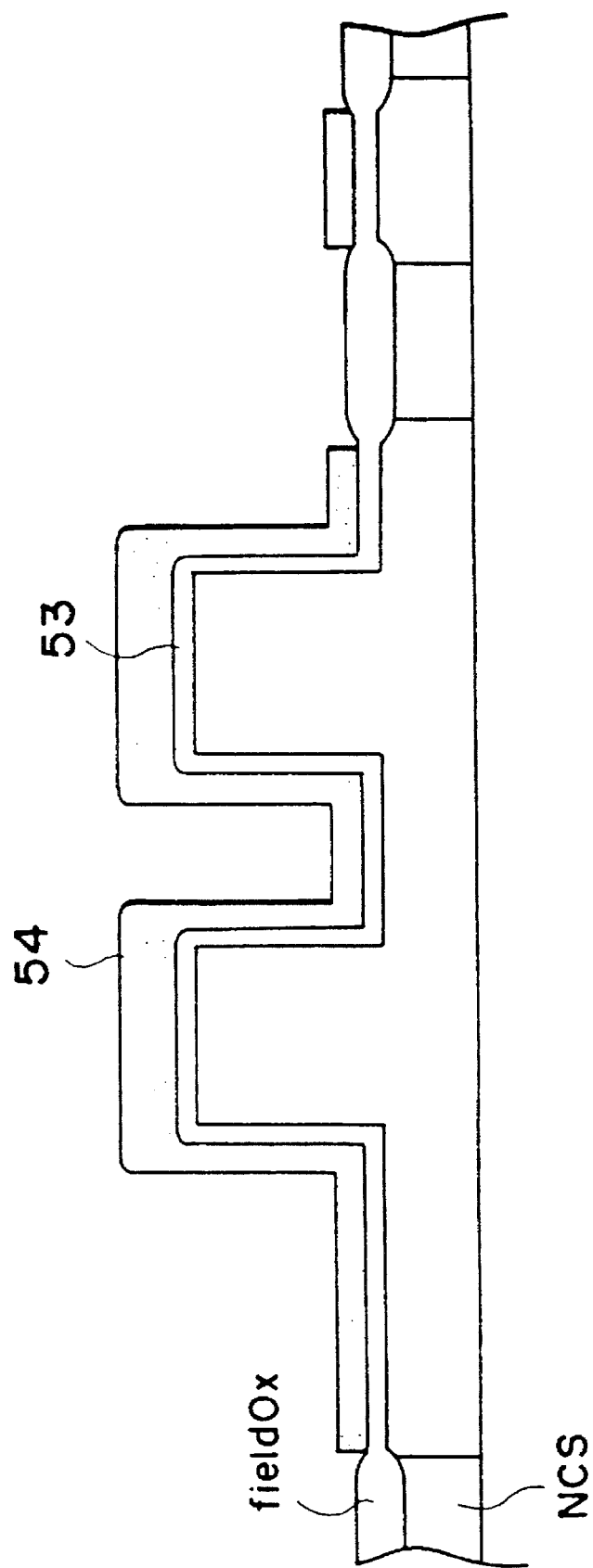
FIG. 17 is a schematic view which illustrates a process of manufacturing a semiconductor memory according to the present invention.

The state of the substrate realized by the aforesaid process is shown in FIGS. 15, 16 and 17.

Then, by using an HF type solution to perform etching slightly, and an H3PO5 type solution is used to peel off the Si3N4 film. Then, only the oxide film-formed below the $Si_3N_4$ film is etched by using the HF type solution, and a gate oxide film 56 having a thickness of 100 Å or less is formed. Then, a polycrystal silicon is deposited by the LP-CVD method. Then, by etching it, the polycrystal silicon 57 can be left on only the side wall. Then, resist patterning is performed in accordance with the NMOS or PMOS to be formed, so that an N-type polysilicon gate electrode 57 is formed in a case of the NMOS or a P-type polysilicon gate electrode 59 is formed in a case of the PMOS simultaneously with forming of the source and drain NSD or PSD.

Then, a selection CVD method is used to form a low resistance material 58 on only the gate electrodes 57 and 59.

Figure 18:
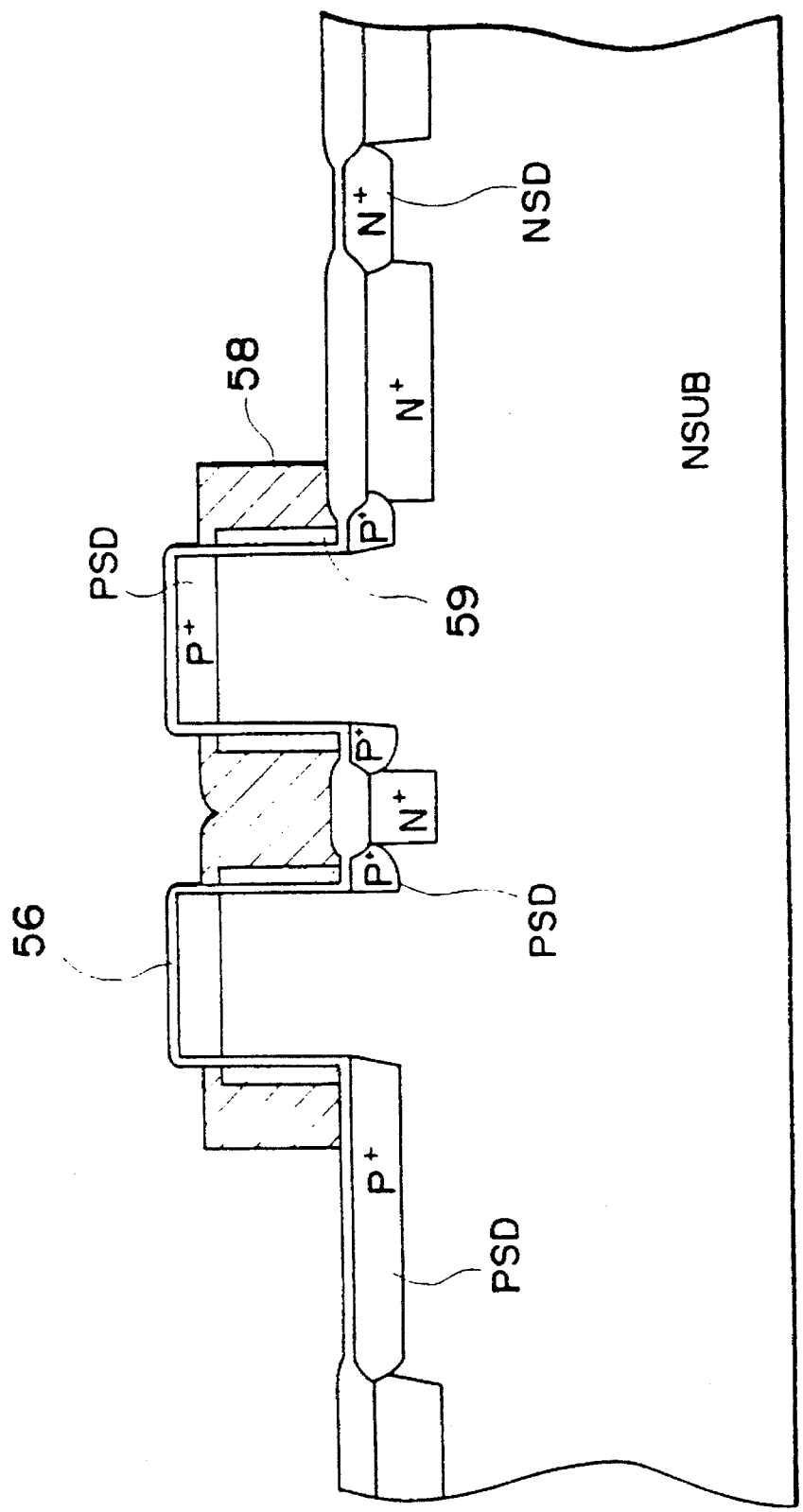
FIG. 18 is a schematic view which illustrates a process of manufacturing a semiconductor memory according to the present invention.
Figure 19:
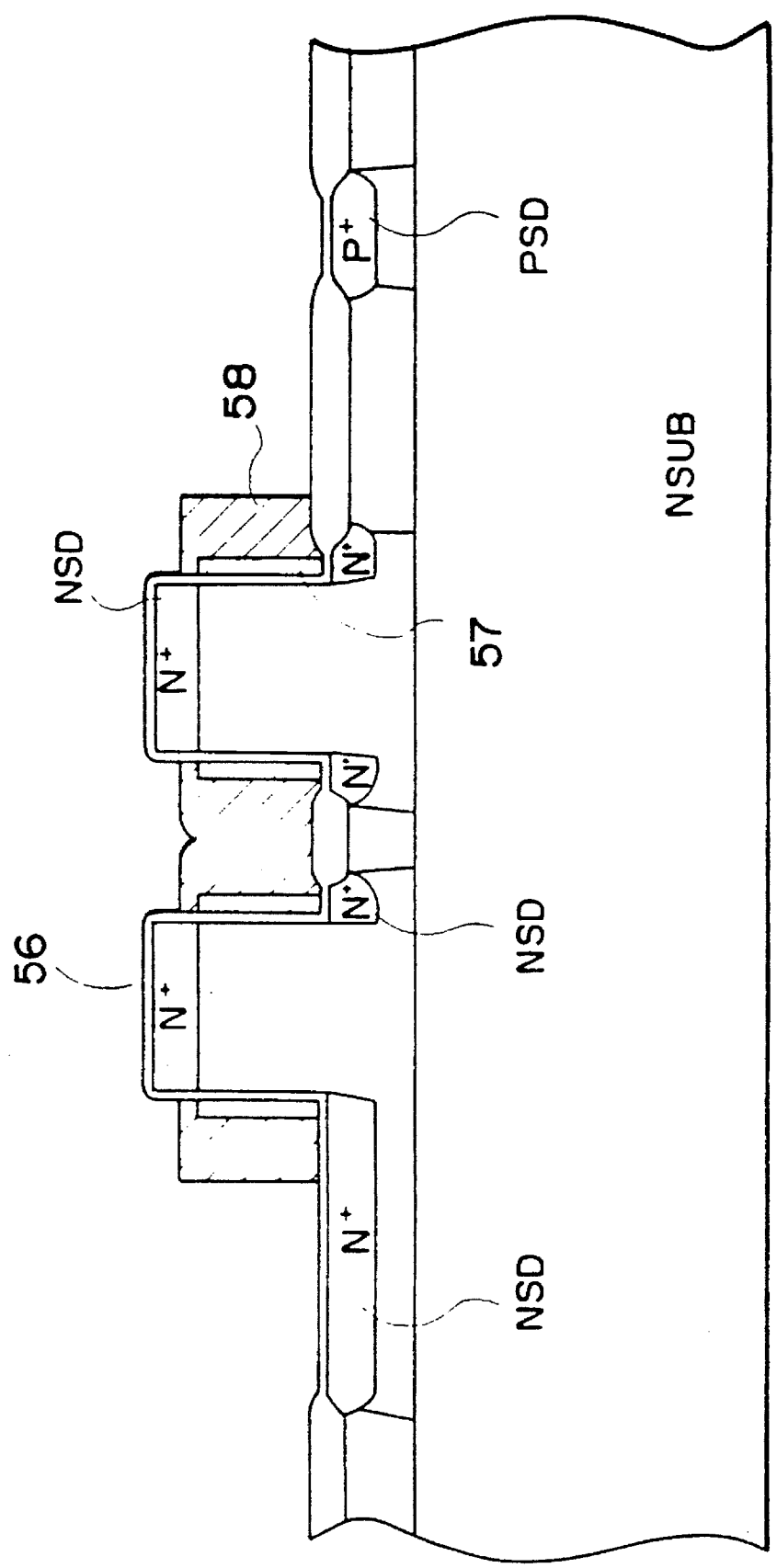
FIG. 19 is a schematic view which illustrates a process of manufacturing a semiconductor memory according to the present invention.
Figure 20:
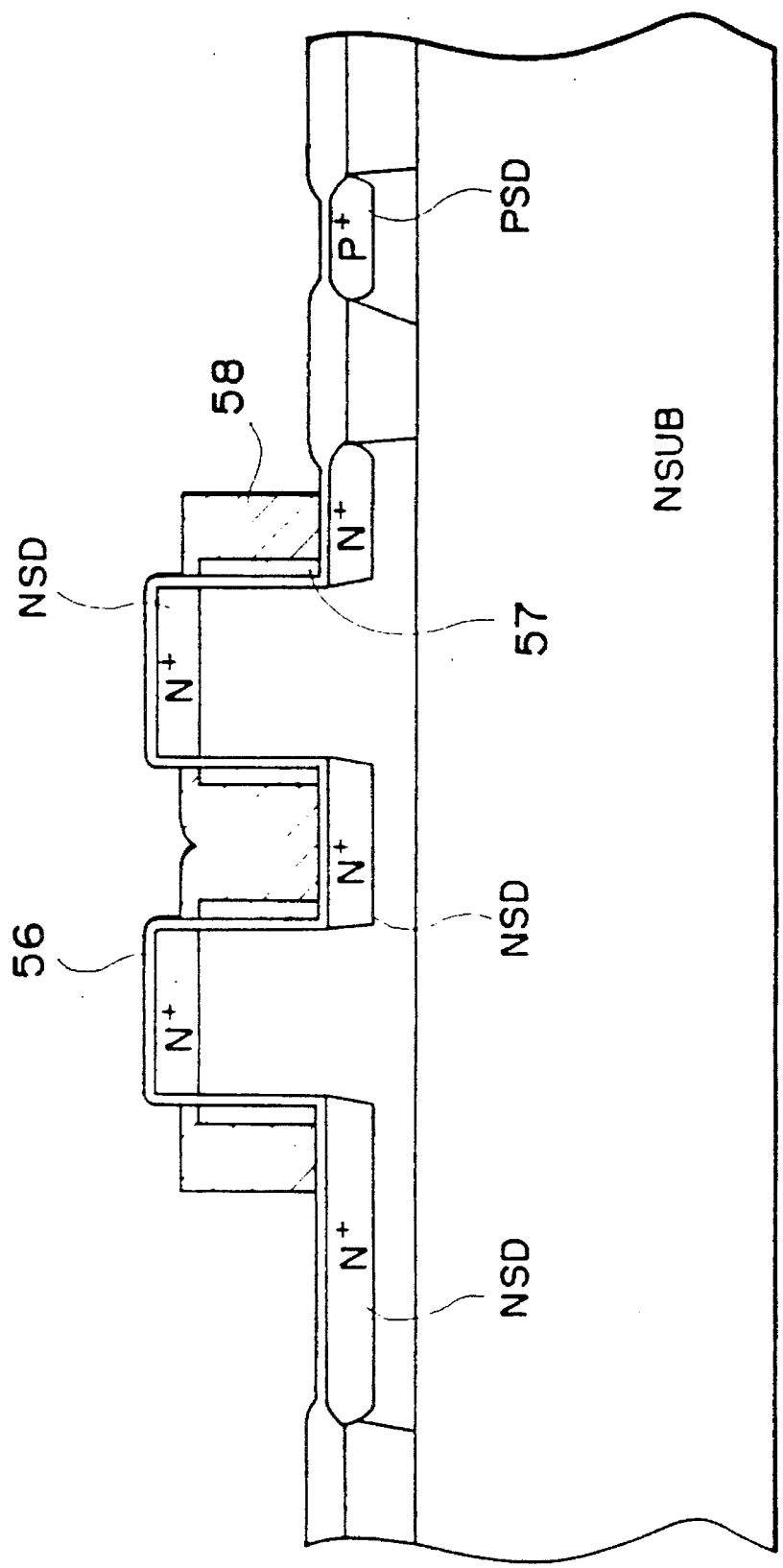
FIG. 20 is a schematic view which illustrates a process of manufacturing a semiconductor memory according to the present invention.

The method of forming the gate electrode is an essential portion of this embodiment and is arranged in such a manner that etching back (entire-surface etching) is performed while omitting patterning of the gate electrode. As a result, the resistance can be reduced, the NMOS and the PMOS can be individually formed, the work function for the gate electrode can be selected, and the wiring of the circuit for the gate can be completed by the selfalignment manner as shown in FIGS. 18, 19 and 20.

Then, a heat oxide film having a thickness of 500 Å or less is formed, and then oxide silicon serving as an insulating film 60 between layers is deposited by a CVD method such as TEOS exhibiting excellent coating feasibility.

Figure 21:
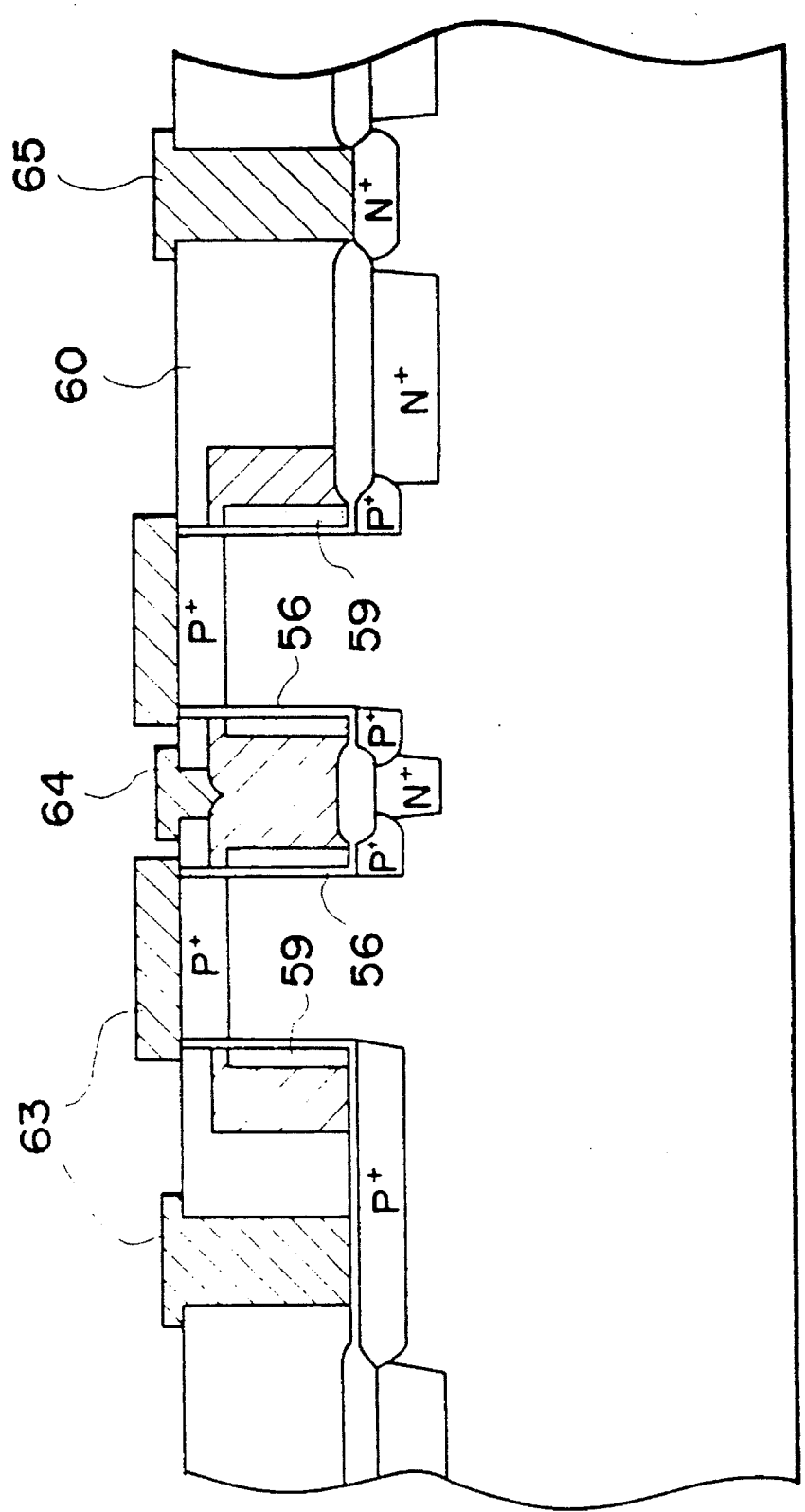
FIG. 21 is a schematic view which illustrates a process of manufacturing a semiconductor memory according to the present invention.
Figure 22:
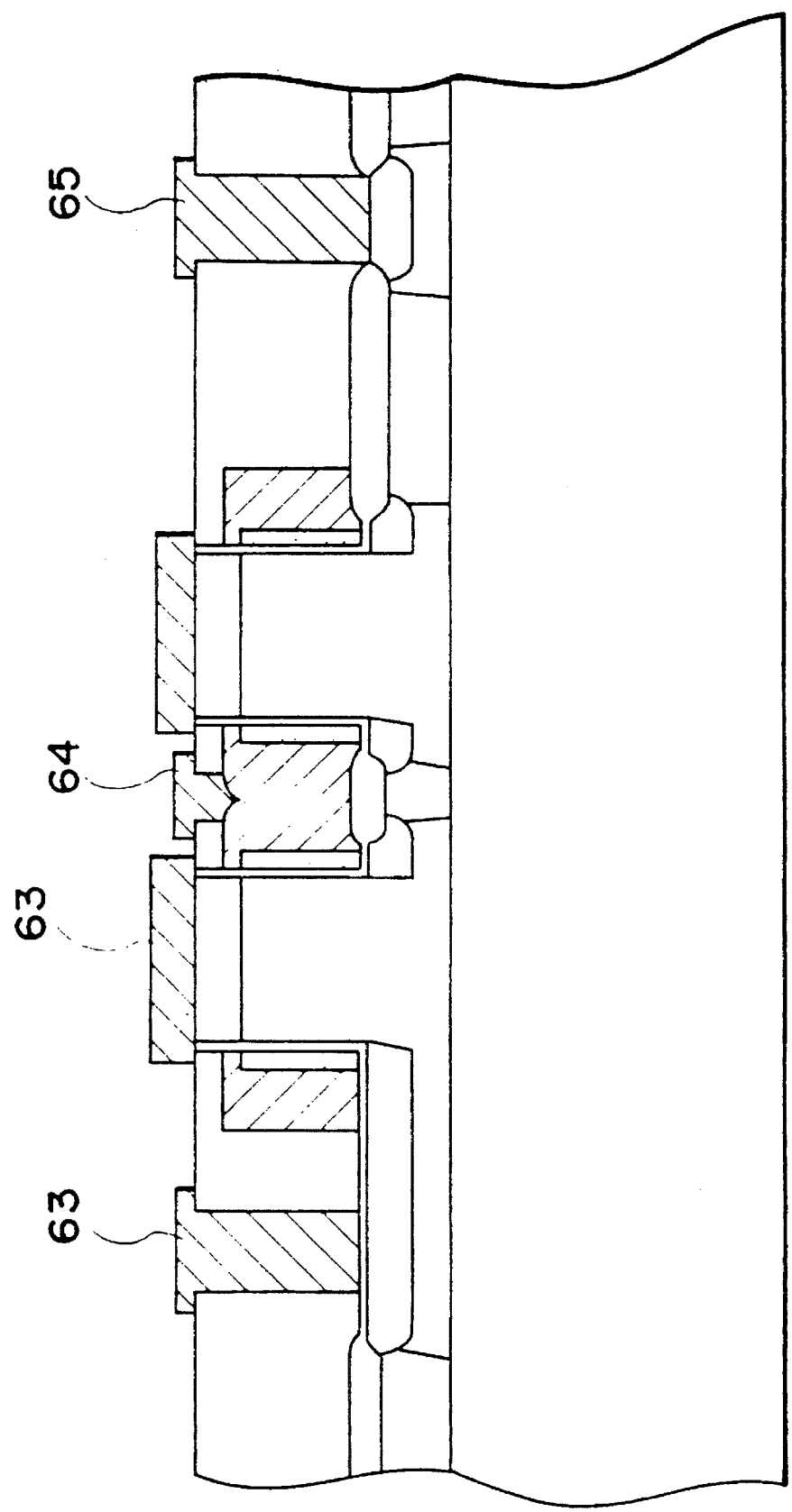
FIG. 22 is a schematic view which illustrates a process of manufacturing a semiconductor memory according to the present invention.
Figure 23:
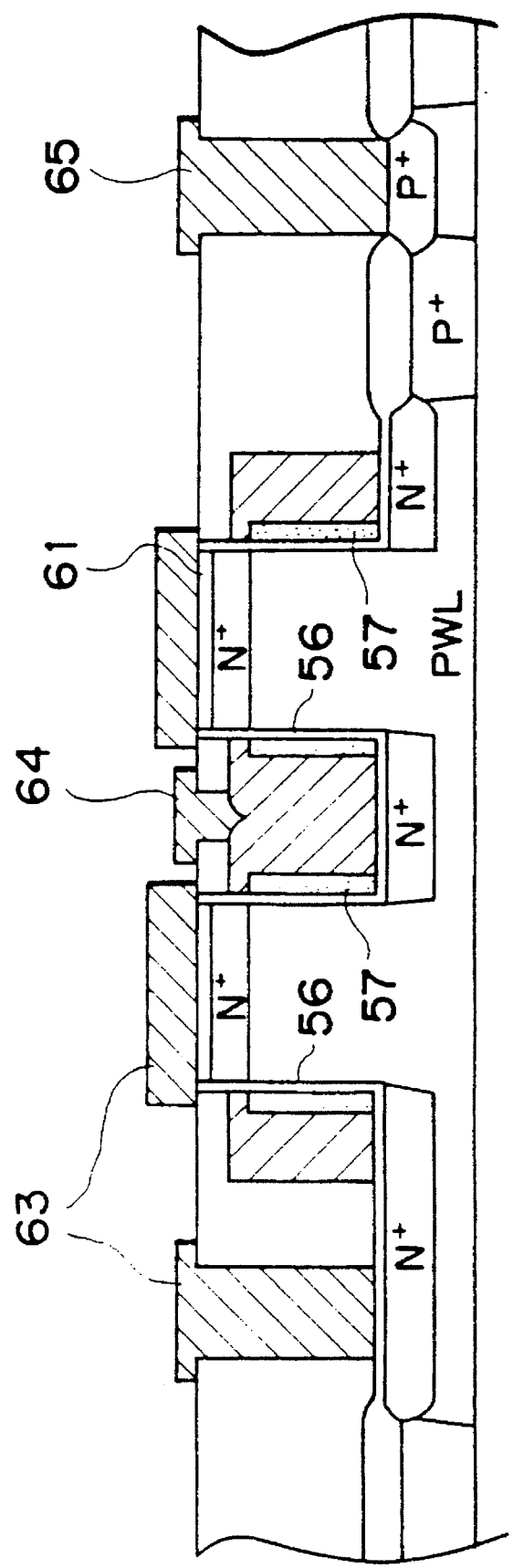
FIG. 23 is a schematic view which illustrates a process of manufacturing a semiconductor memory according to the present invention.

Then, the oxide silicon is etched back, so that the top surface of the columnar semiconductor layer, that is, the source and drain region in the upper portion is caused to appear outside. Then, a storage insulating film 61 for constituting a memory element is formed on the source and drain region NSD of the FET serving as the memory cell. As the insulating film 61, oxide silicon formed by oxidizing the top surface of the region NSD is exemplified. As an alternative to this, an insulating film made of aluminum oxide, tantalum oxide, or silicon nitride, or the like may be employed. The material and the thickness of the layer are determined so as to be broken with the operating voltage (breakage voltage). Then, a contact hole in the upper source and drain of the NMOS and PMOS is formed. Then, a contact hole for ejecting the gate electrode for the NMOS and PMOS and that for substrate electrode is formed and the conductor is deposited. By patterning this according to a desired wiring shape, a source and drain electrode 64, a gate electrode 64 and a well electrode 65 are formed as shown in FIGS. 21, 22 and 23.

As described above, the CMOS type semiconductor memory can be manufactured.

(Manufacturing Method 2)

A method of manufacturing a semiconductor memory having a memory cell structure according to Embodiment 2 will now be briefly described with reference to FIGS. 24 to 31. Description will be made here to a process until which the columnar semiconductor layer is formed. The processes corresponding to FIGS. 18, 19, 20, 21, 22 and 33 are arranged to be the same as those according to the manufacturing process according to the aforesaid embodiment.

First, an N-type monocrystal silicon substrate NSUB having a specific resistance of 0.1 to 1 Ω·cm is subjected to a heat oxidation process, so that a heat oxidation film having a thickness of about 1,000 to 10,000 Å is formed.

Then, the oxide film formed on a portion on which the NMOS will be formed is removed by etching and an oxide film having a thickness of about 100 to 500 Å is again formed (patterning process for P-well). While using the oxide film having the thickness of 1,000 to 10,000 Å as a mask, a P-type impurity such as $BF^{+2}$ is ion-injected, and then, heat treatment at about 1,000° to 1,100° C. is performed, resulting in a P-well PWL having a depth of about 2.0 to 3.0 μm to be formed.

Then, a heat oxide film 71 having a thickness of about 100 to 500 Å is formed, and an Si3N4 film 72 having a thickness of about 500 to 2000 Å is formed by the LP-CVD method.

Figure 24:
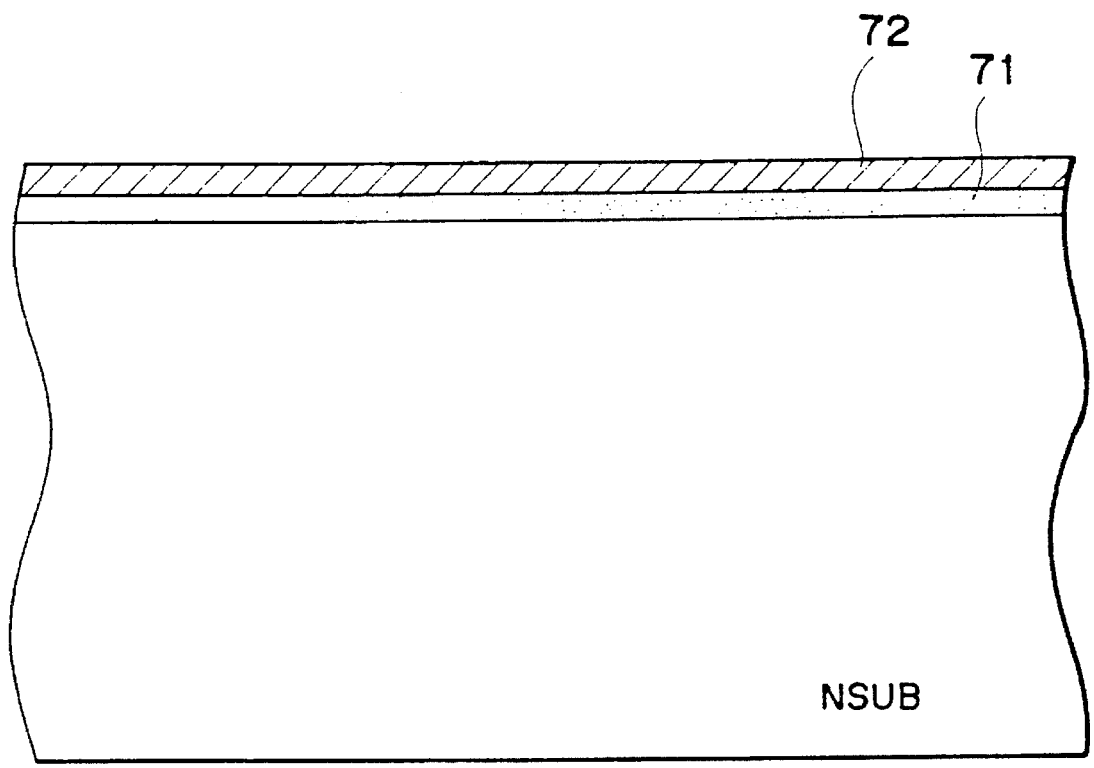
FIG. 24 is a schematic view which illustrates a process of manufacturing a semiconductor memory according to the present invention.
Figure 25:
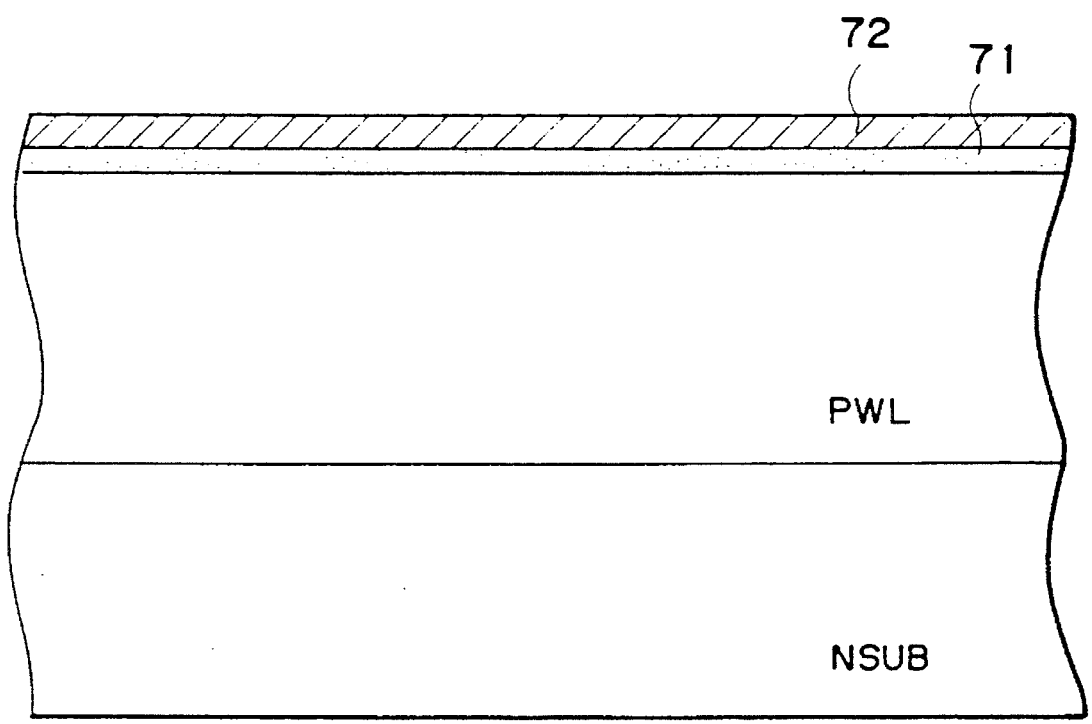
FIG. 25 is a schematic view which illustrates a process of manufacturing a semiconductor memory according to the present invention.

The aforesaid processes are shown in FIGS. 24 and 25. These processes are the same as those of the manufacturing method according to the aforesaid embodiment. However, the following processes are different from them.

A region in which the NMOS will be formed is subjected to a high-energy $p^+$ ion injection operation with a voltage level of 300 KeV to 1 MeV by using a resist mask RM. As a result, the range (RP) becomes about 1 to 2 μm and thereby a drain region 73 according to this embodiment is formed as an embedded layer of an $N^+$ type semiconductor displaying a dose quantity of $10^{14}$ to $10^{15}$ cm$^{-2}$. On the aforesaid portion, the P-type region which becomes the channel portion of the NMOSSGT is left (see FIG. 27).

Figure 26:
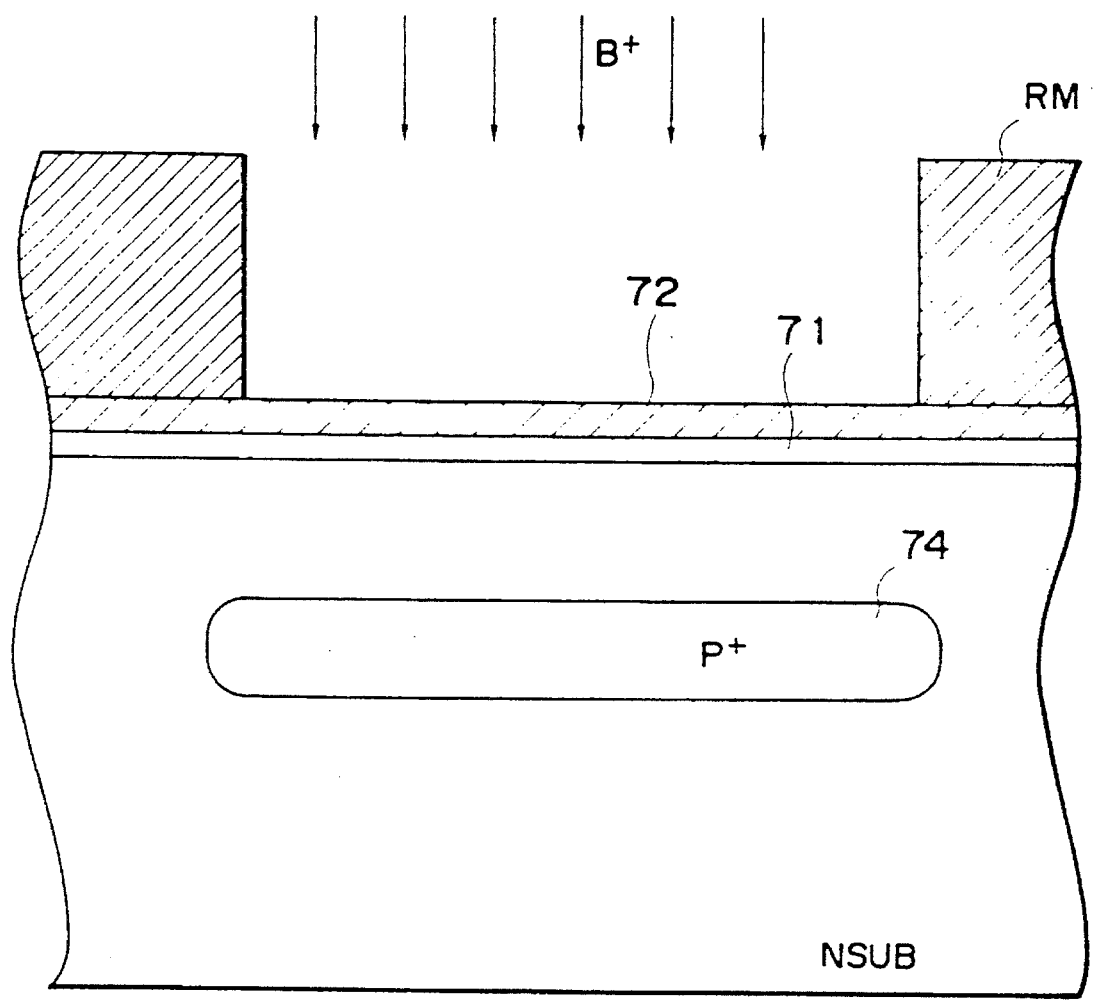
FIG. 26 is a schematic view which illustrates a process of manufacturing a semiconductor memory according to the present invention.

Similarly, the PMOSSGT is formed by injecting B ion while giving high energy into the substrate NSUB, so that an embedded layer 74 made of $p^+$ type semiconductor is formed (see FIG. 26).

Then, patterning for forming the SGT portion is performed, so that Si3N4 and SiO2 are removed by etching (a process of patterning for the active region). Then, the resist film is peeled off, and then the Si substrate is subjected to etching while using the Si3N4 film 72 as the mask. According to the aforesaid embodiment, the depth of the etched portion becomes substantially the same as the gate length of the SGT. Therefore, a severe accuracy is required in this process. However, according to this embodiment, the gate length is determined since the embedded layer is formed. Therefore, by stopping etching in the aforesaid embedded layer, the gate length can be equalized satisfactorily.

Figure 28:
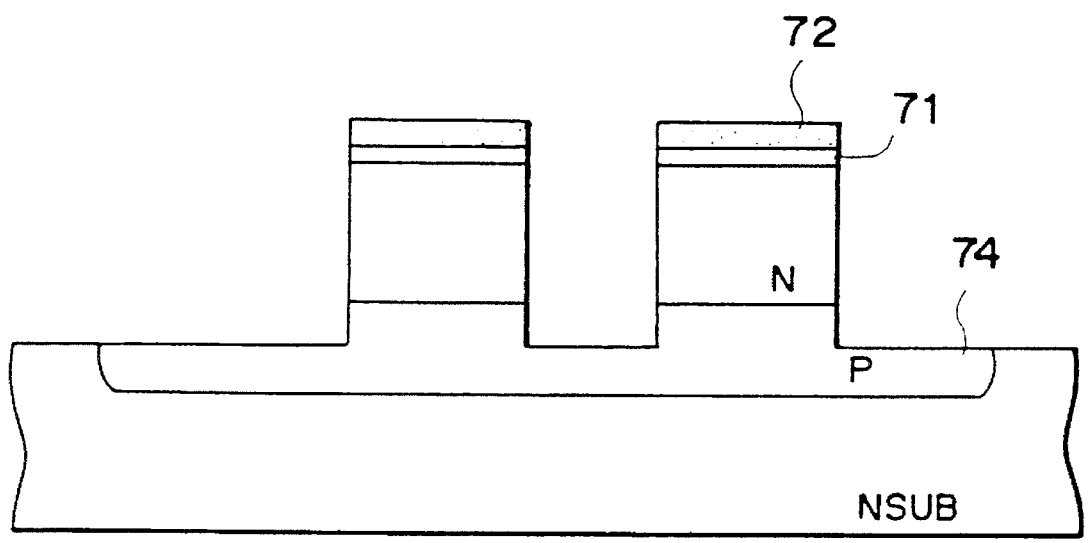
FIG. 28 is a schematic view which illustrates a process of manufacturing a semiconductor memory according to the present invention.
Figure 29:
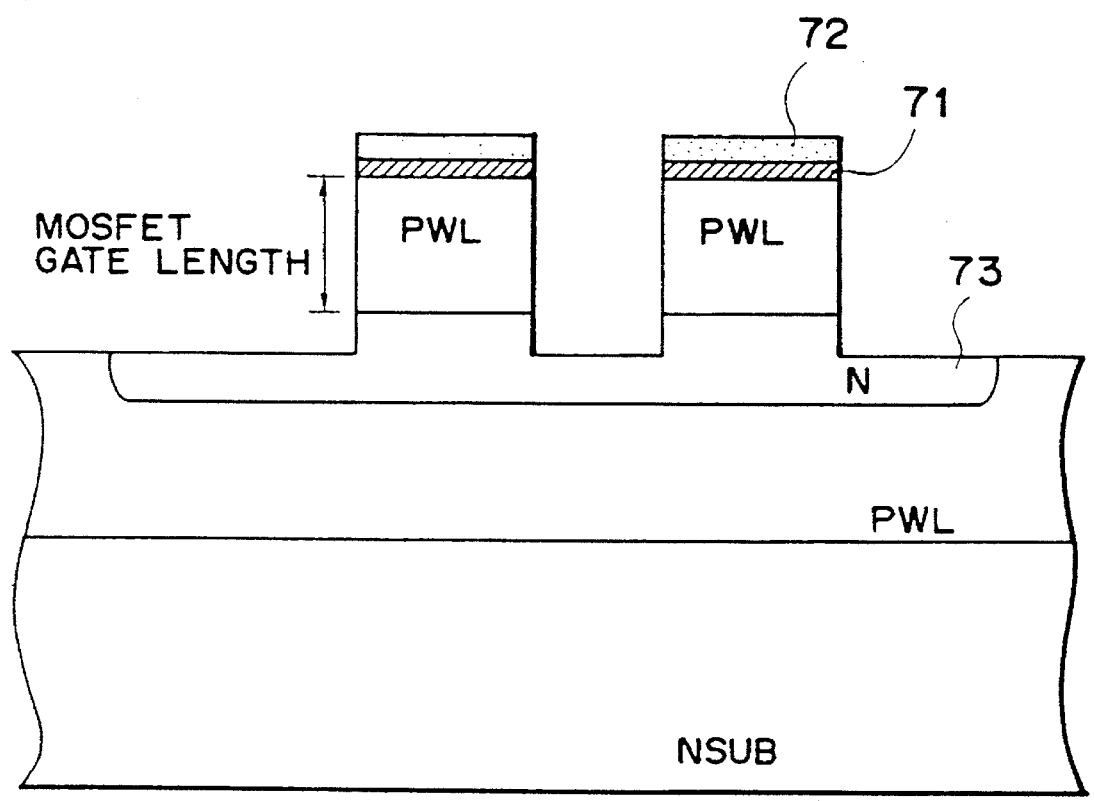
FIG. 29 is a schematic view which illustrates a process of manufacturing a semiconductor memory according to the present invention.

The aforesaid processes are shown in FIGS. 28 and 29.

Similarly to the aforesaid embodiment, a gate insulating film 80 is then formed, and channel stops 75 and 76 for insulating the element and the field insulating film are formed by the selective oxidation method while using a silicon nitride film 81 as a mask.

Figure 30:
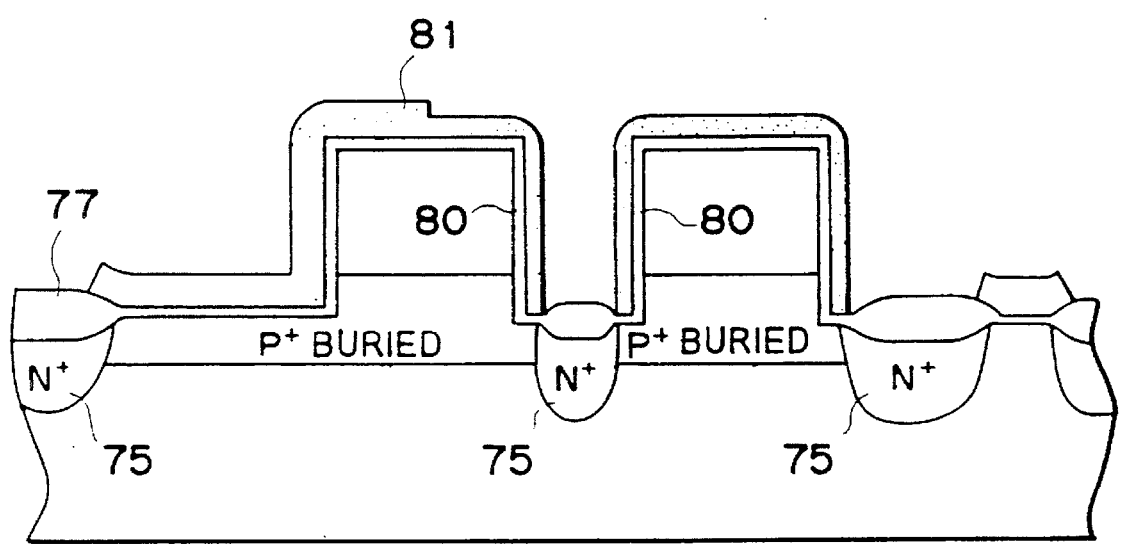
FIG. 30 is a schematic view which illustrates a process of manufacturing a semiconductor memory according to the present invention.
Figure 31:
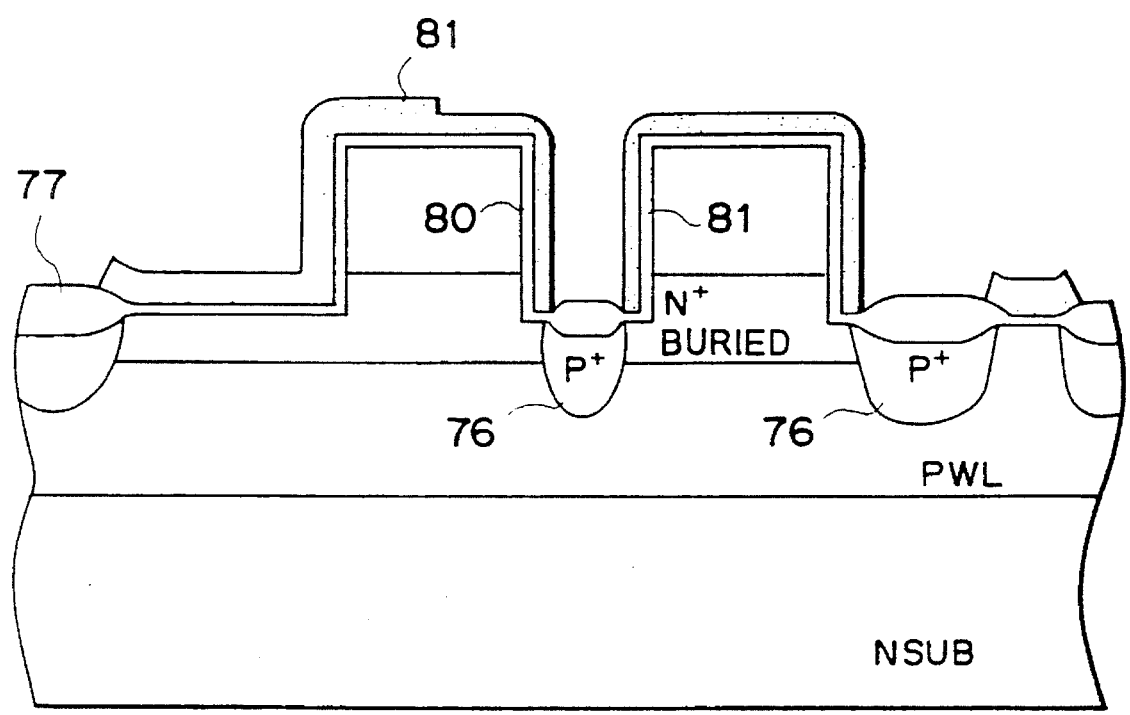
FIG. 31 is a schematic view which illustrates a process of manufacturing a semiconductor memory according to the present invention.

The aforesaid processes are shown in FIGS. 30 and 31.

The present invention is not limited to the aforesaid various embodiments. The present invention includes various combinations and modifications by substituting each technical elements hereinafter.

Then, another embodiment will now be described in which a transistor which can be easily fined and which exhibits excellent current driving performance is used as the memory cell transistor and by making the gate of this transistor to be the word line, a memory connected to the bit line is formed on the source region of this transistor while interposing an pn junction. As a result, a single-permanent-write enabled memory exhibiting reduced error rate and having high density and high speed read/write characteristics can be realized.

The PN-junction breakage type memory according to this embodiment stores information as follows:

In a case where writing is performed. a signal capable of performing the breakage is applied to the word line and the bit line, so that the PN junction is broken by forming, for example, eutectic alloy of Al and Si for use to form the electrode to cause short circuit to be realized.

A bipolar transistor used as the addressing transistor in order to achieve this will cause a problem in that a large size memory cannot be constituted because each memory cell requires a too large driving current and a problem of heat or the like arises. However, according to this embodiment, the SGT is used as the addressing transistor and memory elements made of semiconductor layers are layered on the transistor. Therefore, the convention problem can be overcome.

Embodiment 8(A)

Figure 32:
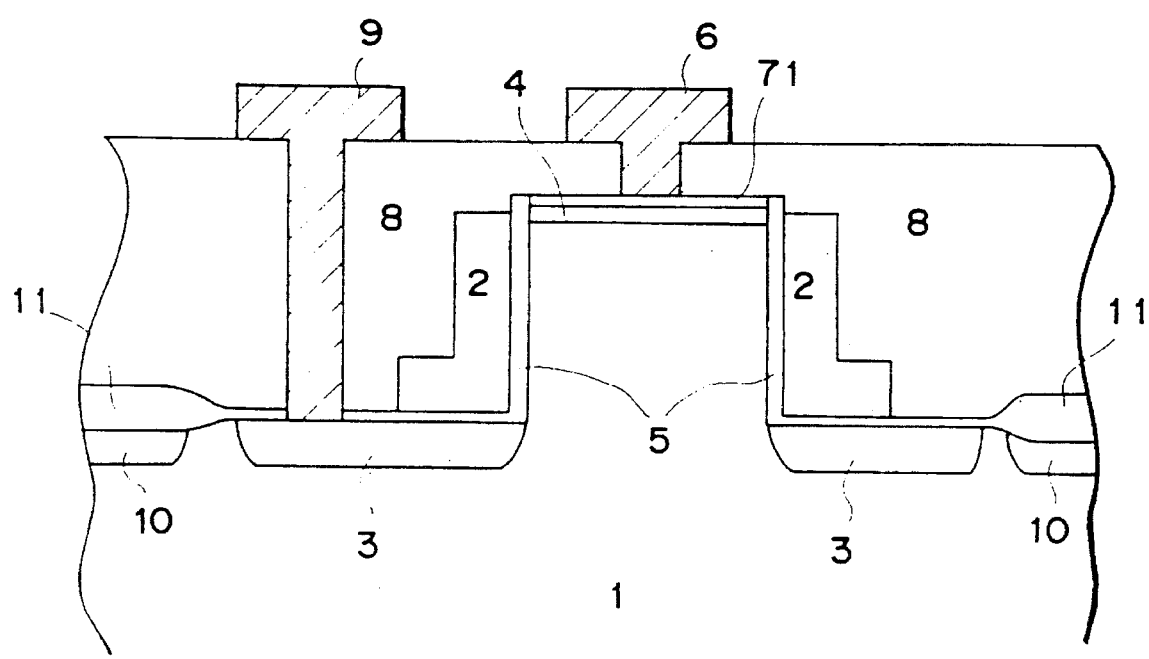
FIG. 32 is a schematic cross sectional view which illustrates a memory cell according to Embodiment 8A of the present invention.
Figure 33:
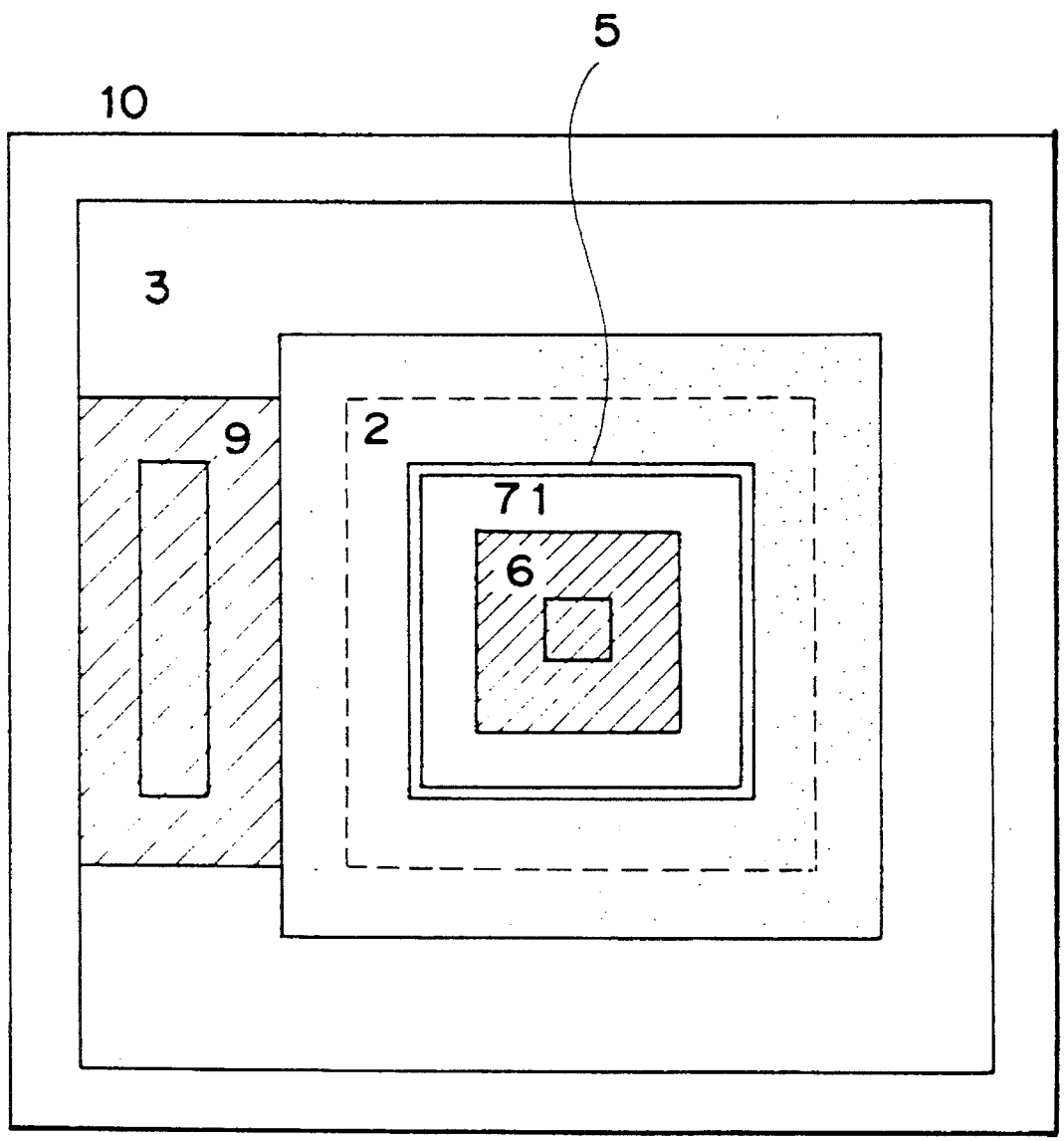
FIG. 33 is a schematic top view which illustrates a memory cell according to Embodiment 8A of the present invention.

FIG. 32 illustrates Embodiment 8(A) of the present invention. Referring to FIG. 32, reference numeral 1 represents a P- or N-type semiconductor substrate, 2 represents a gate electrode for an MOSFET and made of polysilicon or metal such as Al, Mo, or W or the like. Reference numerals 3 and 4 represent N or P high-concentration layer serving as the source and drain region. Reference numeral 5 represents a gate oxide film and 6 represents an ejecting electrode of an anode (71) for a zener diode to be connected to the source side. Reference numeral 8 represents an insulating film between layers and 9 represents a drain electrode made of metal such as Al, W, or Mo, or the like. Reference numeral 10 represents an element separating diffusion layer formed into the same shape as that of the substrate and displaying high concentration. FIG. 33 is a plan view when FIG. 32 is viewed from an upper portion.

Embodiment 9(A)

Figure 34:
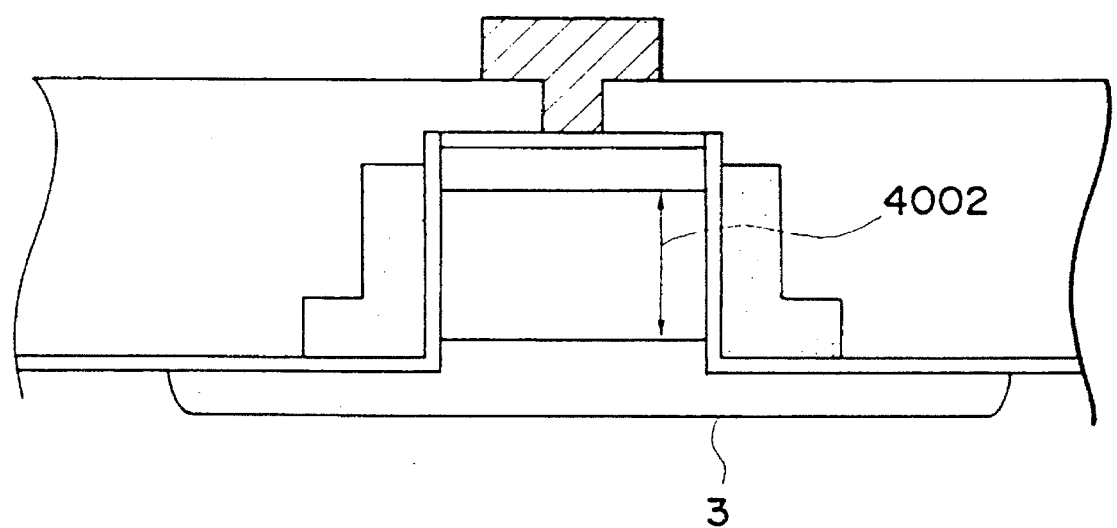
FIG. 34 is a schematic cross sectional view which illustrates a memory cell according to Embodiment 9A of the present invention.

FIG. 34 illustrates Embodiment 9(A) of the present invention. An object of this embodiment is to improve the controllability of L of the SGT and to prevent deterioration of the voltage resistance of the lower portion. Since a flat layer of $P/N^+/P$ or $N/p^+/N$ is formed prior to bulk-etching the substrate 1, the thickness of upper P or N layer serving as the effective channel 4002 is controlled by diffusion. Furthermore, bulk etching is stopped in the aforesaid $N^+$ or $p^+$ layer, so that scattering of L generated due to unsatisfactory accuracy at the time of etching the gate material and to the unsatisfactory accuracy of Si etching can be prevented. Furthermore, the generation-rebonded current in the lower portion 4001 due to a defect of the depletion layer or the like can be prevented.

Embodiment 10(A)

Figure 35:
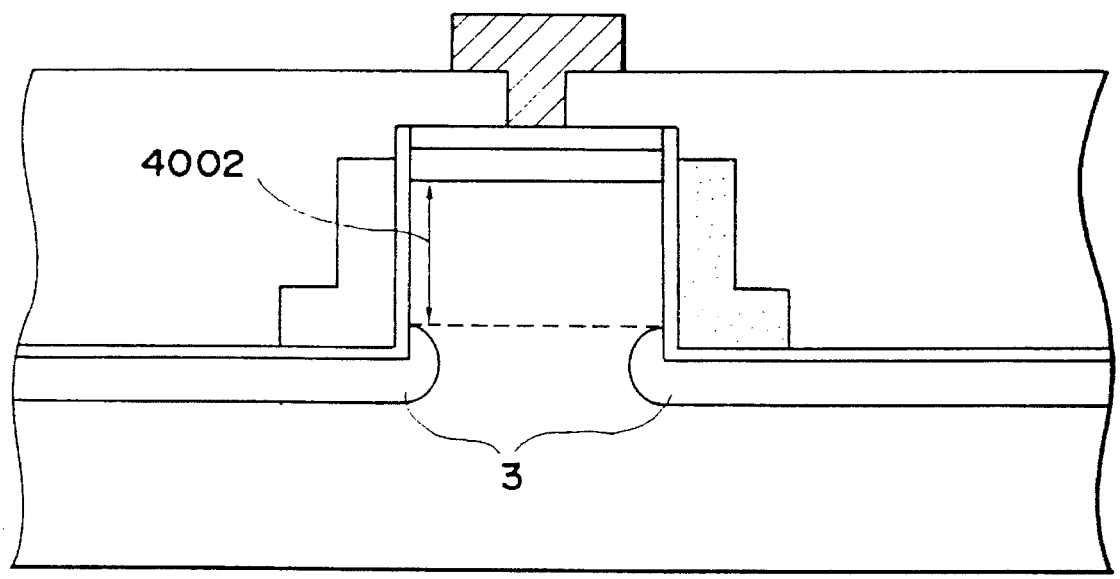
FIG. 35 is a schematic cross sectional view which illustrates a memory cell according to Embodiment 10A of the present invention.

Furthermore, a similar effect obtained from the structure shown in FIG. 34 can be obtained by performing the drain diffusion to cover the portion 4001 shown in FIG. 35. Furthermore, the potential of the channel can be made to be the same level as that of the substrate. As a result, a high performance SGT exhibiting excellent OFF characteristics can be realized and thereby a further improved device can be obtained according to the present invention.

Figure 36:
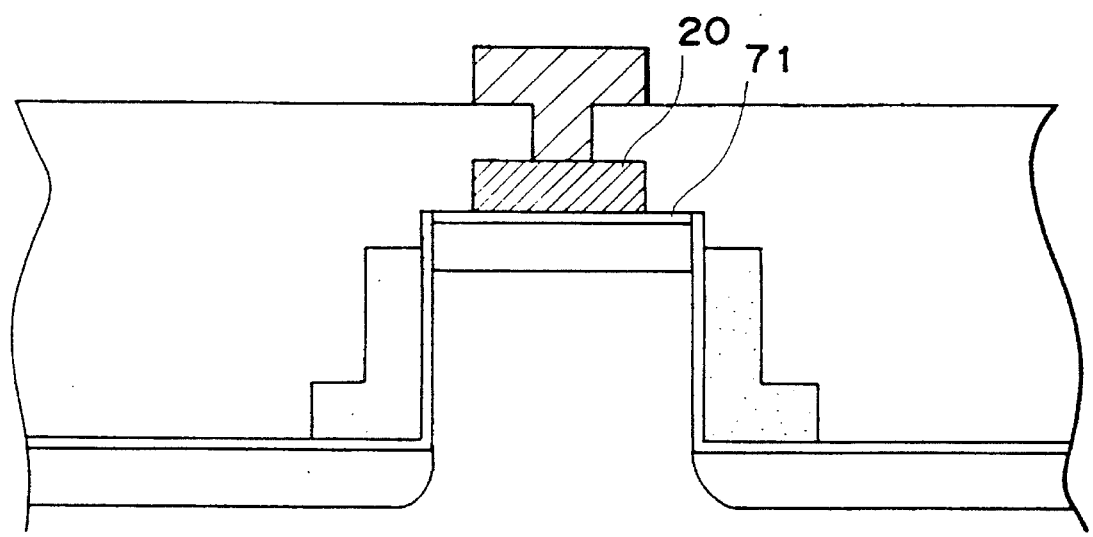
FIG. 36 is a schematic cross sectional view which illustrates a memory cell according to another embodiment of the present invention.
Figure 37:
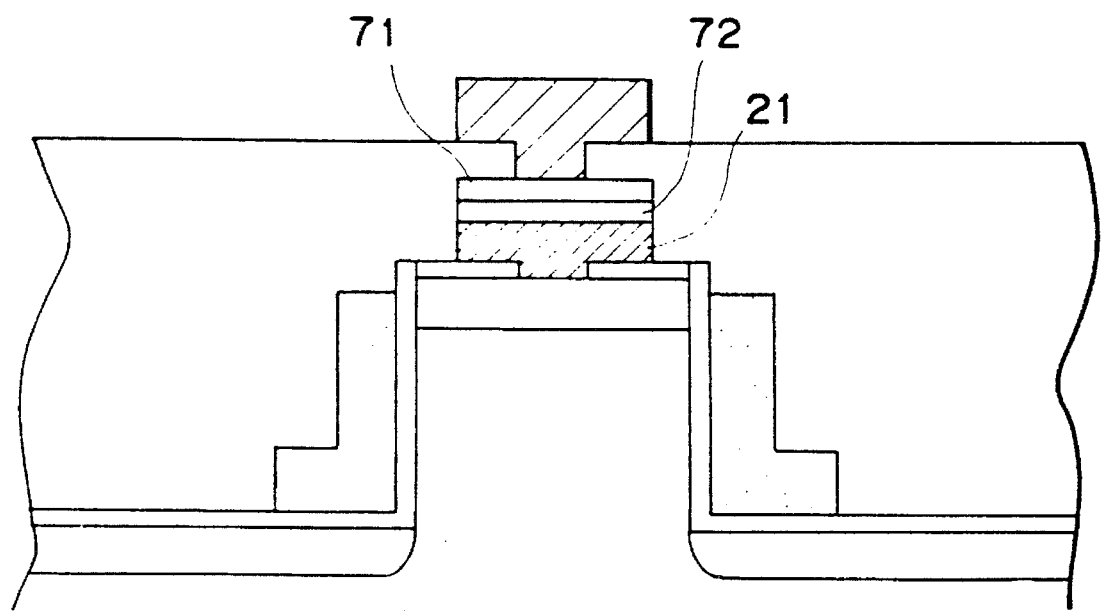
FIG. 37 is a schematic cross sectional view which illustrates a memory cell according to another embodiment of the present invention.
Figure 38:
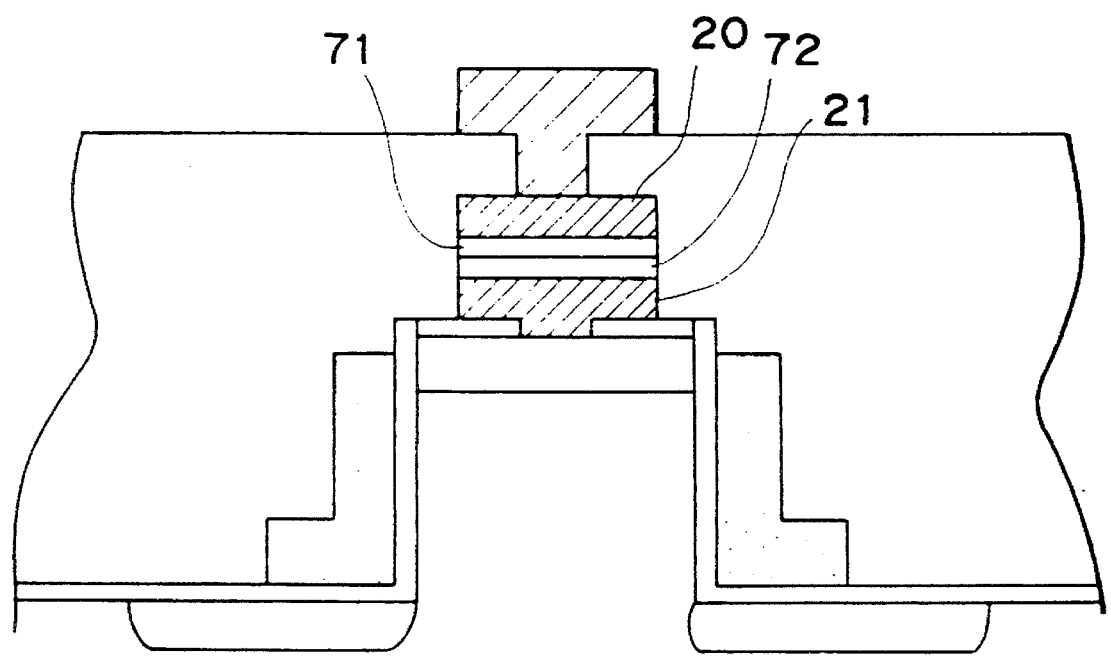
FIG. 38 is a schematic cross sectional view which illustrates a memory cell according to another embodiment of the present invention.

FIGS. 36 to 38 illustrate another embodiment of the present invention in which the structure of the memory element is altered and is formed into zener diodes 71 and 72. The aforesaid structure is required to prevent generation of tunneling current due to high concentration $p^+/n^+$ junction and to satisfactorily form the contact surface of the output side of the zener diode.

Embodiment 11(A)

Since the source (drain) region 4 on the SGT shown in FIG. 32 displays the impurity concentration of $10^{20}$ cm$^{-3}$ or higher, the tunneling current of the zener diode increases when a diffusion layer 71 is formed on it. Furthermore, since the diffusion layer 71 becomes a very shallow diffusion layer, the interface encounters a problem such as a spike if the electrode 6 is made of Al or the like. In this case, there arises a fear of deterioration of the yield. Accordingly, a structure shown in FIG. 36 is arranged in such a manner that an absorbing layer 20 made of polysilicon or barrier metal (TiN) is formed between the electrode 6 and the diffusion layer 71 so as to realize a satisfactory interface characteristics.

Embodiment 12(A)

In a structure shown in FIG. 37, the cathode of the zener diode is newly formed by polysilicon or a barrier metal 21 individually from the source of the SGT, so that $p^+/N$ or $N^+/P$ junction is formed. As a result, the generation of the tunnelling current due to the aforesaid $p^+/N^+$ junction can be prevented and the S/N in the conductive state and that in the non-conductive state can be improved.

Embodiment 13(A)

FIG. 38 illustrates a structure arranged for the purpose of overcoming the aforesaid two problems and structured in such a manner that the two end portions (the top and the bottom ends) of the zener diode are held by the absorbing layers 20 and 21.

Referring to FIG. 35, the same elements as those shown in FIG. 32 are omitted from description.

Figure 39:
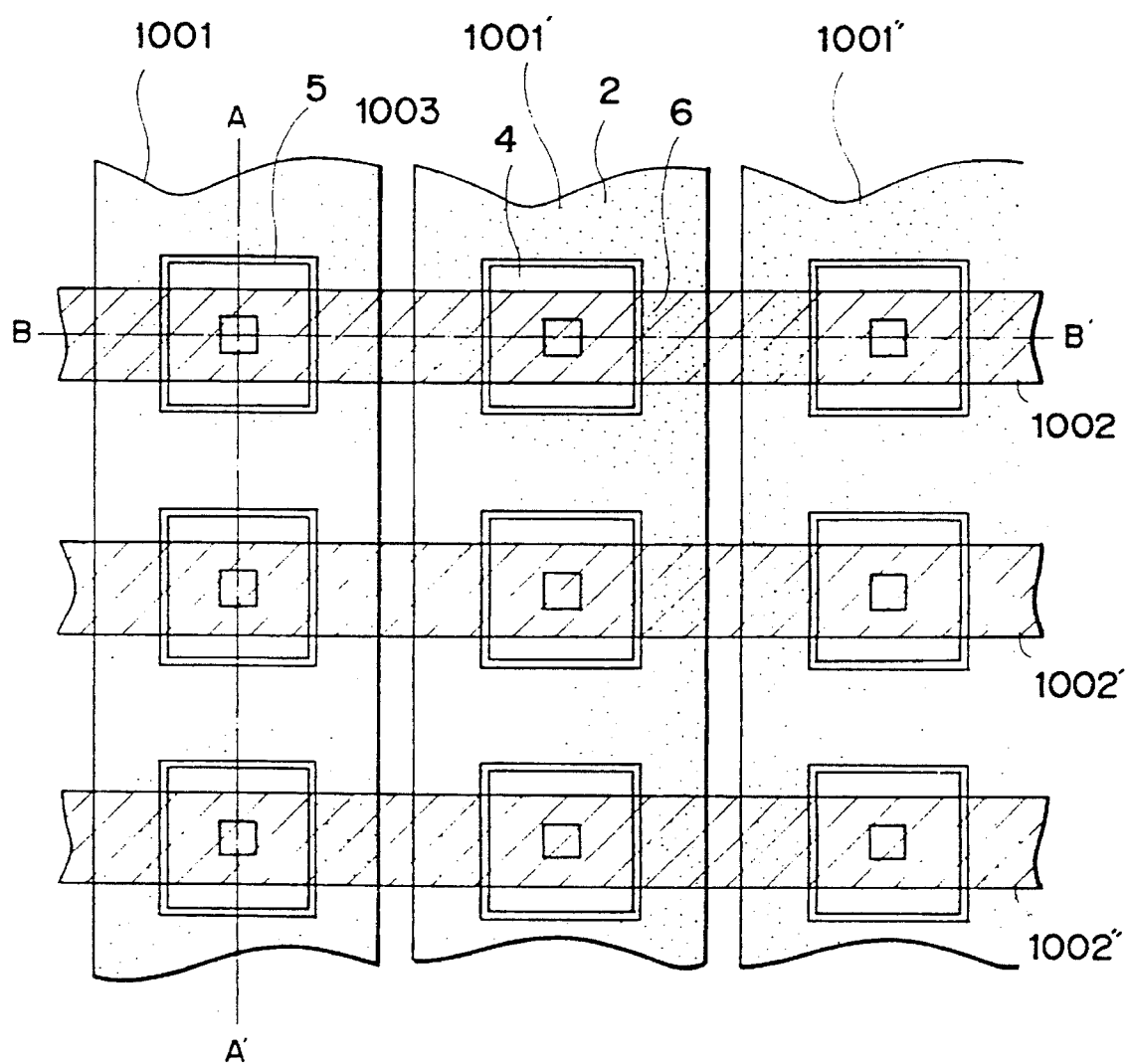
FIG. 39 is a schematic top view which illustrates a semiconductor memory according to the present invention.

FIG. 39 is a plan view which illustrates a structure in which a plurality of cells according to the aforesaid embodiment are disposed in the form of an array. Reference numerals 1001, 1001' and 1001" represent word lines connected to corresponding MOSFETs and 1002, 1002' and 1002" represent bit lines through which output passes from corresponding MOSFETs via the zener diode.

Figure 40:
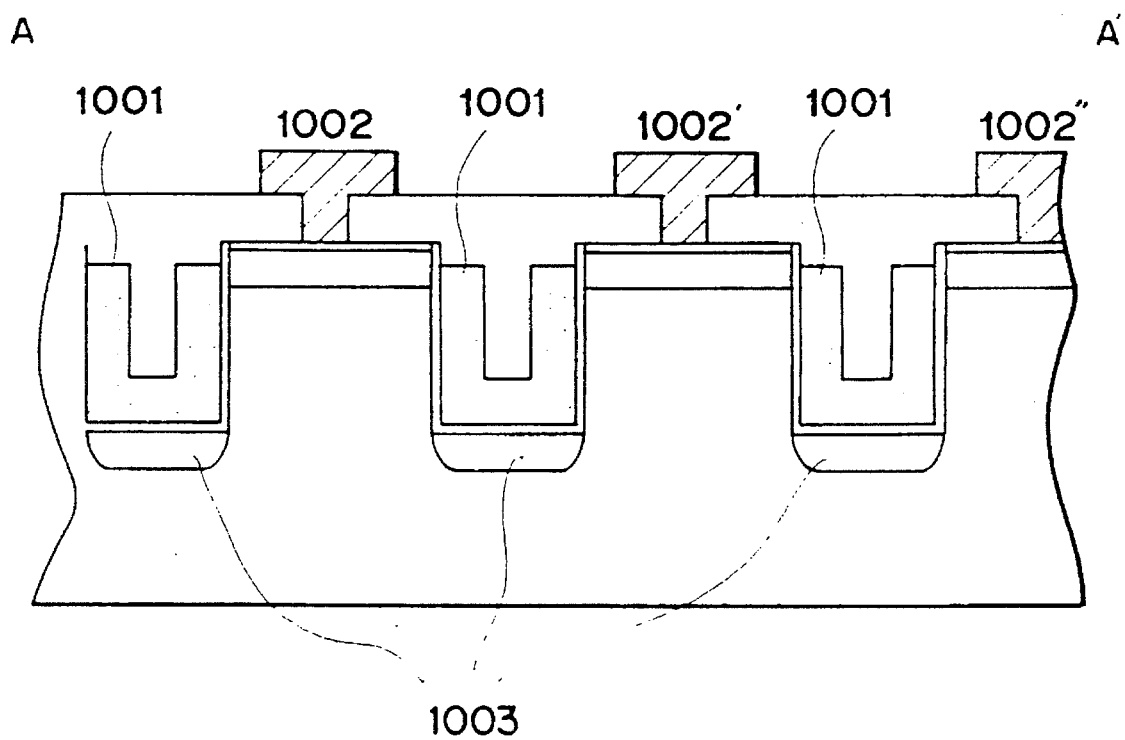
FIG. 40 is a schematic cross sectional view which illustrates a semiconductor memory according to the present invention.
Figure 41:
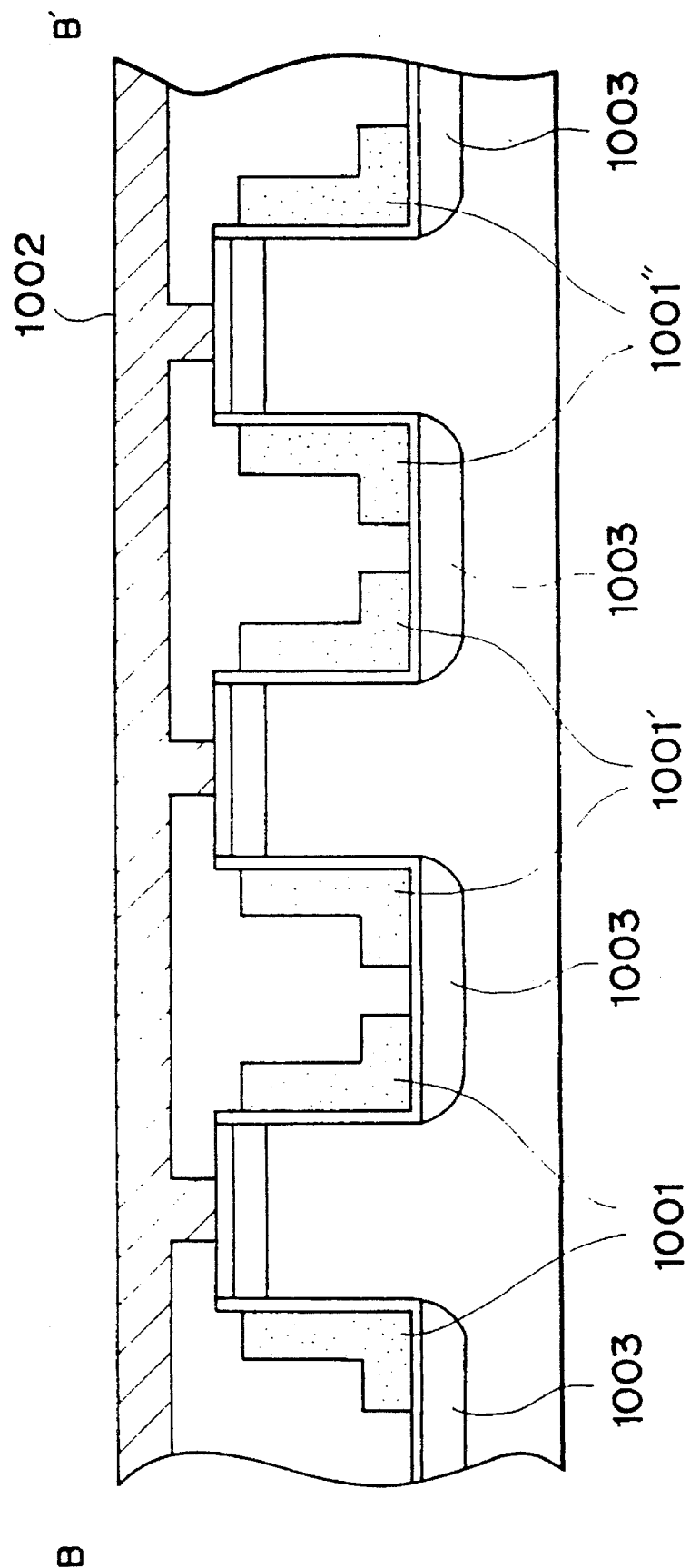
FIG. 41 is a schematic cross sectional view which illustrates a semiconductor memory according to the present invention.

FIGS. 40 and 41 are cross sectional views respectively taken along lines A–A' and B–B' of FIG. 39.

Figure 42A:
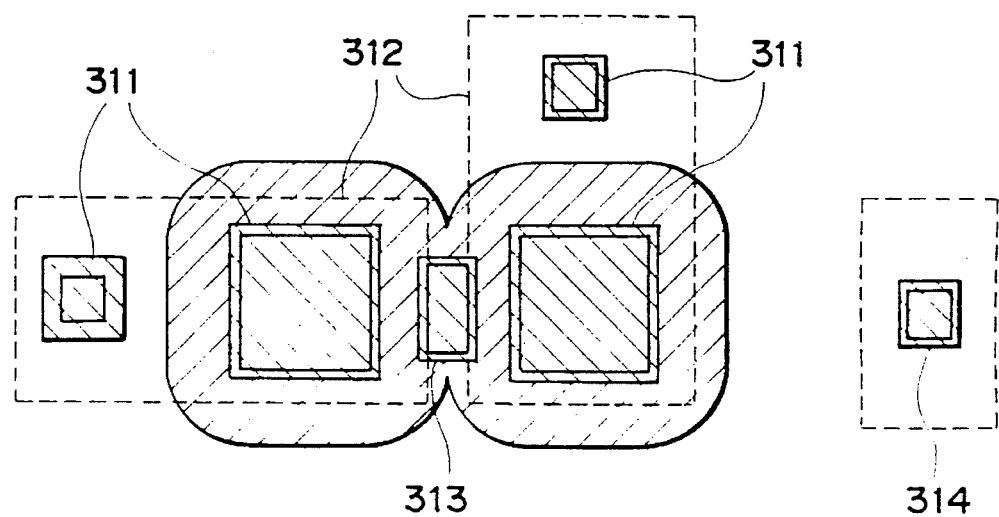
FIGS. 42A and 42B are schematic top views and a schematic cross sectional view which illustrate a peripheral circuit of a semiconductor memory according to the present invention.
Figure 42B:
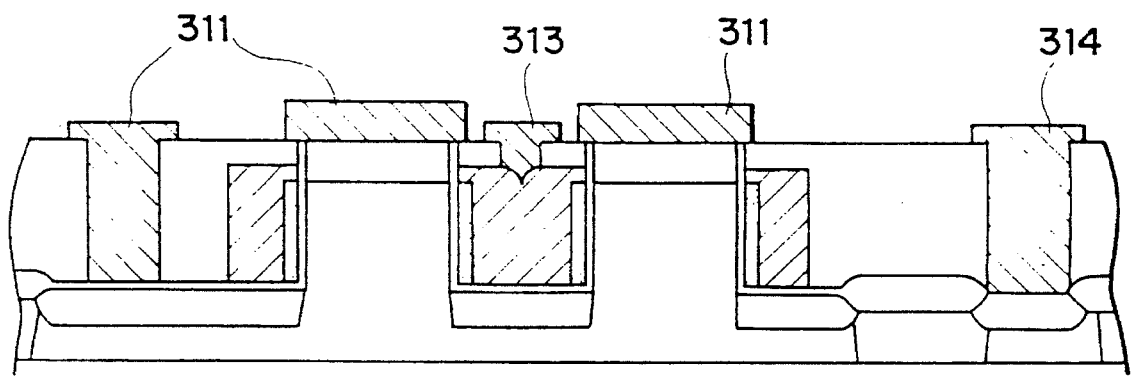

FIG. 42 is a top view and a cross sectional view of a peripheral circuit of the semiconductor memory according to the present invention.

Reference numeral 311 represents source and drain electrode, 312 represents an active region, 313 represents a gate electrode ejecting portion and 314 represents a well electrode ejecting portion.

As described above, also SGT is used in the peripheral circuit.

Then, a method of manufacturing a memory will now be described in which a predetermined conductive type semiconductor layer is used in place of the insulating film as the aforesaid memory element and which stores 1 and 0 by breaking or non-breaking the PN junction. The basic manufacturing method is the same as that for manufacturing the insulating type memory as described with reference to FIGS. 12 to 30. Therefore, description may be made about only a process of manufacturing the semiconductor memory element employed in place of the process of manufacturing the insulating memory element.

Figure 43:
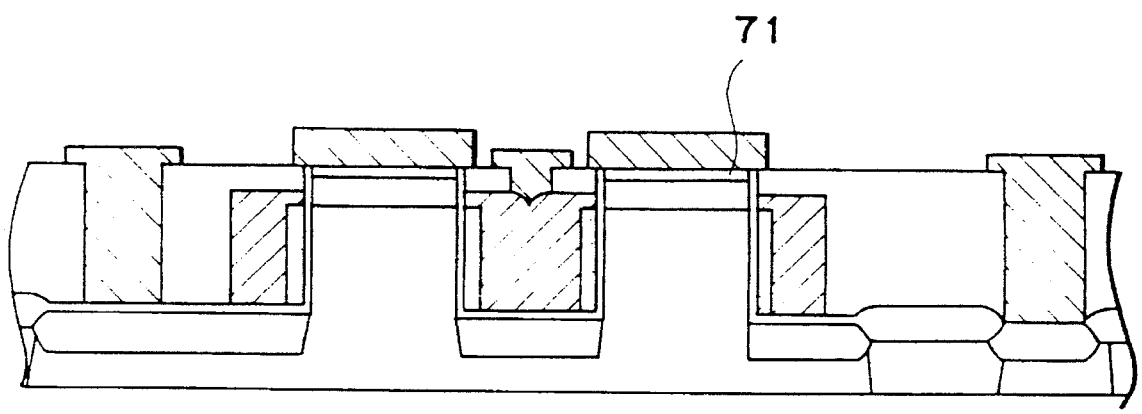
FIG. 43 is a schematic view which illustrates a process of manufacturing the semiconductor memory according to the present invention.

For example, a columnar semiconductor layer is formed and the lower wiring and the insulating between the layers are formed. Then, the top surface of the columnar MOSFET is caused to appear outside by etching back. Although the insulating film is formed by heat oxidation 2 in the case of the insulating layer memory element, this embodiment is arranged in such a manner that a P-type semiconductor layer is formed in the case of the NMOS and an N-type semiconductor layer is formed in the case of the PMOS. Furthermore, the PN junction is formed by introducing $BF^{+2}$ type P-type impurity by using a resist mask, so that the P-layer is formed. The P-type layer may be deposited by the CVD method to perform patterning. Thus, the P-type semiconductor layer 71 as shown in FIG. 43 and serving as the memory element is formed by forming electrodes on a structure realized due to the aforesaid process, the P-type semiconductor layer forming the main electrode region of the MOSFET and the PN junction.

Figure 44:
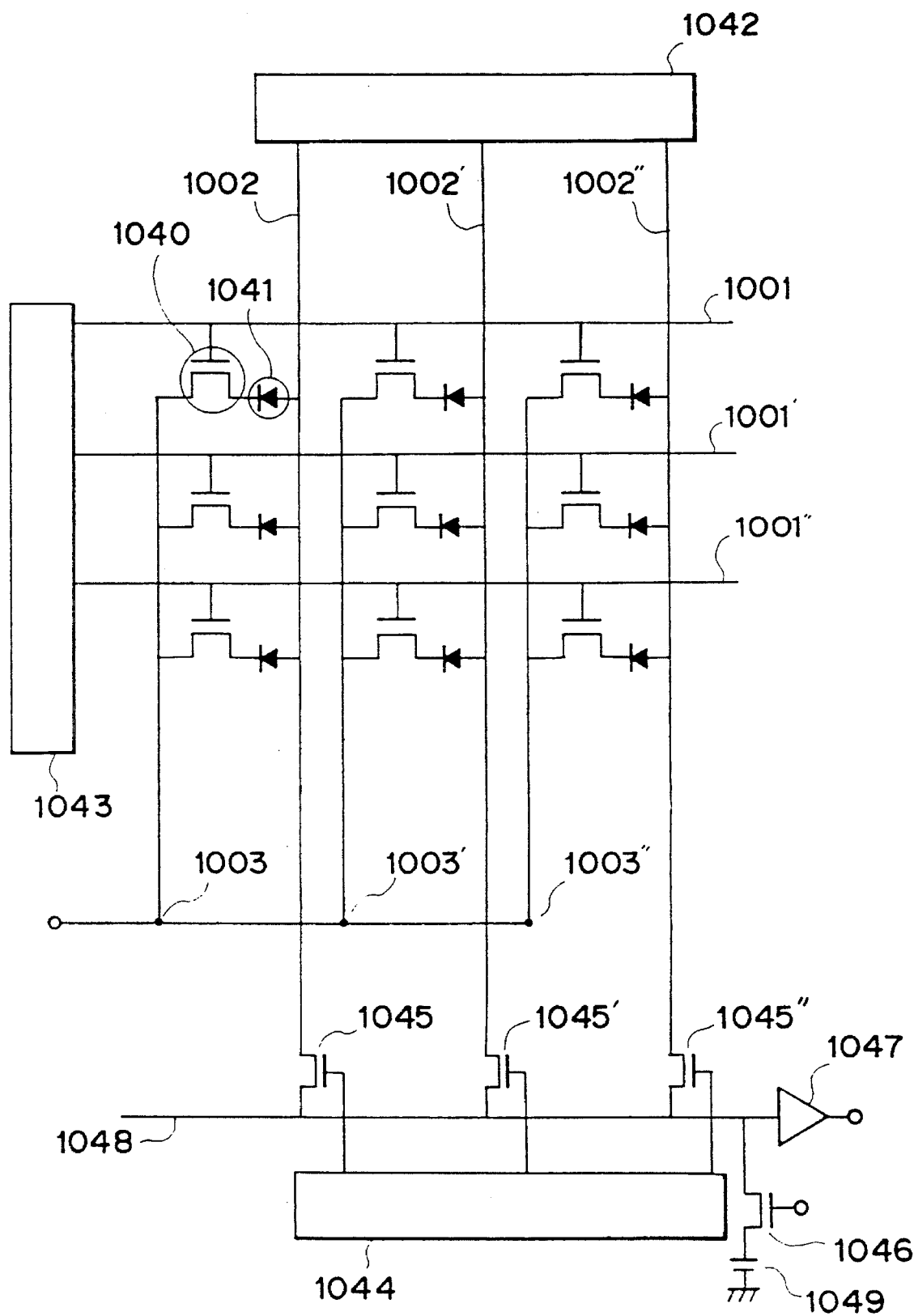
FIG. 44 is a circuit diagram which illustrates a semiconductor memory according to the present invention.

Then, the way of operating the memory device according to this embodiment and method of storage performed by it will now be described. FIG. 44 illustrates an equivalent circuit of the layout of the memory cell shown in FIG. 39. Referring to FIG. 44, reference numerals 1001 to 1001'" represent word lines, 1002 to 1002" represent bit lines and 1003 to 1003'" represent power supply lines. Each cell has a fine transistor 1040 having improved current driving performance and a pn junction 1041 formed in the source layer of the transistor thereof. Thus, a memory cell is constituted.

As the peripheral circuits of the memory, the following elements are provided: a bit line voltage setting circuit 1042, a word line voltage setting circuit 1043, a bit line sequentially selection signal generating circuit 1044, bit line selection switches 1045 to 1045", a switch for resetting the bit line reading line 1048 and an amplifier 1047.

Then, the writing operation will now be described.
(1) Writing Operation 1:
(precharge of bit lines)

The bet line is set to reference-voltage VDD by the voltage setting circuit 1042. As a result, the potential difference between the power supply line and the bit line is eliminated. Therefore, no potential is generated and no current passes between the source and the drain regardless of the level of voltage applied to the word line. As a result, the pn junction 1041 is not broken. The precharging voltage for the bit line may be different from power supply voltage VDD if the conductive state is not realized due to the breakage of the aforesaid pn junction region. The value of VDD may be about 1 to 5 V.

(2) Writing Operation 2:
(discharge of word lines)

The voltage of all of the word lines is fixed to first ground level VGND1, for example, 0 V. The aforesaid operation is performed in order to prevent mixture of a signal with the word line adjacent to the word line for performing the writing operation, the mixture being caused from crosstalk.

(3) Writing Operation 3
(selection of writing word line)

In a case where the present writing bit is a cell at the second row and second column when the top left cell is made to be the origin, the word line in which the writing bit exists becomes 1001' shown in FIG. 3. Therefore, the potential of this word line is made to be VG which holds the following relationship:

$$V_{GND1} < V_G < V_{GB} \tag{2}$$

where VGB is gate insulating film breaking voltage.

(4) Writing Operation 4
(selection of bit line)

A bit line potential which corresponds to a writing cell present on a selected line is set to ground potential 1. Since all of the transistors of the selected line are brought to the actuated state, high voltage is applied to the pn junction by making the potential of the bit line to be the ground potential. Therefore, the pn junction is broken and therefore the conductive state is realized. It is preferable that the bit line selections be sequentially performed because an electric current passes between the bit line and the word line when the writing operation is completed. However, a plurality of bit lines may be simultaneously written.

Then, the reading operation will now be described.
(1) Reading Operation 1
(precharge of bit lines)

It is performed similarly to the writing operation. The reason for this lies in that a problem taken place in that a blank bit is written due to the reading operation must be prevented. The voltage at this time may be a level similar to power supply voltage VDD.

(2) Reading Operation 2 (discharge of word line)

The voltage of all of the word lines is set to second ground level VGND2 which holds the following relationship with first ground level VGND1:

$$V_{GND1} < V_{GND2} \tag{3}$$

(3) Reading Operation 3 (selection of line to be read)

The potential of the word line of the line to be read is fixed to range VG defined according to Equation (2). As a result, the transistor on the aforesaid line is brought to an actuated state.

(4) Reading Operation 4 (resetting of bit line reading line)

The bit line reading line 1048 is reset by the switch 1046. The resetting potential is determined by the power source connected to the switch 1046, the potential being made to be VGND2. Then, the switch 1046 is switched off and the bit line reading line is brought into a floating state.

(5) Reading Operation 5 (selection of bit line)

The bit line sequential selection signal generating circuit 1044 is used to raise the level of the gate of the selection bit selection switch, the switch is switched on so as to be connected to the bit line reading line. In a case where the selection cell has not been written, the voltage of the reading line is converged to a value obtained from the following equation assuming that the capacity of the bit line is CBIT and the capacity of the reading line is COUT:

$$\frac{C_{BIT} \cdot V_{DD} + C_{OUT} \cdot V_{GND2}}{C_{BIT} + C_{OUT}}$$

In a case where the selection cell has been written and therefore the state in which the pn junction has ben brought into the conductive state, this reading line is connected to the power source VDD while interposing the transistor. Therefore, the voltage of the reading line is converged to VDD. The aforesaid difference is used to discriminate whether or not the written cell (bit) has been written. This voltage is detected by the amplifier 1047. As a result, the reading operation is performed. In the writing mode, the time required for the potential of the reading line to be converged to VDD determines the reading speed. The capacity of the bit line and that of the bit line reading line are in proportion to the capacity of the memory. Therefore, a critical factor is the feasibility of driving the large capacity. The transistor structure fined satisfactorily and exhibiting excellent driving performance according to this embodiment will cause a significant effect to be obtained.

The reason why the two levels of the ground potentials are provided to perform the operation according to this embodiment lies in that the breakage of the pn junction must be prevented at the time of the reading operation. That is, the potential difference to be applied to the two end portions of the pn junction at the time of the reading operation is made to be smaller than the difference at the time of the writing operation.

According to this embodiment, the semiconductor layer is used as the memory element and information is recorded depending upon a fact that the pn junction is broken or not broken. Therefore, scattering of the state of the breakage in each cell can be prevented, causing satisfactory reliability to be obtained.

In any case, according to the present invention, the memory element is realized by a junction which can be electrically broken, the junction being exemplified by the PN junction, insulating film/semiconductor junction, metal/insulating film/semiconductor junction, PIN junction, semiconductor/insulating film/semiconductor junction, IN junction, PI junction, short-key junction and heterojunction.

Embodiment 1(H)

Figure 47:
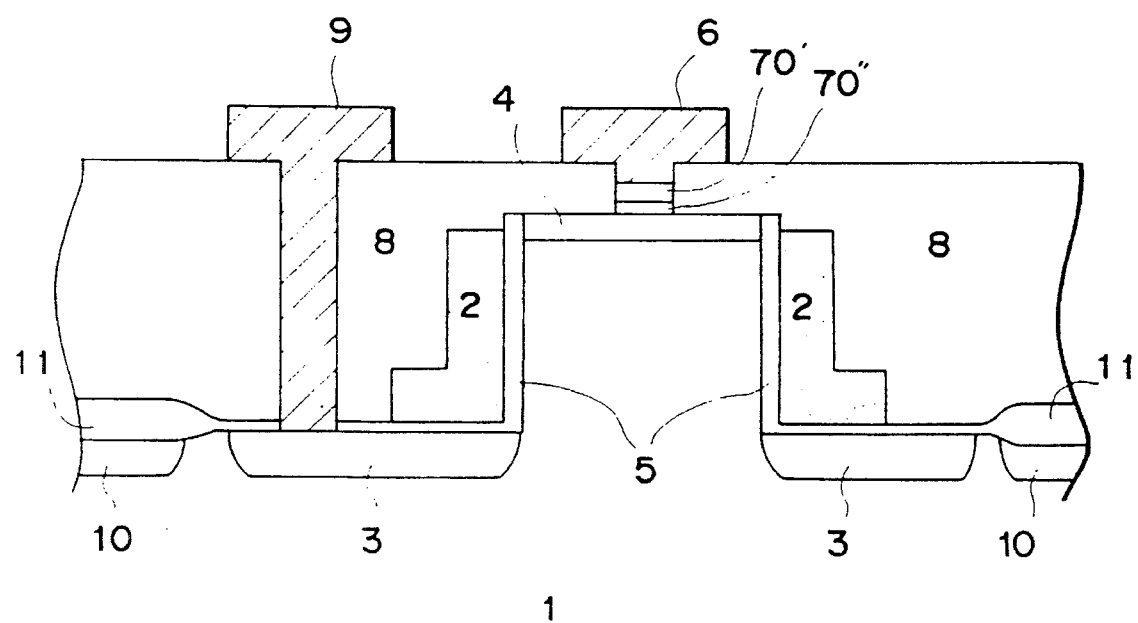
FIG. 47 is a schematic cross sectional view which illustrates a memory cell according to Embodiment 1(H) of the present invention.

FIG. 47 is a schematic cross sectional view which illustrates a semiconductor memory according to Embodiment 1(H) by a portion corresponding to one cell.

A semiconductor substrate 1 has a columnar semiconductor layer in the upper portion thereof. A gate electrode 2 is formed around the columnar portion while holding a gate insulating film 5. A drain region 3 is formed in the side portion of the lower portion of the columnar portion, the columnar portion having a source region 4 formed thereon. Reference numeral 9 represents a drain electrode. A source electrode 6 is connected to the source region 4 while interposing an insulating film 70' and a barrier metal 70". The vertical size of the columnar semiconductor layer is longer than the necessitated gate length and the length of one side is made to be of the order of sub-micron (0.1 μm). The relationship relationship between the length of the one side, the gate voltage and the concentration of the impurity of the semiconductor are as described above.

Referring to FIG. 47, the gate electrode 2 overlaps the source region 4. Another positional relationship between 2 and 4 may, of course, be employed in which the source region 4 sets off (the LDD structure) in relation to the gate electrode 2 or the same may overlap (the GOLD structure) it similar to the conventional MOSFET.

Reference numerals 10 and 11 respectively represent a channel stopper for insulating the elements and a field insulating film.

Figure 48:
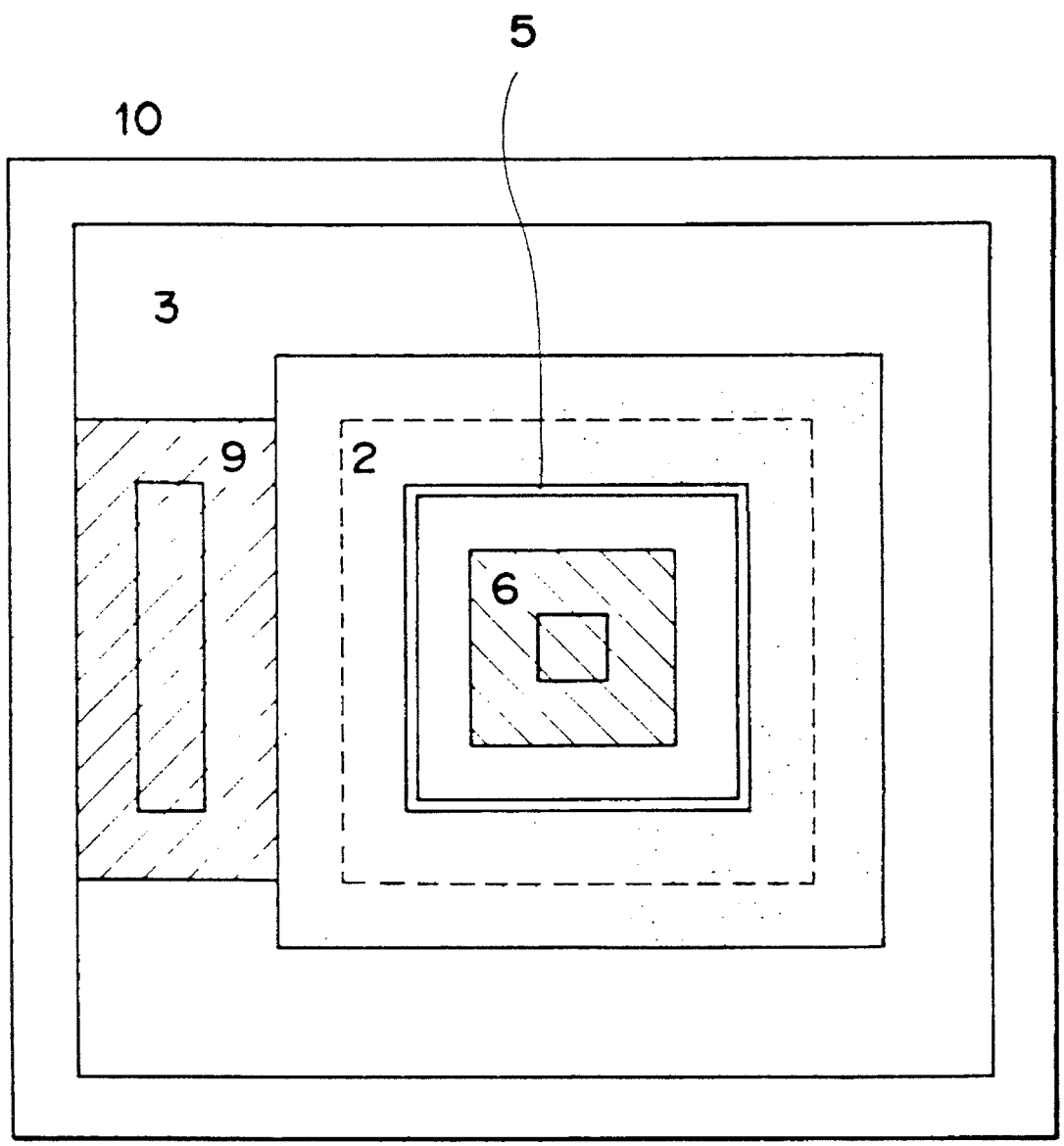
FIG. 48 is a schematic top view which illustrates a memory cell according to Embodiment 1(H) of the present invention.

FIG. 48 is a schematic top view of the cell shown in FIG. 47.

Embodiment 2(H)

Figure 49:
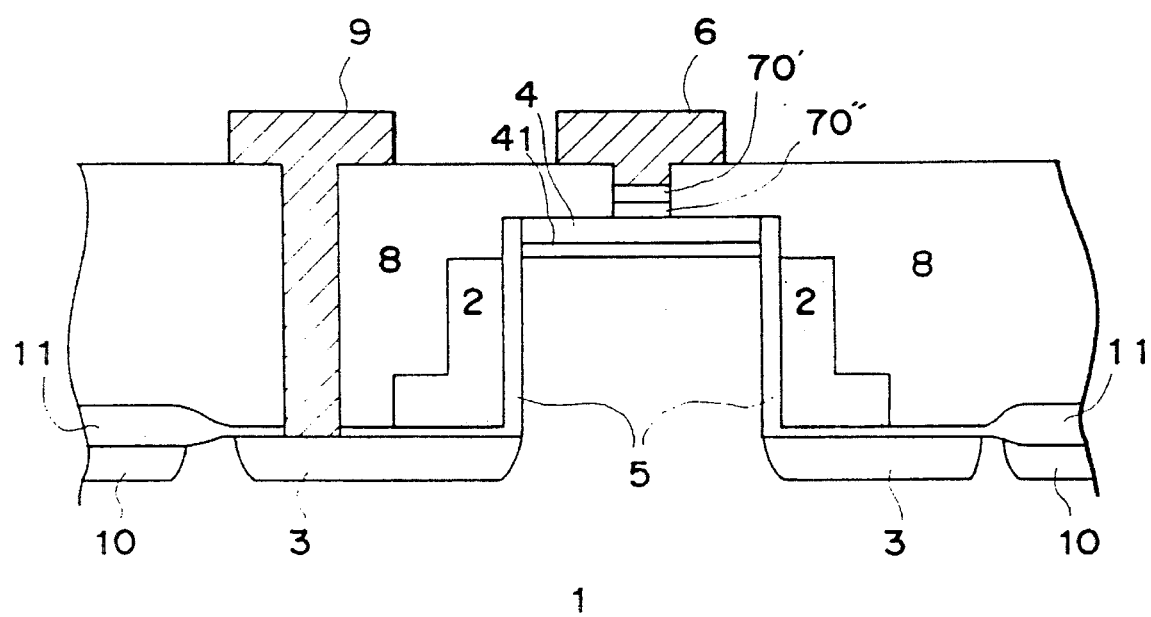
FIG. 49 is a schematic top view which illustrates a memory cell according to Embodiment 2(H) of the present invention.

FIG. 49 illustrates a second embodiment arranged in such a manner that the LDD structure is added similarly to the conventional MOSFET.

Although the present invention enables excellent durability against the hot carrier to be obtained as compared with the conventional MOSFET structure, the effect of the hot carrier cannot be completely eliminated. Accordingly, a layer 41 showing a concentration lower than that of the diffusion layer of the source and drain region is additionally formed for the purpose of further improving the durability against the hot carrier.

As described above, the one cell is structured by stacking the barrier metal and the insulating layer on a vertical type MOSFET.

In a case where a P-type semiconductor is employed to form the substrate 1, the N-type semiconductor may be employed to form the source region and the drain region. A contrary structure may also be employed.

The electrodes 2 may be constituted by a multilayer of polysilicon or WSi or their combination. As the metal layer 70", a barrier metal made of TiN, Ti, or W or the like may be employed. As the wiring electrodes 6 and 9, Al, Al—Si, or Al—Si—Cu, or the like may be employed.

The insulating film 70' must be a dielectric member from which a desired capacity can be obtained. Specifically, single or multilayered silicon oxide, silicon nitride, aluminum oxide or tantalum oxide is employed. In order to be broken by a voltage level of 3 to 5 V but to withstand a voltage level of 1 to 3 V, its thickness, structure and material are selected.

When the insulating film 70' is applied with high voltage at its two end portions and is thereby broken, the wiring metal existing in its upper portions generally reacts with the insulating layer in the broken portion and reaches the lower portion. Since the barrier metal 70" is formed in the lower portion of the insulating layer according to the present invention, the introduction of the wiring metal, which has reached the lower portion of the insulating layer due to the aforesaid reaction, into the source region is prevented. If the aforesaid structure is not employed, the wiring metal which has reached the lower portion of the insulating layer due to the reaction penetrates the source region 4 and reaches the channel. As a result, a short circuit is realized between the source and the channel and leakage takes place. However, according to the present invention, the aforesaid short circuit and the leakage can be completely prevented. Therefore, the breakage or defect of the transistor can be prevented at the time of the writing operation as a memory device.

Embodiment 3(H)

Figure 50:
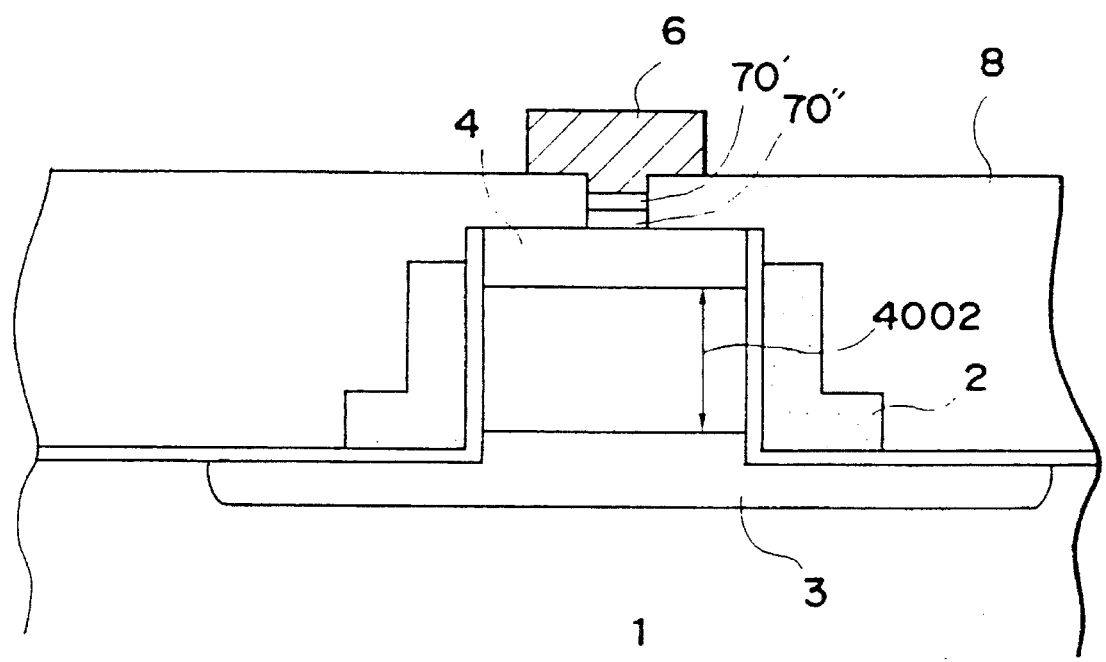
FIG. 50 is a schematic top view which illustrates a memory cell according to Embodiment 3(H) of the present invention.

FIG. 50 illustrates a memory cell according to Embodiment 3(H).

The difference from the structure shown in FIG. 47 lies in that the drain region 3 is formed to cover the overall lower surface of the column and thereby the channel region is narrowed. According to this structure, the controllability of the effective channel length 4002 of the SGT can be improved and the deterioration of the voltage resistance can be prevented. Furthermore, the generation-re-bonded current in the lower portion of the column can be completely prevented.

Embodiment 4(H)

Figure 51:
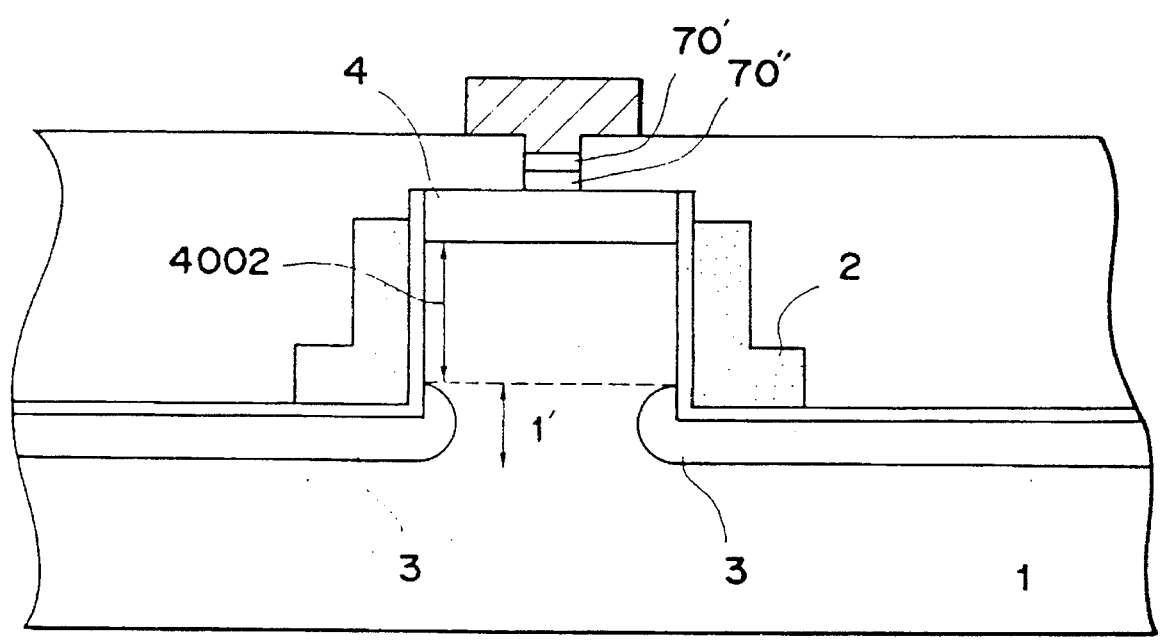
FIG. 51 is a schematic top view which illustrates a memory cell according to Embodiment 4(H) of the present invention.

FIG. 51 illustrates a memory cell according to Embodiment 4(H).

The difference from the structures shown in FIGS. 47 and 50 lies in that a portion 3 of the drain region is positioned in a portion of the column.

According to this structure, a cell exhibiting further improved OFF-characteristics can be obtained in addition to the effect obtained from the structure shown in FIG. 50. The reason for this lies in that the channel and the substrate 1 can be maintained at the same potential while interposing a region 1'.

Embodiment 5(H)

Figure 52:
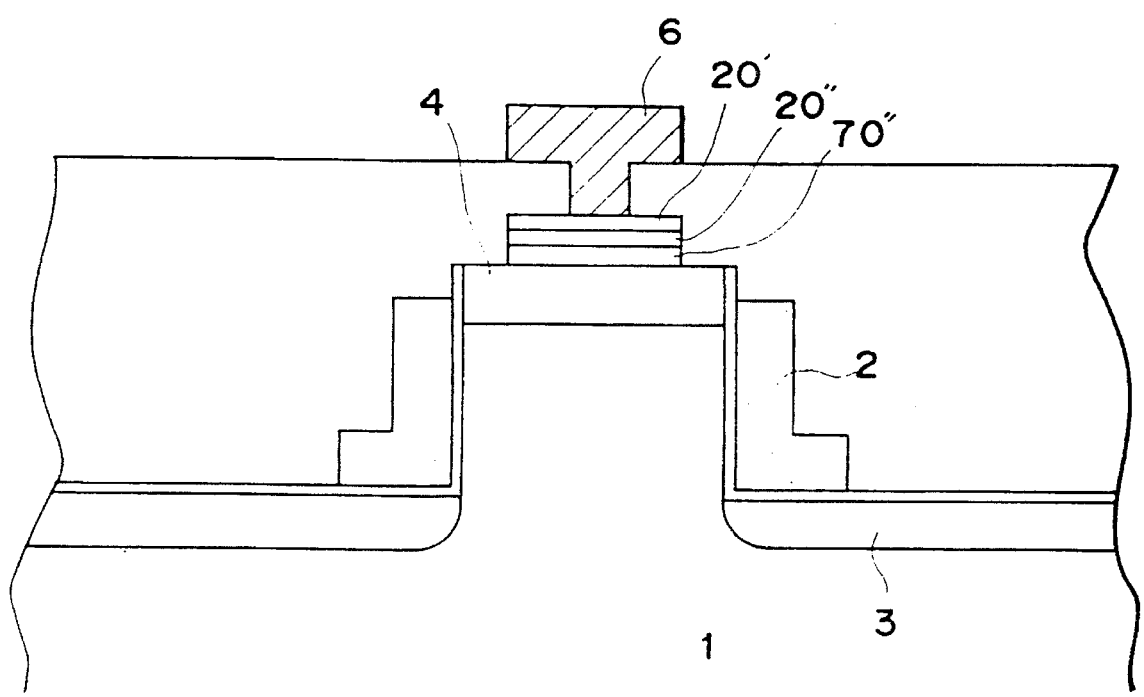
FIG. 52 is a schematic top view which illustrates a memory cell according to Embodiment 5(H) of the present invention.

FIG. 52 is a cross sectional view which illustrates a memory cell according to Embodiment 5.

The difference from FIG. 47 lies in that a $p^+$ layer 20' and an n-layer 20" made of polysilicon are formed on the barrier metal 70" and the wiring electrode 6 is formed on the $p^+$ layer 20'. In general, the potential of the wiring electrode 6 is lower than that of the source layer 4, the aforesaid layers 20' and 20" are made to have an inverse bias relationship and thereby a non-conductive state is realized. When high voltage or large electric current is applied between the electrode 6 and the source 4, the aforesaid $p^+$ layer 20' and the $n^+$ layer 20" are broken. As a result of this breakage, Si of the aforesaid polysilicon layer and the electrode 6 react with each other and the metal of the electrode 6a comes in contact with the barrier metal 70". As a result, the electrode 6 and the source region 4 are brought into the conductive state. According to the present invention, the barrier metal 70" is formed as described above, the metal 6 of the electrode 6 is not diffused into the source region 4. Therefore, the breakage of the transistor at the time of the writing mode in which the conductive state is realized can be prevented. As a result, a reliable memory device can be realized.

Embodiment 5(H)

Figure 53:
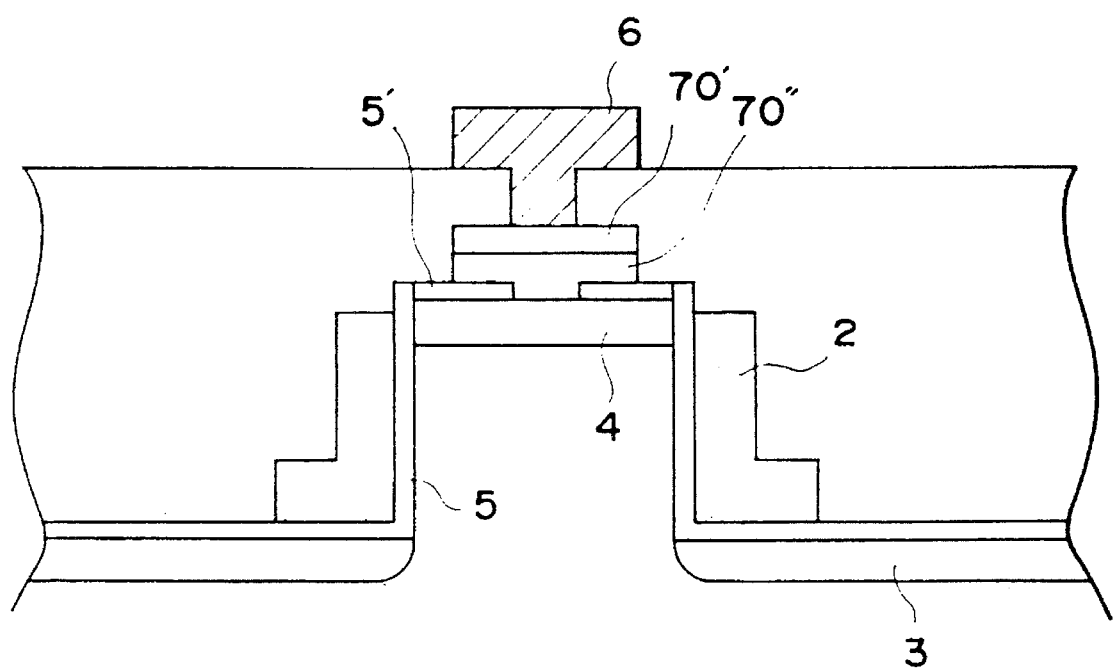
FIG. 53 is a schematic top view which illustrates a memory cell according to Embodiment 6(H) of the present invention.

FIG. 53 illustrates a memory cell according to Embodiment 6(H).

The difference from the structure shown in FIG. 52 lies in that the source region 4 is formed into a P- or N-type semiconductor region of an order of $10^{19}$ or less, preferably of an order of $10^{16}$ to $10^{17}$. Furthermore, the barrier metal 70" is formed on it while being communicated via an opening of the insulating film 5' In addition, the insulating film 70' is formed on the layer 21.

Since the necessity of forming the film 70' by the heat oxidation method can be eliminated, a problem of deterioration of the voltage resistance and that of the insulating characteristics due to dopant can be overcome.

Embodiment 7(H)

Figure 54:
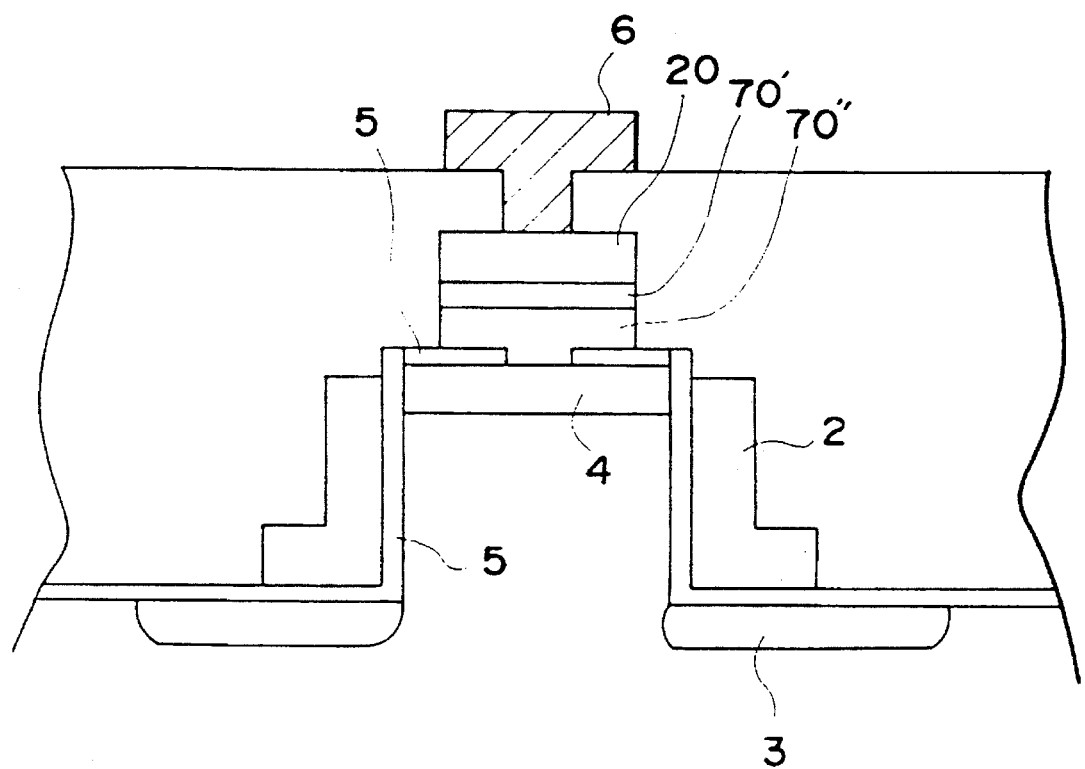
FIG. 54 is a schematic top view which illustrates a memory cell according to Embodiment 7(H) of the present invention.

A memory cell according to Embodiment 7(H) shown in FIG. 54 is constituted by forming the polysilicon layer 20 on the insulating film 70' according to the embodiment shown in FIG. 53.

According to aforesaid Embodiments 1(H) to 7(H), various problems can be overcome and high performance and fine semiconductor memory can be realized.

By using the MOSFET to constitute the switching device in place of the bipolar transistor, the driving current required per memory cell can be significantly reduced and mounting density can be raised and the power consumption can be reduced.

By using the SGT to constitute the switching device, a further fined device can be formed and therefore a semiconductor memory having a larger size and high performance can be realized.

According to Embodiments 3(H) and 4(H), the high concentration source or drain region extends to the source and drain region in the/ower portion of the SGT. Therefore, a problem of deterioration of reliability due to the generation-rebonded current and the concentration of the electric field can be effectively overcome.

That is, since the lower drain region 3 can be determined due to the diffusion from the surface of the substrate prior to performing etching of the substrate, the accuracy of the channel length L can be significantly improved as compared with the conventional method in which the effective channel length (L) is determined by the bulk etching method. Furthermore, a finer MOSFET can be manufactured.

Dark currents are generated in the depletion layer formed between the drain and the gate-mainly due to a defect in the lower portion of the channel and that at an end point of the drain region. However, since the aforesaid point is covered with the drain region according to the present invention, the concentration of the electric fields, deterioration of the voltage resistance and generation of the dark current can be prevented.

Furthermore, when the gate electrode is formed in a maskless manner by using a metal CVD exhibiting excellent coating feasibility, the electrode ejecting region can be formed by a selfalignment manner.

By using the memory cell having a transistor which can be easily fined and which exhibits excellent current driving performance and by making the gate of this transistor to be the word line, a semiconductor memory connected to the bit line is formed on the source region of this transistor while interposing the insulating film between layers. As a result, a single-permanent-write enabled semiconductor memory exhibiting reduced error rate and having high density and high speed read/write characteristics can be realized.

Embodiment 8(H)

Figure 55:
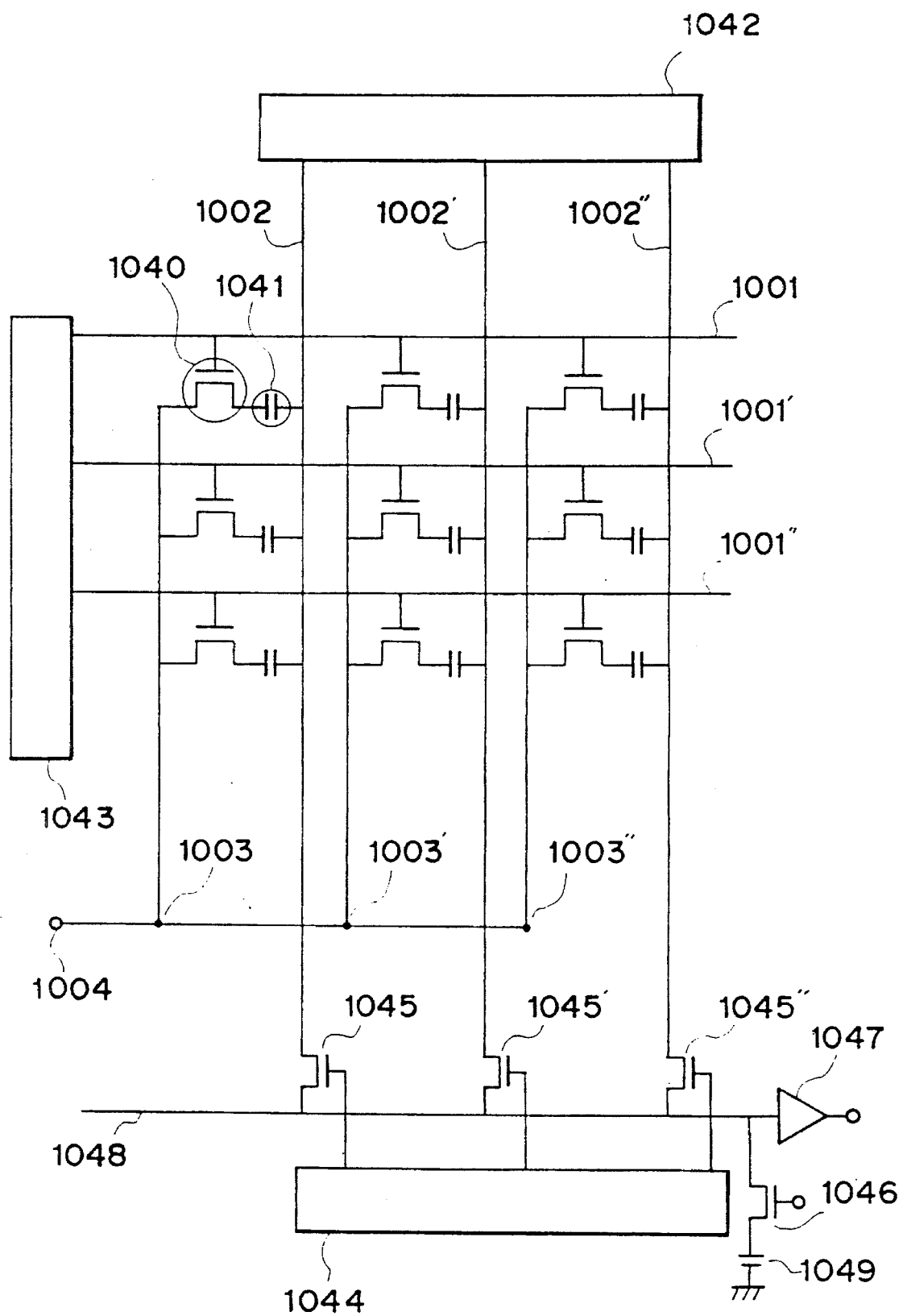
FIG. 55 is a circuit diagram which illustrates a semiconductor memory according to the present invention.

FIG. 55 is a circuit diagram which illustrates an embodiment of a semiconductor memory having 3×3 cells according to the present invention.

One cell has an addressing transistor 1040 and a memory element 1041. The memory element 1041 is, of course, a capacitor before the insulating film is broken and is not a capacitor after it has been broken.

The transistor 1040 and the memory element 1041 can be constituted by the structures according to aforesaid Embodiments 1(H) to 7(H).

Reference numerals 1001, 1001' 1001" ' and 1001''' represent word lines connected to the gates of the FET.

Reference numerals 1002, 1002' and 10012" represent bit lines each connected to either side of the memory element.

Reference numerals 1003, 1003', 1003" and 1004 represent power supply lines.

As the peripheral circuits of the memory, the following elements are provided: the bit line voltage setting circuit 1042, the word line voltage setting circuit 1043, the selection signal generating circuit 1044 for sequentially selecting the bit lines, the bit line selection switches 1045, 1045' and 1045", the switch 1046 for resetting the bit line reading line 1048 and an amplifier 1047.

Figure 56:
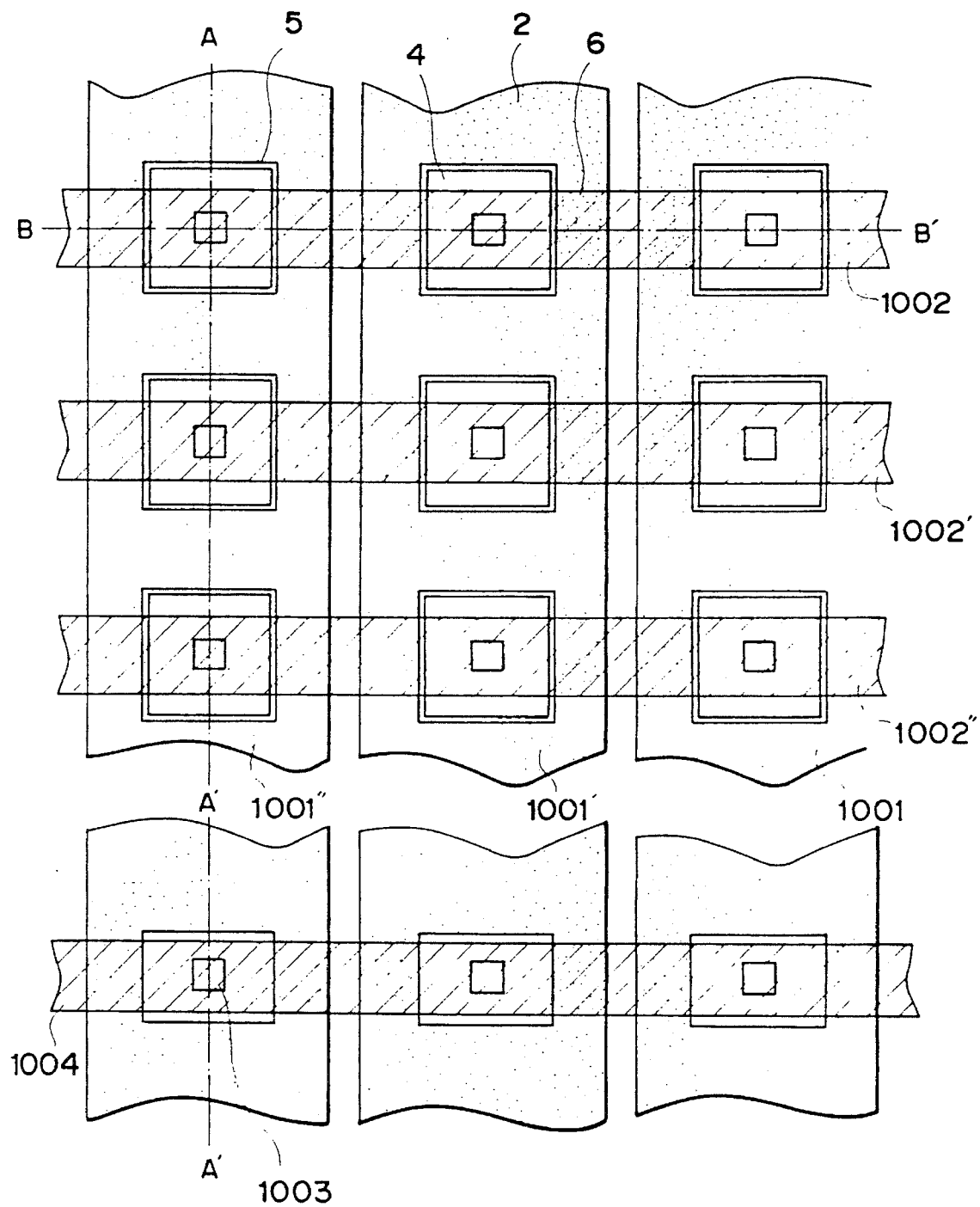
FIG. 56 is a schematic top view which illustrates a semiconductor memory according to Embodiment 7(H) of the present invention.

FIG. 56 is a schematic top view of the semiconductor memory shown in FIG. 55.

Referring to FIG. 56, a wiring 1004 is used for the purpose of reducing the resistance generated in the flow from the power supply line 1004 to each memory cell. In order to prevent a delay of the memory access time, it is formed to have a certain interval in the rows and columns.

Three memory cells in one row constitute the word lines 1001, 1001' and 1001" since their gate electrodes 2 are connected by the same electrode layer.

Similarly, the three memory cells in one column constitute the bit lines 1002, 1002' and 1002" since the electrodes of their memory elements are connected by the same wiring layer.

Figure 57:
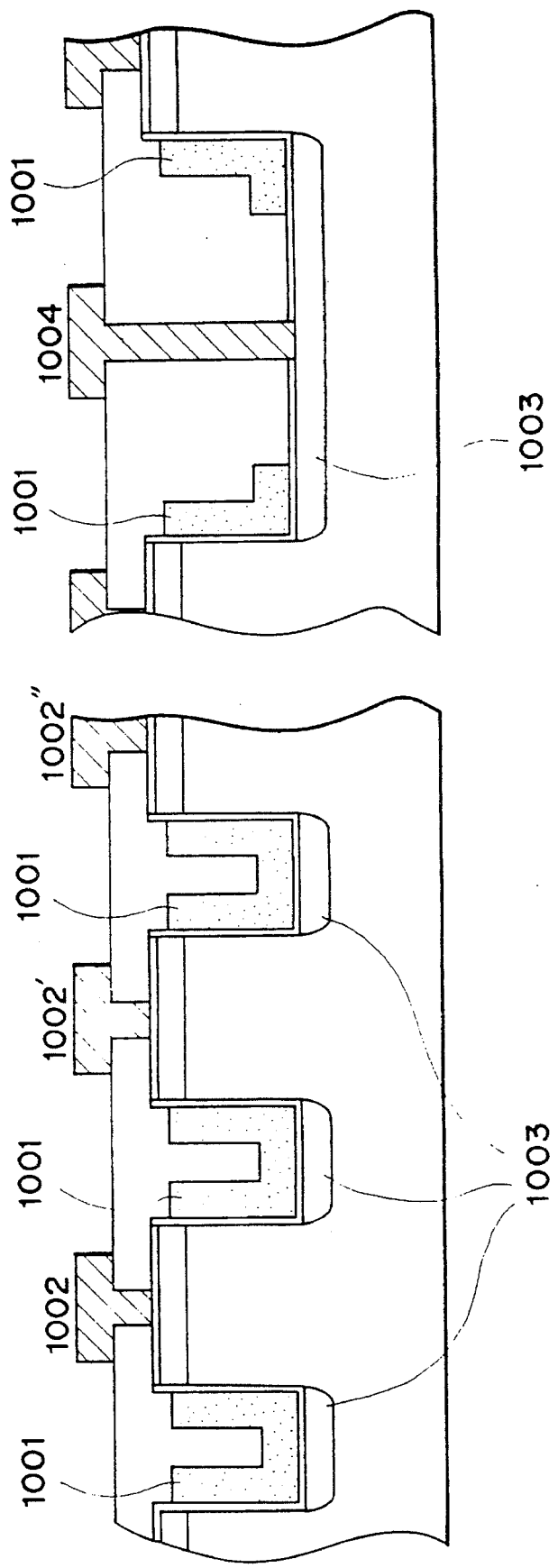
FIG. 57 is a cross sectional view taken along line AA' of FIG. 56.

FIG. 57 is a cross sectional view taken along line AA' of FIG. 56. FIG. 1is a cross sectional view taken along line BB' of FIG. 56.

Then, the operation of the aforesaid semiconductor memory will now be described.

First, its writing operation will now be described, the writing operation, including the following four main operations.

(1) Writing Operation 1: (precharge of bit lines)

The bet line is set to reference voltage $V_{DD}$ by the voltage setting circuit 1042. As a result, the potential difference between the power supply line and the bit line is eliminated. Therefore, no potential is generated and no current passes between the source and-the drain of the FET regardless of the level of voltage applied to the word line. As a result, the insulating film 1041 is not broken. The precharging voltage for the bit line may be the same level as that of the power supply voltage or may be different from the same. In this case, the structure must be arranged in such a manner that the conductive state is not realized due to the breakage of the insulation film region. The value of $V_{DD}$ may be about 1 to 5 V.

(2) Writing Operation 2: (discharge of word lines)

The voltage of all of the word lines is fixed to first ground level $V_{GND1}$, for example, 0 V. The aforesaid operation is performed in order to prevent mixture of a signal with the word line adjacent to the word line for performing the writing operation, the mixture being caused from crosstalk.

(3) Writing Operation 3 (selection of writing word line)

In a case where the present writing bit is a cell at the second row and second column when the top left cell shown in FIG. 55 is made to be the origin, the word line in which the writing bit exists becomes 1001' shown in FIG. 55. Therefore, the potential of this word line is made to be $V_G$ which holds the following relationship:

$$V_{GND1} < V_G < V_{GB} \tag{2}$$

where $V_{GB}$ is gate insulating film breaking voltage.

(4) Writing Operation 4 (selection of bit line)

A bit line potential which corresponds to a writing cell present on a selected line is set to ground potential. Since all of the FETs of the selected line are brought to the actuated state, high voltage is applied to the insulating film by making the potential of the bit line to be the ground potential. Therefore, the insulating film is broken and therefore the conductive state is realized. It is preferable that the bit line selections be sequentially performed because an electric current passes between the bit line and the word line when the writing operation is completed. However, a plurality of bit lines may be simultaneously written.

Then, the reading operation will now be described, the reading operation including the following four main operations.

(1) Reading Operation 1 (precharge of bit lines)

It is performed similarly to the writing operation. The reason for this lies in that a problem taken place in that a blank bit is written due to the reading operation must be prevented. The voltage at this time may be a level similar to power supply voltage $V_{DD}$.

(2) Reading Operation 2 (discharge of word line)

The voltage of all of the word lines is set to second ground level $V_{GND2}$ which holds the following relationship with first ground level $V_{GND1}$:

$$V_{GND1} < V_{GND2} \quad (3)$$

(3) Reading Operation 3 (selection of line to be read)

The potential of the word line of the line to be read is fixed to range VG defined according to Equation (2). As a result, the FET on the aforesaid line is brought to an actuated state.

(4) Reading Operation 4 (resetting of bit line reading line)

The bit line reading line 1048 is reset by the switch 1046. The resetting potential is determined by the power source connected to the switch 1046, the potential being made to be $V_{GND2}$. Then, the switch 1046 is switched off and the bit line reading line is brought into a floating state.

(5) Reading Operation 5 (selection of bit line)

The bit line sequential selection signal generating circuit 1044 is used to raise the level of the gate of the selection bit selection switch, the switch is switched on so as to be connected to the bit line reading line. In a case where the selection cell has not been written, the voltage of the reading line is converged to a value obtained from the following equation assuming that the capacity of the bit line is $C_{BIT}$ and the capacity of the reading line is $C_{OUT}$:

$$\frac{C_{BIT} \cdot V_{DD} + C_{OUT} \cdot V_{GND2}}{C_{BIT} + C_{OUT}}$$

In a case where the selection cell has been written and therefore the state in which the insulating film has ben brought into the conductive state, this reading line is connected to the power source $V_{DD}$ while interposing the transistor. Therefore, the voltage of the reading line is converged to $V_{DD}$. The aforesaid difference is used to discriminate whether or not the written cell (bit) has been written. This voltage is detected by the amplifier 1047. As a result, the reading operation is performed. In the writing mode, the time required for the potential of the reading line to be converged to $V_{DD}$ determines the reading speed. The capacity of the bit line and that of the bit line reading line are in proportion to the capacity of the memory. Therefore, a critical factor is the feasibility of driving the large capacity. The SGT fined satisfactorily and exhibiting excellent driving performance according to this embodiment, and in particular, the improved SGT structure will cause a significant effect to be obtained.

The reason why the two levels of the ground potentials are provided to perform the operation according to this embodiment lies in that the breakage of the insulating film must be prevented at the time of the reading operation. That is, the potential difference to be applied to the two end portions of the insulating film at the time of the reading operation is made to be smaller than the difference at the time of the writing operation.

(Manufacturing Method)

Then, a method of manufacturing the semiconductor memory according to Embodiment 8(H) shown in FIGS. 57 to 31 will now be described.

(Manufacturing Method 1)

First, an N-type silicon substrate NSUB having a specific resistance of 0.1 to 1 Ω·cm is subjected to a heat oxidation process, so than a heat oxidation film having a thickness of about 1,000 to 10,000 Å is formed.

Then, the oxide film formed on a portion on which the NMOS is formed is removed by etching and an oxide film having a thickness of about 100 to 500 Å is again formed by the heat oxidation (patterning process for P-well).

While using the oxide film having the thickness of 1,000 to 10,000 Å as a mask, a P-type impurity such as $BF^{+2}$ is ion-injected into a region in which the NMOS will be formed. It is preferable that the concentration of the impurity be 1E13 to 14 $cm^{-2}$.

Then, heat treatment at about 1,000° to 1,100° C. is performed, resulting in a P-well PWL having a diffusion depth of about 1.0 to 1.5 μm to be formed. The oxide film is fully peeled off by using an HF type solution, and a heat oxide film 51 having a thickness of 100 to 500 Å is again formed. Then, a low pressure chemical vapor deposition (LP-CVD) method is used to form an Si3N4 film 52 having a thickness of 500 to 2,000 Å is formed.

Then, the element portion is formed by performing patterning in such a manner that the Si3N4 film and the SiO2 film are removed by etching (a process of patterning for the active region).

Then, the resist film is peeled off, and then the Si substrate is subjected to etching while using the Si3N4 film 52 as the mask. The cross sectional shape of the Si substrate is changed by the etching gas and the pressure and the like. In order to make the shape perpendicular, a low pressure method is effective in general. However, it is in a trade-off relation with the selection ratio or the like. As the etching gas, a Cl2 type gas is used and etching is performed under a pressure of about 1 Pa, so that a rectangular groove is formed.

The state of the substrate thus formed is shown in FIGS. 12, 13 and 14.

Then, the wafer is cleaned with an NH3OH type solution, and a heat oxide film having a thickness of 300 Å or less is formed. This oxide film is again peeled off by an HF type solution. Then, a heat oxide film 53 having a thickness of 50 to 300 Å is again formed, and then an Si3N4 film 54 having a thickness of 500 Å or less is formed by the LP-CVD method. The Si3N4 film 54 is etched back, so that only the Si3N4 film formed in the groove portion is removed. However, the Si3N4 film is left in the S/D contact portion, the etching back be performed by using a parallel and plate type etching device and a CF4 type gas be used under pressure of a level of 1.8 Pa or lower. Then, a resist pattern is used, so that $BF^{+2}$ (in the case of NMOS) type and P-type (N-type such as Al in a case of PMOS) high impurity concentration region (element separated region) 55 or 55' is formed.

Figure 58:
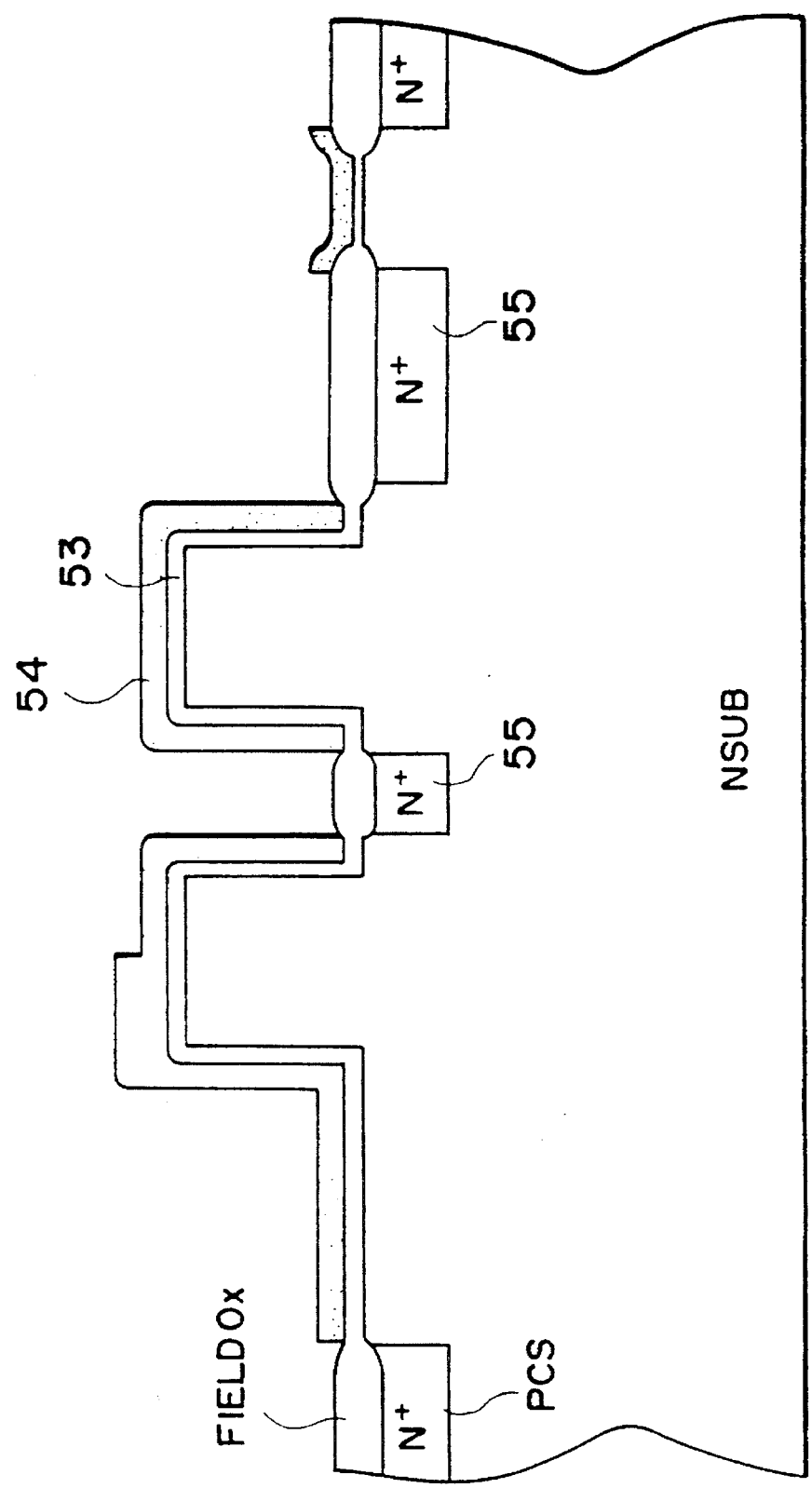
FIG. 58 is a schematic view which illustrates a process of manufacturing a semiconductor device according to the present invention.
Figure 59:
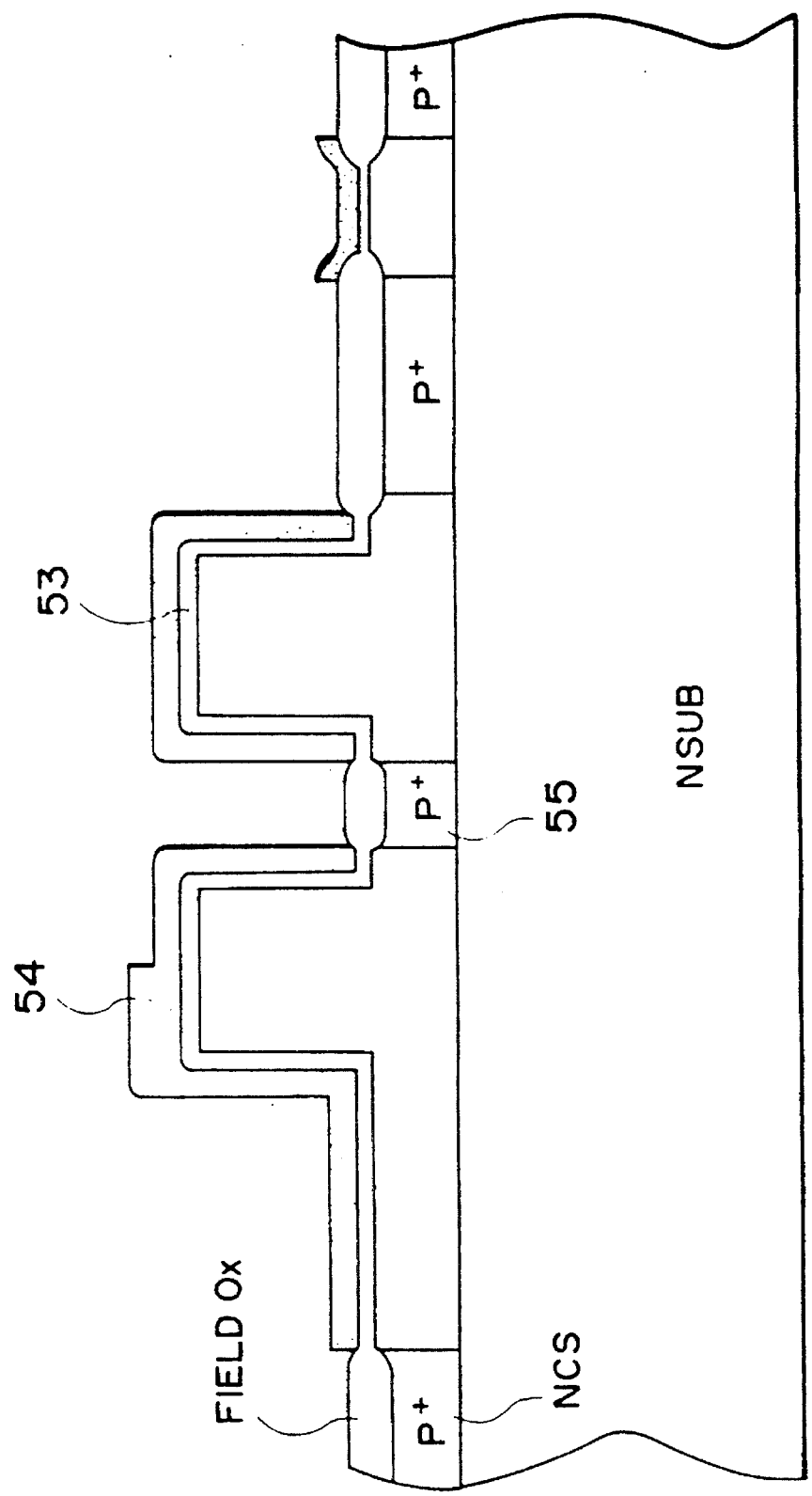
FIG. 59 is a schematic view which illustrates a process of manufacturing a semiconductor device according to the present invention.
Figure 60:
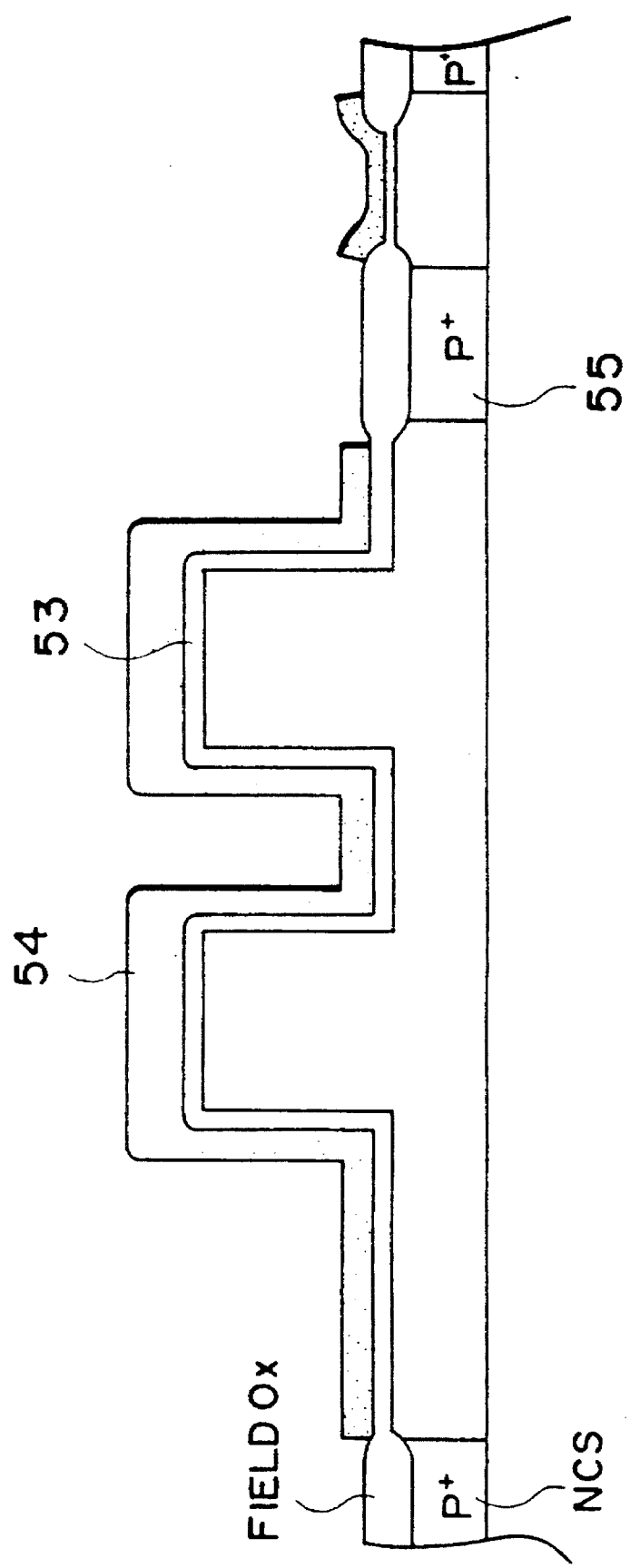
FIG. 60 is a schematic view which illustrates a process of manufacturing a semiconductor device according to the present invention.
Figure 61:
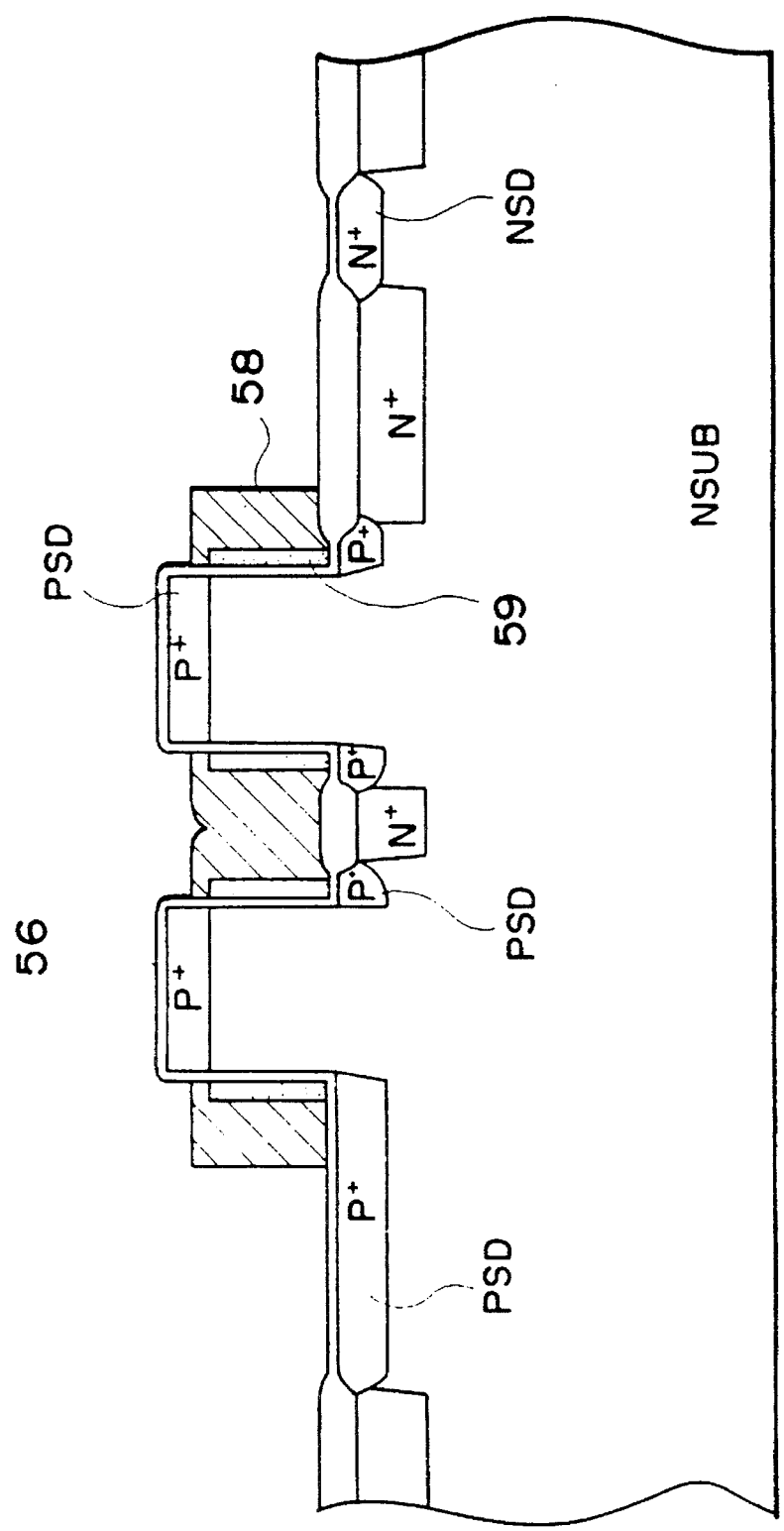
FIG. 61 is a schematic view which illustrates a process of manufacturing a semiconductor device according to the present invention.
Figure 62:
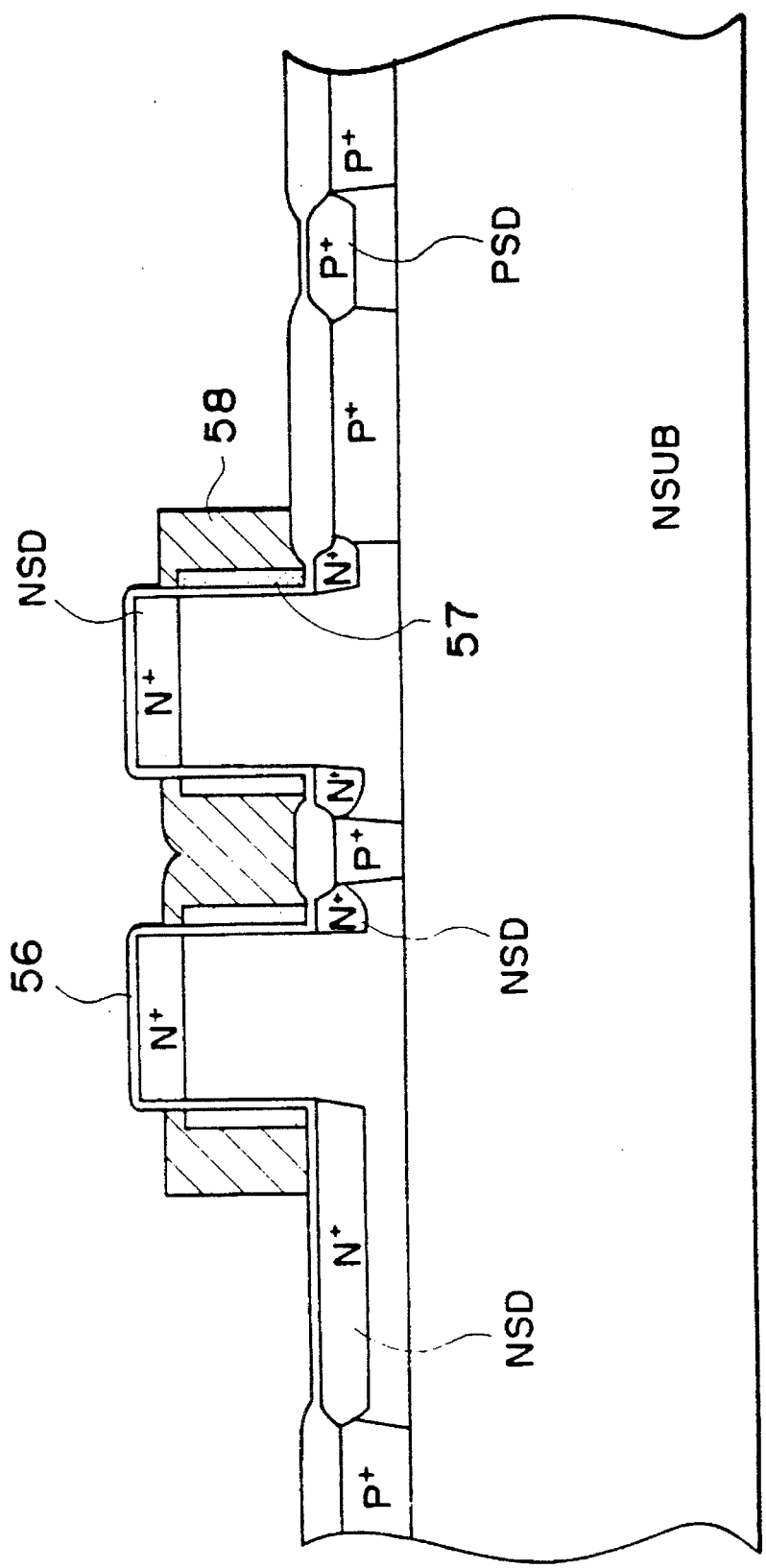
FIG. 62 is a schematic view which illustrates a process of manufacturing a semiconductor device according to the present invention.
Figure 63:
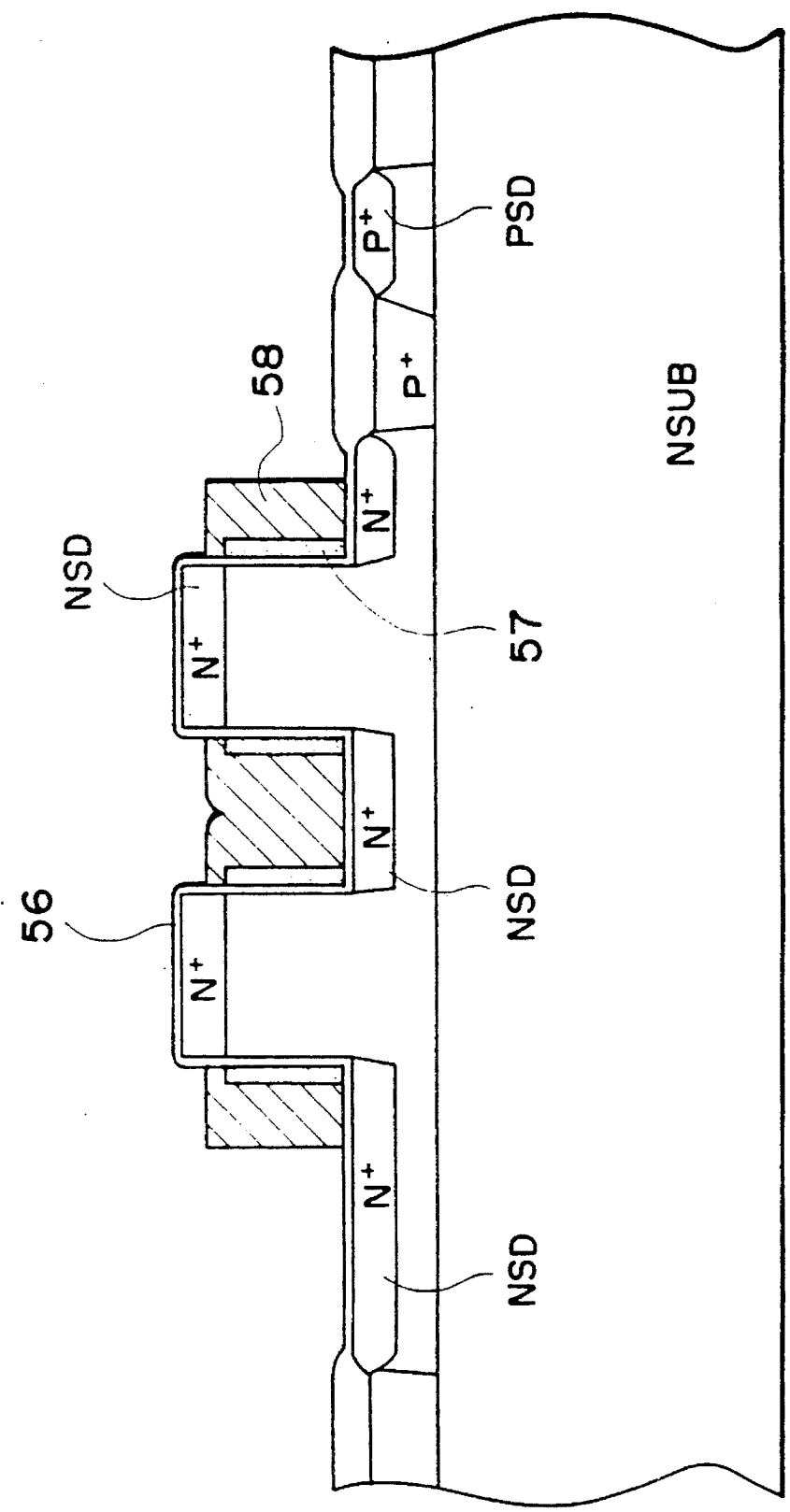
FIG. 63 is a schematic view which illustrates a process of manufacturing a semiconductor device according to the present invention.

It is preferable that the impurity dose quantity be made about 1E14 to 1E15 $cm^{-2}$. Then, the heat oxidation film is formed in only the groove portion. The state of the substrate realized by the aforesaid process is shown in FIGS. 58, 59 and 60.

Then, by using an HF type solution to perform etching slightly, and an H3PO5 type solution is used to peel off the Si3N4 film. Then, only the oxide film formed below the Si3N4 film is etched by using the HF type solution, and a gate oxide film 56 having a thickness of 100 Å or less is formed. Then, a polycrystal silicon is deposited by the LP-CVD method. Then, by etching it back, the polycrystal silicon 57 can be left on only the side wall. Then, resist patterning is performed in accordance with the NMOS or PMOS to be formed, so that an N-type polysilicon gate electrode 57 is formed in a case of the NMOS or a P-type polysilicon gate electrode 59 is formed in a case of the PMOS simultaneously with forming of the source and drain NSD or PSD.

Then, a selection CVD method is used to form a low resistance material 58 on only the gate electrodes 57 and 59.

The method of forming the gate electrode is an essential portion of this embodiment and is arranged in such a manner that etching back (entire-surface etching) is performed while omitting patterning of the gate electrode. As a result, the resistance can be reduced, the NMOS and the PMOS can be individually formed, the work function for the gate electrode can be selected, and the wiring of the circuit for the gate can be completed by the selfalignment manner.

Then, a heat oxide film having a thickness of 500 Å or less is formed, and then oxide silicon serving as an insulating film 60 between layers is deposited by a CVD method such as TEOS exhibiting excellent coating feasibility.

Figure 64:
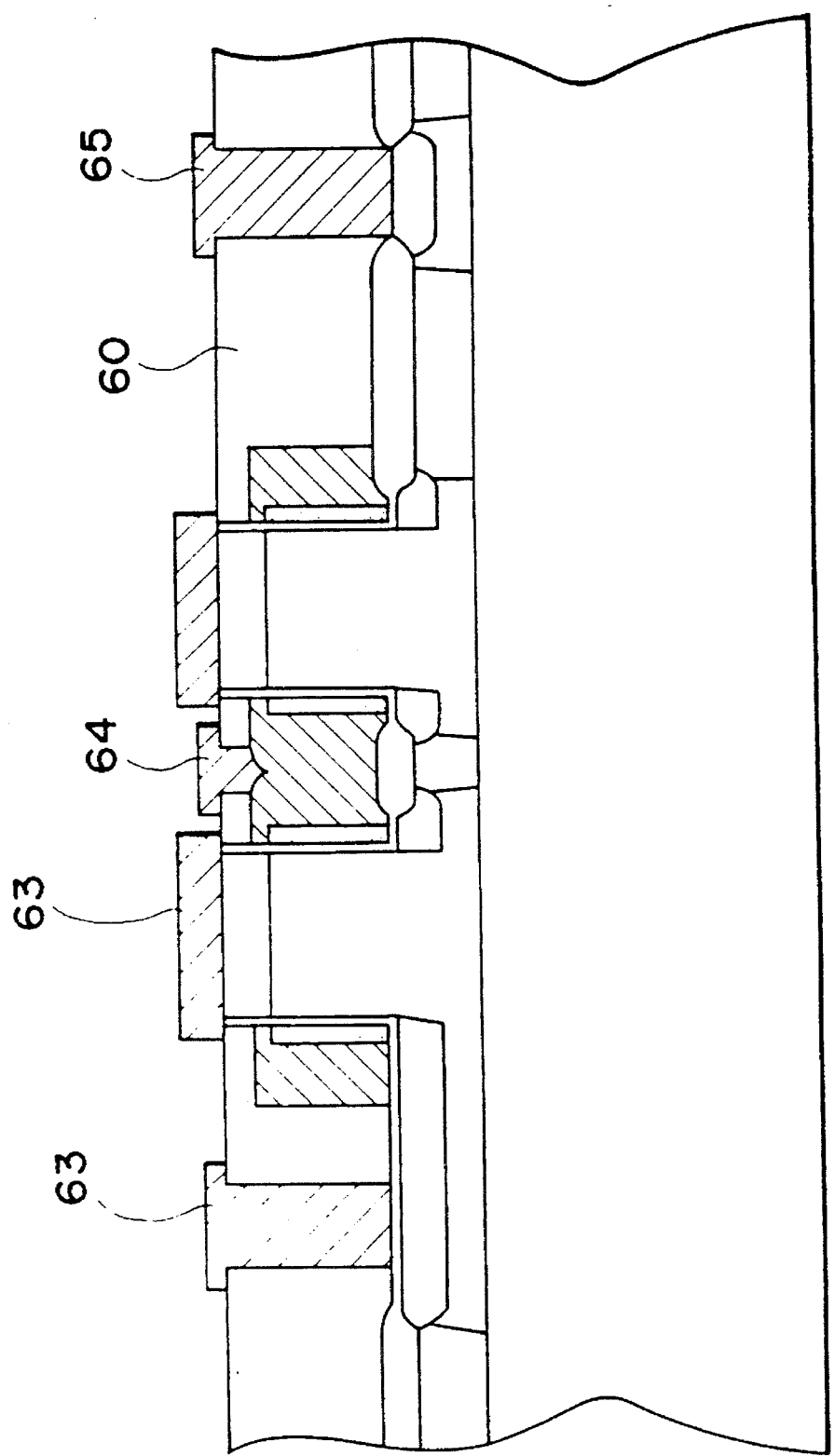
FIG. 64 is a schematic view which illustrates a process of manufacturing a semiconductor device according to the present invention.
Figure 65:
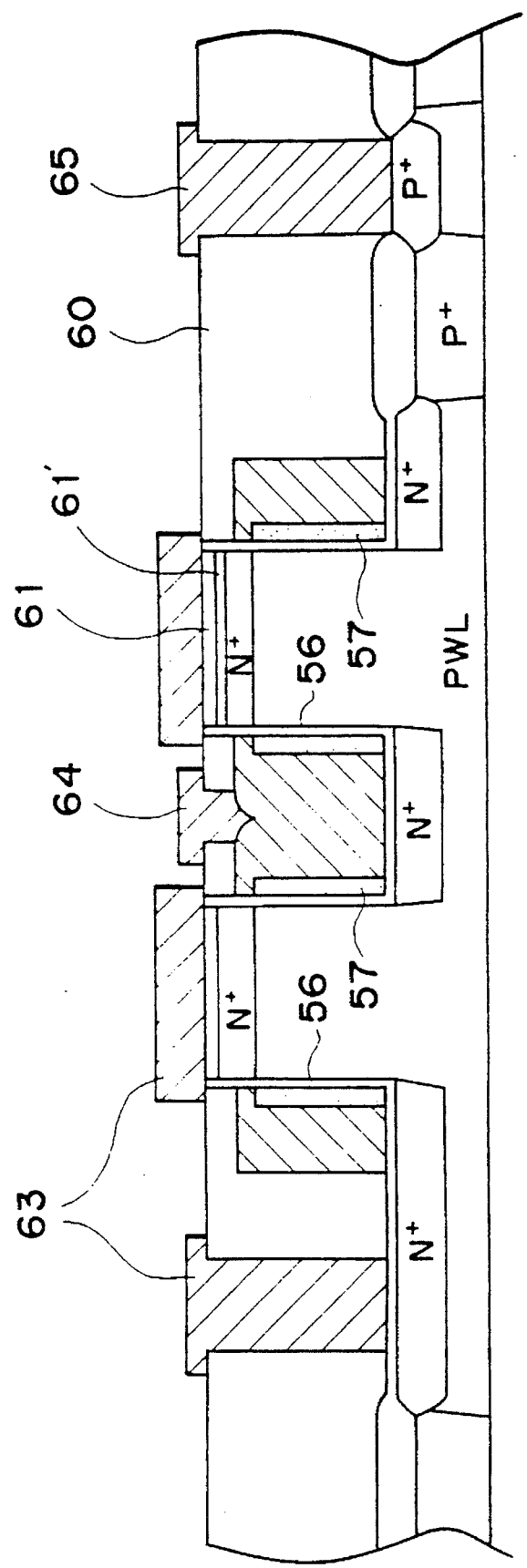
FIG. 65 is a schematic view which illustrates a proceSS of manufacturing a semiconductor device according to the present invention.
Figure 66:
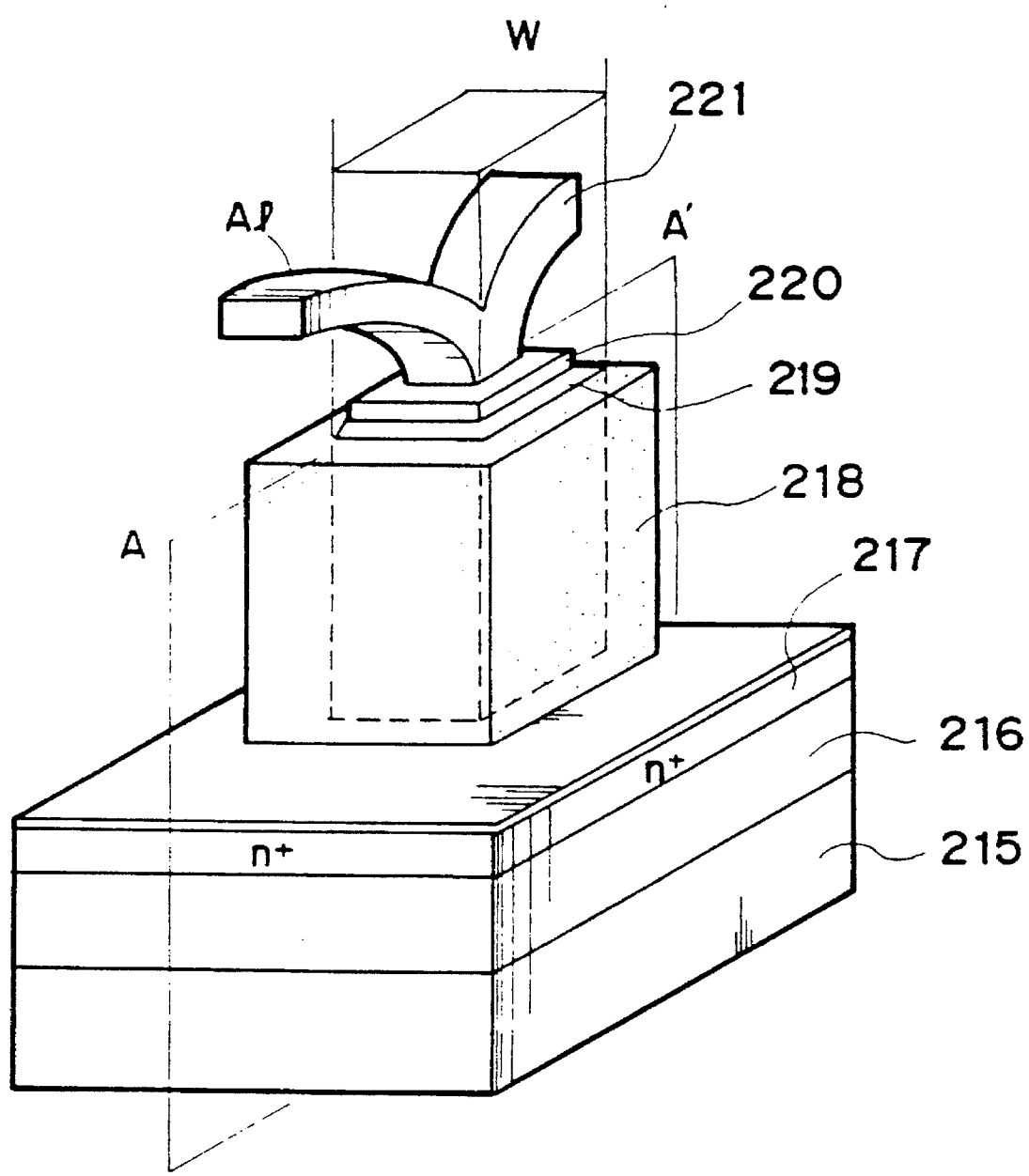
FIG. 66 is a schematic perspective view which illustrates a conventional surrounding gate type transistor (SGT)
Figure 67:
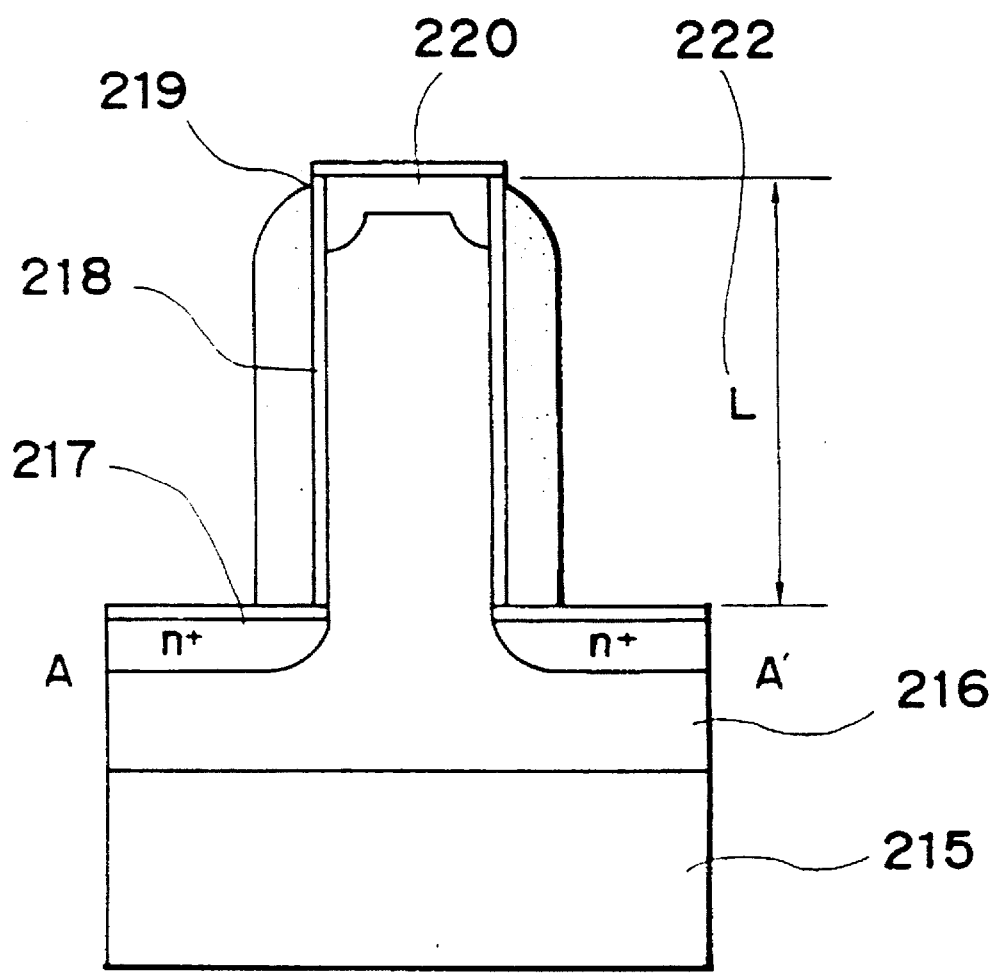
FIG. 67 is a schematic cross sectional view which illustrates the conventional surrounding gate type transistor (SGT)

Then, the oxide silicon is etched, so that the top surface of the columnar semiconductor layer, that is, the source and drain region in the upper portion is caused to appear outside. Then, a barrier metal is formed on the source and drain region NSD of the FET serving as the memory cell and a storage insulating film 61 for constituting a memory element is formed. As the insulating film 61, oxide silicon formed by oxidizing the top surface of the region NSD is exemplified. As an alternative to this, an insulating film made of aluminum oxide, tantalum oxide, or silicon nitride, or the like may be employed. The material and the thickness of the layer are determined so as to be broken with the operating voltage (breakage voltage). Then, a contact hole in the upper source and drain of the NMOS and PMOS is formed. Then, a contact hole for ejecting the gate electrode for the NMOS and PMOS and that for substrate electrode is formed and the conductor is deposited. By patterning this according to a desired wiring shape, a source and drain electrode 64, a gate electrode 64 and a well and substrate electrode 65 are formed as shown in FIGS. 21, 64 and 65.

As described above, the CMOS type semiconductor memory can be manufactured.

(Manufacturing Method 2)

A method of manufacturing a semiconductor memory having a memory cell structure according to Embodiment 2 (H) will now be briefly described with reference to FIGS. 65 to 30. Description will be made here to a process until which the columnar semiconductor layer is formed. The processes corresponding to FIGS. 61, 62, 63, 21, 64 and 65 are arranged to be the same as those according to the manufacturing process according to the aforesaid embodiment.

First, an N-type monocrystal silicon substrate NSUB having a specific resistance of 0.1 to 1 Ω·cm is subjected to a heat oxidation process, so that a heat oxidation film having a thickness of about 1,000 to 10,000 Å is formed.

Then, the oxide film formed on a portion on which the NMOS will be formed is removed by etching and an oxide film having a thickness of about 100 to 500 Å is again formed (patterning process for P-well).

While using the oxide film having the thickness of 1,000 to 10,000 Å as a mask, a P-type impurity such as $BF^{+2}$ is ion-injected, and then, heat treatment at about 1,000° to 1,100° C. is performed, resulting in a P-well PWL having a depth of about 2.0 to 3.0 μm to be formed.

Then, the heat oxide film 71 having a thickness of about 100 to 500 Å is formed, and the Si3N4 film 72 having a thickness of about 500 to 2000 Å is formed by the LP-CVD method. The processes to the aforesaid stage are shown in FIGS. 24 and 25. The aforesaid processes are the same as those of the manufacturing processes according to the aforesaid embodiment, but the difference lies in the following processes. A region in which the NMOS will be formed is subjected to a high-energy $p^+$ ion injection operation with a voltage level of 300 KeV to 1 MeV by using a resist mask RM.

As a result, the range (Rp) becomes about 1 to 2 μm and thereby the drain region 73 according to this embodiment is formed as an embedded layer of an $N^+$ type semiconductor displaying a dose quantity of $10^{14}$ to $10^{15}$ cm$^{-2}$. On the aforesaid portion, the P-type region which becomes the channel portion of the NMOSSGT is left (see FIG. 27). Similarly, the PMOSSGT is formed by injecting $B^+$ ion while giving high energy into the substrate NSUB, so that the embedded layer 74 made of $p^-$ type semiconductor is formed (see FIG. 26).

Then, patterning for forming the SGT portion is performed, so that Si3N4 and SiO2 are removed by etching (a process of patterning for the active region).

Then, the resist film is peeled off, and then the Si substrate is subjected to etching while using the Si3N4 film 72 as the mask. According to the aforesaid embodiment, the depth of the etched portion becomes substantially the same as the gate length of the SGT. Therefore, a severe accuracy is required in this process. However, according to this embodiment, the channel gate length is determined since the embedded layer is formed. Therefore, by stopping etching in the aforesaid embedded layer, the gate length can be equalized satisfactorily. The aforesaid processes are shown in FIGS. 28 and 29.

Similarly to the aforesaid embodiment, the gate insulating film 80 is then formed, and the channel stops 75 and 76 for insulating the element and the field insulating film are formed by the selective oxidation method while using a silicon nitride film 81 as a mask. The aforesaid processes are shown in FIGS. 30 and 31.

The present invention is not limited to the aforesaid various embodiments. The present invention includes various combinations and modifications by substituting each technical elements hereinafter.

Embodiment 1(B)

Figure 68A:
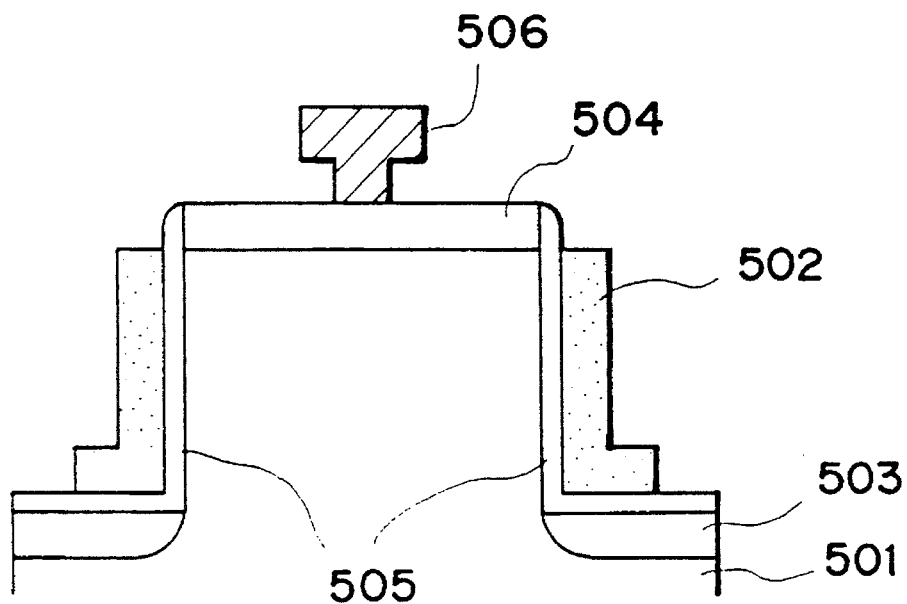
FIGS. 68A and 68B are schematic views which illustrate Embodiment 1(B) of the present invention.
Figure 68B:
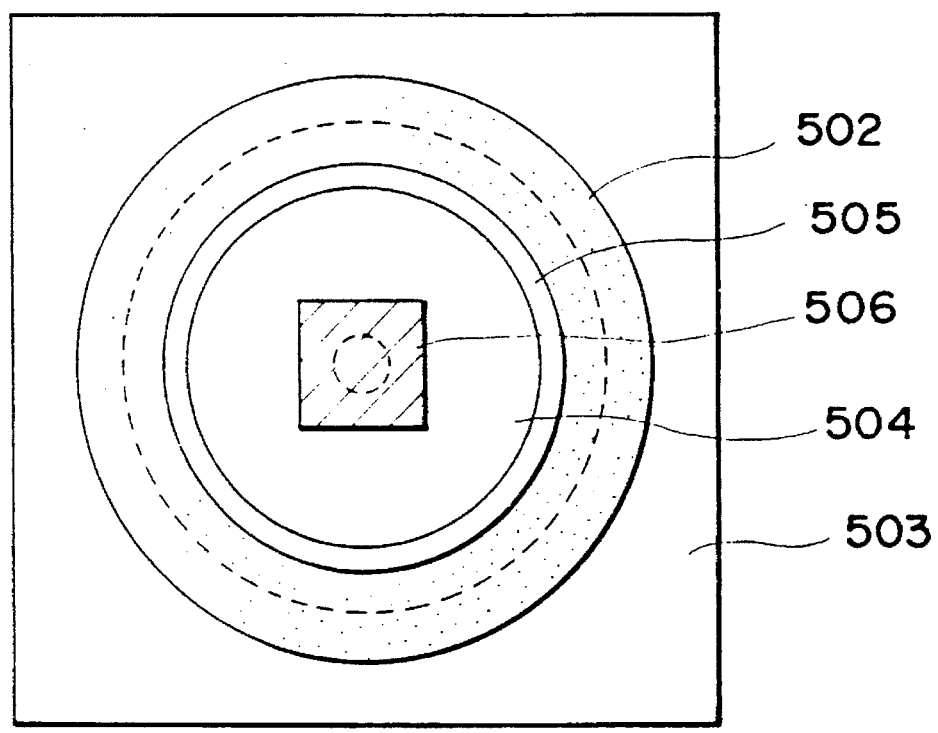

FIG. 68 illustrates Embodiment 1(B).

Referring to FIG. 68, reference numeral 501 represents a P- or N-type semiconductor substrate.

Reference numeral 502 represents a MOSFET gate electrode made of metal such as polysilicon, al, Mo, or W, or the like.

Reference numeral 503 and 504 represent high-concentration N or P layers serving as the source-drain region.

Reference numeral 505 represents a gate oxidation film and 506 represents a source ejecting electrode.

The channel region, the gate insulating film 219 and the gate electrode 218 are formed into circular shapes in order to prevent forming edges.

Figure 69:
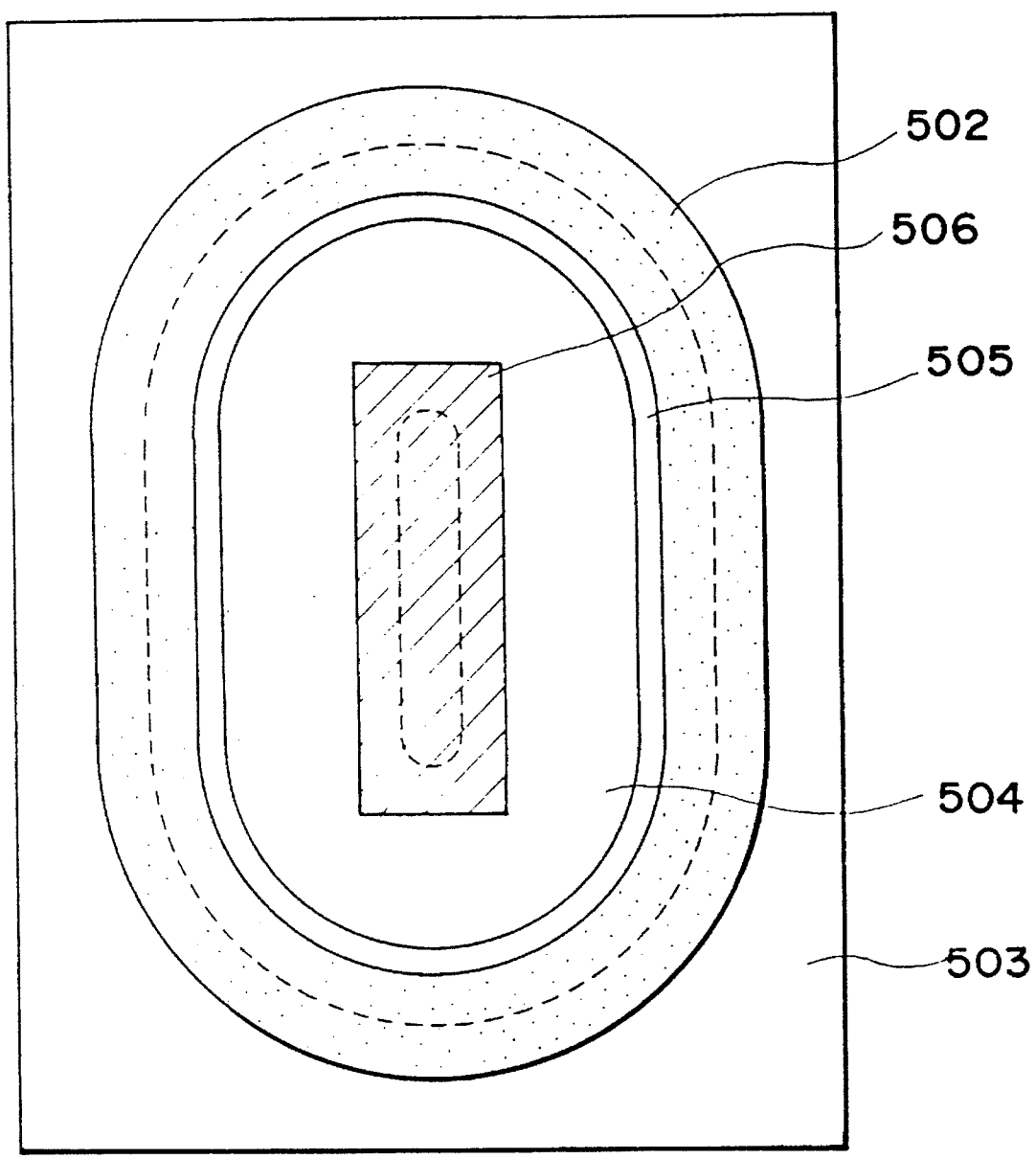
FIG. 69 is a schematic view which illustrates Embodiment 2(B) of the present invention.

FIG. 69 is a top view which illustrates Embodiment 2 (B) of the present invention. By forming the SGT cell into an elliptic shape, the gate width w can be changed while eliminating the necessity of enlarging the radius of the circular portion and thereby an effect can be obtained in that the design freedom can be improved.

Figures 70A, 70B:
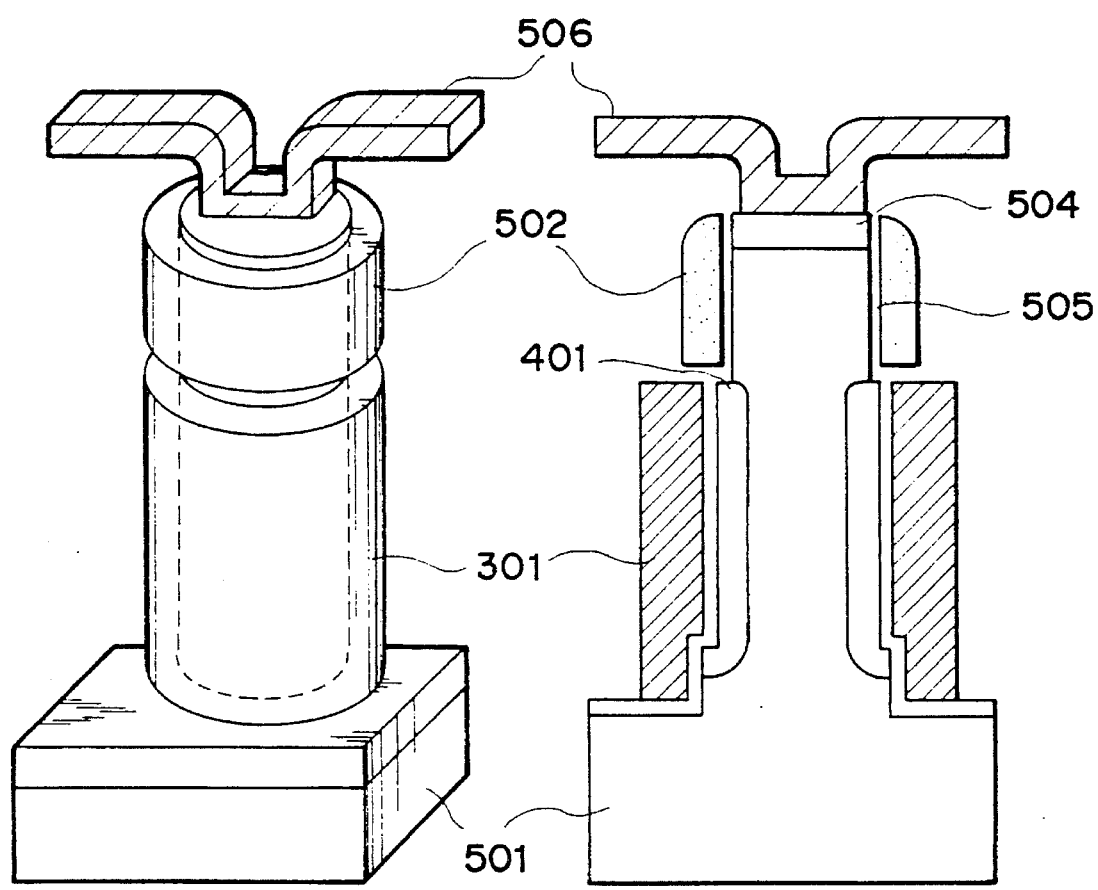
FIGS. 70A and 70B are schematic views which illustrate Embodiment 3(B) of the present invention.

Then, Embodiment 3(B) of the present invention will now be described with reference to FIG. 70. FIG. 70A illustrates an example in which the present invention is applied to a dynamic RAM and FIG. 70B is a cross section of this example. The same elements as those according to the embodiment shown in FIG. 68 are given the same reference numerals and their descriptions are omitted here.

A strage node 401 and a field node 301 are formed below the SGT. Both of the SGT and the capacitor are formed into a cylindrical shapes. As for the circuit structure, the gate 502 of the SGT is connected to the word line. By selecting the word line, information in the capacitor is read out into to the bit line 506.

Figure 71A:
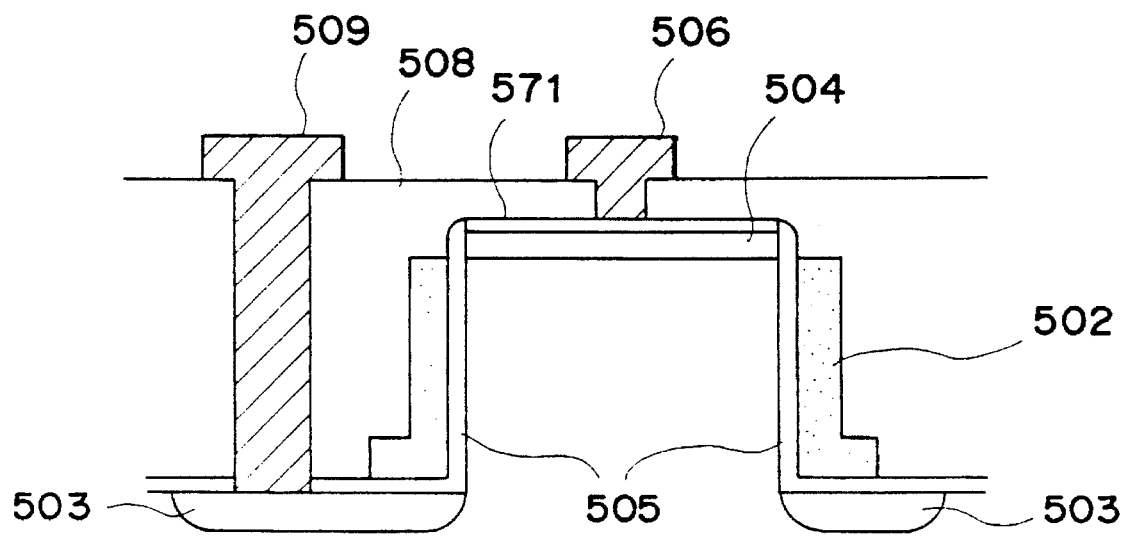
FIGS. 71A and 71B are schematic views which illustrate Embodiment 4(B) of the present invention.
Figure 71B:
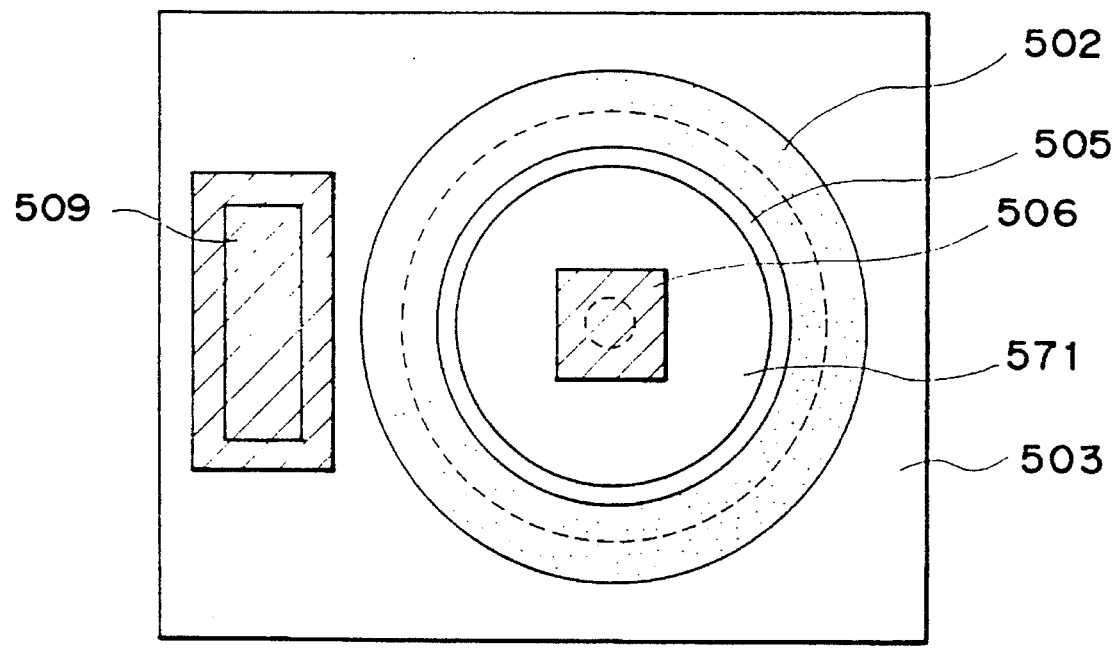

FIGS. 71A and 71B respectively are cross sectional shape and a top view of Embodiment 4(B) of the present invention. The same elements as those shown in FIG. 68 are given the same reference numerals and their descriptions are omitted here.

This embodiment is an example of an application of the present invention to a permanent information storing memory. Reference numeral 571 represents a pn junction formed between the source layer 4 of the SGT and the bit line 506, the pn junction being used to determine whether or not the memory is conductive. Reference numeral 509 represents a drain ejecting electrode and 508 represents an insulating film between layers.

Furthermore, a similar effect can be obtained from a memory the conduction state of which is determined by breaking/not breaking the insulating film in place of the pn junction.

By using the memory cell having a transistor which can be easily fined and which exhibits excellent current driving performance and by making the gate of this transistor to be the word line and by forming a semiconductor memory connected to the bit line on the source region of this transistor while interposing the insulating film between layers. As a result, a single-permanent-write enabled semiconductor memory exhibiting reduced error rate and having high density and high speed read/write characteristics can be realized.

Figures 45A, 45B:
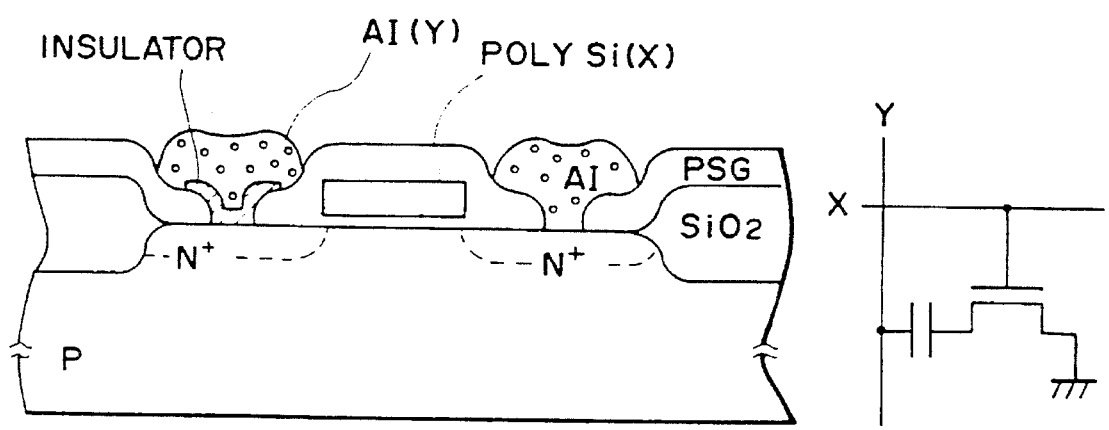
FIGS. 45A and 45B are schematic views which illustrate a conventional memory.
Figure 46:
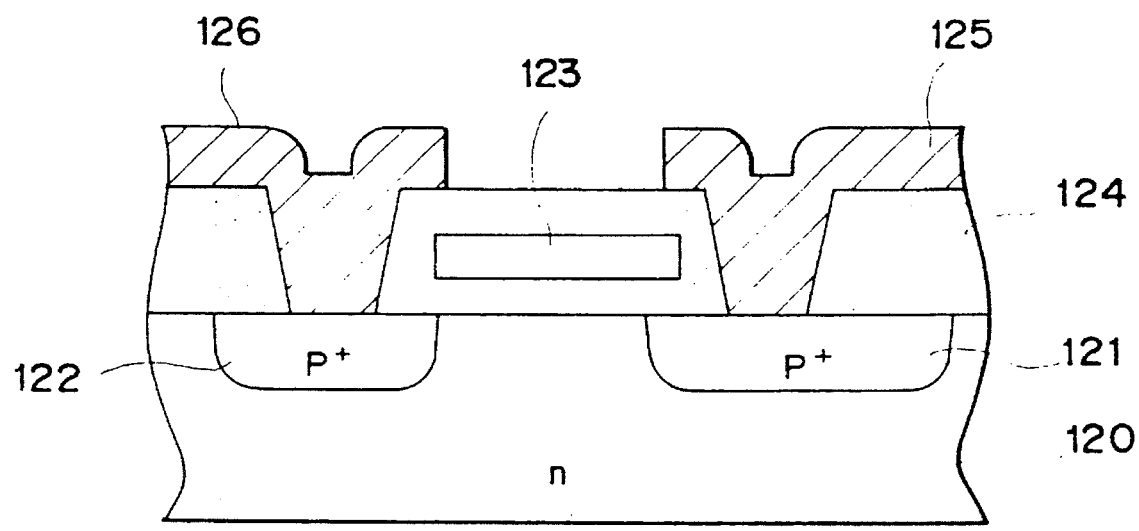
FIG. 46 is a schematic view which illustrates a conventional memory.

The aforesaid Embodiments 1(B), 2(B), 3(B) and 4(B) are used as the addressing transistor or a cell in the circuit shown in FIGS. 8, 44 and 45.

The aforesaid manufacturing methods according to Embodiments 1(B) to 4(B) are the same as those shown in FIGS. 12 to 23 except for a fact that the shape of the mask is changed in order to curve the edge portion of the side surface.

Embodiment 1(C)

Figure 72:
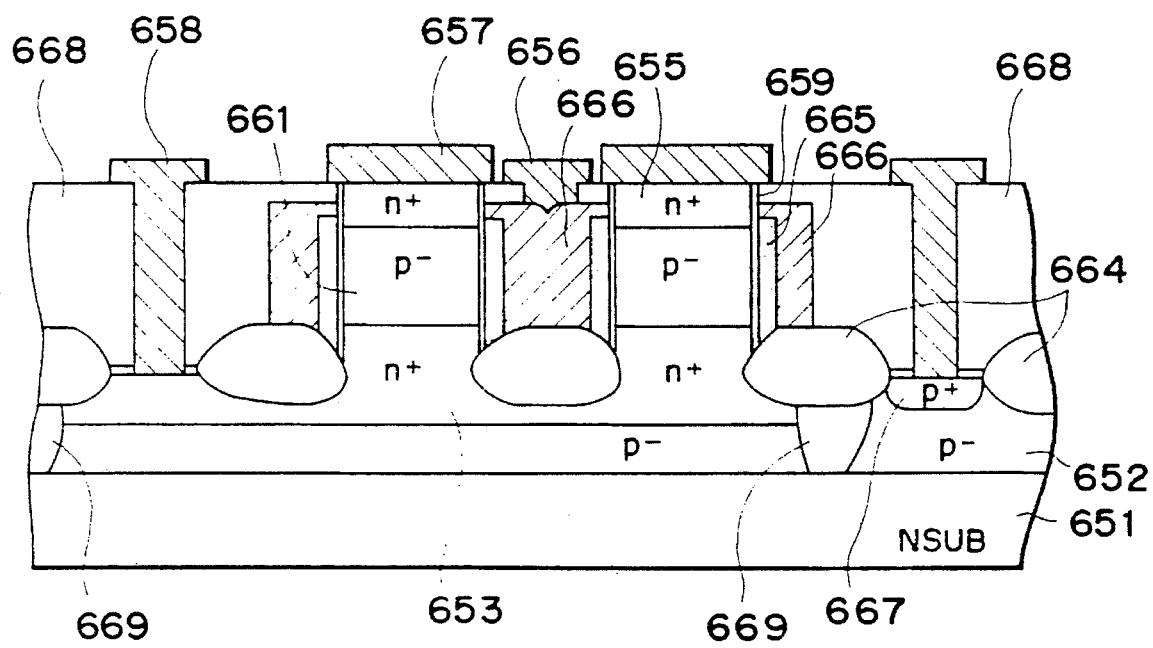
FIG. 72 is a cross sectional view which illustrates the structure of Embodiment 1(C) of the present invention.
Figure 73:
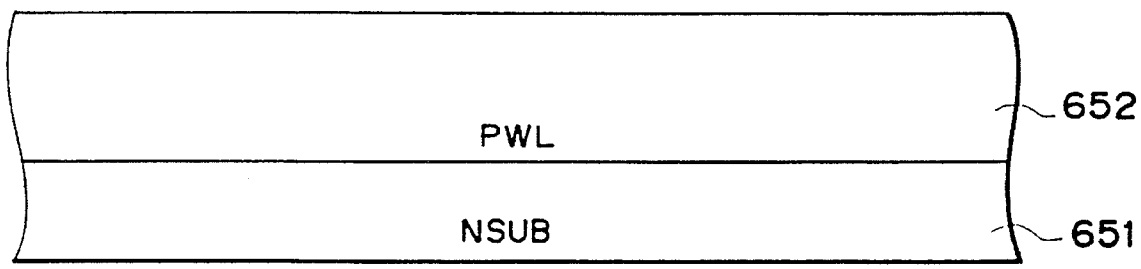
FIG. 73 is a cross sectional view which illustrates a manufacturing process according to Embodiment 1(C) of the present invention.

Embodiment 1(C) of the present invention will be described with reference to the drawings. FIG. 72 is a cross sectional view which illustrates a surrounding gate type (hereinafter called an "SGT type") N-MOS Tr according to Embodiment 1(C).

Referring to FIG. 72, reference numeral 651 represents a N-type Si substrate, 652 represents a P$^-$ layer, 653 represents a drain N$^+$ layer of the NMOS, 655 represents a source N$^+$ layer of the N-MOS, 656 represents an Al electrode for ejecting the gate, 657 represents a source ejecting Al electrode, 658 represents drain ejecting Al electrode, 659 represents a gate oxide film, 661 represents a P$^-$ Epi layer, 664 represents a field oxide film, 665 represents a gate electrode made of polysilicon, 666 represents a selection CVD metal film (Al, Mo, or W, or the like), 667 represents a P$^+$ layer for taking a contact with the substrate, 668 represents a CVD insulating film and 669 represents a P-type impurity region for separating the element.

The essential portion of this embodiment lies in a fact that the field oxide film 664 which is thicker than the gate oxide film 659 is formed just below the gate electrode 665. As a result, the gate source capacity of this transistor can be reduced.

Then, a method of forming the N-MOS according to the present invention will now be described with reference to a flow chart of the process shown in FIGS. 73 to 78.

First, an N-type silicon substrate 651 having a specific resistance of 0.1 to 1 Ω·cm is subjected to a heat oxidation process, so that a heat oxidation film (omitted from illustration) having a thickness of about 1,000 to 10,000 Å is formed.

Then, the oxide film formed on a portion on which the NMOS will be formed is removed by etching and an oxide film (omitted from illustration) having a thickness of about 100 to 500 Å is again formed.

While using the aforesaid oxide film as a mask, a P-type impurity such as BF$_2{}^+$ is ion-injected into a region in which the N-MOS will be formed. The concentration of the impurity is about 1E13 to 14 cm$^{-2}$.

Then, heat treatment at about 1,000° to 1,100° C. is performed, resulting in a diffusion depth of about 1.0 to 1.5 μm to be formed.

The surface oxide film is fully peeled off by using an HF type solution. In order to form the N-MOS drain region 653, resist patterning is performed and As ions are injected. The concentration of the impurity is about 5E15 to 5E16 cm$^{-2}$.

Figure 74:
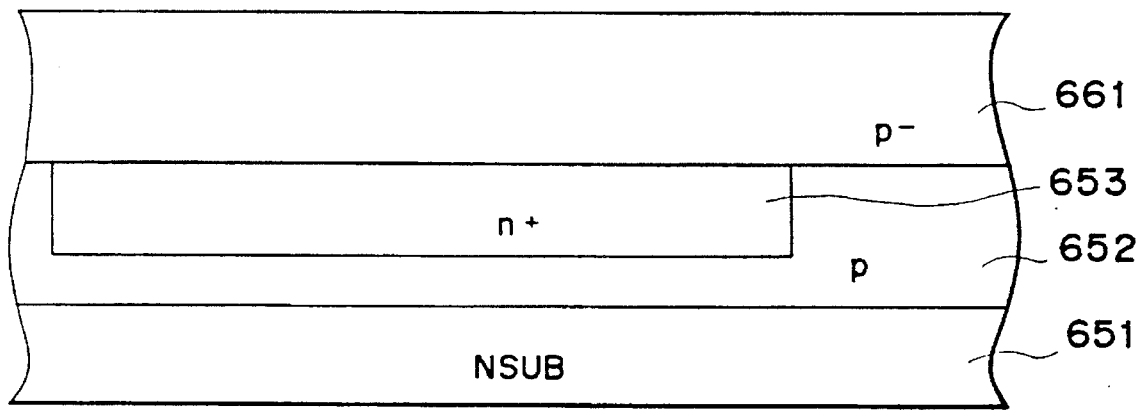
FIG. 74 is a cross sectional view which illustrates the manufacturing process according to Embodiment 1(C) of the present invention.
Figure 75:
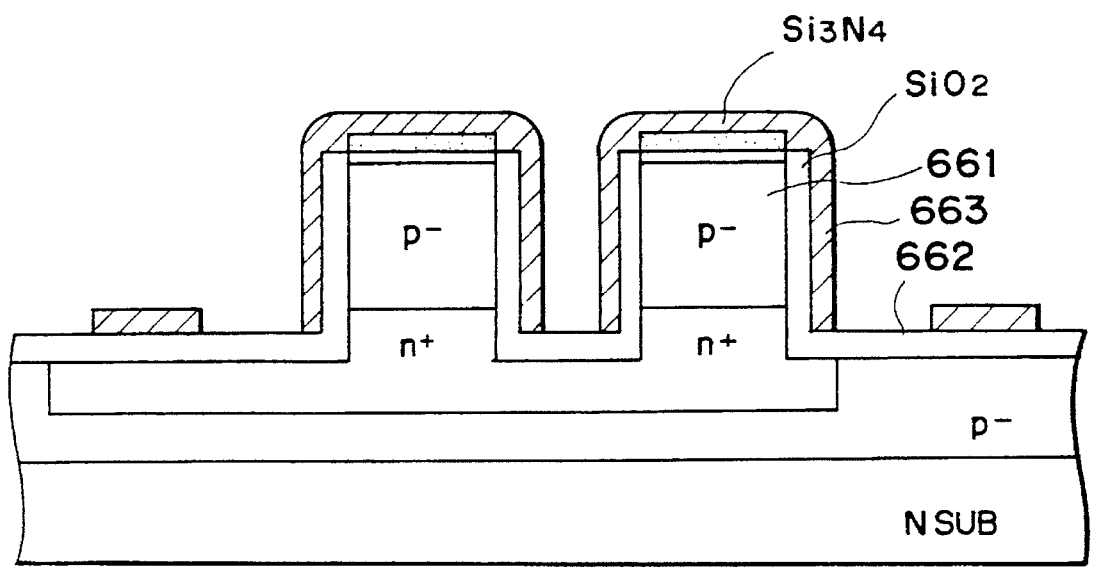
FIG. 75 is a cross sectional view which illustrates the manufacturing process according to Embodiment 1(C) of the present invention.
Figure 76:
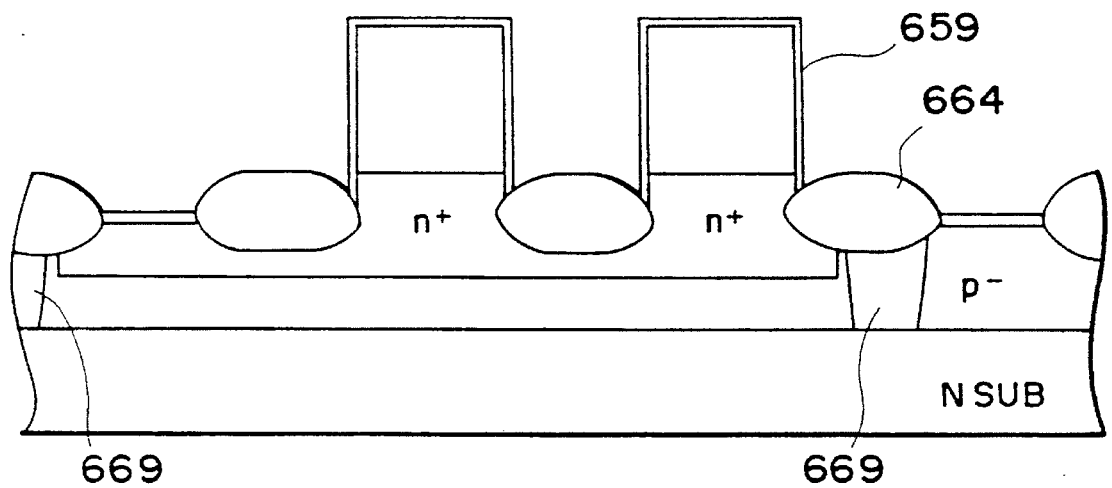
FIG. 76 is a cross sectional view which illustrates the manufacturing process according to Embodiment 1(C) of the present invention.
Figure 77:
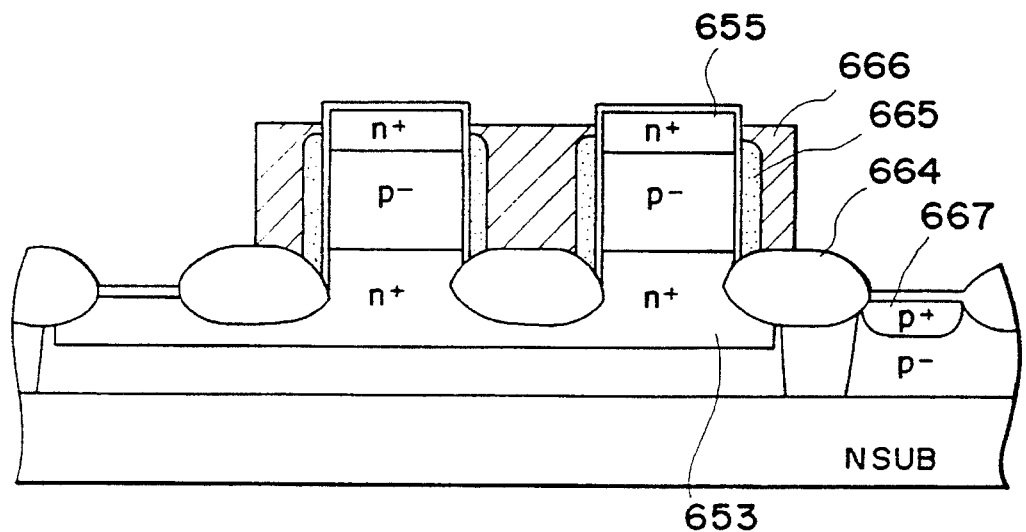
FIG. 77 is a cross sectional view which illustrates the manufacturing process according to Embodiment 1(C) of the present invention.
Figure 78:
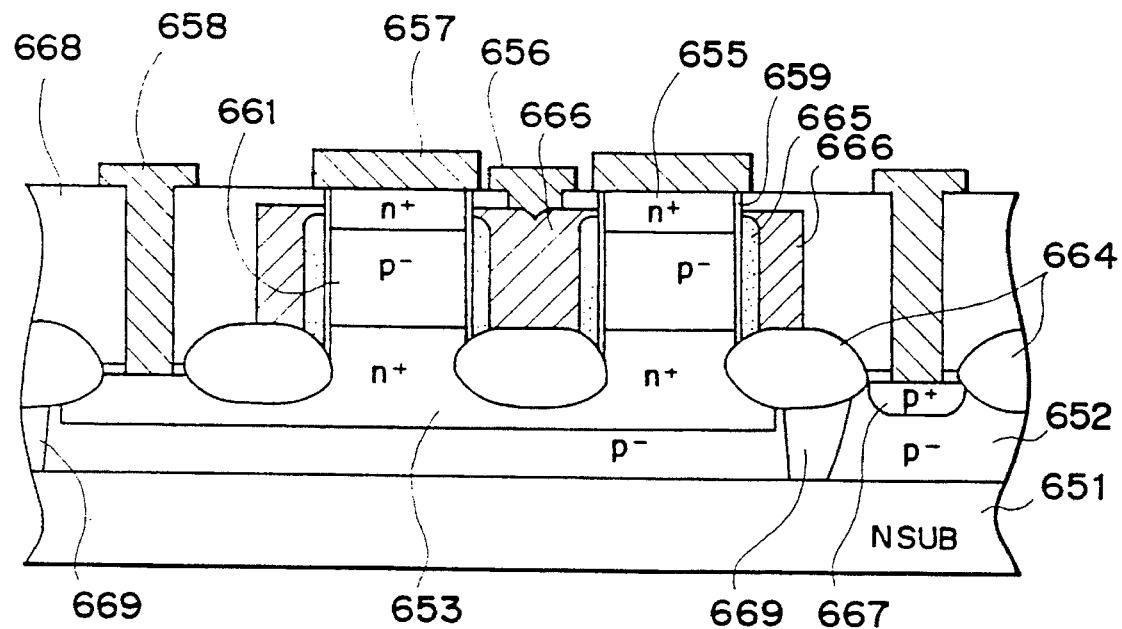
FIG. 78 is a cross sectional view which illustrates the manufacturing process according to Embodiment 1(C) of the present invention.

Then, the surface oxide film is fully peeled off by using an HF type solution and the P$^-$ layer 661 having a thickness of about 0.5 μm is formed by low temperature epitaxial growth (FIG. 74).

Then, the heat oxide film having a thickness of 100 to 500 Å is again formed. Then, the LP-CVD method is used to form an Si3N4 film having a thickness of 500 to 2,000 Å.

Then, the element portion is formed by performing patterning in such a manner that the Si3N4 film and the SiO2 film are removed by etching. Then, the resist film is peeled off, and then the Si substrate is subjected to etching while using the Si3N4 film as the mask. The cross sectional shape of the Si substrate is changed by the etching gas and the pressure and the like. In order to make the shape perpendicular, a low pressure method is effective in general. However, it is in a trade-off relation with the selection ratio or the like. As the etching gas, a Cl type gas is used and etching is performed under a pressure of about 0.5 to 5 Pa, so that a rectangular groove is formed.

Then, the wafer is cleaned with an NH4OH type solution, and a heat oxide film having a thickness of 300 Å or less is formed. This oxide film is again peeled off by an HF type solution.

Then, a heat oxide film having a thickness of 500 to 2000 Å is again formed, and then an Si3N4 film having a thickness of 500 Å to 1500 Å is formed by the LP-CVD method. The Si3N4 film is etched by forming a resist pattern in the source contact region and the substrate contact region of the NMOS according to this embodiment. The projection portion of the element region is covered with the Si3N4 film and required portions are left by the resist. The most critical factor is to form the heat oxide film having the thickness of 500 to 2,000 Å. As a result, the thickness of the field oxide film to be formed at the time of oxidizing the field can be arbitrary thicken (see FIG. 75).

Then, a resist pattern is used, so that BF$^{+2}$ type and P-type impurity region (element separated region) 669 is formed. The impurity concentration is made about 1E14 to 1E15 cm$^{-2}$.

Then, the filed is oxidized to realize a thickness of 2,000 to 8,000 Å.

Then, by using an HF type solution to perform etching slightly, and an H3PO5 type solution is used to peel off the Si3N4 film. Then, only the oxide film formed below the Si3N4 film is etched by using the HF type solution, and a gate oxide film having a thickness of 150 Å or less is formed (see FIG. 76).

Then, a polycrystal silicon is formed by the LP-CVD method. Then, by etching it back, the polycrystal silicon can be left on only the side wall of the columnar semiconductor layer.

Then, resist patterning is performed in accordance with the N-MOS or P-MOS to be formed, so that an N-type poly gate electrode is formed in a case of the NMOS or a P-type poly gate electrode is formed in a case of the PMOS simultaneously with forming of the source and drain.

Then, the gate polysilicon 665 is subject to the selection CVD method to form a low resistance material on only the gate electrode 65. According to this process, etching back is performed while omitting patterning of the gate electrode. As a result, the resistance can be reduced, the NMOS and the PMOS can be individually formed, the work function for the gate electrode can be selected, and the wiring of the circuit for the gate can be completed by the selfalignment manner (see FIG. 77).

Then, a heat oxide film having a thickness of 500 Å or less is formed, and a CVD method such as TEOS exhibiting excellent coating feasibility is performed, so that the insulating film between the layers is formed. Then, the oxide silicon is etched back, so that only the top surface of the columnar NOS is caused to appear outside. Then, opening for contact from the gate electrode, source and drain and the substrate is formed and wiring is arranged, so that the N-NOS Tr having the SGT structure is formed (see FIG. 78).

According to this embodiment, the N-NOS Tr is described. However, the P-NOS Tr can be formed by the similar process while considering the conduction type. Therefore, its description is omitted here.

The essential portion of this embodiment lies in that the field oxide film 664 is formed just below the gate electrode 665. As a result, the capacity of the gate and source of the transistor can be reduced.

Embodiment 2(C)

Embodiment 2(C) will now be described with reference to FIG. 79.

Figure 79:
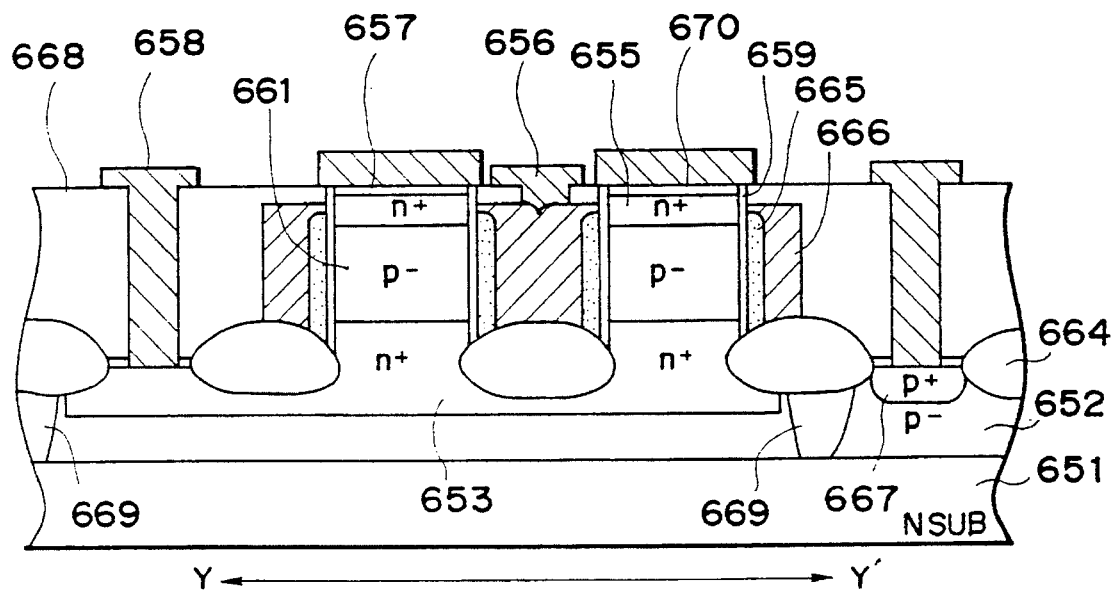
FIG. 79 is a cross sectional view which illustrates a manufacturing process according to Embodiment 2(C) of the present invention.

FIG. 79 illustrates this embodiment in which the present invention is applied to a memory having a MOS Tr+ zener diode. Referring to FIG. 79, the same elements as those according to Embodiment 1(C) are given the same reference numerals and their descriptions are omitted here.

Referring to FIG. 79, reference numeral 670 represents a P⁺ region formed on the N-MOS Tr source region according to Embodiment 1(C) and serving as an anode of the PN diode. Reference numeral 655 represents a source region of the N-MOS Tr source region and serving as a cathode of the PN diode.

Figure 81:
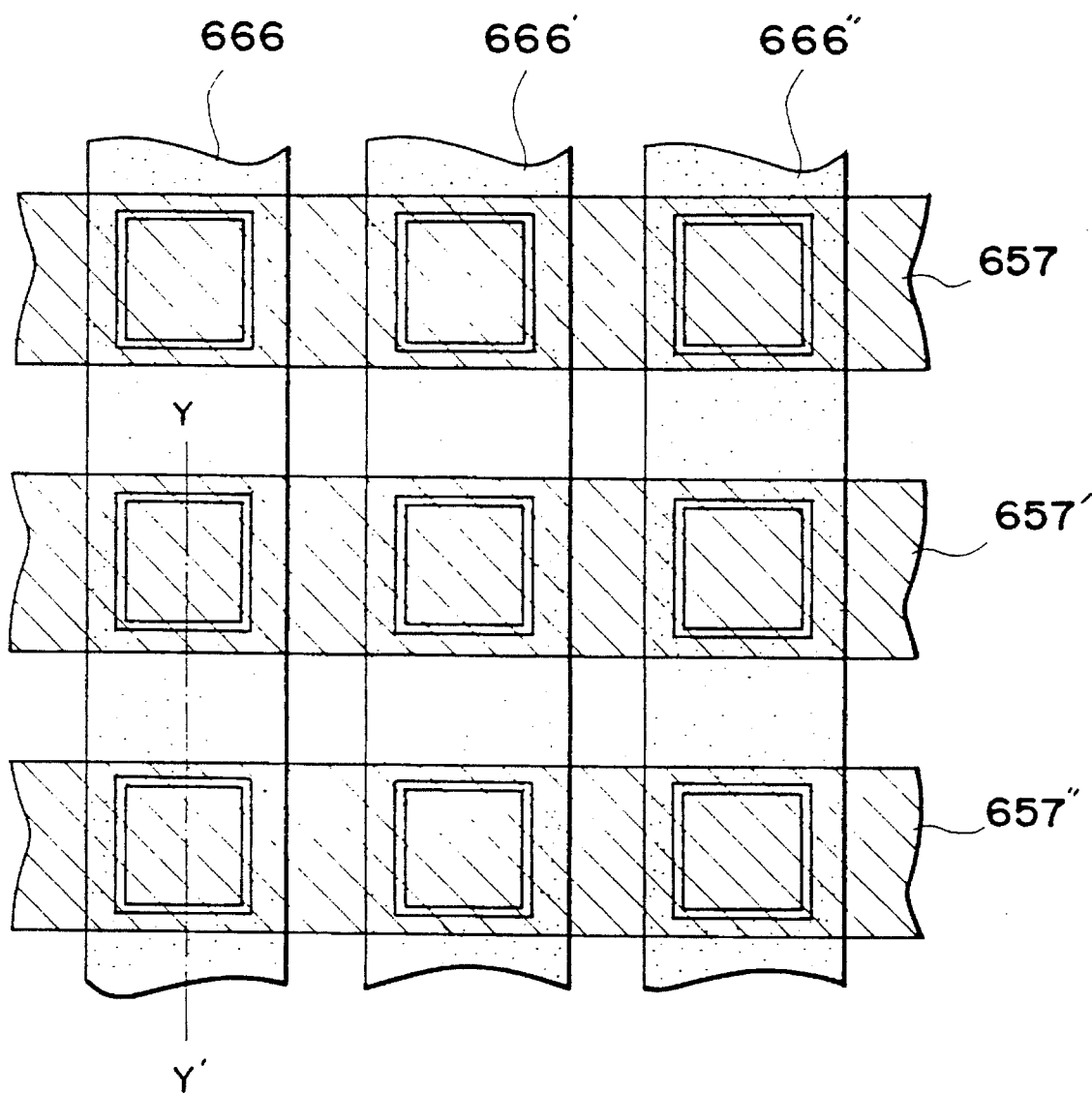
FIG. 81 is a plan view which illustrates Embodiments 2 (C) and 3 (C)
Figure 82:
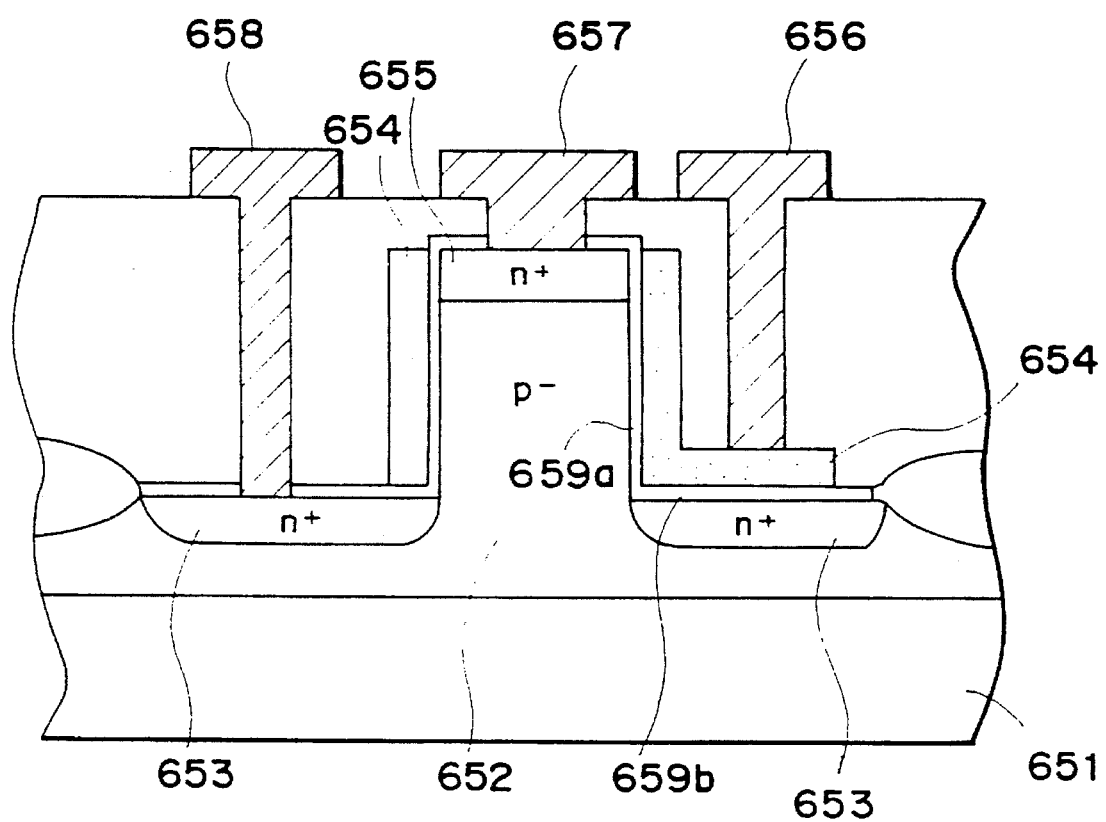
FIG. 82 is a cross sectional view which illustrates a conventional example.

FIG. 81 is a plan view which illustrates a pattern layout of this memory. Line Y-Y' shown in FIG. 79 corresponds to line Y-Y' shown in FIG. 81. Referring to FIG. 81, reference numerals 666, 666' and 666" represent word lines and 657, 657' and 657" represent bit lines.

Since the way of operation and storing method of the memory device according to the aforesaid embodiments are the same as those of the structure shown in FIG. 44 and therefore their descriptions are omitted here.

Since the thickness of the field oxide film 664 shown in FIG. 79 is made to be a thick film having a thickness of 2,000 to 8,000 Å according to this embodiment, the gate source capacity can be reduced and operation speed of the memory can be raised.

Embodiment 3(C)

Then, Embodiment 3(C) according to the present invention will now be described.

Figure 80:
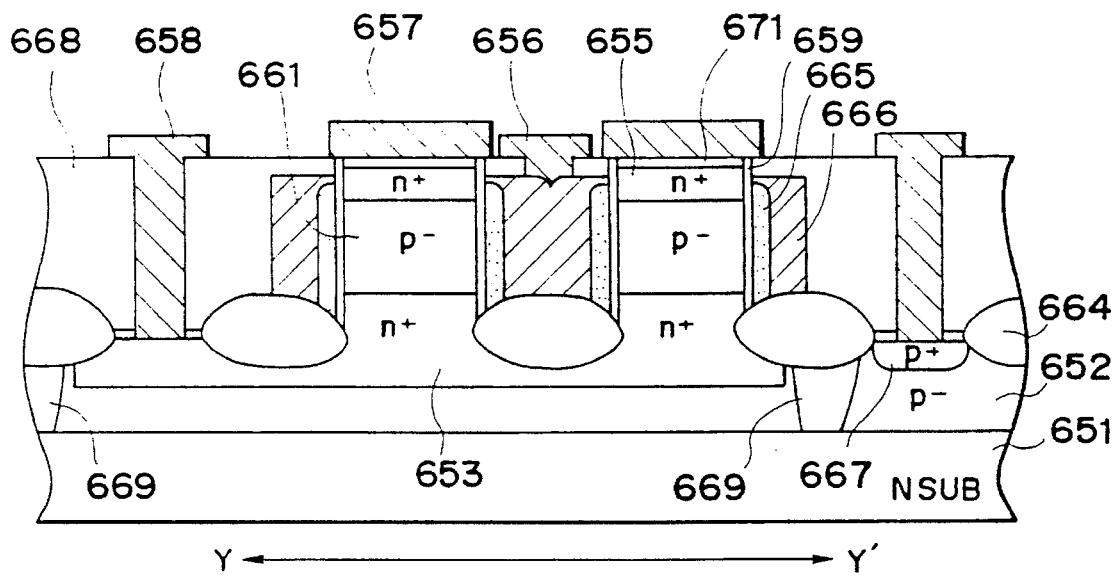
FIG. 80 is a cross sectional view which illustrates a manufacturing process according to Embodiment 3(C) of the present invention.

FIG. 80 is a cross sectional view which illustrates the structure of this embodiment in which the pn junction of the memory portion according to Embodiment 2(C) is placed by an insulating film. Also referring to FIG. 80, the same elements as those according to Embodiment 1(C) shown in FIG. 72 are given the same reference numerals.

The memory according to this embodiment is arranged to utilize the breakage of the insulating film in place of the breakage of the pn junction according to Embodiment 2(C).

According to this embodiment, reference numeral 655 represents a source region of the N-MOS, 657 represents an insulating film for the memory. The insulating film is a heat oxide film, or a CVD oxide film, or the like. The operation is the same as that according to Embodiment 2(C) and also the pattern layout is the same as that shown in FIG. 81. The operation method is the same as that shown in FIG. 8 and FIG. 55.

Also according to this embodiment, the thickness of the field oxide film 664 shown in FIG. 80 is thickened to 2,000 to 8,000 Å. Therefore, the gate source capacity can be reduced and operation speed of the memory can be raised.

Embodiment 1(D)

Figure 83A:
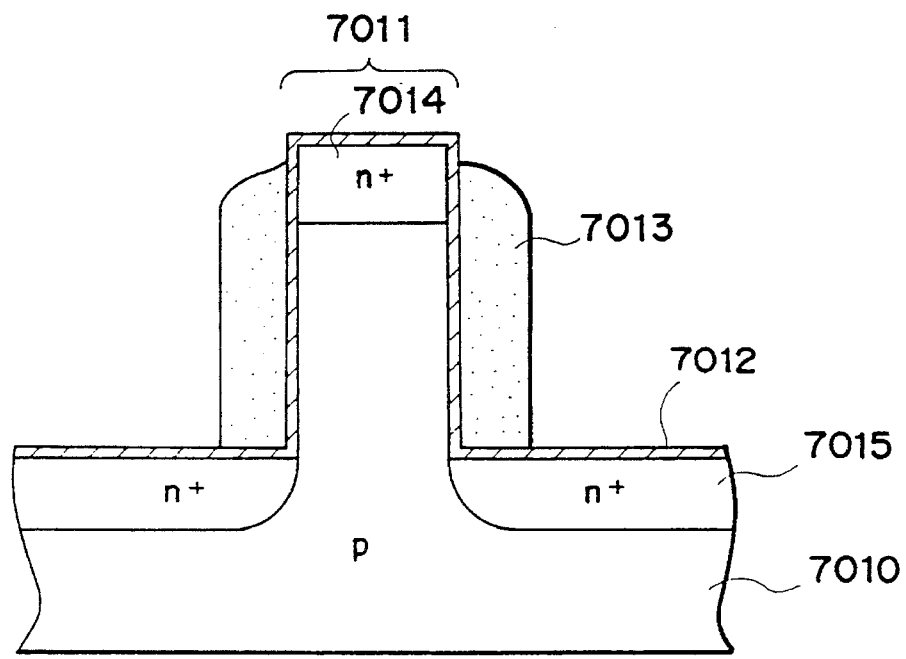
FIGS. 83A and 83B are cross sectional views which illustrate a process of manufacturing a vertical NMOS transistor according to Embodiment 1(D) of the present invention.
Figure 83B:
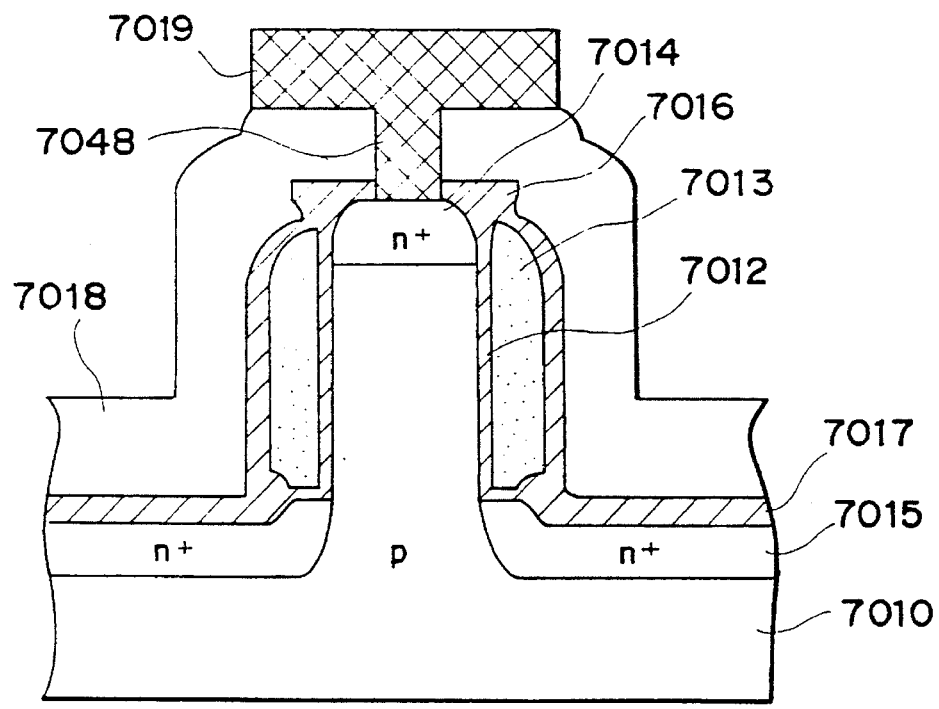

Embodiment 1(D) is an application of the present invention to the process of manufacturing the vertical n-type MOS transistor as shown in FIGS. 83A and 83B.

A p-type layer 7010 obtained by doping and diffusing a p-type layer in a p-type silicon substrate or an n-type silicon substrate is subjected to anisotropic etching by 1 μm or less while leaving a portion. As a result, a columnar silicon 7011 which includes the transistor will be built in is formed.

Then, heat oxidation by 50 Å is performed, so that a gate oxide film 9012 is formed. Then, the polysilicon is removed by the anisotropic etching until the polysilicon on the top surface of the columnar silicon is completely removed. As a result of this process, a gate polysilicon 7013 as a gate electrode surrounding the columnar silicon is formed.

Then arsenic ions are injected by 5E15 (cm$^{-2}$) and then heat treatment at 900° C. is performed for 20 minutes, so that n⁺ type source layer 7014 and n⁺ type drain layer 7015 in which ions are activated are formed (see FIG. 83A).

Then, a manufacturing method according to the present invention is applied. That is, heat treatment at 850° C. is performed for about 10 minutes in a gas containing O2, for example, a gas arranged to be H2:O2=2:3 (volume ratio). As a result, the oxide film formed on the n⁺ drain 7015 is thicken and also the surface of the gate polysilicon electrode 7013 is oxidized. Furthermore, a portion of the oxide film which surrounds the n+ source region 7014 and which is not covered with the polysilicon gate electrode 7013 is thickened. According to this embodiment, the thickness of the oxide film on the top surface of the columnar silicon 7011 becomes about 200 Å.

Then, a CVD oxide film is deposited by about 3000 Å on the entire surface so that an insulating film 7018 is formed. Then, a contact hole 7048 is formed and an Al electrode 7019 is formed, so that a structure shown in FIG. 83B is formed.

According to Embodiment 1D of the present invention, the following improvements can be realized as compared with the conventional structure:

(1) The voltage resistance between the gate and the source was improved to 20 to 30V from the conventional level of 5 V.

(2) The capacity between the gate and the source was reduced from 2.2 fF to 0.5 fF.

(3) The deterioration in the yield due to an excessive leak current between the gate and the source can be significantly prevented.

Embodiment 2(D)

Figure 84:
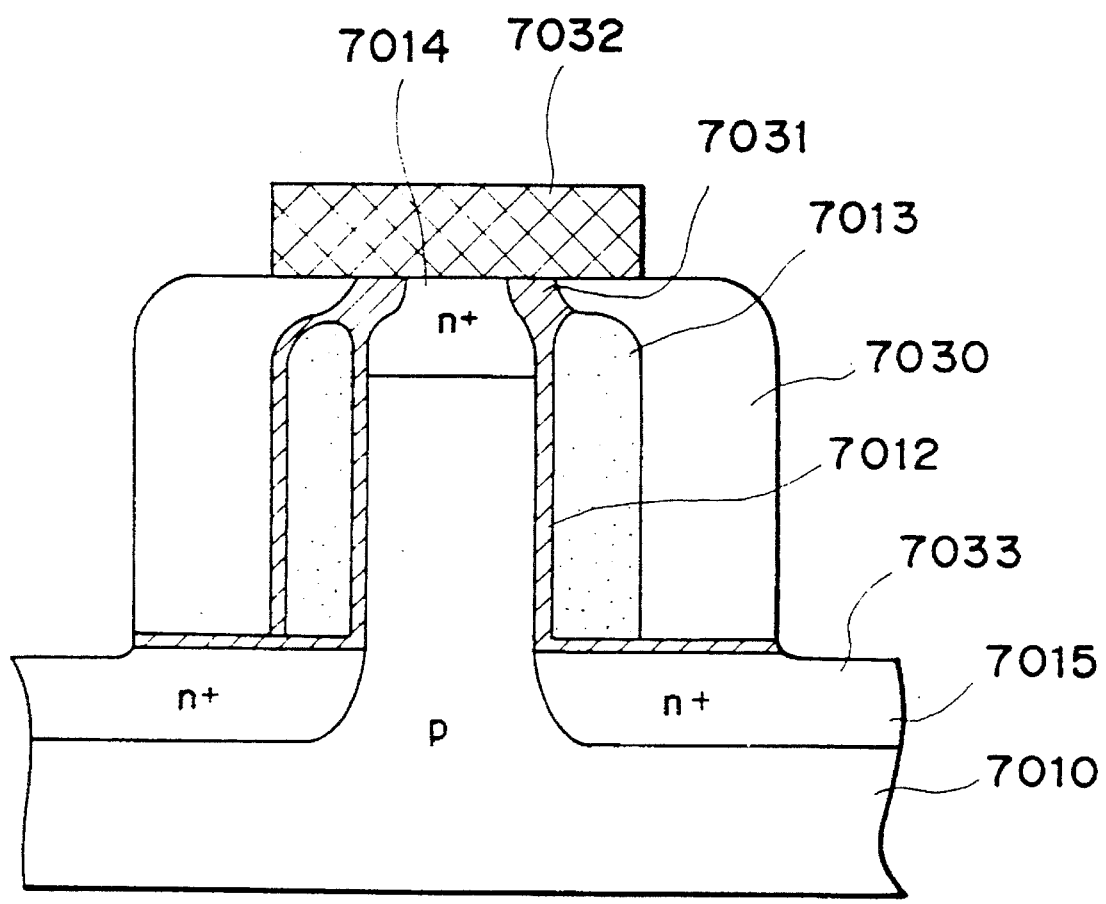
FIG. 84 is a cross sectional view which illustrates a process of manufacturing a vertical NMOS transistor according to Embodiment 2(D) of the present invention.

Embodiment 2(D) is arranged in such a manner that the present invention is applied to the method of manufacturing the vertical type MOS transistor in a way different from Embodiment 1(D) as shown in FIGS. 83A and 84. The manufacturing processes to that shown in FIG. 83A are the same as those according to Embodiment 1D. Then, processes to a state shown in FIG. 84 will now be described.

In a state shown in FIG. 83A, a CVD silicon oxide film having a thickness of 3,500 Å is deposited. Then, anisotropic etching is performed by using a mixture gas composed of CF4 and SF4 until the top surface of the columnar silicon appears. As a result, an oxide film 7030 is left in such a manner that it surrounds the polysilicon.

Then, the manufacturing method according to the present invention is applied. That is, heat treatment at 850° C. is performed in a gas arranged to be H2:O2=2:3 to oxidize the exposed surface of the silicon layer.

Then, the oxide film on the top surface of the columnar silicon is removed by a mixture gas composed of CH4 and SF6. According to this embodiment, the oxide film has a thickness of 200 Å. By etching thus performed, also the oxide film in the portion of the top surface of the n+ drain region 7015 which is not covered with the CVD SiO2 7030 is removed.

Furthermore, the gate oxide film 7031 adjacent to the top surface of the columnar silicon is thickened (to 230 Å or less).

Then, an Al electrode 7032 is formed, so that the source electrode is formed (see FIG. 84).

The vertical type transistor according to this embodiment 1D caused the following improvements to be realized as compared with the conventional structure:

(1) The voltage resistance between the gate and the source was improved to 15 to 20 V from the conventional level of 5 V.

(2) The capacity between the gate and the source was reduced from 2.2 fF to 1.2 fF.

(3) The defect of the element due to the leak between the source and the gate can be substantially eliminated.

Although the effects obtainable from this embodiment is not so significant as compared with those obtainable from Embodiment 1D, the necessity of performing patterning the contact hole and the etching process can be eliminated. Therefore, the area (the surface of the n+ silicon layer) for connecting the Al electrode and the n+ source layer can be reduced. In other words, the contact area between the Al electrode and the n+ silicon can be enlarged assuming that the columnar silicon has the same size, so that the contact resistance can be reduced.

Embodiment 3(D)

A manufacturing method according to Embodiment 3(D) of the present invention will now be described with reference to FIGS. 83A and 85.

Figure 85:
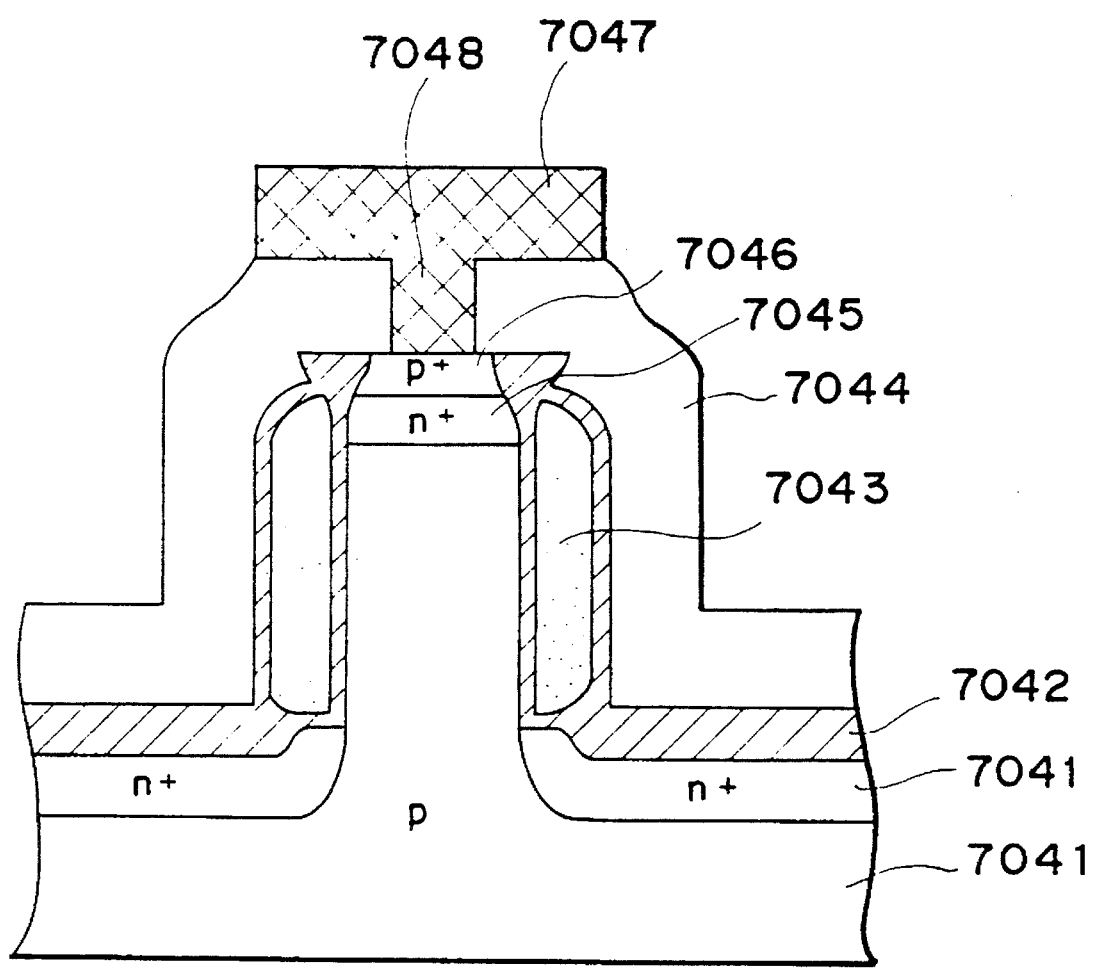
FIG. 85 is a cross sectional view which illustrates junction breakdown type storage device according to Embodiment 3(D) of the present invention.
Figure 86:
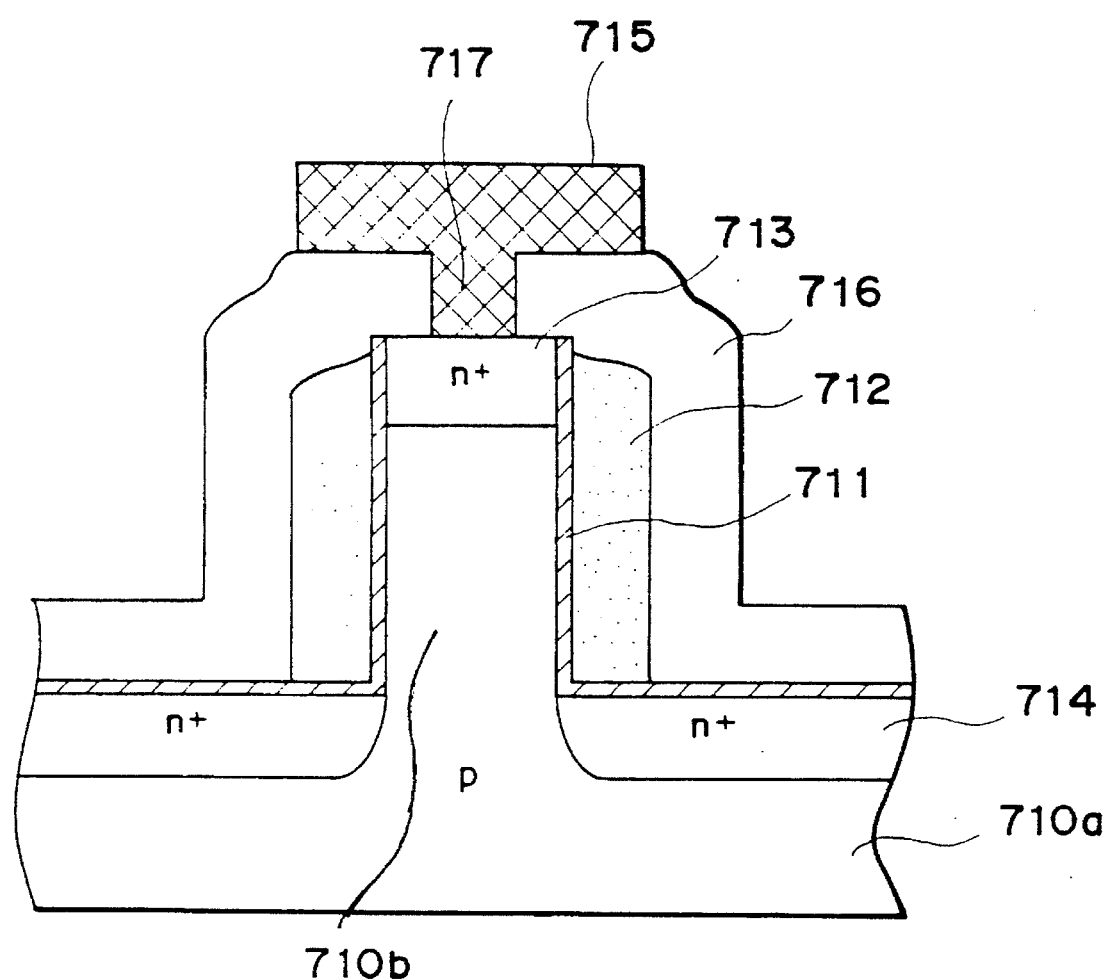
FIG. 86 is a cross sectional view which illustrates a vertical NMOS manufactured by a conventional manufacturing method.

This embodiment is arranged in such a manner that the present invention is applied to a memory transistor of a junction breaking type memory element shown in FIG. 85.

The processes from forming the structure shown in FIG. 83A to the process in which the contact hole 7048 is formed are the same as Embodiment 1(D).

According to this embodiment, the contact hole 7048 is formed, and then BF2+ ions are injected by 1E16 (cm$^{-2}$) so that a p+ type layer 7046 is formed.

Then, Al is deposited and is subjected to patterning, so that an Al electrode 7047 is formed (see FIG. 85).

As a result of the application of the present invention, the following effects were obtained according to the present invention:

(1) The voltage resistance between the n+ gate or p+ gate and the source was improved to 20 to 30 V from the conventional level of 5 V.

(2) The leak current between the n+ gates or the p+ gates can be significantly prevented.

(3) The capacity between the n+ gates was reduced from 2.2 fF to 0.3 fF.

Although embodiments 1(D) to 3(D) were described about the NMOS, PMOS can be similarly manufactured by inverting the polarity of the electrode and the conduction type of the semiconductor. Furthermore, both the PMOS and the NMOS can be formed on the same substrate by performing proper patterning and masking. In addition, the memory cell according to Embodiment 3(D) can be manufactured on the same substrate on which the PMOS and the NMOS are formed.

Embodiment 1(E)

Figure 87:
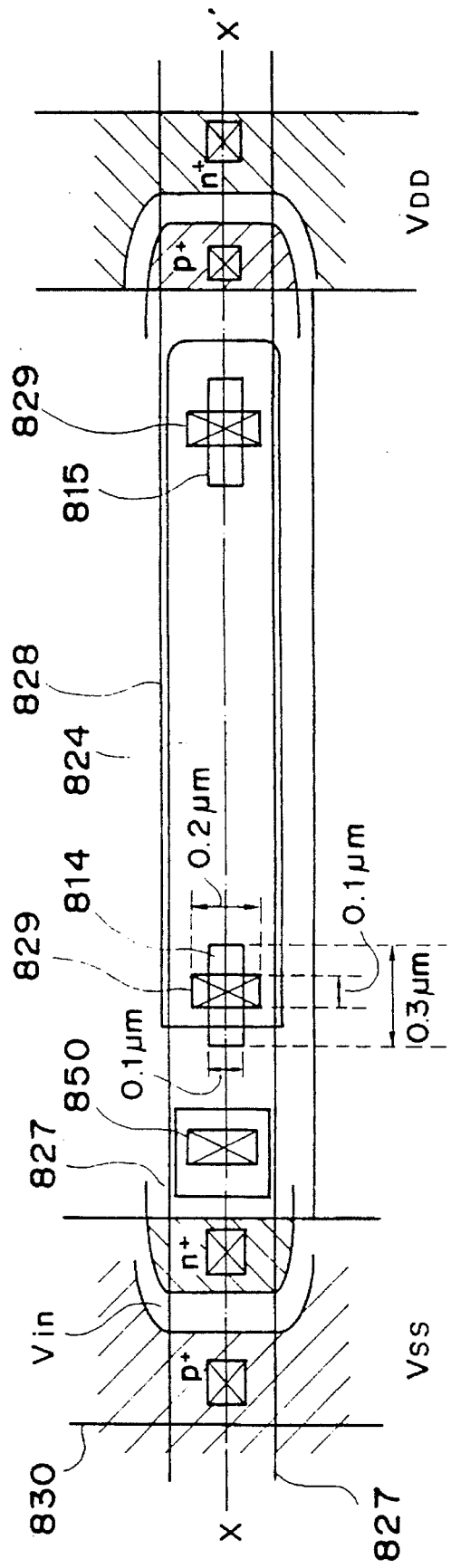
FIG. 87 is a plan view which illustrates a CMOS invertor according to Embodiment 1(E) of the present invention.
Figure 88:
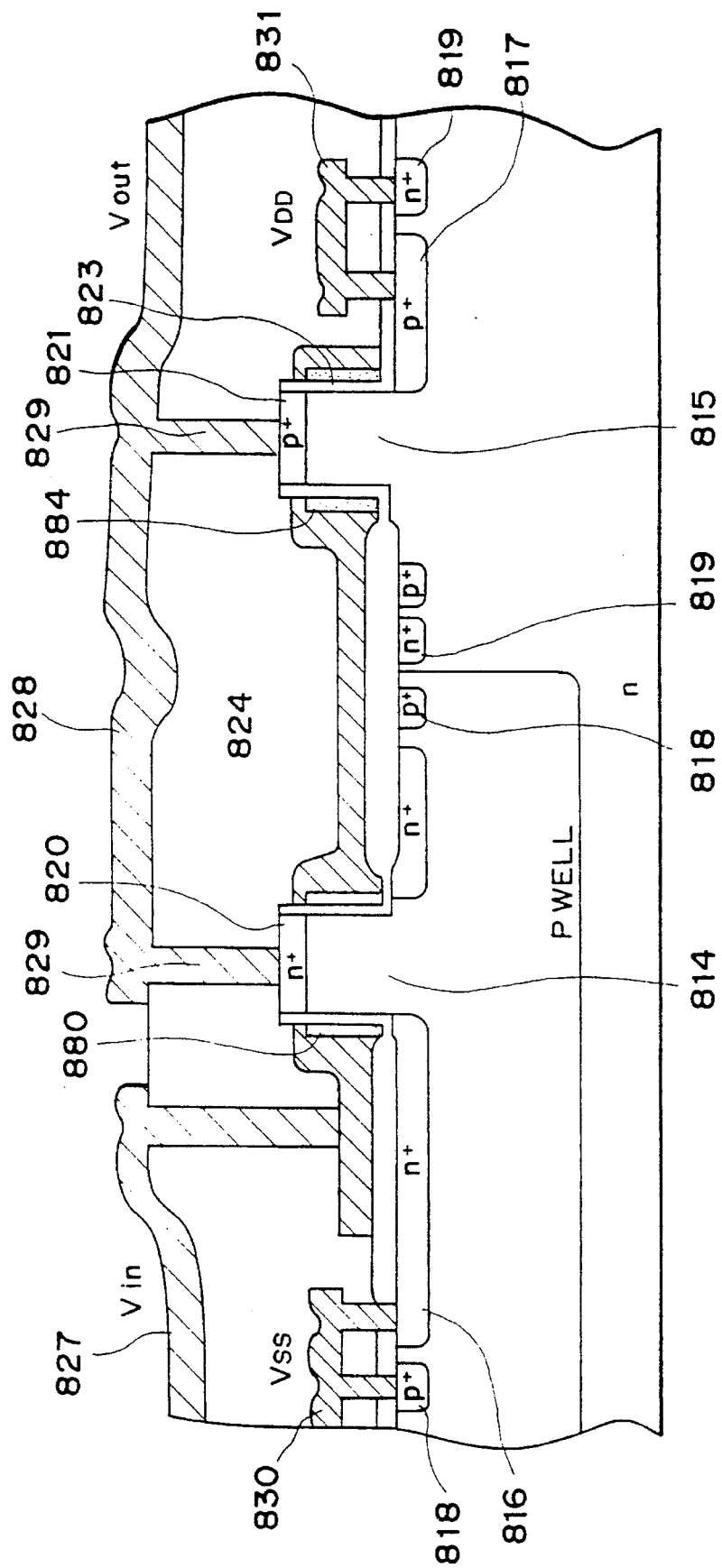
FIG. 88 is a cross sectional view which illustrates the CMOS invertor according to Embodiment 1(E) of the present invention.

FIG. 87 is a plan view which illustrates a CMOS invertor circuit formed by the columnar semiconductor according to an embodiment of the present invention. FIG. 88 is a cross sectional view taken along line X–X' of FIG. 87.

Referring to the drawings, reference numerals 814 and 815 represent MOSFET land, 829 represents a contact hole, 824 represents a gate electrode (wiring), and 827, 828, 830 and 831 represent Al wirings.

Reference numerals 816 and 820 represent an N-type source and drain regions, 817 and 821 represent P-type source and drain regions, 822 and 823 represent gate oxide films, 880 and 884 represent gate electrodes (gate polysilicon) and 818 and 819 represent channel stop regions serving as device separation regions.

Referring to the drawings, reference numeral 829 represents a contact hole with Vout to be ejected from the PMOS and NMOS according to the present invention. The contact hole 829 having a size 0.1 μm×0.2 μm is formed substantially perpendicular to columnar semiconductor lands (hereinafter called "lands") 814 and 815 each having a size 0.1 μm in width×0.3 μm. A sufficient alignment margin of 0.1 μm is made from the lands 814 and 815.

The CMOS invertor according to this embodiment and formed as described above was measured, resulting in that the base MOSFET land and the Al wiring were connected to each other satisfactorily. Therefore, a reliable contact was confirmed.

In order to make a comparison, the CMOS invertor was manufactured in such a manner that the longer side of the contact hole with the aforesaid land is placed in parallel to the longer side of the land, resulting in that a portion of the CMOS invertors could not be operated due to the deviation of the alignment.

A method of manufacturing the structure shown in FIGS. 87 and 88 according to this embodiment will now be described.

(Manufacturing Method)

The manufacturing method according to the present invention will now be described with reference to flow charts shown in FIGS. 89 to 96.

FIGS. 89 to 92 are cross sectional views which illustrate the process of manufacturing the NMOS according to this embodiment.

First, an N-type silicon substrate 810 having a specific resistance of 0.1 to 1 Ω·cm is subjected to a heat oxidation process, so that a heat oxidation film having a thickness of about 1,000 to 10,000 Å is formed.

Then, the oxide film formed on a portion on which the NMOS is formed is removed by etching and an oxide film having a thickness of about 100 to 500 Å is again formed (patterning process for P-well).

While using the oxide film having the thickness of 1,000 to 10,000 Å as a mask, a P-type impurity such as $BF_2^+$ is ion-injected into a region in which the NMOS will be formed. The concentration of the impurity is 1E13 to 14 $cm^{-2}$.

Then, heat treatment at about 1,000° to 1,100° C. is performed, resulting in a PWL 21 having a diffusion depth of about 1.0 to 1.5 μm to be formed.

The oxide film is fully peeled off by using an HF type solution, and a heat oxide film having a thickness of 100 to 500 Å is formed. Then, a LP-CVD method is used to form an Si3N4 film 801 having a thickness of 500 to 2,000 Å.

Then, the element portion is formed by performing patterning in such a manner that the Si3N4 film 801 and the SiO2 film 802 are removed by etching (a process of patterning for the active region).

Figure 89:
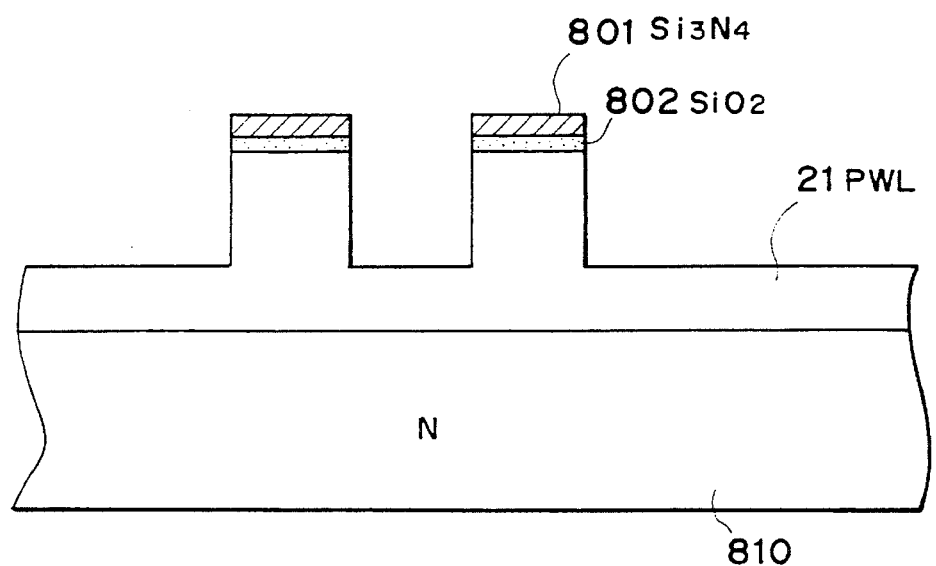
FIG. 89 is a cross sectional view which illustrates a process of manufacturing an NMOSFET according to Embodiment 1 (E) of the present invention.

Then, the resist film is peeled off, and then the Si substrate is subjected to etching while using the Si3N4 film 801 as the mask. The cross sectional shape of the Si substrate is changed by the etching gas and the pressure and the like. In order to make the shape perpendicular, a low pressure method is effective in general. However, it is in a trade-off relation with the selection ratio or the like. As the etching gas, a Cl2 type gas is used and etching is performed under a pressure of about 1 Pa, so that a rectangular groove is formed (FIG. 89).

Then, the wafer is cleaned with an NH3OH type solution, and a heat oxide film having a thickness of 300 Å or less is formed. This oxide film is again peeled off by an HF type solution. Then, a heat oxide film having a thickness of 50 to 300 Å is again formed, and then an Si3N4 film 801 having a thickness of 500 Å or less is formed by the LP-CVD method. The Si3N4 film 54 is etched back, so that only the Si3N4 film formed in the groove portion is removed (however, the Si3N4 film is left for the source/drain contact portion).

The etching back is performed by using a parallel and plate type etching device and a CF4 type gas be used under pressure of a level of 1.8 Pa.

Then, a resist pattern is used, so that $CF^{+2}$ type and P-type high impurity concentration region (element separated region) 819 is formed. The impurity concentration is made about 1E14 to 1E15 $cm^{-2}$.

Figure 90:
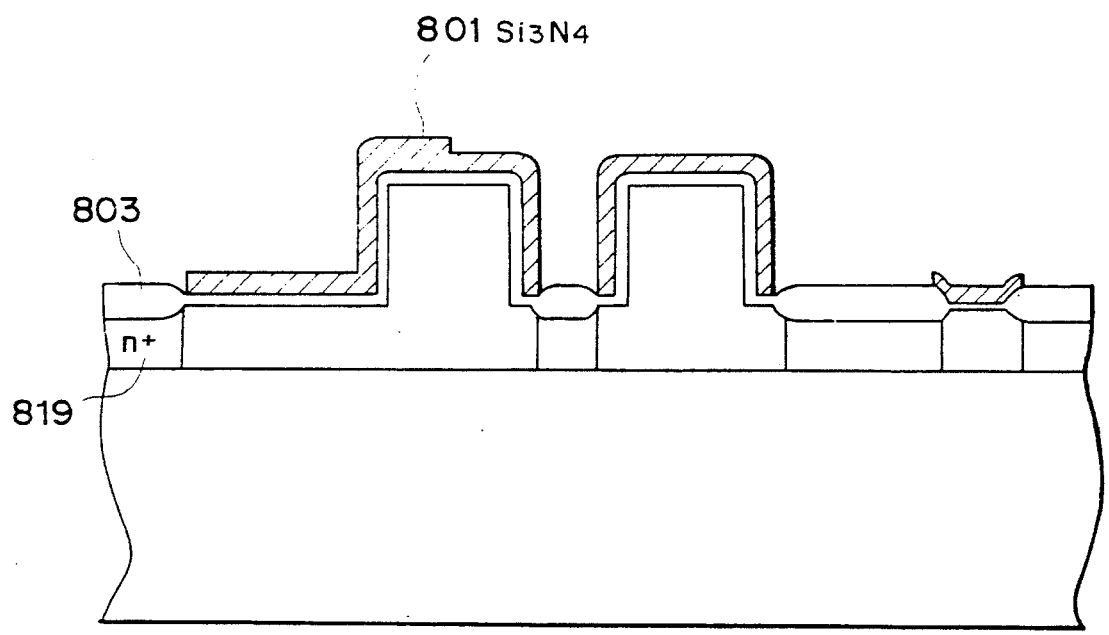
FIG. 90 is a cross sectional view which illustrates a process of manufacturing the NMOSFET according to Embodiment 1(E) of the present invention.
Figure 91:
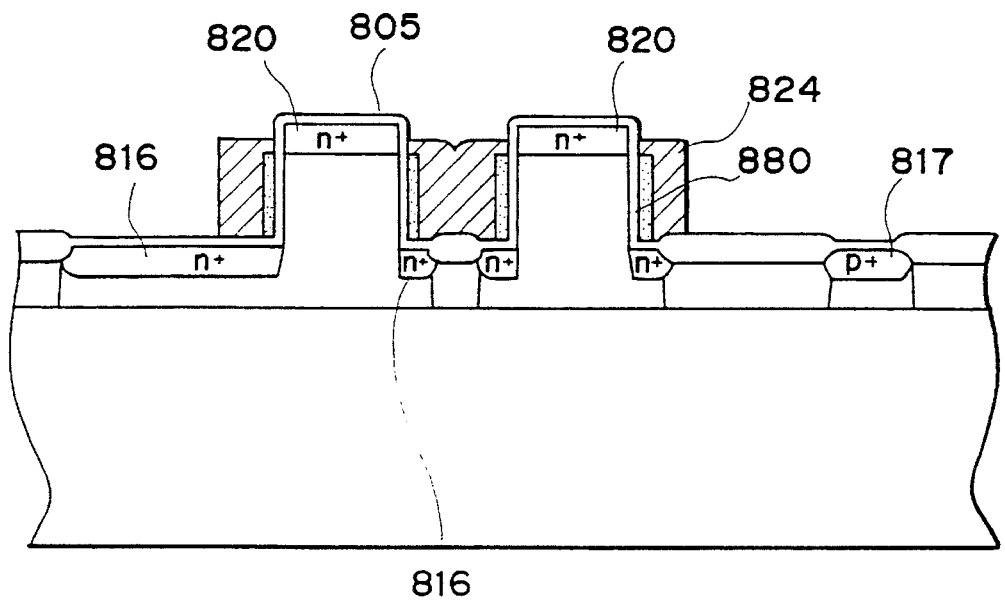
FIG. 91 is a cross sectional view which illustrates a process of manufacturing the NMOSFET according to Embodiment 1(E) of the present invention.
Figure 92:
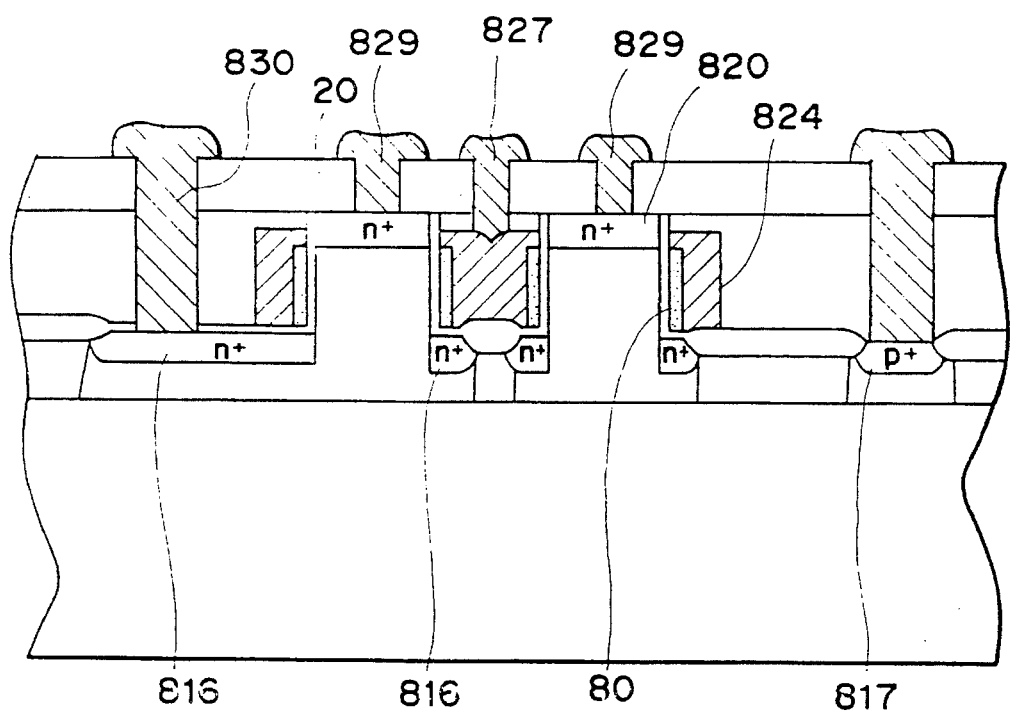
FIG. 92 is a cross sectional view which illustrates a process of manufacturing the NMOSFET according to Embodiment 1(E) of the present invention.
Figure 93:
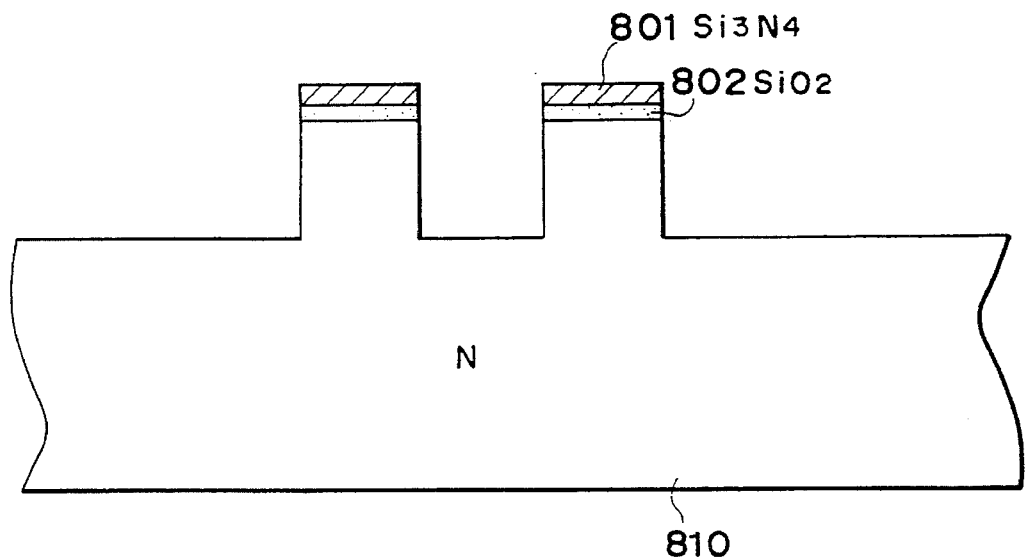
FIG. 93 is a cross sectional view which illustrates a process of manufacturing the PMOSFET according to Embodiment 1(E) of the present invention.
Figure 94:
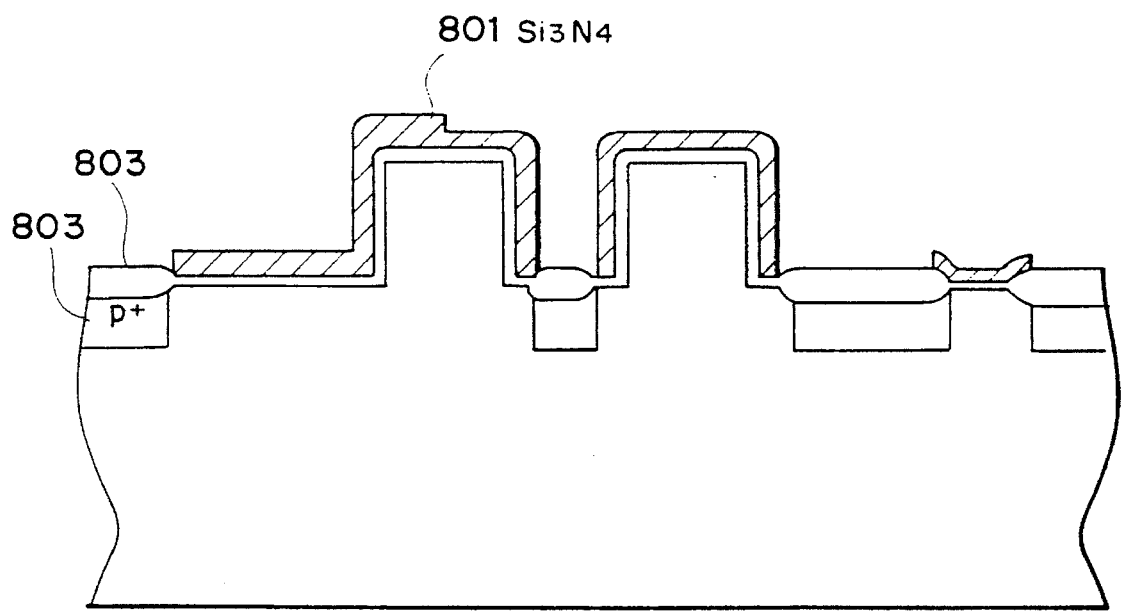
FIG. 94 is a cross sectional view which illustrates a process of manufacturing the PMOSFET according to Embodiment 1(E) of the present invention.
Figure 95:
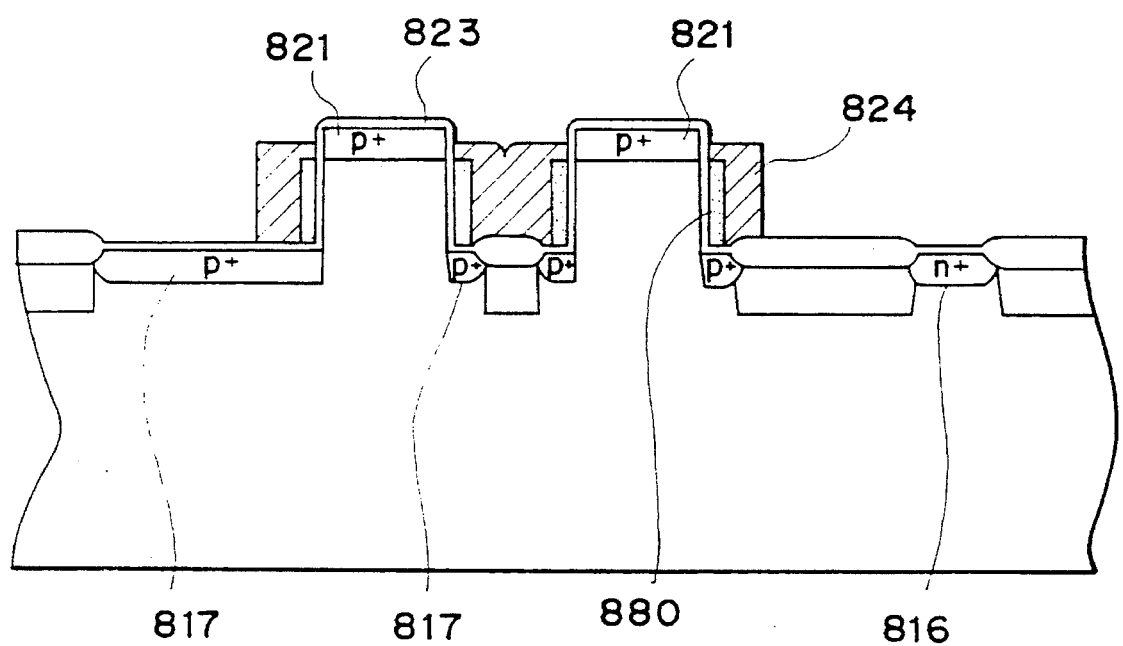
FIG. 95 is a cross sectional view which illustrates a process of manufacturing the PMOSFET according to Embodiment 1(E) of the present invention.
Figure 96:
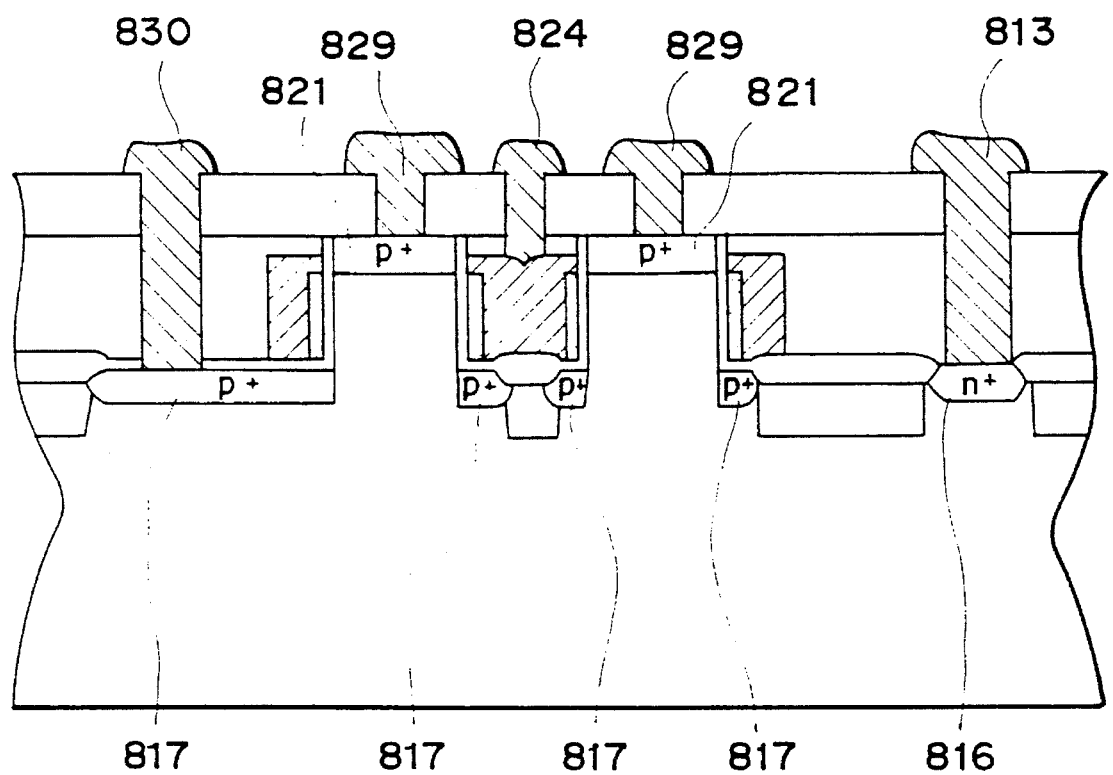
FIG. 96 is a cross sectional view which illustrates a process of manufacturing the PMOSFET according to Embodiment 1(E) of the present invention.

Then, the heat oxidation film 803 is formed in only the groove portion (see FIG. 90).

Then, by using an HF type solution to perform etching slightly, and an H3PO5 type solution is used to peel off the Si3N4 film 801.

Then, only the oxide film formed below the Si3N4 film is etched by using the HF type solution, and a gate oxide film having a thickness of 100 Å or less is formed. Then, a polycrystal silicon is formed by the LP-CVD method.

Then, by etching it back, the polycrystal silicon 880 can be left on only the side wall.

Then, resist patterning is performed, so that an N-type polysilicon gate electrode 880 is formed in a case of the NMOS simultaneously with forming of the source and drain regions 816 and 820.

Then, a selection CVD method is used to form a low resistance material 824 on only the gate electrodes 880 (see FIG. 5).

Then, heat oxidation is performed by 500 Å or less and the CVD such as TEOS exhibiting excellent coating feasibility is performed, so that an insulating film between layers is formed.

Then, this insulating film is etched back, so that only the top surface of the columnar MOS is allowed to appear outside.

Then, the insulating film is deposited and a process, which is an essential portion of the present invention and in which a contact hole 829 is formed in a direction perpendicular to the Lop surface of the columnar semiconductor layer. Furthermore, an opening for the electrode is formed from the gate and the substrate, and the wiring is arranged, so that the cell according to this embodiment is structured (see FIG. 92).

FIGS. 93 to 96 are cross sectional views which illustrate the process of manufacturing the PMOSFET. Since the process is the same as the aforesaid process of manufacturing NMOSFET except for the conduction type of each semiconductor region and it can be manufactured similarly, its description is omitted here.

Therefore, the peripheral circuits can be formed by the CMOS structure.

Embodiment 2(E)

Embodiment 2(E) of the present invention will now be described with reference to FIGS. 97 to 100.

Figure 97:
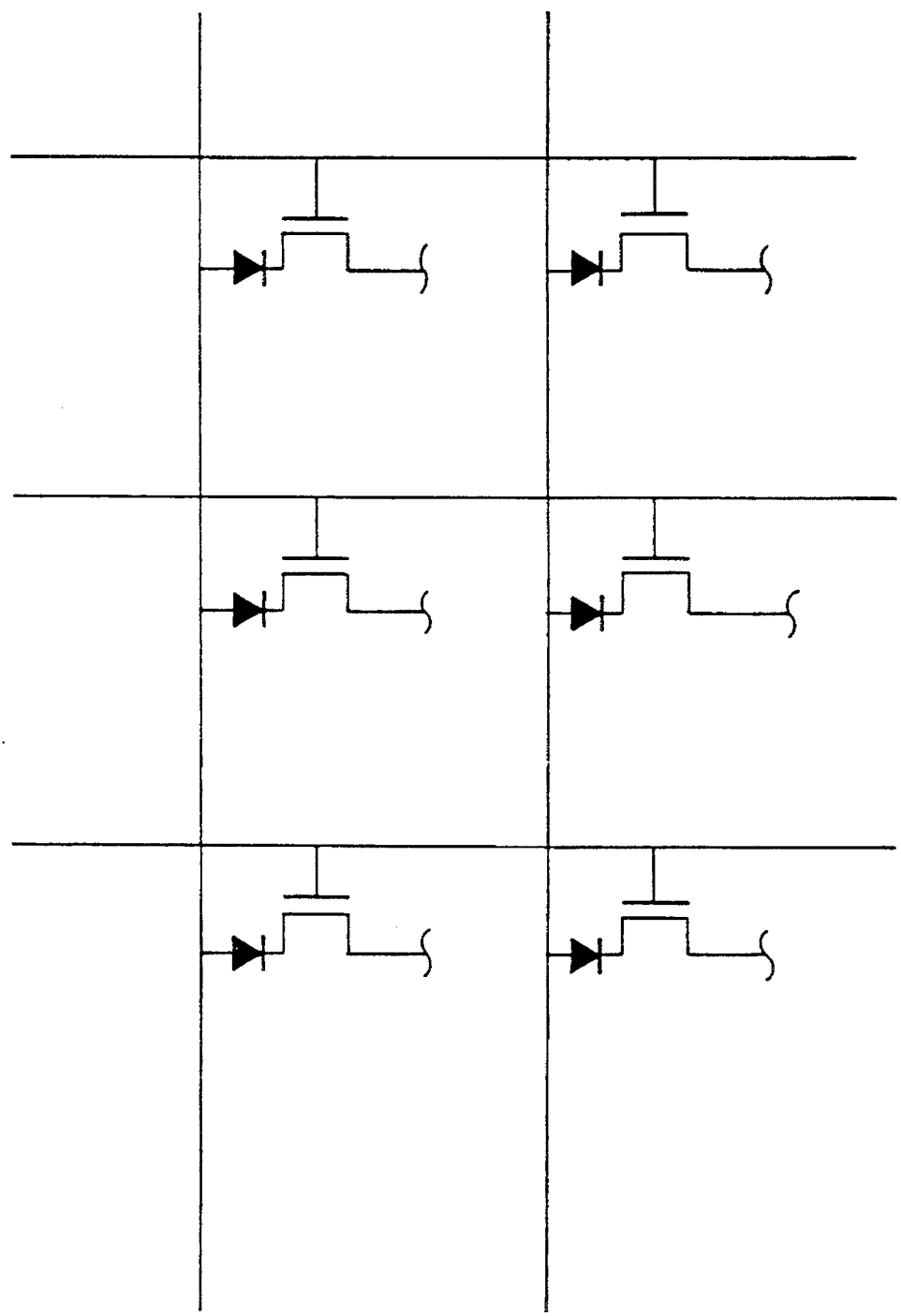
FIG. 97 is a circuit diagram which illustrates a junction breakdown type storage device according to Embodiment 2(E) of the present invention.
Figure 98:
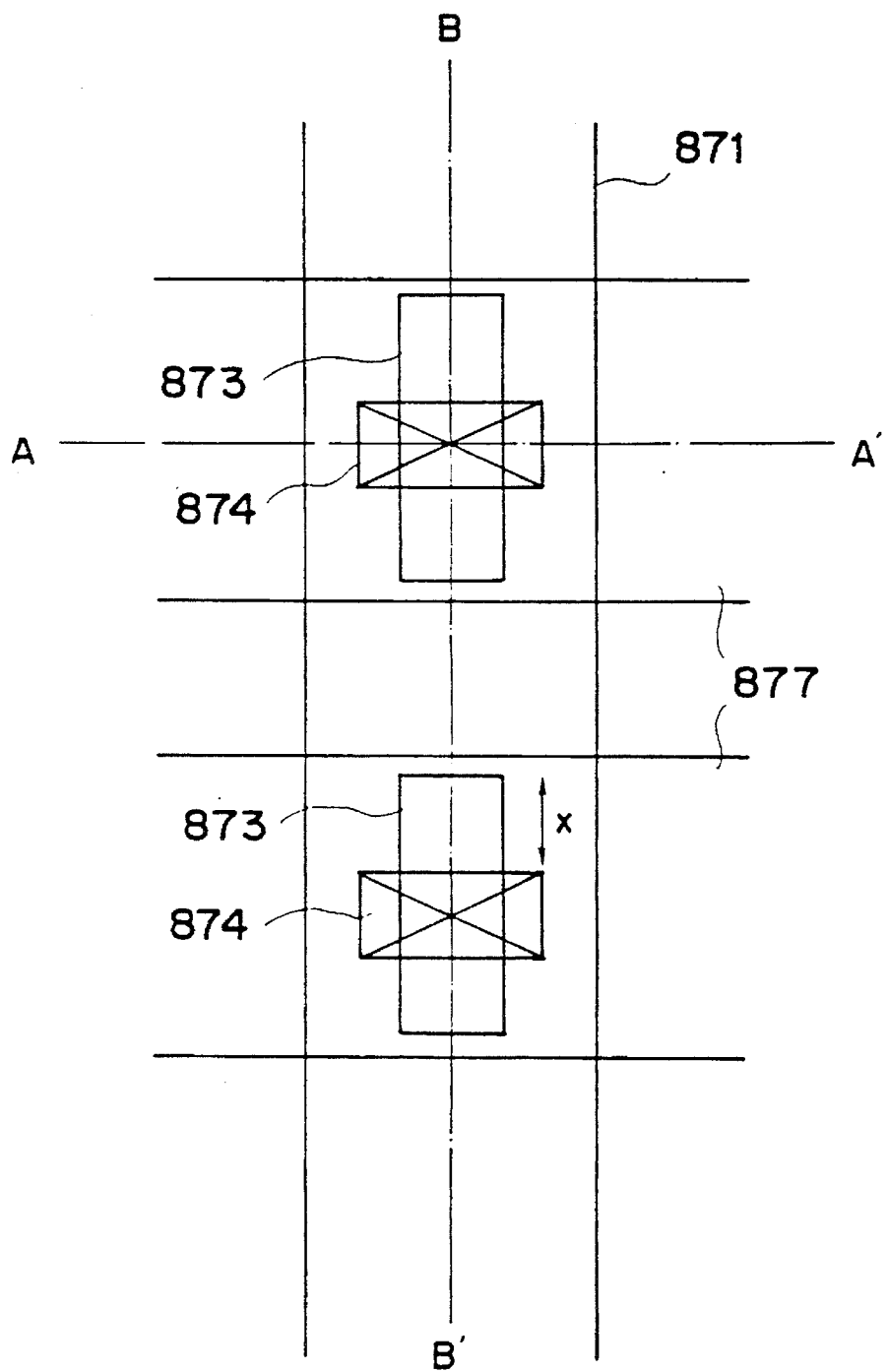
FIG. 98 is a plan view which illustrates a memory portion of the junction breakdown type storage device according to Embodiment 2(E) of the present invention.
Figure 99:
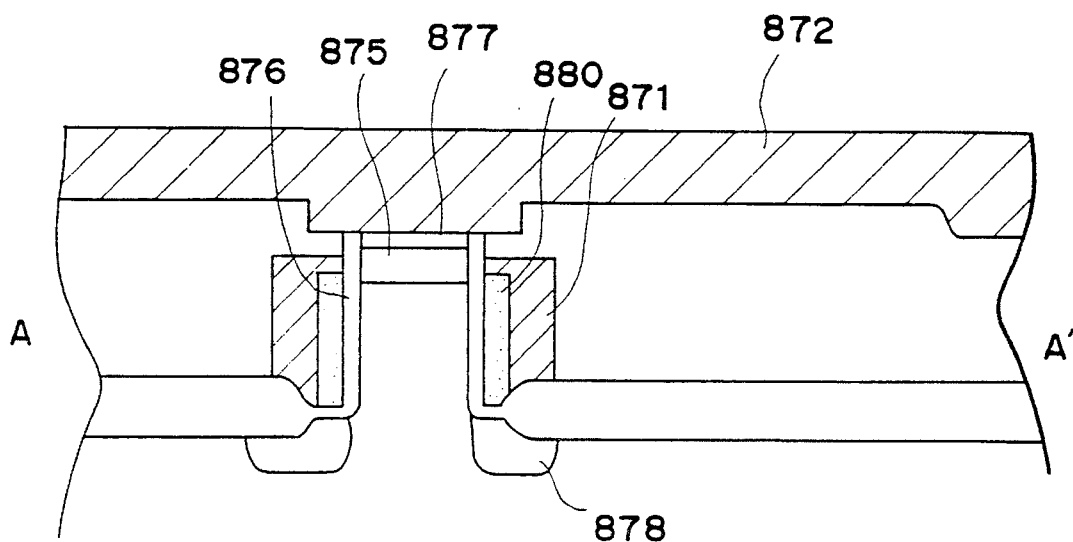
FIG. 99 is a plan view which illustrates the memory portion of the junction breakdown type storage device according to Embodiment 2(E) of the present invention.
Figure 100:
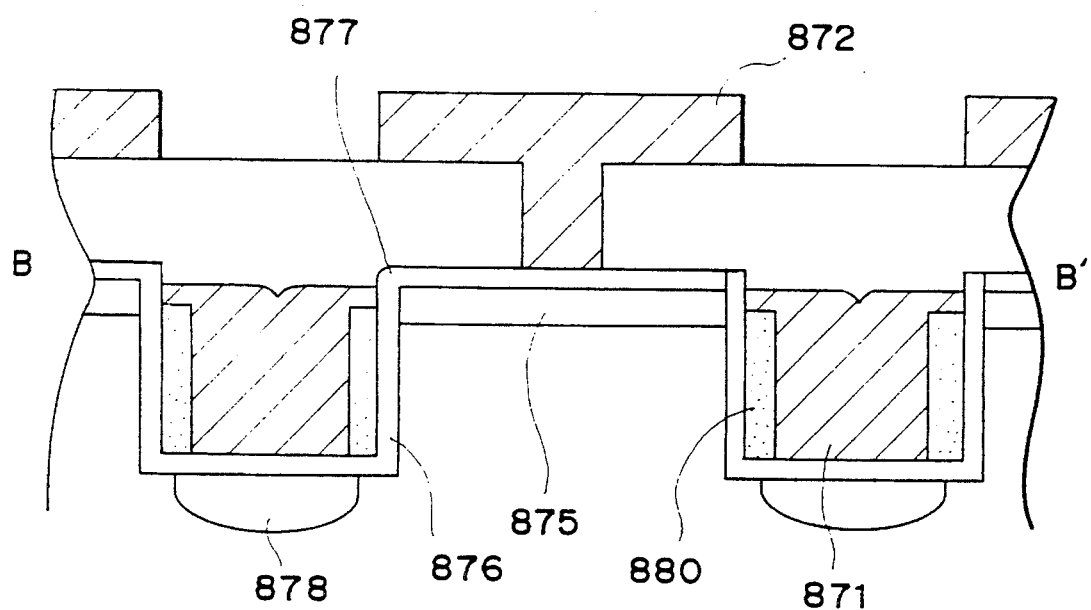
FIG. 100 is a plan view which illustrates the memory portion of the junction breakdown type storage device according to Embodiment 2(E) of the present invention.
Figure 101:
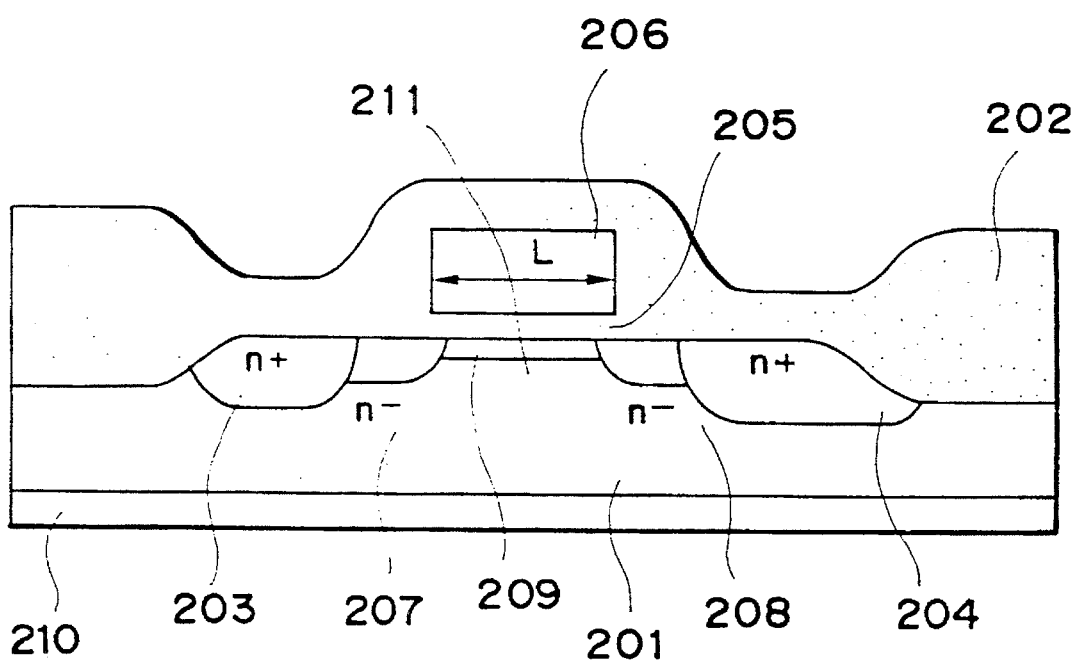
FIG. 101 is a schematic cross sectional view which illustrates an LDD (Lightly Doped Drain) structure as a typical MOSFET.
Figure 102:
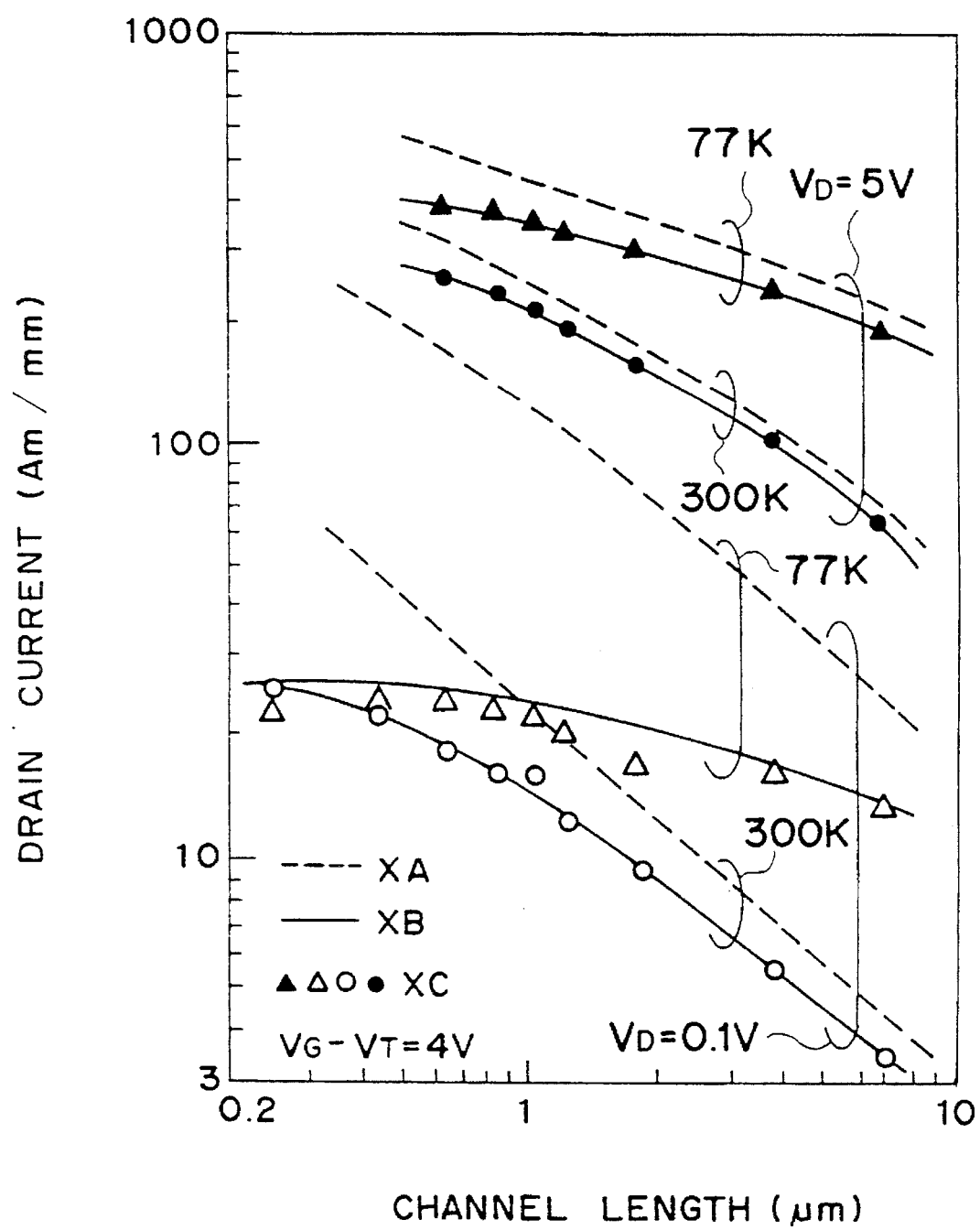
FIG. 102 is a graph which illustrates an example of the relationship between the channel length and the drain current.
Figure 103:
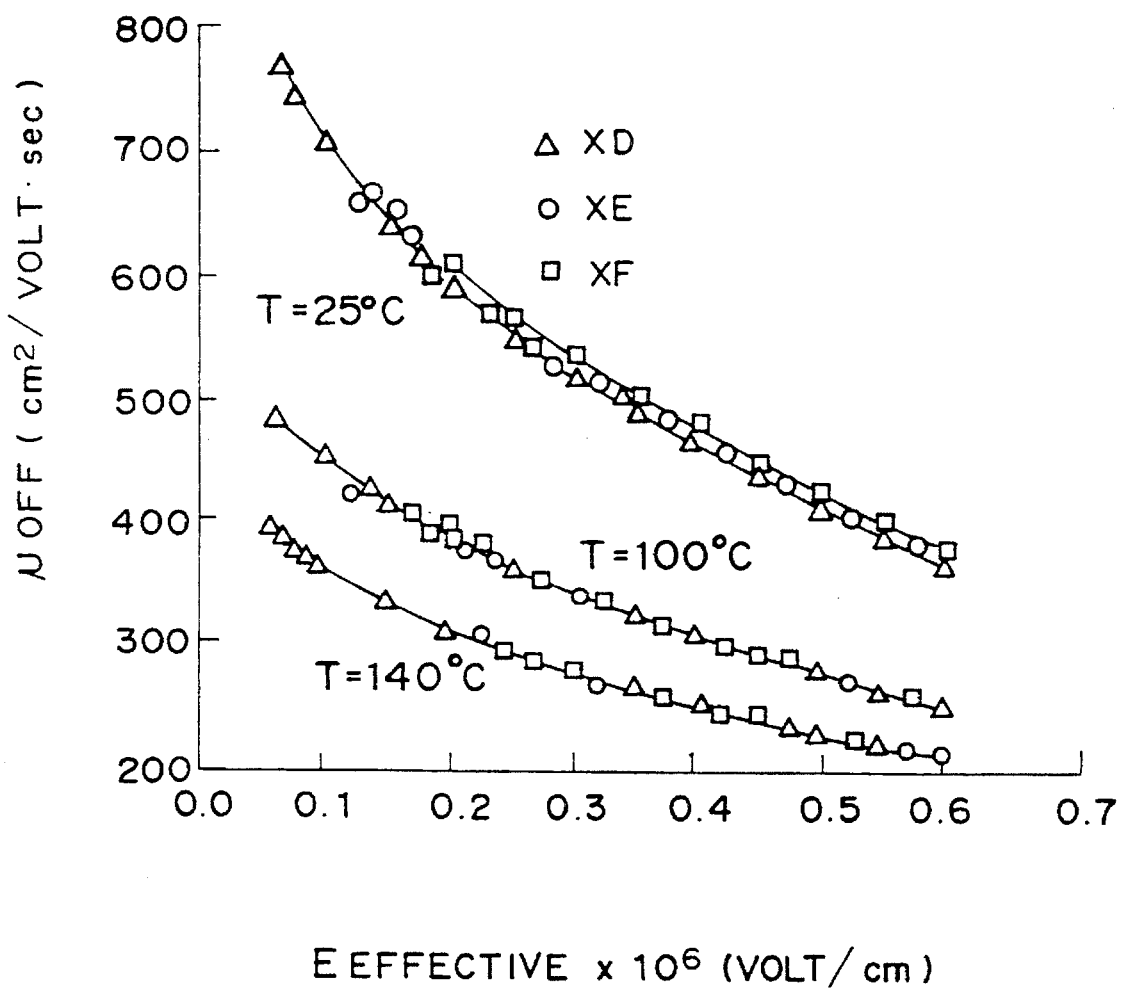
FIG. 103 is a graph which illustrates the relationship between the vertical directional field intensity (axis of abscissa) and the mobility (axis of ordinate)
Figure 104A:
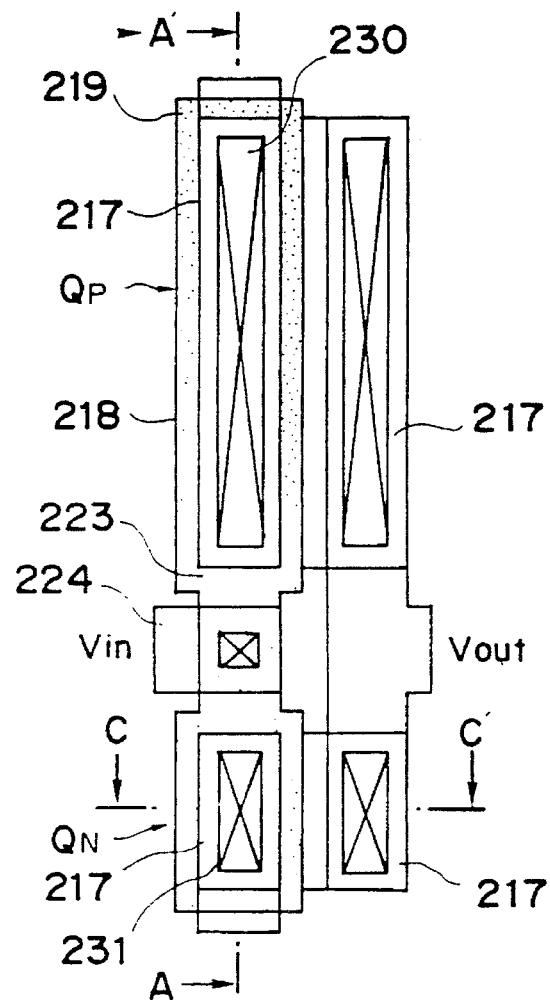
FIGS. 104A and 104B are plan views which illustrate a conventional CMOS which uses the SGT.
Figure 104B:
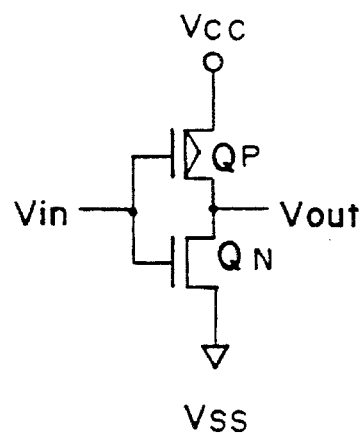
Figure 105:
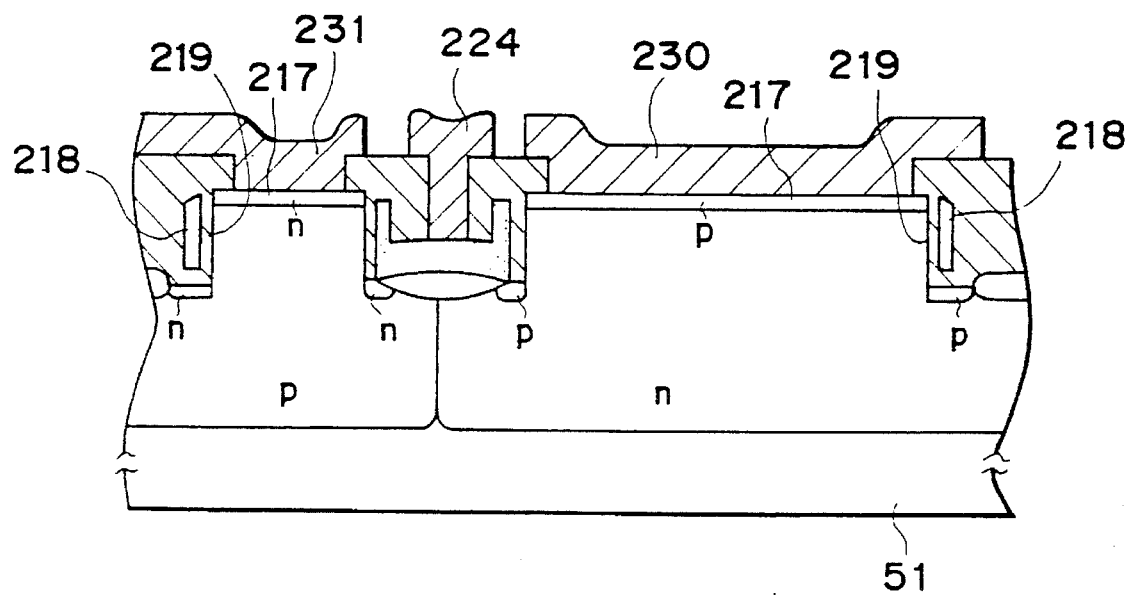
FIG. 105 is a plan view which illustrates the conventional CMOS which uses the SGT.
Figure 106:
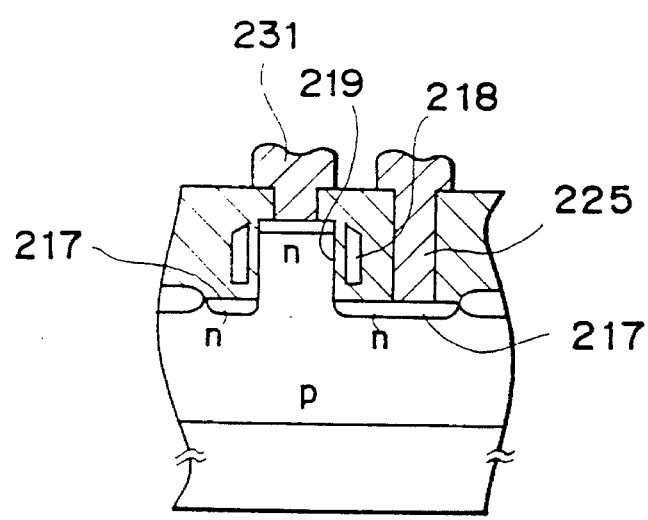
FIG. 106 is a plan view which illustrates the conventional CMOS which uses the SGT.
Figure 107:
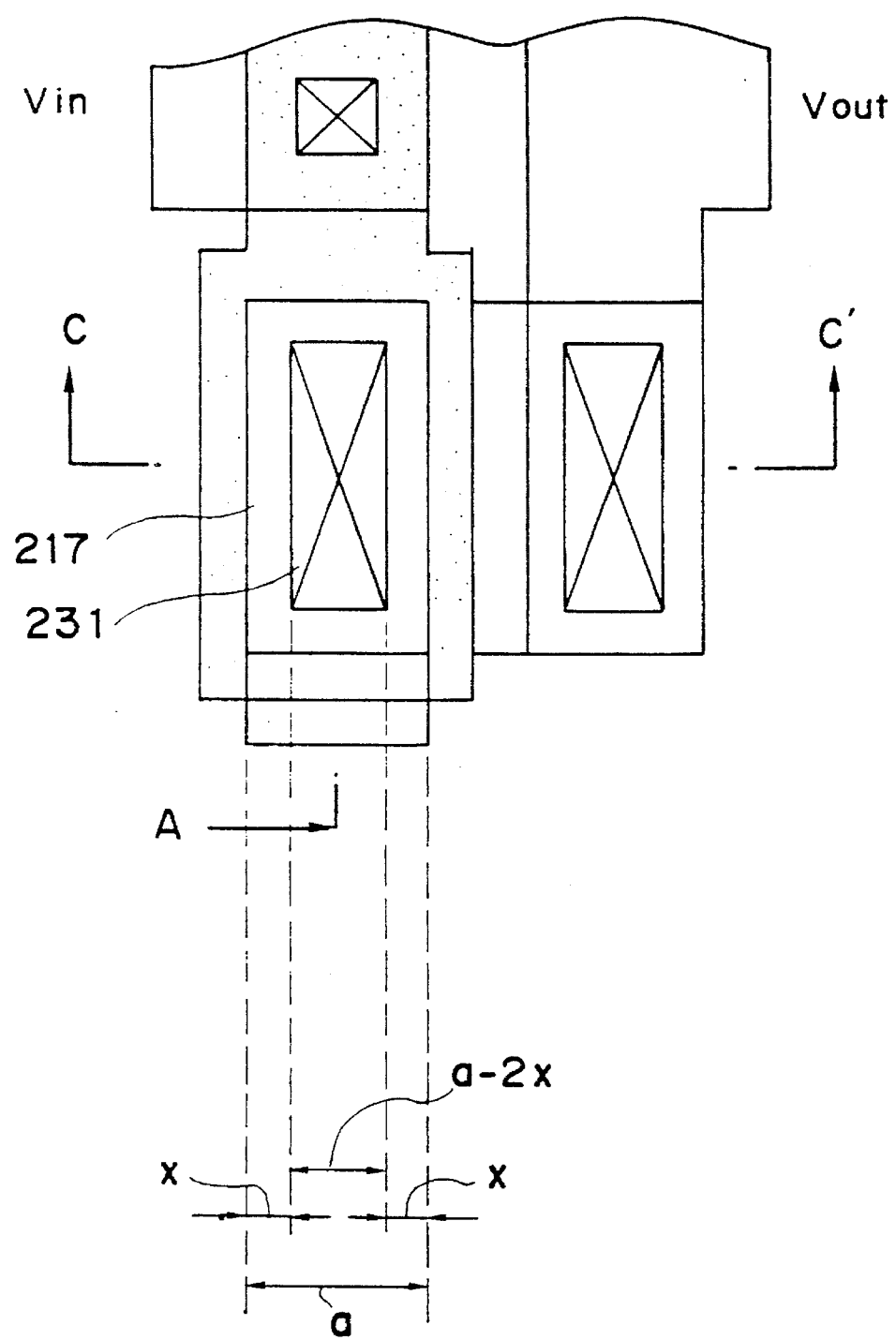
FIG. 107 is an enlarged plan view which illustrates a contact hole portion of the conventional CMOS which uses the SGT.

FIG. 97 is a circuit diagram for a junction breaking type memory device according to the present invention. FIG. 98 is a plan view which illustrates a memory cell portion of the junction breaking type memory device. FIGS. 99 and 100 respectively are cross section taken along line A–A' and B–B'.

Referring to the drawings, reference numeral 871 represents a gate wiring and a gate electrode, 872 represents bit lines, 873 represents a memory cell land and 874 represents a contact hole of the memory cell land 873 and the bit line 872.

Also according to this embodiment, as shown in FIG. 98, a sufficient margin from the bit line can be provided by forming the hole perpendicular to the land in a case where the contact is realized on the rectangular columnar semiconductor layer. Furthermore, the area of the contact hole can be reduced. For example, assuming that the width of the bit line is 0.33 μm, the size of the land is 0.1× 0.3 μm and that of the contact hole is 0.1×0.2 μm, x becomes 0.1 μm, resulting in a yield of 100%.

Embodiment 1(F)

Embodiment 1(F) of the present invention will now be described with reference to the drawings.

FIG. 108 illustrates a process in which an electrode material 114 is formed on projecting lands (hereinafter called "lands") 111 to 113 formed on the semiconductor wafer, and then the top surfaces of the lands are caused to appear by etching back.

Figure 108A:
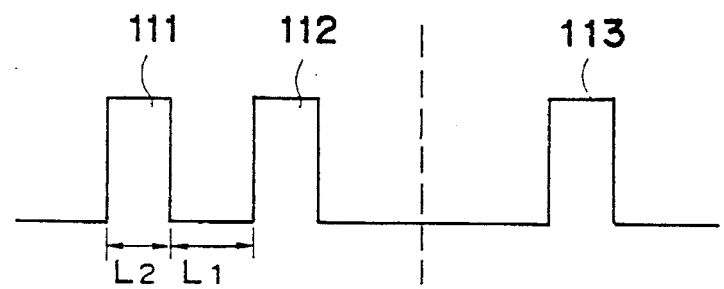
FIGS. 108A to 108D illustrate a process according to the method of the present invention.
Figure 108B:
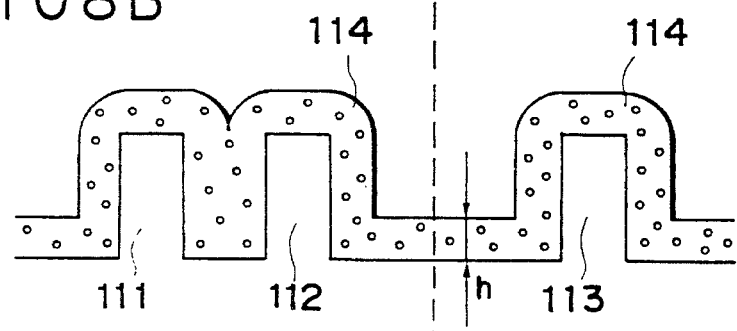

Referring to FIG. 108A, the lands 111 to 113 are formed, the electrode material 114 is supplied to the entire surface as shown in FIG. 108B, and then etching back is performed to remove the electrode material 114 by a desired thickness in the direction of its thickness.

Figure 108C:
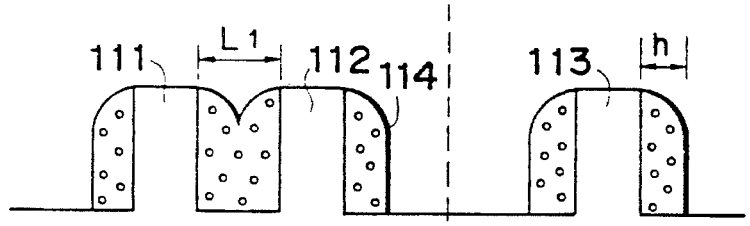
Figure 108D:
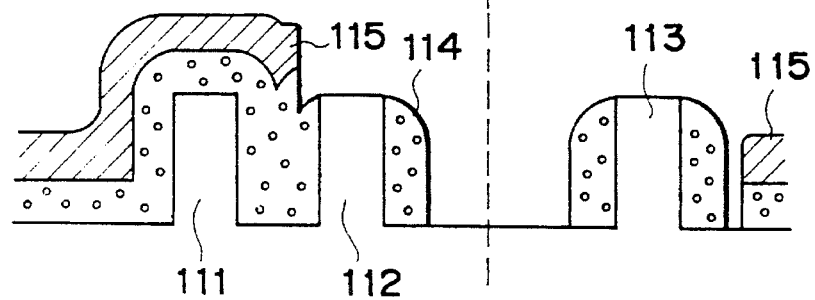

If normal etching back is performed, the electrode material 114 is separated from other regions as is shown in the land 113 shown in FIG. 108C. In order to connect it to the other regions, a photolithography process with a resist or the like is performed to subject the electrode material 114 to patterning in order to obtain a desired shape. However, if the thickness h of the electrode 114 is thin, a severe patterning accuracy (alignment accuracy) is required. Therefore, if position of the resist 115 is slightly deviated as is shown in the land 113 shown in FIG. 108D, a disconnection can be taken place.

Figure 109:
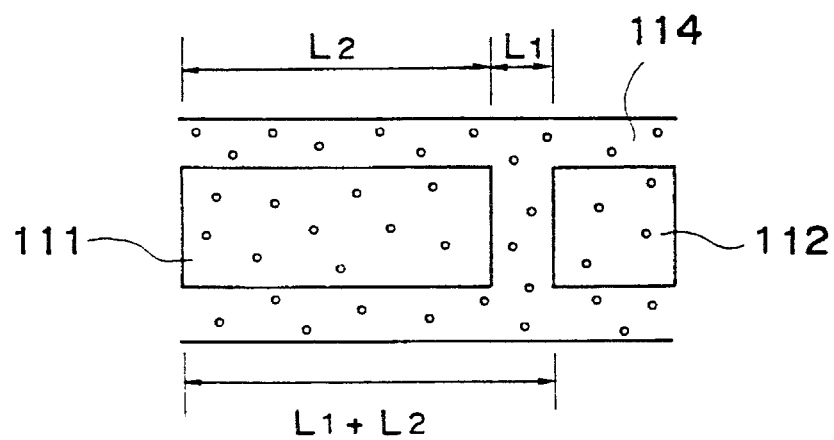
FIG. 109 is a schematic plan view which illustrates an apparatus according to the present invention.
Figure 110:
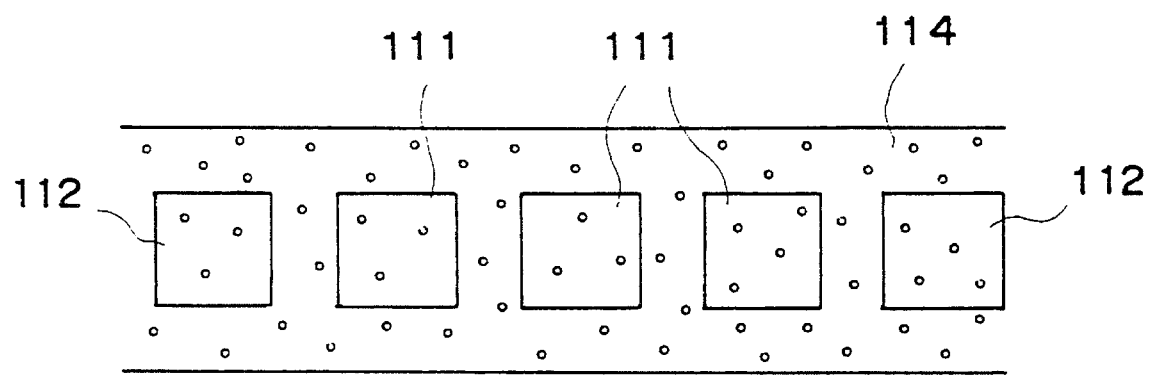
FIG. 110 is a schematic plan view which illustrates an apparatus according to the present invention.
Figure 111:
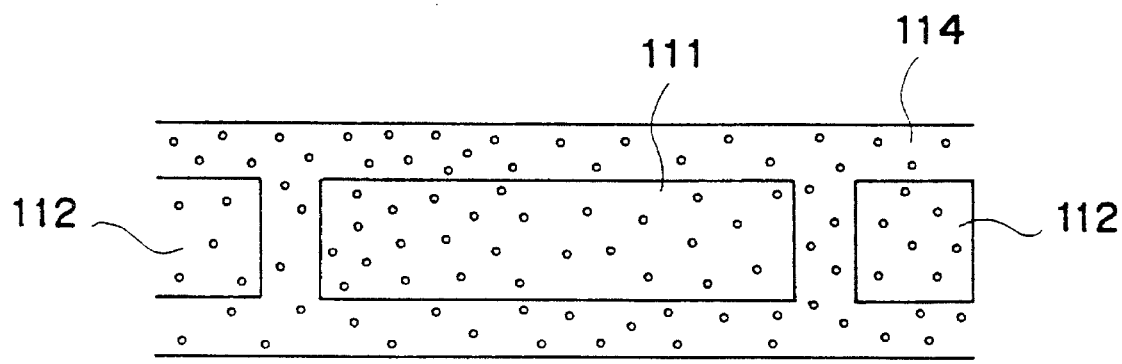
FIG. 111 is a schematic plan view which illustrates an apparatus according to the present invention.
Figure 112:
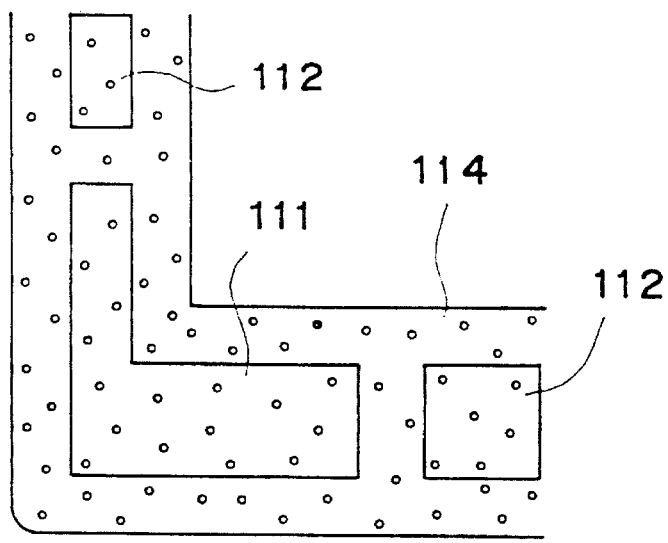
FIG. 112 is a schematic plan view which illustrates an apparatus according to the present invention.

Accordingly, as shown in FIG. 108, a dummy land 111 regardless of the element function is formed adjacent to the land 112 which has the device function at a proper interval L1 (≦2h). As a result, as can be seen from FIG. 108D, patterning of the resist 115 is freed from the severe accuracy. That is, assuming that the horizontal length of the dummy land 111 is L2, the accuracy required for the alignment may be (L1+L2) as shown in a plan view FIG. 109. Thus, the margin allowed by only L1 can be increased by L2 and therefore the risk of the disconnection or the like can be significantly reduced. Therefore, even if the electrode material 114 is used as the gate electrode of the SGT, this gate electrode material can be used as the gate wiring as it is. Furthermore, by using a plurality of dummy lands 111 or by using an elongated dummy land 111, the lands 112 can be connected to each other by only the etching back method using no mask (see FIGS. 110 and 111). If a hooked dummy land 111, angled wiring can be arranged (see FIG. 112). As described above, the shape of the dummy land 111 is not limited. The dummy land 111 corresponds to the columnar layer according to the present invention, while the land 112 corresponds to the columnar semiconductor layer according to the present invention.

Figure 113:
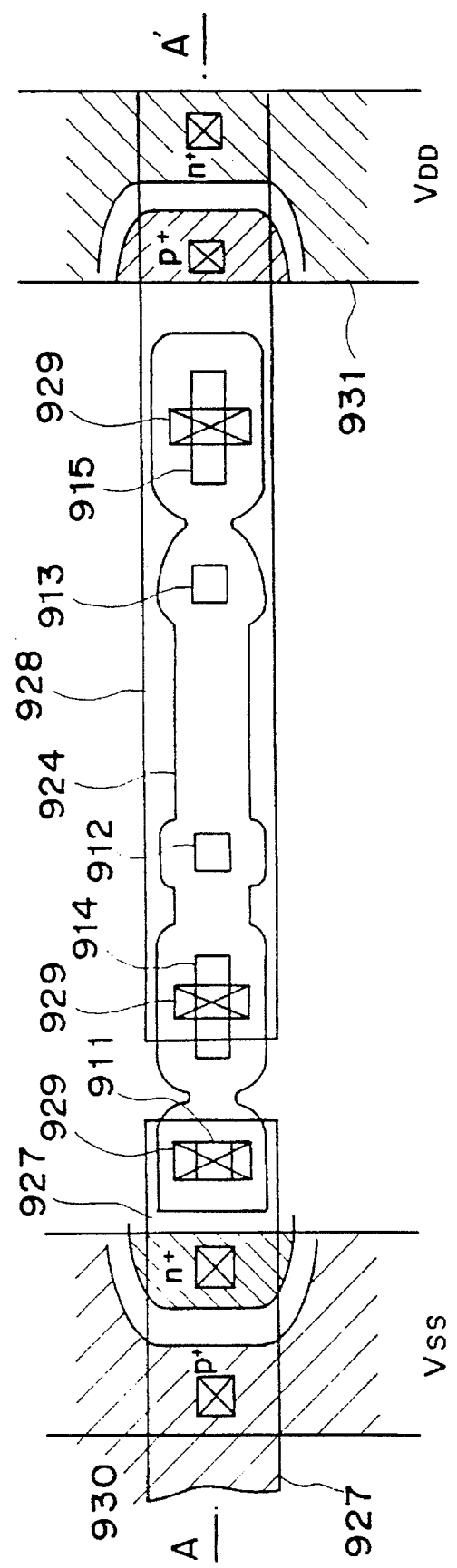
FIG. 113 is a plan view which illustrates the CMOS invertor according to the present invention.
Figure 114:
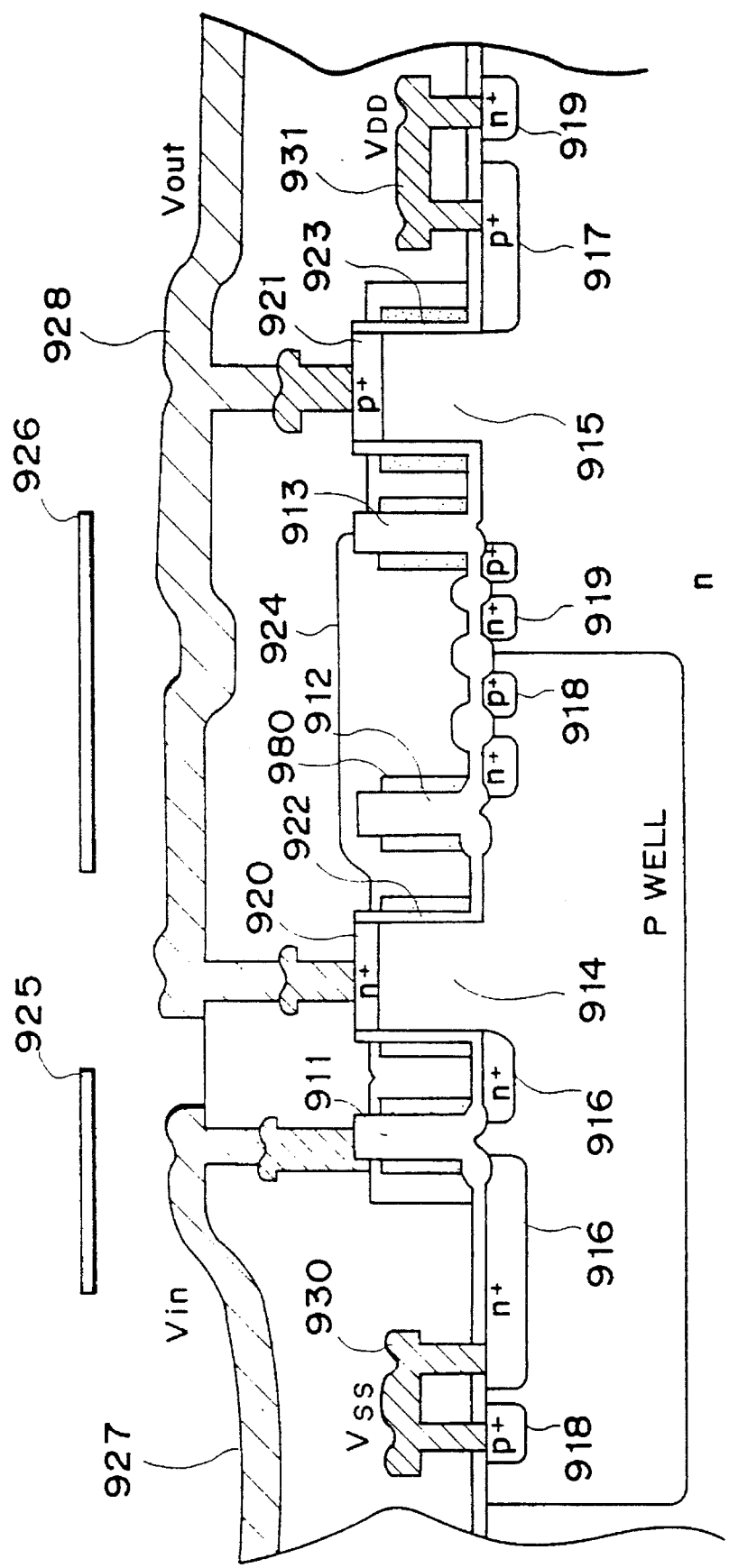
FIG. 114 is a cross sectional view taken along line A–A' of FIG. 113.

FIG. 113 is a plan view which illustrates a CMOS invertor according to the present invention and FIG. 114 is a cross sectional view taken along line A–A' of FIG. 113.

Referring to FIGS. 113 and 114, reference numerals 911, 912 and 913 represent dummy lands. Reference numeral 914 represents a land constituting a vertical type nMOSFET and 915 represents a land constituting a vertical pMOSFET. Reference numerals 916 and 920 respectively represent a source region and a drain region of the nMOSFET, 917 and 921 respectively represent a source region and a drain region of the pMOSFET, 918 and 919 represent channel stop layers, 922 and 923 represent gate oxide films and 924 represents a gate wiring also serving as a gate electrode. Reference numeral 929 represents a contact portion.

The gate wiring 924 is patterned by using masks 925 and 926 which respectively establishing alignment between the dummy land 911 and the FET land 914, between the dummy lands 912, 913 and FET lands 914 and 915. The element 924 is used as the gate wiring as well as using it as the gate electrode. The mask 926 is matched by using the dummy lands 912 and 913. That is, the alignment can be performed with an accuracy in a range of the size of the dummy land regardless of the total thickness of the polysilicon 980 serving as the gane electrode and the low resistance material 924. Referring to FIGS. 113 and 114, in the portion of the dummy land 912, the end portion of the mask is positioned at an intermediate position of the distance from the nMOSFET 914, while the end portion of the mask is positioned on the dummy land in the portion of the dummy land 913.

Figure 115:
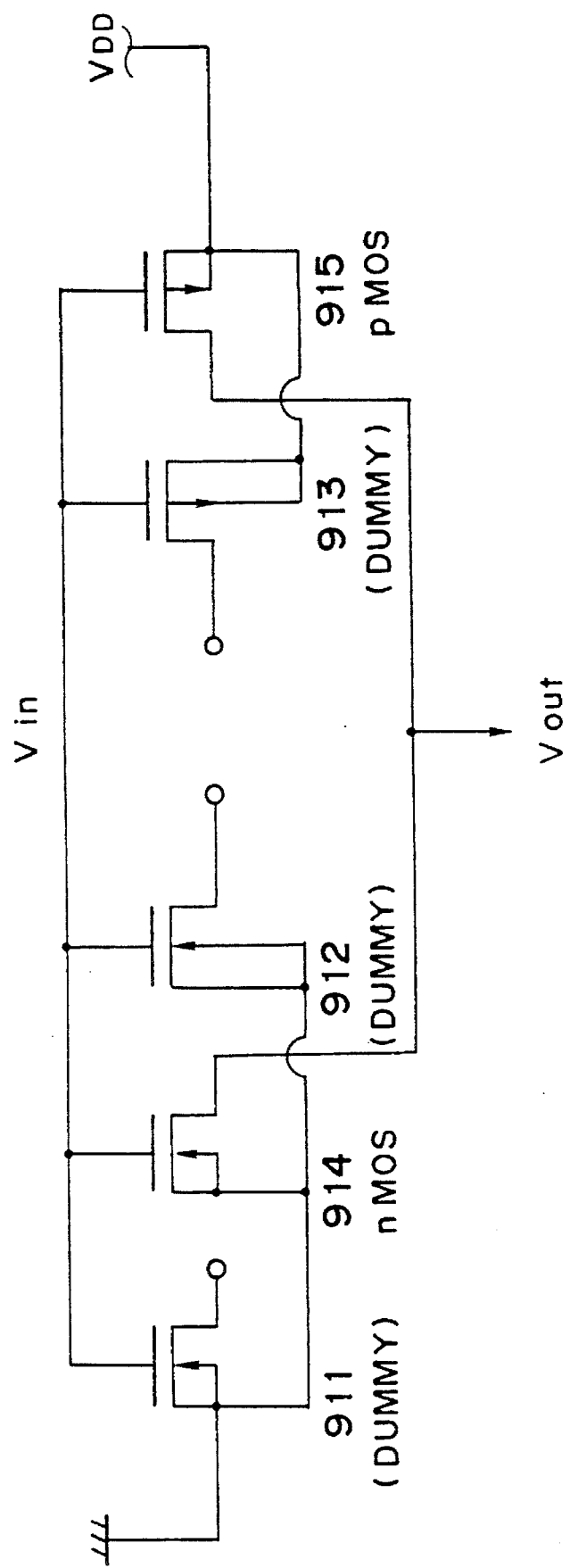
FIG. 115 is an equivalent circuit diagram of the CMOS in a case where a parasitic MOSFET is used.
Figure 116A:
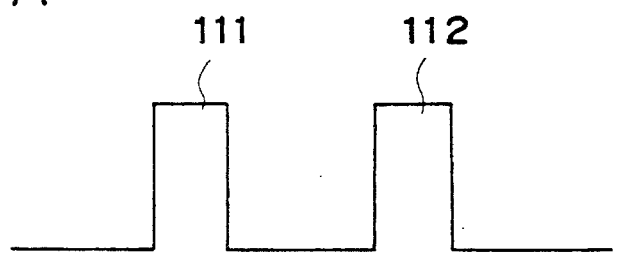
FIGS. 116A to 116D illustrate a process according to the method of the present invention.
Figure 116B:
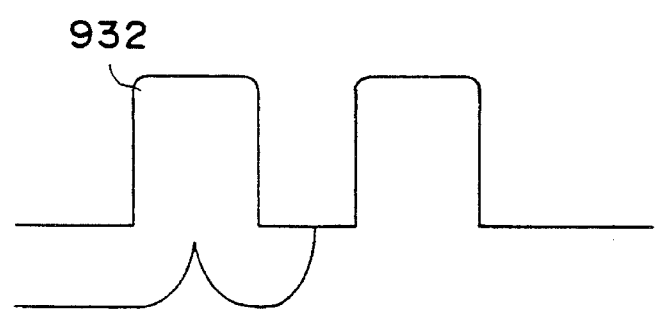
Figure 116C:
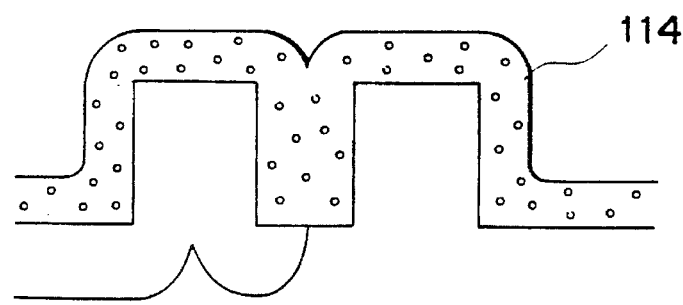
Figure 116D:
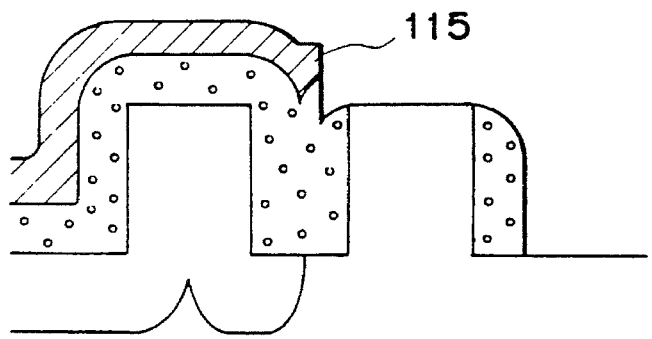

If the dummy land is formed by the same method as that for forming the MOSFET land, the dummy land undesirably becomes a parasitic MOSFET. For example, if the dummy lands 911 to 913 shown in FIGS. 113 and 114 form the 10 parasitic MOSFET, the equivalent circuit becomes as shown in FIG. 115, causing a defect to take place in the operation of the circuit. The generation of the parasitic MOS must be prevented. Accordingly, the overall body of the dummy land 111 is oxidized at the LOCOS process by the same process as that shown in FIG. 108 (see FIG. 116B). Then, a process which is the same as that shown in FIG. 1 is performed, causing a state shown in FIGS. 116C and 116D to be realized. Therefore, the parasitic MOS is not formed and forming of the parasitic MOS can be prevented while maintaining the function as the dummy land.

Figure 117:
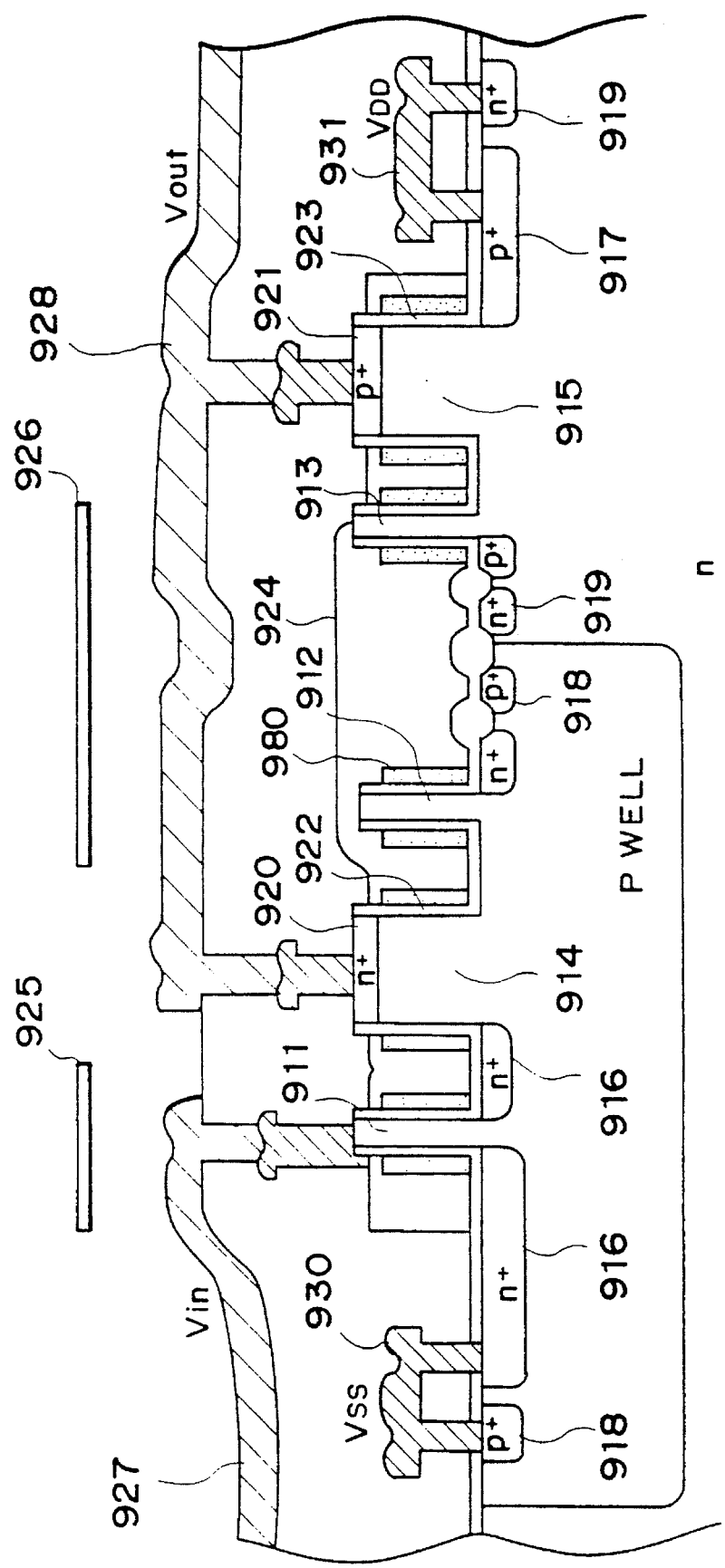
FIG. 117 is a cross sectional view which illustrates the CMOS invertor according to the present invention.

It is necessary for at least the portion around the dummy land to be insulating material, preferably the overall body of the dummy land is made of insulating material. FIG. 114 illustrates an example in which the overall body of the dummy land is made of the insulating material. FIG. 117 illustrates an example in which the side surface of the dummy land is made of the insulating material. Referring to FIGS. 117, the same elements as those shown in FIG. 114 are given the same reference numerals.

Then, a process for manufacturing the aforesaid semiconductor device will now be described.
(Manufacturing Example 1)

According to Manufacturing Example 1, a structure, in which the overall body of the dummy land is made of the insulating material, is formed. FIGS. 118 to 121 illustrate a process of forming a pMOS portion. FIGS. 122 to 125 illustrate a process of forming the nMOS portion.

First, an N-type silicon substrate having a specific resistance of 0.1 to 1 Ω·cm is subjected to a heat oxidation process, so that a heat oxidation film having a thickness of about 1,000 to 10,000 Å is formed. Then, the oxide film formed on a portion on which the nMOS is formed is removed by etching and an oxide film having a thickness of about 100 to 500 Å is again formed by the heat oxidation (patterning process for P-well). While using the oxide film having the thickness of 1,000 to 10,000 Å as a mask, a P-type impurity such as $BF^{+2}$ is ion-injected into a region in which the nMOS will be formed. The concentration of the impurity is 1E13 to 14 $cm^{-2}$. Then, heat treatment at about 1,000° to 1,100° C. is performed, resulting in a diffusion depth of about 1.0 to 1.5 μm to be formed.

Figure 118:
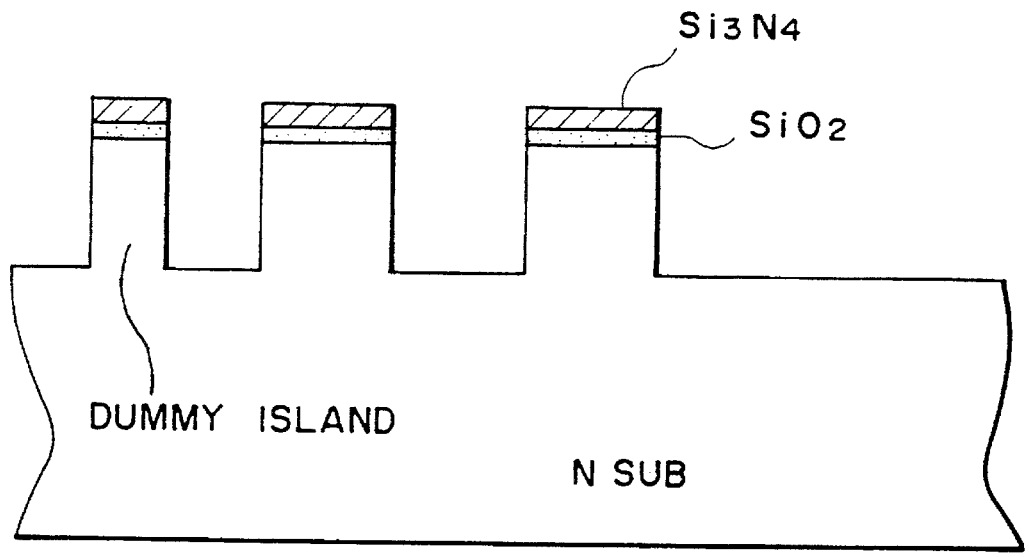
FIG. 118 illustrates a process of manufacturing a pMOS according to the present invention.

The oxide film is fully peeled off by using an HF type solution, and a heat oxide film having a thickness of 100 to 500 Å is again formed. Then, a LP-CVD method is used to form an Si3N4 film having a thickness of about 500 to 2,000 Å. Then, the element portion and the dummy land are formed by performing patterning in such a manner that the Si3N4 film and the SiO2 film are removed by etching. Then, the resist film is peeled off, and then the Si substrate is subjected to etching while using the Si3N4 film as the mask. The cross sectional shape of the Si substrate is changed by the etching gas and the pressure and the like. In order to make the shape perpendicular, a low pressure method is effective in general. However, it is in a trade-off relation with the selection ratio or the like. As the etching gas, a Cl2 type gas is used and etching is performed under a pressure of about 1 Pa, so that a rectangular groove is formed (FIG. 118).

Figure 119:
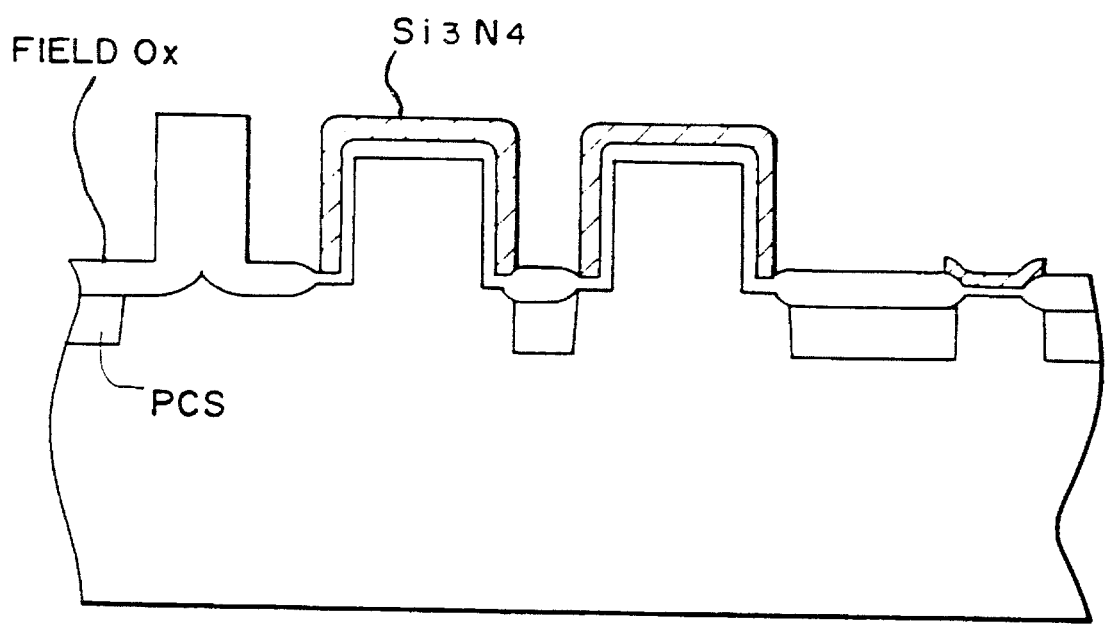
FIG. 119 illustrates a process of manufacturing a pMOS according to the present invention.
Figure 120:
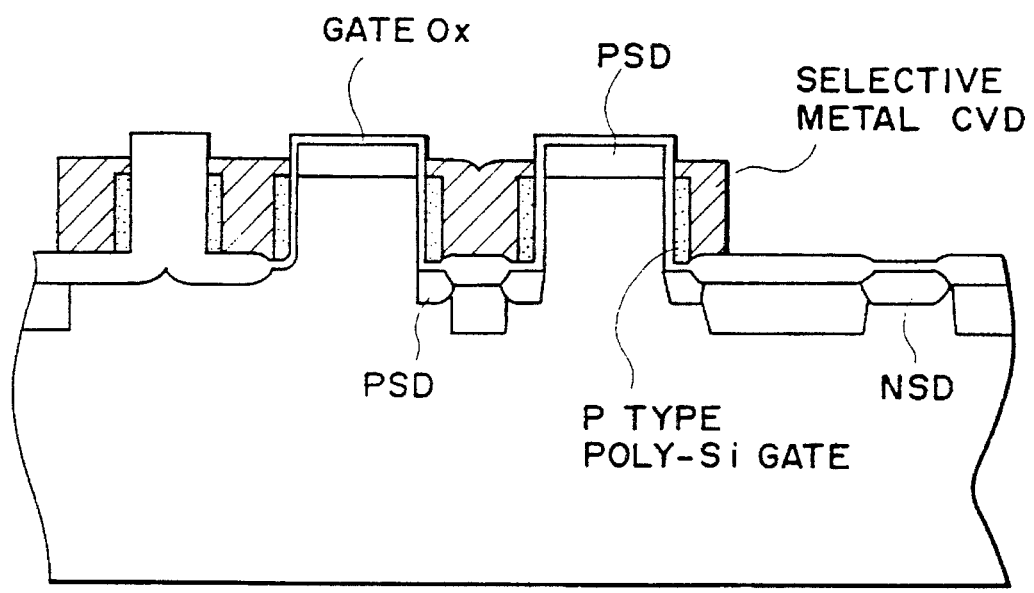

Then, the wafer is cleaned with an NH4OH type solution, and a heat oxide film having a thickness of about 300 Å is formed. This oxide film is again peeled off by an HF type solution. Then, a heat oxide film having a thickness of 50 to 300 Å is again formed, and then an Si3N4 film having a thickness of about 500 Å is formed by the LP-CVD method. The Si3N4 film is etched back, so that only the Si3N4 film formed in the groove portion is removed. The etching back can be performed by using a parallel and plate type etching device and a CF4 type gas can be used under pressure of a level of 1.8 Pa. Then, resist patterning is performed for the purpose of peeling off the Si3N4 film in the dummy land portion. Then, by using an HF type solution to perform etching slightly, and an H3PO5 type solution is used to peel off the Si3N4 film. Then, a resist pattern is used to form the $BF_2^+$ type p-type impurity region (element separation region) is formed. The concentration of the impurity is about 1E14 to 1E15 $cm^{-2}$. Then, a heat oxide film is formed in only the groove portion and the dummy land portion (FIG. 119).

Then, by using an HF type solution to perform etching slightly, and an H3PO4 type solution is used to peel off the Si3N4 film. Then, only the oxide film formed below the Si3N4 film is again etched by using the HF type solution, and a gate oxide film having a thickness of about 100 Å is formed. Then, a polycrystal silicon is formed by the LP-CVD method. Then, by etching it back, the polycrystal silicon can be left on only the side wall. Then, resist patterning is performed, so that a P-type polysilicon gate electrode is formed simultaneously with forming of the source and the drain. Then, a selection CVD method is used to form a low resistance material on only the gate electrode (see FIG. 120).

Then, etching back (etching of the entire surface) is performed. Then, head oxidation about 500 Å is performed, and then a CVD such as TEOS (Tetraethylorthosilicate) exhibiting excellent coating feasibility is performed, so that an insulating film between layers is formed. Then, this insulating film is etched back, so that only the top surface of the columnar MOS is caused to appear outside. Then, opening for the electrode from the gate and the substrate is formed and wiring is formed, so that the cell structure according to this embodiment is realized (see FIG. 121).

Although the pMOSFET is described, the nMOSFET can be manufactured similarly while considering the conduction type. Therefore, its description is omitted here. The process of forming the nMOS portion is shown in FIGS. 122 to 125 which correspond to FIGS. 118 to 121 which illustrate the process of forming the pMOS portion.

Therefore, the peripheral circuits can be manufactured by the MOS structure.

(Manufacturing Example 2)

This embodiment is arranged in such a manner that only the side surface of the dummy land is made of the insulating material.

Figure 126A:
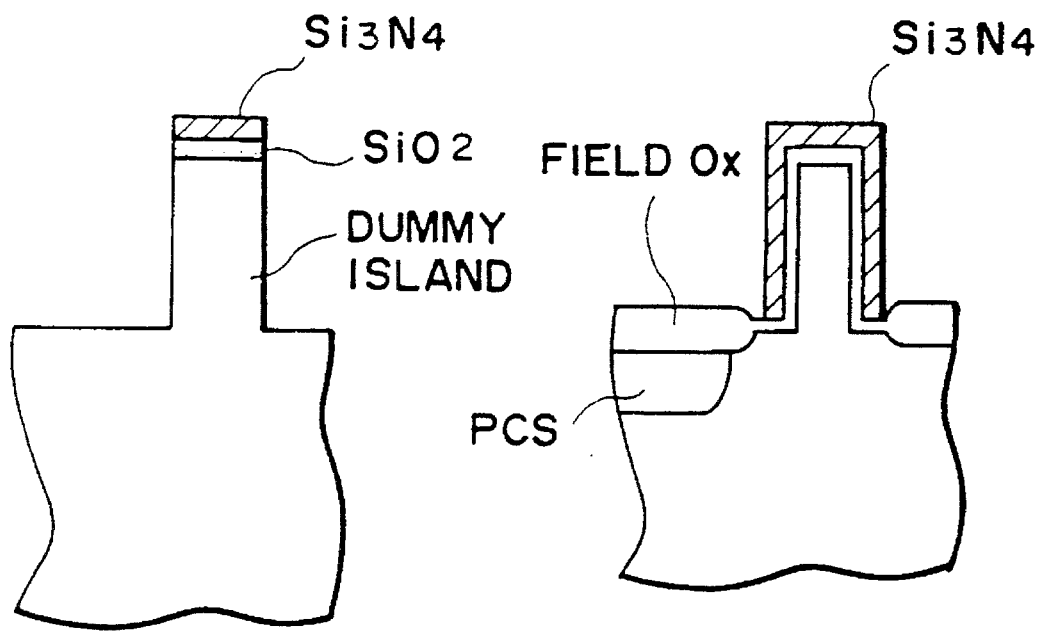
Figure 126B:
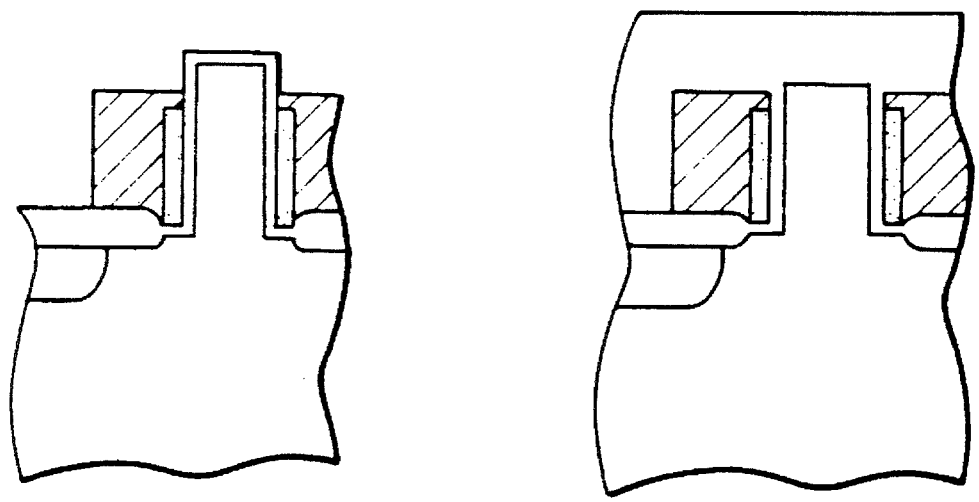

FIGS. 126A to 126D illustrate a process of forming the dummy land in the nMOS portion. These drawings are extractions of portions corresponding to the dummy land portions shown in FIGS. 118 to 121. According to this embodiment, the heat oxide film is formed in only the groove portion while leaving the Si3N4 film on the dummy land portion as shown in FIG. 126B. Then, the Si3N4 film is removed, so that an insulating layer can be formed on only the surface of the dummy land. The residual portions are the same as those according to Manufacturing Example 1.

The process of forming the dummy land in the nMOS portion is arranged similarly.

(Manufacturing Example 3)

When a portion for taking the CMOS invertor $V_{in}$ shown in FIG. 114 or 117 is manufactured, patterning of the gate wiring (common to the gate electrode) is performed by using a mask 925. According to this embodiment, the end portion of the mask reaches an intermediate portion between the nMOS lands 914 and the dummy land 911 in the process of matching the mask 925. Then, contact with $V_{in}$ can easily be established on the gate wiring 924 extending toward the dummy land.

According to Manufacturing Examples 1 and 3, a CMOS using a reliable gate wiring and all of circuits included in a width of 0.33 μm could be formed. The size of the columnar semiconductor layer was 0.1 μm×0.3 μm, that of the dummy land was 0.1 μm×0.1 μm and the total thickness of the gate electrode was 1150 Å. Furthermore, since the aforesaid dummy land is fully formed by the insulating material, the circuit operation could not be hindered.

Figure 127:
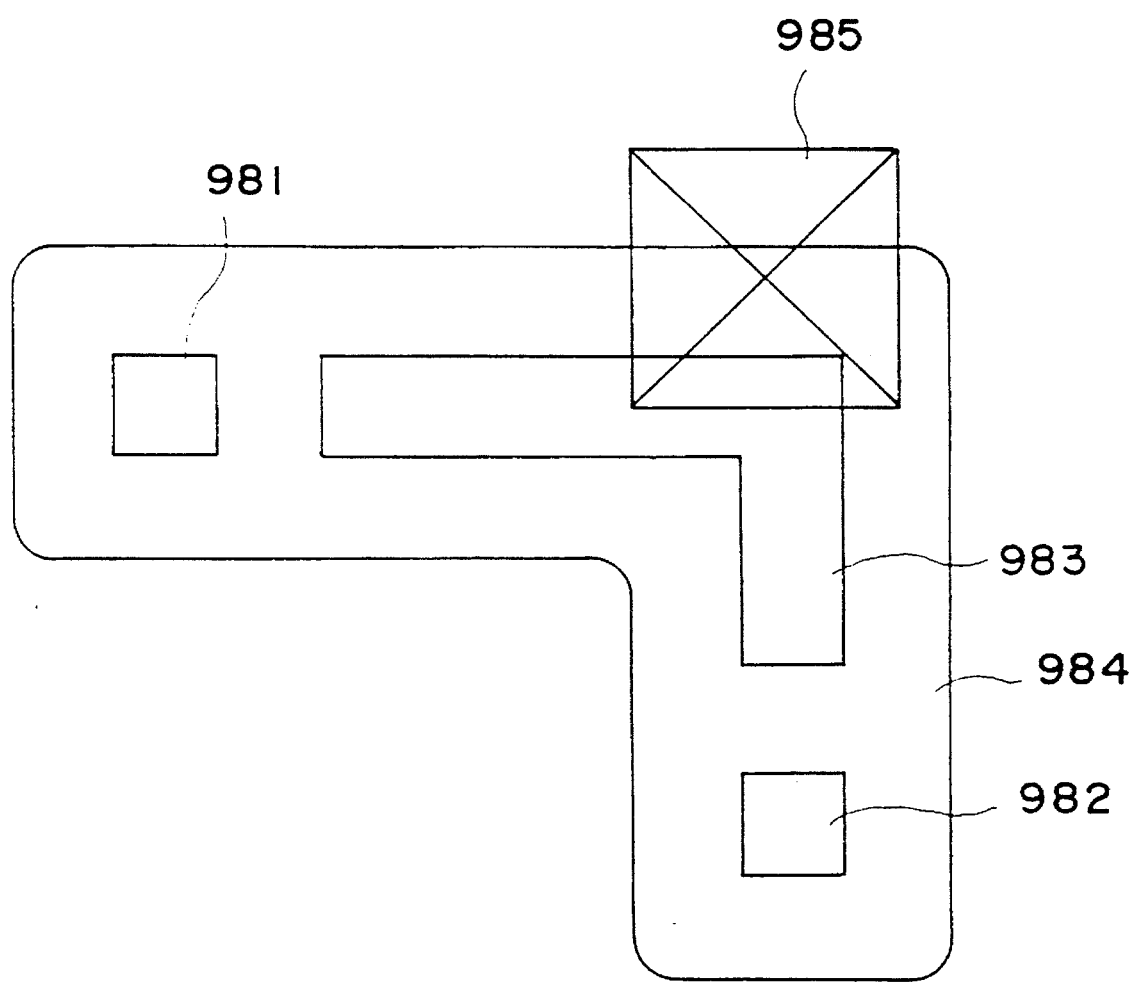

FIG. 127 is a plan view which illustrates a CMOS manufactured by forming the gate electrode wiring while using a common $V_{in}$ for the pMOS and nMOS positioned away from each other. Reference 981 represents a pMOS, 982 represents an nMOS, 983 represents a dummy land, 984 represents a dummy electrode wiring and 985 represents a contact portion.

The CMOS is manufactured by a method similarly to that according to Manufacturing Example 1. However, according to this embodiment, the gate electrode material 984 is deposited, and the entire surface is etched by the etching back method by using no mask.

According to this method, the CMOS is manufactured by using a 5" inch wafer and the contact hole 985 is formed to reach the dummy land 983, so that the Al electrode is formed. It was measured, resulting in no disconnection to be found over the surface of the 5" wafer. The size of the SGT was 0.1 μm×0.1 μm and the thickness of the gate electrode was 0.1 μm. A satisfactory large size of the Al contact hole 0.25 μm×0.25 μm was obtained.

According to the present invention, the SGT exhibiting excellent driving performance is used as the addressing transistor of the memory cell and a junction, which can be electrically broken, is used as the memory element of the memory cell. As a result, the writing and reading operations can be performed at high speed. Furthermore, the main electrode region of the SGT and the insulating film of the memory element are stacked on each other, so that a memory cell the size of which can be minimized is obtained. In addition, in the aforesaid structure, the wiring can be disposed in the separation portion for separating the elements of the memory cell, so that a highly integrated semiconductor device can be obtained.

According to the present invention, the SGT exhibiting excellent driving performance is used as the addressing transistor of the memory cell and a junction, which can be electrically broken, is used as the memory element of the memory cell. As a result, the writing and reading operations can be performed at high speed. Furthermore, the main electrode region of the SGT and the insulating film of the memory element are stacked on each other, so that a memory cell the size of which can be minimized is obtained. In addition, in the aforesaid structure, the wiring can be disposed in the separation portion for separating the elements of the memory cell, so that a highly integrated semiconductor device can be obtained.

Furthermore, the SGT cell is formed into a cylindrical shape, so that a region in which the thickness of the oxide film is locally reduced can be eliminated and thereby the concentration of the electric field can be relieved.

As a result, the voltage resistance of the oxide film can be improved and a reliable semiconductor device can be realized.

As described above, according to the present invention, the surrounding gate type semiconductor device having the gate insulating film and the gate electrode around the columnar semiconductor layer formed on the substrate is arranged in such a manner that an oxide film which is thicker than the gate insulating film formed around the columnar semiconductor layer is formed just below the aforesaid gate electrode. The gate source capacity can be reduced, the switching characteristics of the transistor can be improved and the operation speed of the transistor and that of the memory can be raised.

According to the present invention, the following effects can be obtained in manufacturing the vertical type MOS transistor:

1. The voltage resistance between the source and the gate can be improved. That is, the source electrode and the gate electrode are assuredly separated from each other by the oxide film which is sufficiently thicker than the gate oxide film, so that the breakdown voltage resistance between the source and the gate is improved.

2. The breakdown voltage resistance between the source and the gate can be improved. That is, the drain electrode and the gate electrode are assuredly separated from each other by the oxide film which is sufficiently thicker than the gate oxide film, so that the breakdown voltage resistance between the drain and the gate is improved.

3. The leak current between the source and the gate can be reduced. That is, although the gate oxide film formed adjacent to the source electrode can be easily damaged at the time of injecting ions into the source, the leak current which can be generated in the oxide film can be reduced by thickening the oxide film to be formed between the source and the gale.

4. The alignment margin at the time of the manufacturing process can be enlarged.

5. The parasitic capacity between the source and the gate can be reduced and thereby the switching operation speed can be raised.

According to the present invention, the rectangular or the rectangular-like contact hole is formed substantially in such a manner that its longer side is perpendicular to the rectangular or the rectangular-like member which is the subject of the contact. As a result, even if the short side of the member which is the subject of the contact is very short, the contact can be easily and assuredly established.

As a result, the yield can be improved and a problem taken place in that the semiconductor device cannot be operated due to the deviation of the alignment can be prevented.

Furthermore, the alignment margin can be satisfactorily enlarged and the area of the contact hole can be reduced.

That is, according to the present invention, contact can be easily established in a fine region while maintaining a desired margin. In particular, a significantly effect can be obtained in a case where contact is established in a fine region having a large aspect ratio and a narrow width.

As described above, according to the present invention, one or more columnar layers, which do not constitute a circuit, are located at arbitrary positions different from the positions of the one or more columnar semiconductor layers in addition to these columnar semiconductors. Therefore, the ejecting wiring from the periphery portion of the columnar semiconductor layer for use at the time of etching the layer formed on the aforesaid columnar semiconductor layer by the etching back method can be significantly improved. As a result, a very fine device can be manufactured, causing a significant effect to be obtained when the surrounding gate type MOSFET is manufactured.

In addition, the aforesaid columnar layer is arranged in such a manner that its surface is made of an insulating film. Therefore, the generation of the parasitic capacity or the like which adversely effects upon the circuit characteristics can be prevented.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A semiconductor device having a member which is the subject of contact and which is formed into a rectangular or a rectangular-like shape, said semiconductor device comprising, a contact hole formed in such a manner that its longer side crosses at substantially right angles from the direction of the longer side of said contact member which is the subject of contact, wherein said member which is the subject of contact comprises semiconductor material having a columnar structure formed on said substrate.

2. A semiconductor device having a member which is the subject of contact and which is formed into a rectangular or a rectangular-like shape, said semiconductor device comprising, a contact hole formed in such a manner that its longer side crosses at substantially right angles from the direction of the longer side of said contact member which is the subject of contact, wherein said member which is the subject of contact comprises columnar semiconductor material which constitutes a surrounding gate-type MOSFET.

3. A semiconductor device comprising:

a first columnar semiconductor island having a top surface of a rectangular or rectangular-like shape;

an insulating layer provided on said first columnar semiconductor island; and a contact hole provided in said insulating layer for exposing said top surface of said first columnar semiconductor island, wherein said contact hole is arranged such that the direction of the longer side of said contact hole is substantially at a right angle to the direction of the longer side of said top surface of said first columnar semiconductor island.

4. A semiconductor device according to claim 3, wherein said top surface is a surface provided at a source or a drain of a transistor.

5. A semiconductor device according to claim 3, further comprising a gate electrode provided by an insulating film on a side surface of said first columnar semiconductor island.

6. A semiconductor device according to claim 3, further comprising a second columnar semiconductor island provided in the direction of the longer side of said top surface of said first columnar semiconductor island.

7. A semiconductor device according to claim 6, wherein said second columnar semiconductor island has a top surface of a rectangular or a rectangular-like shape and a rectangular contact hole for exposing said top surface of said second columnar semiconductor island, said rectangular contact hole being arranged such that the direction of the longer side of said rectangular contact hole is substantially at a right angle to the direction of the longer side of said top surface of said second columnar island.

* * * * *

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

SHEET 17 OF 112

FIG. 17, "fieldOx" should read --FIELD Ox--.

SHEET 107 OF 112

FIG. 118, "ISLAND" should read --LAND--.

SHEET 108 OF 112

Figure 121:
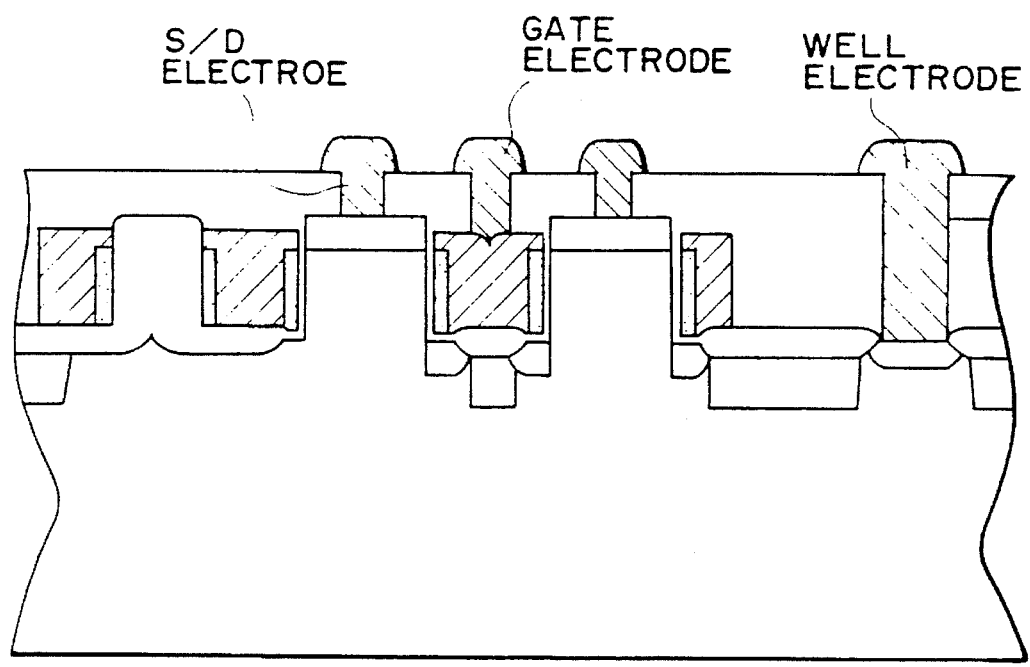

FIG. 121, "ELECTROE" should read --ELECTRODE--.

SHEET 109 OF 112

Figure 122:
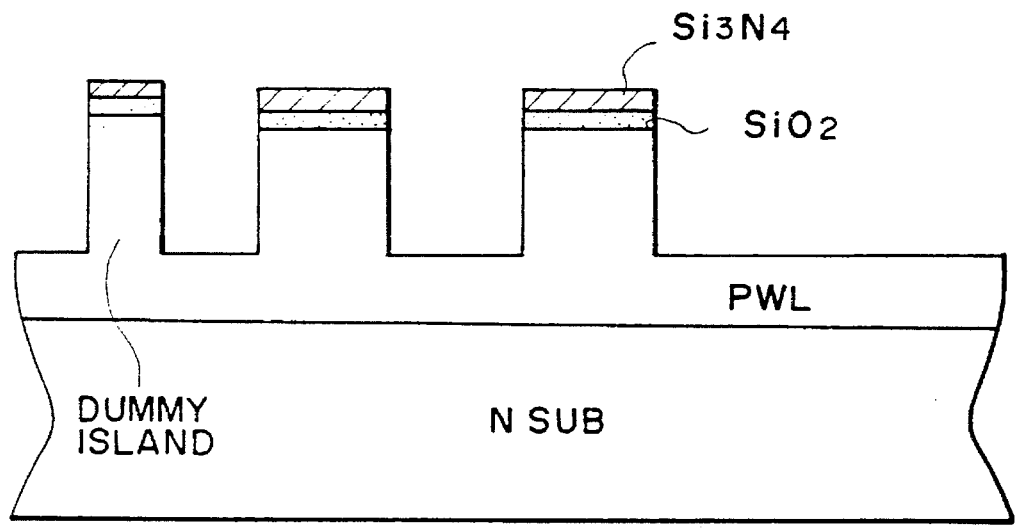
Figure 123:
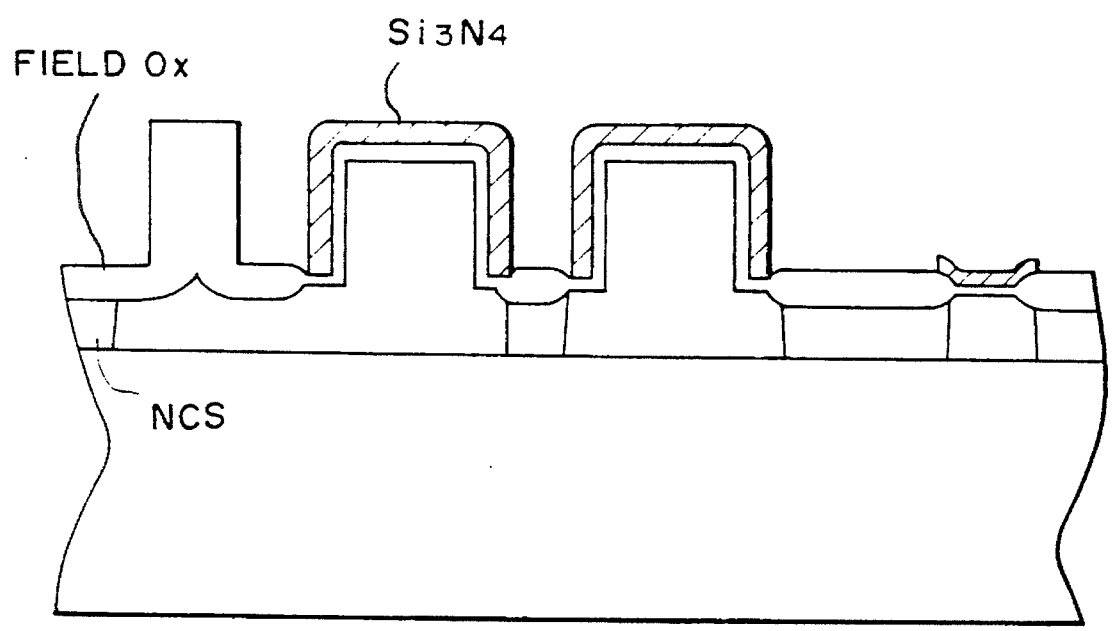
Figure 124:
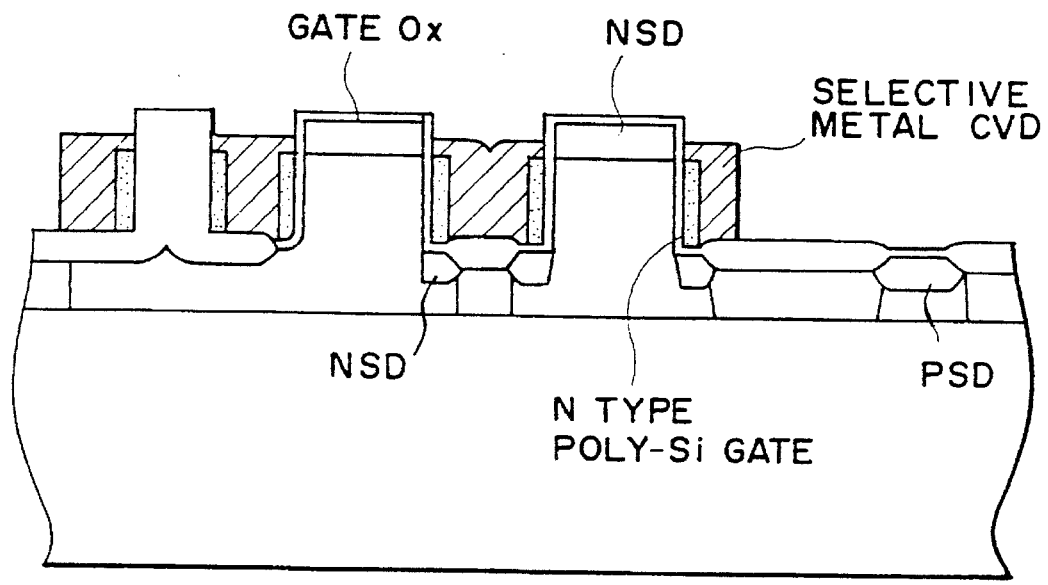
Figure 125:
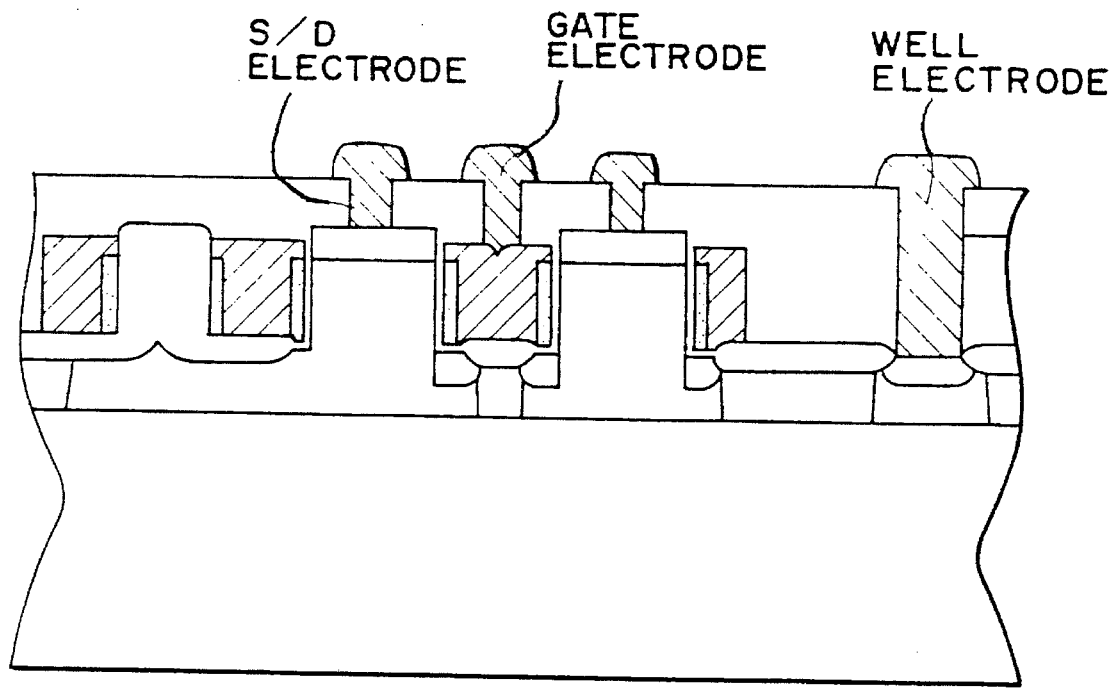

FIG. 122, "ISLAND" should read --LAND--.

SHEET 111 OF 112

FIG. 126, "ISLAND" should read --LAND--.

AT [57] ABSTRACT

Line 3, "substrate," should read --substrate;--.

COLUMN 1

Line 53, "represent" should read --represent the--.
Line 54, "region and" should read --region,--.
Line 55, "film," should read --film, and--.
Line 56, "represent" should read --represent an--.
Line 63, "arises" should read --gives rise to--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 2

Line 3, "the similar scaling" should read --scaling similar--.
Line 4, "for use to fining" should read --used for fining--.
Line 8, "Masahara" should read --Masahara,--.
Line 17, "are" should read --which are--.
Line 52, "al" should read -al.,--.

COLUMN 3

Line 8, "Masouka" should read --Masuoka--.
Line 39, "be a" should read --be in a--.
Line 40, "facts" should be deleted.
Line 43, "floating" should read --floating gate--.
Line 44, "arises" should read --arise--.

COLUMN 4

Line 3, "an" should read --a--.
Line 6, "terms" should read --terms of--.
Line 26, "be a" should read --be in a--.
Line 28, "facts" should be deleted.
Line 31, "floating" should read --floating gate--.
Line 32, "arises" should read --arise--.
Line 51, "$\delta1<\delta2$" should read --$\delta1<\delta2$
Line 53, "an" should read --a--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 5

Line 22, "gate." should read --gate-- and "the MOS" should read --the SGT-MOS--.
Line 34, "monocrytal" should read --monocrystal--.
Line 37, "arises" should read --arise--.

COLUMN 6

Line 12, "becomes too difficult." should read --becomes too difficult to achieve.--.

COLUMN 9

Line 48, "proceSS" should read --process--.

COLUMN 10

Line 37, "illustrates" should read --illustrates a--.

COLUMN 12

Line 48, "high" should read --highly--.
Line 67, "high" should read --highly--.

COLUMN 13

Line 14, "thicken." should read --thickened.--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 14

Line 1, "rectangular" (second occurrence) should read --rectangular-like--.
Line 54, "the" (first occurrence) should be deleted.
Line 56, "or" should read --to--.

COLUMN 15

Line 7, "on" should read --on the--.
Line 24, "silicide" should read --silicides--.
Line 25, "polycide" should read --polycides--.
Line 32, "dr" should read --or-- and "also" should be deleted.
Line 59, "is" should read --are--.

COLUMN 16

Line 3, "stacking" should read --stacking the--.

COLUMN 17

Line 44, "by" should read --in-- and "selfalignment" should read --self-alignment--.
Line 46, "arid" should read --and--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 18

Line 29, "1:" should read --1--.
Line 30, "bet" should read --bit-- and "reference-voltage" should read --reference voltage--.
Line 43, "2:" should read --2--.
Line 45, "VGND1 ," should read --VGND1,--.

COLUMN 19

Line 9, "taken" should read --taking--.
Line 10, "bit is" should read --bit that is--.
Line 43, "ben" should read --been--.
Line 54, "to-the" should read --to the--.

COLUMN 20

Line 6, "siliccn" should read --silicon--.
Line 59, "by using" and "solution" should read --solution is used--.
Line 61, "film-formed" should read --film formed--.

COLUMN 21

Line 5, "only" should be deleted.
Line 13, "by" should read --in-- and "selfalignment" should read --self-alignment--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 22

Line 12, "ion" should read --ions--.
Line 25, "since" should read --when--.
Line 51, "performed." should read --performed--.
Line 54, "for use" should be deleted.
Line 55, "cause" should read --cause a--.
Line 63, "convention" should read --conventional--.

COLUMN 23

Line 58, "a" should be deleted.

COLUMN 24

Line 11, "1000'" (2nd occurrence) should read --"1001"--.
Line 24, "also SGT is" should read --SGT is also--.
Line 33, "only" should be deleted.

COLUMN 25

Line 2, "tially" should read --tial--.
Line 5, "1:" should read --1--.
Line 7, "bet" should read --bit-- and "reference-voltage" should read --reference voltage--.
Line 18, "2:" should read --2--.
Line 54, "taken" should read --taking--.
Line 55, "bit is" should read --bit that is--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 26

Line 22, "ben" should read --been--.

COLUMN 27

Line 6, "gale" should read --gate--.
Line 8, "relationship" (1st occurrence) should be deleted.

COLUMN 28

Line 51, "5(H)" should read --6(H)--.

COLUMN 29

Line 17, "the/ower" should read --the lower--.
Line 29, "gate-mainly" should read --gate mainly--.
Line 39, "selfalignment" should read --self-alignment--.
Line 60, "1000" '" should read --"1001"--.

COLUMN 30

Line 20, FIG. 1is" should read --FIG. 11--.
Line 27, "1:" should read --1--.
Line 28, "bet" should read --bit--.
Line 32, "and-the" should read --and the--.
Line 41, "2:" should read --2--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 31

Line 7, "taken" should read --taking--.
Line 8, "bit is" should read --bit that is--.
Line 42, "ben" should read --been--.

COLUMN 32

Line 51, "be" should read --is--.
Line 52, "be" should read --is--.
Line 62, "by using" should be deleted and "solution" should read --solution is used--.

COLUMN 33

Line 17, "selfalignment" should read --self-alignment--.
Line 37, "for" should read --for the--.

COLUMN 34

Line 29, "since" should read --when--.
Line 43, "elements" should read --element--.
Line 49, "al," should read --Al,--.
Line 51, "numeral" should read --numerals--.

COLUMN 35

Line 3, "strage" should read --stage--.
Line 6, "a" should be deleted.
Line 9, "are" should read --are a--.
Line 32, "layers. As a result," should read --layers,--.
Line 55, "represents" should read --represents a--.
Line 60, "taking" should read --making--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 36

Line 57, "arbitrary" should read --arbitrarily--.
Line 58, "thicken" should read --thickened--.
Line 59, "that" should read --that a--.
Line 63, "filed" should read --field--.
Line 65, "by using" should be deleted and "solution" should read --solution is used--.

COLUMN 37

Line 13, "gate polysilicon" should read --polysilicon gate-- and "subject" should read --subjected--.
Line 21, "by" should read --in-- and "selfalignment" should read --self-alignment--.
Line 28, "NDS" should read --MOS--.
Line 31, "N-NOS" should read --N-MOS--.
Line 32, "N-NOS" should read --N-MOS--.
Line 33, "P-NOS" should read --P-MOS--.
Line 52, "serving" should read --serves--.
Line 59, "Since the" should read --The--.
Line 64, "a thick film having a thickness of-- should be deleted.

COLUMN 38

Line 32, "will be built in" should be deleted.
Line 48, "thicken" should read --thickened--.
Line 60, "ID" should read --1(D)--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 39

Line 8, "processes to" should read --processes as--.
Line 33, "1D" should read --1(D)--.
Line 43, "is" should read --are--.
Line 45, "1D," should read --1(D),-- and "performing" should be deleted.
Line 64, "BF2$^+$" should read --BF$^{+2}$--.

COLUMN 40

Line 7, "gates" (both occurrences) should read --gate--.
Line 9, "gates" (both occurrences) should read --gate--.
Line 11, "were" should be deleted.
Line 12, "about" should be deleted and "NMOS," should read --NMOS, the--.
Line 29, "an" should be deleted.

COLUMN 41

Line 6, "BF2$^+$" should read --BF$^{+2}$--.
Line 12, "$\mu$m to be formed." should read --$\mu$m.--.
Line 42, "gas" should read --gas may--.
Line 44, "that" should read --that a--.
Line 50, "by using" should be deleted and "solution" should read --solution is used--.
Line 66, "the" should read --a--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 42

Line 8, "Lop" should read --top--.
Line 28, "section" should read --sections--.
Line 55, "by" should read --to--.
Line 66, "be" should be deleted.
Line 67, "taken" should read --take--.

COLUMN 43

Line 18, "III, angled" should read --III is used, angled--.
Line 39, "establishing" should read --establish--.
Line 42, "using it as" should be deleted.
Line 47, "gane" should read --gate--.
Line 56, "10" should be deleted.
Line 67, "as" should read --of--.

COLUMN 44

Line 8, "FIGS." should read --FIG.--.
Line 30, "$\mu$m to be formed." should read --$\mu$m.--.
Line 58, "pattering" should read --patterning--.
Line 60, "by using" should be deleted and "solution" should read --solution is used--.
Line 63, "BF2$^+$" should read --BF$^{+2}$--.

COLUMN 45

Line 1, "by using" should be deleted and "solution" should read --solution is used--.
Line 59, "of" should read --of the--.

UNITED STATES PATENT AND TRADEMARK OFFICE
CERTIFICATE OF CORRECTION

PATENT NO. : 5,598,037
DATED : January 28, 1997
INVENTOR(S) : SHIN KIKUCHI ET AL.

It is certified that error appears in the above-identified patent and that said Letters Patent is hereby corrected as shown below:

COLUMN 46

Line 6, "similarly" should read --similar--.
Line 17, "satisfactory" should read --satisfactorily--, "of the" should be deleted and "hole" should read --hole of--.

COLUMN 47

Line 17, "to be" should be deleted.
Line 18, "gale." should read --gate.--.
Line 31, "taken" should read --taking--.
Line 56, "effects upon" should read --affects--.
Line 59, "particularly" should read --particularity--.

COLUMN 48

Line 1, "the" (2nd. occ.) should read --a--.

Signed and Sealed this

Seventh Day of October, 1997

Attest:

BRUCE LEHMAN

Attesting Officer

Commissioner of Patents and Trademarks